US005440244A

United States Patent [19]

Richter et al.

[11] Patent Number: 5,440,244

[45] Date of Patent: Aug. 8, 1995

[54] METHOD AND APPARATUS FOR CONTROLLING A MIXED VOLTAGE INTERFACE IN A MULTIVOLTAGE SYSTEM

[75] Inventors: Bryan M. Richter, Fremont; Stephen A. Smith, Palo Alto; Mike Assar, Morgan Hill; Abdul Q. Kashmiri; Jerry L. Clark, both of Fremont; Dave M. Singhal, San Jose, all of Calif.

[73] Assignee: Cirrus Logic, Inc., Fremont, Calif.

[21] Appl. No.: 149,061

[22] Filed: Nov. 8, 1993

Related U.S. Application Data

[63] Continuation-in-part of Ser. No. 16,574, Feb. 10, 1993, Pat. No. 5,300,835.

[51] Int. Cl.[6] .......... H03K 19/0175

[52] U.S. Cl. .......... 326/37; 326/81; 326/58; 326/83

[58] Field of Search .......... 326/37–38, 326/121, 80–81, 68, 58, 83, 86

[56] References Cited

U.S. PATENT DOCUMENTS

| | | | |
|---|---|---|---|
| 4,472,647 | 9/1984 | Allgood | 307/475 |
| 4,775,808 | 10/1988 | Trumpp | 307/443 |
| 5,058,063 | 10/1992 | Wada et al. | 365/185 |
| 5,122,692 | 6/1992 | Seki | 307/475 |
| 5,136,190 | 8/1992 | Chern et al. | 307/475 |
| 5,144,165 | 9/1992 | Dhong et al. | 307/451 |
| 5,157,281 | 10/1992 | Santin et al. | 307/296.8 |
| 5,319,254 | 6/1994 | Goetting | 307/443 |
| 5,327,020 | 7/1994 | Ikeda | 307/290 |
| 5,331,219 | 7/1994 | Nakamura | 307/475 |

OTHER PUBLICATIONS

3 Volt System Logic For Personal Computers Data Book, Advance Micro Devices 1992, pp. 1–100 to 1–103.

Digital Integrated Electronics, Taub & Schilling 1977, pp. 156–161, 273–277.

Harris Semiconductor CMOS Logic ICs App. Note, Apr. 1986, "QMOS HC/HCT Logic Designs For Battery–Powered Or Battery–Backed Up Operation" by J. Nadolski, pp. 1–5.

Linear Interface Integrated Circuits, Motorola Semiconductor Products 1979, pp. 4–21 to 4–23, 4–132 to 4–136.

CMOS Data Book, National Semiconductor 1977, pp. 1–106 to 1–113 & 1–116.

Interface Data Book, National Semiconductor 1978, pp. 4–4 to 4–13.

Advanced CMOS Logic ICs Data Book, GE Corp./-RCA Division, Oct. 1988, pp. 16–20.

CMOS Integrated Circuits Data Book, RCA Corp., Aug. 1983, pp. 78–81, 418–421, 687–694.

RCA/LSI Products–Applications, RCA Corp., Jan.

(List continued on next page.)

*Primary Examiner*—Edward P. Westin
*Assistant Examiner*—Andrew Sanders
*Attorney, Agent, or Firm*—Blakely, Sokoloff, Taylor & Zafman

[57] ABSTRACT

The design and implementation of a low power CMOS bi-directional I/O buffer that translates low voltage core logic level signals into the highest logic level signals to drive the final output stage which outputs a selectable logic level signal. The buffer further translates input signals of a variety of logic levels into low voltage core logic level signals. In either case, AC and DC power consumption is minimized in a mixed power supply environment that requires voltage translation to represent the proper binary logic levels. An multivoltage I/O buffer having multiple input-receiving NOR gates is also described. The NOR gates of the multivoltage I/O buffer having triggering levels optimized for differing core voltage levels. Also described is a host adapted system for interfacing between and removable peripheral card and a host computer. The host adaptor includes an integrated circuit employing the multivoltage bi-directional I/O buffer.

17 Claims, 13 Drawing Sheets

OTHER PUBLICATIONS

1982, "Interfacing COS/MOS With Other Logic Families" by A. Havasy & M. Kutzin, pp. 59–70.
High Speed CMOS Data Book, SGS-Thomson Microelectronics, Oct. 1988, pp. 57–59.
Power MOS Devices Data Book, SGS-Thomson Microëlectronics, Jun. 1988, "Novel Protection And Gate Drives For MOSFET's Used In Bridge-Leg Configurations", pp. 131–136.
The Interface Circuits Data Book, Texas Instruments 1977, pp. 373–384.
High-Speed CMOS Logic Data Book, Texas Instruments, Jun. 1989, "Using High-Speed CMOS And Advanced CMOS Logic In Systems With . . . " by R. Curtis, pp. 4–17 to 4–25, 4–47 to 4–57.
$C^2MOS$ Logic Data Book, Toshiba, Aug. 1990, "TC74AC/ACT & TC74HC/HCT Series", pp. AC4-8–AC51.

METHOD AND APPARATUS FOR CONTROLLING A MIXED VOLTAGE INTERFACE IN A MULTIVOLTAGE SYSTEM

RELATED APPLICATIONS

This application is a continuation-in-part of U.S. application Ser. No. 08/016,574 filed Feb. 10, 1993, now U.S. Pat. No. 5,300,835 for a CMOS Low Power Mixed Voltage Bi-directional I/O Buffer and assigned to the Assignee of the present application.

FIELD OF THE INVENTION

The invention generally relates to integrated circuits and particularly to the design of an integrated circuit in a system with mixed DC voltage supplies. The invention also generally relates to systems for controlling the voltage provided to a removable peripheral device, such as a memory card or Fax card, in a computer system. In particular, the invention relates to the control of voltage supplied to a peripheral card configured to the specifications of the Personal Computer Memory Card International Association (PCMCIA).

BACKGROUND OF THE INVENTION

DC Power consumption in electronic devices can be approximated by the equation P=VI whereas AC power consumption can be approximated by the equation $P=CV^2F$. Thus power consumption is proportional to the voltage supply V or the square of the voltage supply $V^2$. In either case power consumption can be decreased by lowering the voltage supply such as from five volts to three and one third volts. Also decreasing the amount of current consumed will lower the power consumption. The decrease in DC supply voltage from five volts to three volts will approximately decrease power consumption by over forty percent. With the increase of portable electronics and battery operated systems the power consumption and operation time of portable units has become important. Electronics technology has changed from TTL to CMOS in order to decrease the current consumption thereby reducing power consumption. To further decrease power consumption it is desirable that the operating voltage be reduced.

Thus, to achieve low power consumption in portable computer systems it is necessary to operate at voltages below the present 5 V CMOS and TTL DC power supply of 5.0 V (volts) plus or minus 0.5 V. JEDEC (Joint Electronic Development Engineering Committee) specified two standards for low power systems known as LVCMOS (Low Voltage CMOS or 3.3. V CMOS) and LVTTL (Low Voltage TTL). Both of these standards require circuitry to operate with a 3.3 V plus or minus 0.3 V power supply. Other low voltage standards, such as LVBO CMOS (Low Voltage Battery Operated CMOS) which operates with a DC power supply of 2.8 V plus or minus 0.8 V, are being prepared by JEDEC at this time. Each of these standards specify logic level values for inputs (VIH and VIL) and outputs (VOH and VOL). VIL is the maximum voltage at the input of the input buffer that will be recognized as logical zero. VIH is the minimum voltage level at the input of the input buffer that will be recognized as logical one. In a CMOS fabrication process output voltages generally range from ground to the maximum supply voltage. Thus for 3.3 V CMOS the typical logic levels are 0 V to represent logical zero and 3.3 V to represent logical one. In 5 V CMOS the typical logic levels are 0 V to represent logical zero and 5 V to represent logical one. However, in TTL fabrication the typical logic levels are 0.4 V to represent a logical zero and 2.4 V to represent a logical one. It is generally desirable to design a system with one type of logic family with similar logic levels. However due to the lengthy development cycle of integrated circuits, it may be a few years before notebook and hand-held computer designers have all the components necessary to design a complete system operating with only a 3.3 V DC power supply. Presently most floppy disk and hard disk controller integrated circuits that interface with the ISA or EISA bus require a 5.0 V power supply. Most flat panel and CRT Monitor display controllers require a 5.0 V power supply as well. Presently most microprocessors and DRAMs require a 5.0 V power supply to operate. Presently PCMCIA cards are being manufactured that operate at either 3.3 V or 5.0 V or both.

A system designer may need to design a system that operates with devices using a mixed set of DC power supplies. For example the designer may desire to design a system using a 3.3 V memory, a 5.0 V ISA bus, a PCMCIA interface for both 3.3 V and 5.0 V, and a circuit's internal core logic operating with a 3.3 V or 5.0 V power supply. Hence there is a need for integrated circuit components that operate internal core logic using a 3.3 V power supply to conserve power and can simultaneously interface with other system components that generate 5 V CMOS, TTL, 3.3 V CMOS, or LVTTL logic levels from their respective DC power supplies.

In both mixed-voltage and low-voltage-only systems it is sometimes necessary to overdrive a bi-directional pin (also referred to as an Input/Output pin) with an input voltage that is greater than the DC supply voltage for the electronics of that bi-directional pin. For example assume the DC supply voltage is 3.3 V. This device may have to receive an input signal that reaches a value of 5 V from another device that has a DC supply voltage of 5 V. It is also possible that transmission line effects will cause the input voltage to ring above 3.3 V. In any case, it is desirable that power is not excessively consumed and that electronic components are not damaged.

Some prior-art methods for interfacing components of mixed DC supply voltages (also referred to as multiple DC supply voltages) to generate various logic levels use external components, such as diode clamps or voltage translators. Other prior-art methods use open-collector or open-drain output buffers that require an external pull-up resistor. These methods consume power because of extra current drawn from one of the DC supplies. Furthermore, many prior-art methods consider only unidirectional signals and not bi-directional signals, such as those within a data bus. Also such external components use space that is often very valuable, such as within a portable computer. Such additional components also reduce the reliability of a system.

This overdrive or overvoltage condition input at a pin of an integrated circuit was thought to be resolved by the PN junctions of the output transistors or the input protection diodes for an input only pin. Normally these diodes were reversed biased and had no effect on the electronic operation. However if the voltage applied to the pin becomes greater than the DC supply for that pin the diode forward biases. The diode then sinks current from the overvoltage source in order to reduce and maintain the amplitude at approximately 0.6 V above the DC supply voltage. This input protection diode current increases power consumption. In systems that use mixed DC voltage power supplies the input protection diode current can be considerable and cause damage to electronic circuits. In the case of CMOS devices excessive input protection diode current can lead to an effect called "latch-up". Thus, in low voltage (low power) CMOS systems it is desirable that a different approach to handle overvoltage conditions and mixed DC voltage power supplies be found. This would reduce power consumption and decrease the potential for circuit damage.

FIG. 1 represents the schematic of a prior-art CMOS bi-directional I/O buffer. In this case the pin of the integrated circuit has a P-type transistor pull-up 150. Thus, a separate input protection diode is not needed because the PN junction between the transistor drain and the n-well (or n substrate as the case may be) of the P-type transistor 150 is a natural diode. This diode is reverse biased for input voltage levels below the DC supply voltage VDD.

Assume that the I/O buffer of FIG. 1 is in an input mode. Assume that the DC supply voltage VDD 120 is set to 3.3 V. If the input voltage tries to overshoot or ring above VDD +0.6 V, the diode between the P-type transistor drain and substrate will sink current and increase power consumption.

Now assume VDD 120 is set to 5.0 V and the I/O buffer is in the input mode such that the output buffer is tristated. Assume that 3.3 V CMOS logic level signals are input to the PAD at node 101 where a logical one is represented by a voltage level of 3.3 V. The inverter that consists of transistors 160 and 161 has 3.3 V applied to their respective gate connections. Because VDD is set to 5 V and 3.3 V is applied to the gates of transistors 160 and 161 both transistors are in their on state. In this case each transistor is conducting and causes a current to flow from VDD to Ground (also referred to as VSS). In this document this current is referred to as a crowbar current and becomes nearly zero when either transistor 160 or 161 reach an off state. The off state for transistor 160 is reached when the input voltage at the PAD is above a value of VDD minus one P-type transistor threshold (VDD−VTP). The off state for transistor 161 is reached when the input voltage at the PAD is below a value of one N-type transistor threshold (VTN). Thus it is desirable to eliminate the crowbar current to decrease power consumption while supporting mixed logic level signals.

The prior-art tristate output buffer consists of a P-type power transistor 150, an N-type power transistor 151, a NAND gate pre-driver (consisting of transistors 152,153, 154, 155), and a NOR gate pre-driver (consisting of transistors 156, 157, 158, and 159). Signal OEN* 103 is a signal from the core logic that tristates the power transistors 150 and 151. The "*" after a signal name represents that the signal is active low. Thus OEN* is an active low signal. In the case that the output buffer is tristated OEN* is logical one. OEN* is inverted by the inverter consisting of transistors 164 and 165 to generate OEN signal 104. If OEN* is a logical one OEN is a logical zero. OEN* is input to the NOR pre-driver at transistors 157 and 158. In this case OEN* is a logical one and forces the NOR output 111 to be a logical zero. Thus, transistor 151 is turned off because the gate voltage is 0 V. OEN 104 is input into the NAND pre-driver at transistors 154 and 152. In this case OEN is a logical zero and the NAND output 110 is forced to a logical one. Thus transistor 150 is turned off because the gate voltage is VDD volts. For the case that OEN* is a logical one, power transistors 150 and 151 are both off thereby tristating the output buffer.

In the case that the output buffer is turned on and not tristated, OEN* 103 is a logical zero. OEN 104 is a logical one. The NAND pre-driver is enabled and acts like an inverter of DO signal 102. Similarly the NOR pre-driver is enabled and acts like an inverter of DO signal 102. If DO 102 is a logical one, both the NAND pre-driver output 110 and the NOR pre-driver output 111 are logical zero. This turns on transistor 150 and keeps transistor 151 turned off. The PAD output 101 is charged towards VDD to represent a logical one. In the case that DO 102 is a logical zero, both the NAND pre-driver output 110 and the NOR pre-driver output 111 are logical one. This turns on transistor 151 and keeps transistor 150 turned off. The PAD output 101 is discharged towards Ground to represent a logical zero.

To conserve power the core logic that generates the signals OEN* 103 and DO 102 may have the power supply reduced. With the reduced power supply, the voltage representing binary logical values for OEN* and DO may be reduced to a range of 0 V to 3.3 V. The logic one value represented by 3.3 V is insufficient to properly drive an output buffer with a 5 V power supply. The 3.3 V causes crowbar currents in the output buffer. The PAD voltage levels are reduced from the normal range of 0 to 5 V. The rise, fall, and propagation times are greatly effected by the core logic voltage difference. Therefore it is desirable that the core logic with a different supply voltage be able to properly drive an output buffer.

One important application of the above-described I/O buffers is within an integrated circuit device for controlling a removable peripheral card within a computer system. For example, many computer systems include a card socket for receiving a removable PCMCIA peripheral card which may be a hard-disk card, a fax/modem card, or other similar device. In such computer systems, an integrated circuit card controller device provides an interface between a host microprocessor and the PCMCIA card. Typically, the card controller is configured to operate at a single voltage level, such as 3.3 V. However, the PCMCIA card may include internal integrated circuitry design to operate at one or more different voltages levels, such as 5.0 V. For the card controller to properly communicate with the PCMCIA card, it is desirable to include an I/O buffer within the card controller which is capable of converting signals from PCMCIA card voltage levels to the internal voltage of the card controller. In the foregoing example, such an I/O buffer would preferably convert 5.0 V voltage signals to 3.3 V signals. Since the PCMCIA cards are removable and can be replaced with other cards operating at different internal voltages, the I/O buffer of the card controller is preferably capable of properly receiving any one of several different voltage signals for conversion to the internal voltage of the card controller. Accordingly, it would be desirable to provide an I/O buffer for use in a card controller, or other device, which is capable of receiving or transmitting signals at a variety of voltages and which avoids the various disadvantages of conventional I/O buffers described above.

Other problems may also occur in the supply of power to PCMCIA cards, or similar devices. Typically, power is supplied to the PCMCIA card from a power supply device through a PCMCIA socket. A power enable signal is transmitted to the power supply device from the card controller to initiate the supply of power to the PCMCIA card through the card socket. Because of internal impedance within the PCMCIA card, a delay may occur between when the enable signal is output from the card controller device and when the PCMCIA card actually reaches full power. However, the card controller and the PCMCIA card are also interconnected with a data bus which may begin transmission of data signals to the PCMCIA card before the PCMCIA card is adequately powered. As such, a mismatch may occur within the PCMCIA card between the voltage of power supplied to the card and the voltage of signals received along the data bus. Such a mismatch may irreparably damage the PCMCIA card. It would be desirable to provide circuitry for ensuring that the voltage level of power supplied to the PCMCIA card matches the voltage levels of data signals transmitted to the card.

Although the foregoing voltage mismatch problems have been described primarily with reference to devices for controlling and for providing power to a PCMCIA card, many of these problems also occur in other systems having two or more integrated circuits which must interface but which operate at different internal voltage levels.

Regarding the following descriptions and the attached drawings, please note in the figures that wires crossing over do not connect unless the cross-over is highlighted by a darkened circle such as that at node 110. Wires that join at a "T" are understood to represent a connection and may also be highlighted by a darkened circle. Input protection resistor 190 is used to protect the gate oxide of transistors 160 and 161 from static charges that suddenly occur from handling a device. The resistor absorbs some of the energy that is transferred into the integrated circuit from an external source.

BRIEF SUMMARY OF THE INVENTION

In accordance with one aspect of the invention, an input buffer within an integrated circuit is provided with means for receiving input signals at any of a variety of different voltages and for converting those input signals to a core voltage signal which may vary depending upon a specific installation voltage. Preferably, the input buffer includes a plurality of two input NOR gates with each NOR gate having a first input connected to an input line and a second input connected to a core voltage selection line. Separate voltage lines provide power to each of the NOR gates at the core voltage level. Triggering levels of each of the two-input NOR gates are optimized to different core voltage levels to allow the input buffer to properly distinguish between input high signals and input low signals in a binary input signal. In other words, one NOR gate may be optimized to a core voltage of 3.3 V, whereas a second NOR gate is optimized to a core voltage of 5.0 V. Outputs of each of the two-input NOR gates are connected to a single multiple-input NOR gate which provides a single signal to core logic of the integrated circuit.

In a preferred embodiment, a pair of two-input NOR gates are provided. The core voltage of the integrated circuit is set at installation to either 3.3 V or 5.0 V. The triggering level of the first NOR gate is set to 1.6 V, whereas the triggering level of the second NOR gate is set to 1.4 V. With the aforementioned triggering levels and power interconnections, the input buffer is capable of properly receiving either 5.0 V input signals or 3.3 V input signals, of either CMOS or TTL variety, regardless of whether the core voltage of the integrated circuit is set to 3.3 V or 5.0 V. The input buffer is preferably used in connection with an output buffer capable of translating internal core voltages to an external voltage matching the voltage of an external device such as a PCMCIA card.

In accordance with another aspect of the invention, a method and apparatus are provided for maintaining the voltage level of control and data signals supplied to an integrated circuit, such as a PCMCIA card, at the same level as power also provided to the integrated circuit. The means for maintaining the voltages at the same level is preferably embodied within a system having a card controller integrated circuit, a power supply, and a peripheral card socket for receiving a removable PCMCIA card. The power supply is controlled by the card controller to provide power to the PCMCIA card through the card socket at a voltage level matching internal voltage requirements of the PCMCIA card. The card controller is connected directly to the PCMCIA card by a signal transmission line. Circuitry is provided for ensuring that the voltage of data signals transmitted along the data bus line to the PCMCIA card substantially matches the voltage of power provided from the power supply to the PCMCIA card along a power supply line. In this manner, damage resulting from a power mismatch within the PCMCIA card is avoided.

In a preferred embodiment, the forgoing is achieved by connecting the power supply line to the card socket and to an input pin of the card controller device. A connection is provided within the card controller between the slot voltage input pin and an multivoltage I/O buffer connected to the signal transmission line. More specifically, the multivoltage I/O buffer is configured for receiving power from the slot voltage power supply line. In this manner, data cannot be transmitted along the signal transmission line to the PCMCIA card until power is also provided to the PCMCIA card from the power supply. Moreover, by powering the multivoltage I/O buffer using the same power line that is connected to the PCMCIA card, an instantaneous voltage level output by the multivoltage I/O buffer onto the signal transmission line substantially matches the voltage level of power supplied to the PCMCIA card.

Thus, the various aforementioned problems and disadvantages occurring within multivoltage power supply and control systems and integrated circuits are avoided. Other advantages, features and objects of the invention will be apparent from the drawings and from the detailed description, which follows.

BRIEF DESCRIPTIONS OF THE DRAWINGS

DETAILED DESCRIPTION OF PREFERRED EMBODIMENTS

Mixed Voltage Bidirectional I/O Buffer

The present invention includes a method and apparatus for a low power CMOS bi-directional (input and output or I/O) device typically located at bonding PADs on I/O pins of integrated circuits. In the case of driving signals out of an IC, the invention can translate internal low voltage logic signals into various logic level output signals. In the case of receiving signals, the invention can translate various logic level input signals into internal low voltage logic level signals. In either case power consumption is minimized by the invention in order to maximize the operating time for a battery operated portable system.

The invention ideally supports a system with mixed voltages. In mixed voltage systems, a bi-directional data bus has various logic level signals present because of other DC supply voltages used to operate components interfacing with the data bus. The invention accepts various logic level inputs from these components and reduces normal power consumption associated with receiving the various logic levels. At the same I/O PAD the invention will output user selectable logic levels by an appropriate choice of DC supply voltage to the invention. Within the same device, the invention further provides the capability to output at a group of pins one set of logic levels and to output at another groups of pins a different set of logic levels.

Figure 2:
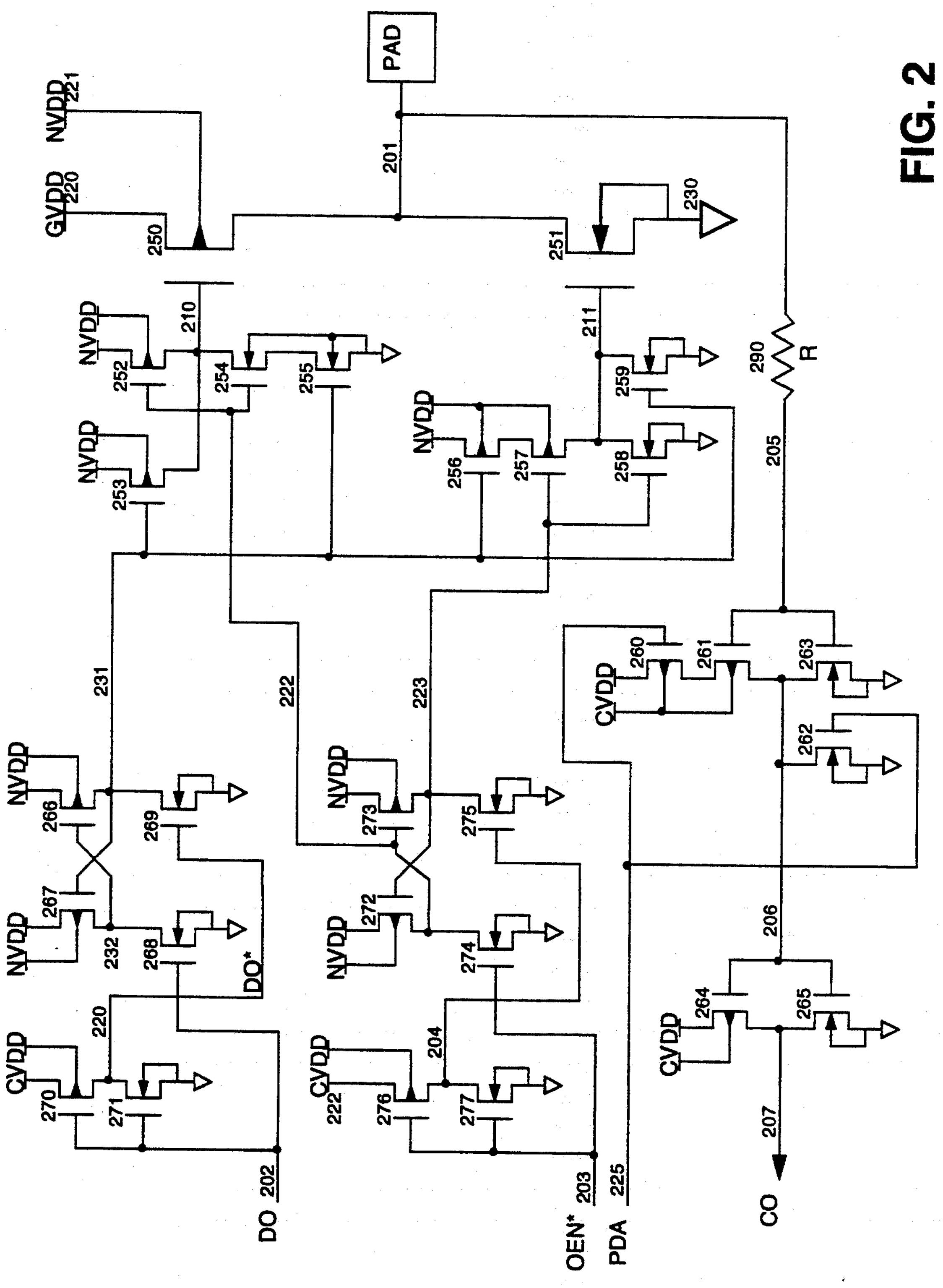
FIG. 2 shows a schematic diagram of a bi-directional I/O buffer that provides low power consumption for systems with mixed DC supply voltages.
Figure 6:
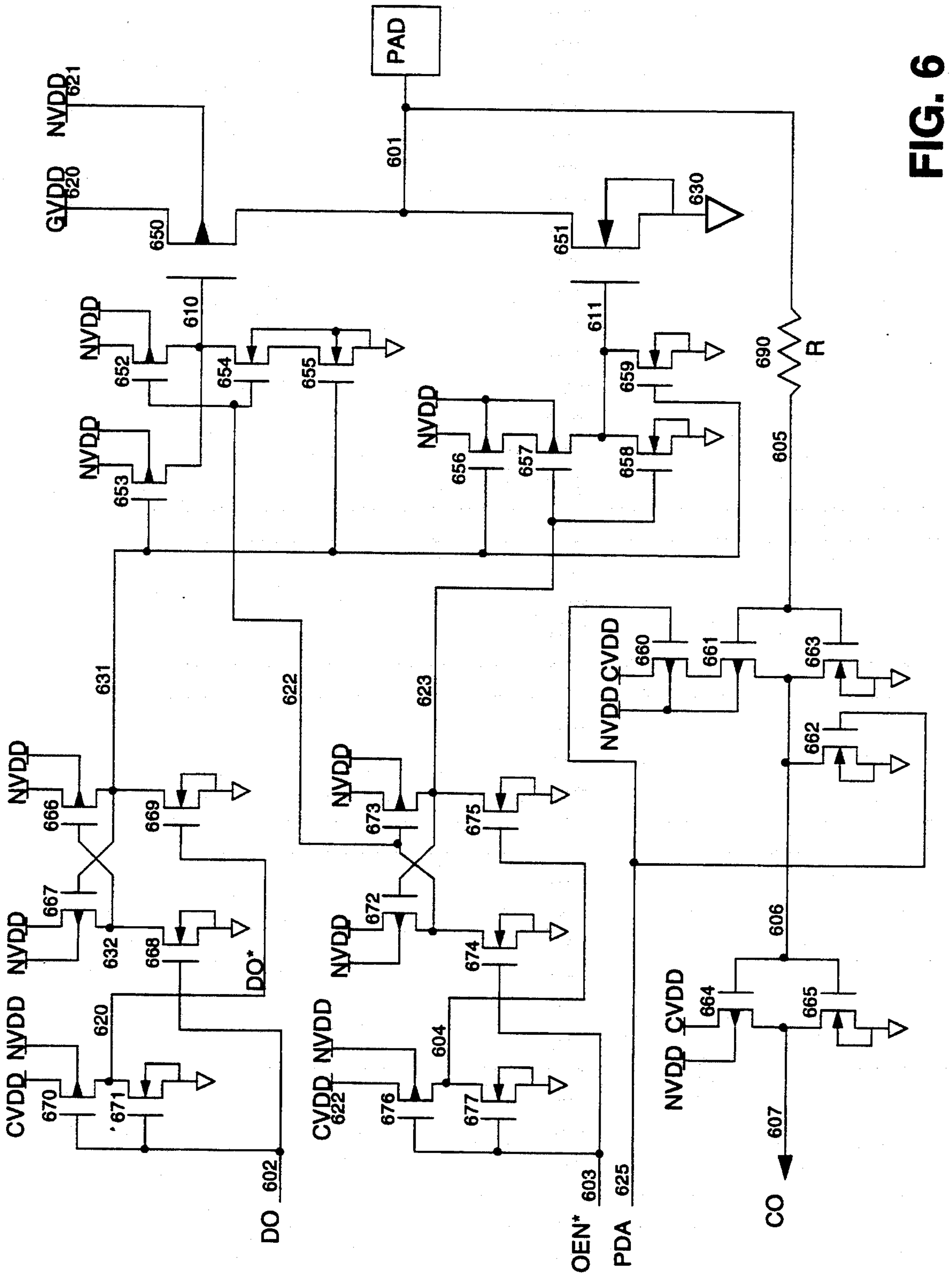
FIG. 6 illustrates the schematic diagram of FIG. 2 in the case that the fabrication process is of a type that provides a p-well for the N-type transistors and an n-substrate for the P-type transistors.

The invention can be manufactured in different CMOS (Complimentary Metal Oxide Semiconductor) processes. FIG. 2 illustrates the invention manufactured in a CMOS process that either contains an n-well or both an n-well and a p-well (also known as twin-tub). FIG. 6 illustrates the invention manufactured in a CMOS process that contains only a p-well such that the n minus substrate is tied to the DC supply voltage NVDD. P-type transistors (also referred to as PFET or PMOS transistor) are represented by the transistor symbol of transistor 270 in FIG. 2. N-type transistors (also referred to as NFET or NMOS transistor) are represented by the transistor symbol of transistor 271 in FIG. 2. The reference to P-type or N-type transistor is not generally used in the text but can be discerned from the figures.

The N-type transistors are assumed to have their respective p substrate or P well (twin tub) tied to Ground or 0 V as indicated by the transistor symbol. The symbol for ground is the triangle symbol at node 230 of FIG. 2. Assume that each N-type transistor that has a connection to this ground symbol is tied to Ground. The power source for Ground is sometimes referred to as the negative power supply or VSS and in digital CMOS circuitry it is usually represented by 0 V.

The bi-directional or I/O buffer consists of two main elements. The first is an input buffer consisting of transistors 260 through 265 in FIG. 2. The second element is an output buffer consisting of transistors 250 through 259 and 266 through 277. Each of these elements is connected together at a PAD at node 201 in FIG. 2. Signals received at the PAD by the invention are input into the input buffer. Signals output at the PAD by the invention are output from the output buffer. The PAD is represented by a square in FIG. 2. The PAD is a bonding surface that allows for a wire from an integrated circuit package to connect a pin of the integrated circuit package to the electronics within a semiconductor substrate.

Input Buffer

The design of the first stage of the input buffer is similar to the design of an inverter that can receive various input logic levels. For the Input buffer to translate 5 V CMOS logic level input signals, 3.3 V CMOS logic level input signals, and TTL logic level input signals into logic signals the core logic understands, we desire the characteristics of a CMOS inverter with a switching threshold designed to worst case conditions. TTL families generally provide the worst case conditions such that VIH=2.0 V and VIL=0.8 V for the LVTTL DC supply voltage of 3.3 V. However, Low Voltage Battery Operated CMOS specifies that VIH=1.4 V and VIL=0.4 V for the minimum DC supply voltage of 2.0 V. By designing for LVTTL we will show that LVBO CMOS conditions are satisfied as well. To satisfy LVTTL conditions it is desirable that the input buffer switching threshold be set at the midpoint between 2.0 V and 0.8 V or 1.4 V for a DC supply voltage of CVDD. CVDD will typically be 3.3 V to match the LVTTL DC supply voltage. Using SPICE analysis, the inverter switching threshold is set by sizing the width and length of the P-type and N-type transistors of the first stage of the input buffer. The inverter switching threshold is not an absolute voltage but varies in proportion to the DC supply voltage. As the DC supply voltage decreases from 3.3 V to 2.0 V the inverter switching threshold decreases as well. JEDEC specified that LVBO CMOS can reach a minimum DC supply voltage of 2.0 V. SPICE analysis of this invention shows that the input buffer operates as low as the LVBO CMOS supply voltage of 2.0 V and will properly receive the appropriate logical zero or logical one for respective logic levels of VIL=0.4 V and VIH=1.4 V. Therefore by designing the input buffer for LVTTL logic levels and a DC supply voltage of 3.3 V, the LVBO CMOS logic levels are satisfied as well. While an inverter may be ideal, it is desirable to turn off an input buffer when not reading signals from the PAD. This reduces power consumption. A NAND or NOR gate, designed to model the switching characteristics of an inverter as described above, can be used to selectively turn on and off the first stage of the input buffer.

In FIG. 2 the first stage of the input buffer consists of a NOR gate (transistors 260, 261, 262, and 263). This stage is designed to simulate an inverter when it is enabled by Power Down (PDA) signal 225. The internal core logic voltage supply (CVDD) is typically 3.3 V which is the power supply to the first stage of the input buffer at transistor 260. Thus when the first stage is enabled it acts like an inverter with a switching threshold 1.4 V designed to meet LVTTL logic levels and a DC supply voltage of 3.3 V. Recall that LVTTL and LVBO CMOS are worst case conditions for logic levels and that the design of an input buffer with a 1.4 V switching threshold for a 3.3 V DC supply voltage satisfies these requirements. Because the 5 V CMOS specifications for VIH and VIL is less stringent than the LVTTL requirements, the 1.4 V switching threshold for an input buffer with a DC supply voltage of 3.3 V will meet the 5 V CMOS logic levels. Therefore the switching threshold of 1.4 V satisfies many external voltage requirements including 5 V CMOS, 3.3 V CMOS, TTL, LVTTL, and LVBO CMOS. Please note that when the input buffer is operational power is more greatly consumed by the TTL and LVTTL specifications for VIL and VIH because of crowbar currents. Providing rail to rail levels (or within 10% of each power supply rail) at the input of the input buffer conserves power in its operational mode because either a P-type transistor or an N-type transistor is in its off state.

The second stage of the input buffer is an inverter consisting of transistors 264 and 265 in FIG. 2. This inverter serves the same function as the inverter consisting of transistors 162 and 163 in FIG. 1. This inverter ensures polarity presented to the core logic at CO output 207 is the same as the PAD polarity. It further provides the desired drive for CO output 207 to overcome internal capacitance within a desired time period. At output CO 207 in FIG. 2 the voltage level representing a logical one is CVDD volts because the input buffer's power supply is CVDD at transistor 264. Therefore, the input buffer executes the translation for a logical one from various logic levels at its input into CVDD volts at CO output 207. CO output 207 is an active high signal with logic levels translated from those at the PAD. CO is sent internally to the core logic of a device to use the signal received at the PAD to perform various functions within a device that contains the invention. This second stage of the input buffer consisting of transistors 264 and 265 may be optional if a weak active low signal is acceptable to the internal core logic. Thus a signal directly from the first stage of the input buffer at node 206 may be driven into the core.

Figure 1:
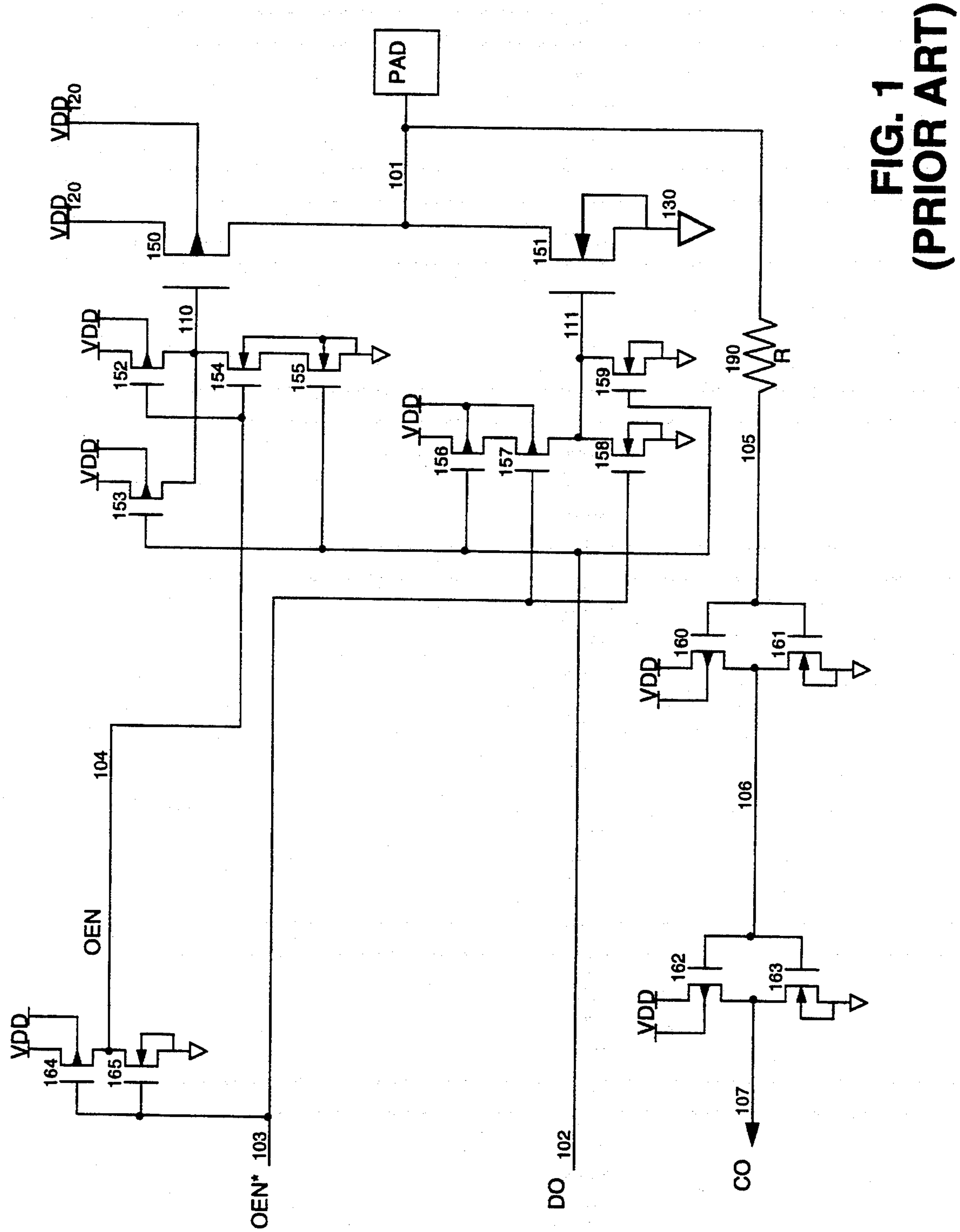
FIG. 1 shows schematic diagram of a prior-art CMOS bi-directional I/O buffer.

In the prior-art the first stage of an input buffer is an inverter. FIG. 1 illustrates the prior-art inverter by transistors 160 and 161. This inverter is constantly enabled and consumes considerable AC power upon switching from rail to rail. Further if the voltage levels are not rail to rail but are TTL logic levels of VIH=2.0 V and VIL=0.8 V, the inverter consumes even more power from both AC switching and DC power due to crowbar currents. Power consumption is even greater If an inverter input is allowed to float. In this case there is no guarantee as to what voltage level is applied to the inputs of the inverter. The inverter may toggle randomly from high to low. Thus the inverter and its respective transistors pass through the linear region of a transistor's functional curve such that it draws current and consumes power. Alternatively if the inverter input is floating, the input could establish a DC level where large crowbar currents consume power. Even pins that are properly receiving signals consume power. If input signals are not needed by the core logic then an inverter driven from rail to rail is consuming AC switching power needlessly. Thus when not reading signals into the core logic, the first stage of the input buffer can be set (referred to as disabled) to ignore all signals at the PAD, including signals that are floating, such that power consumption can be reduced.

In the invention the first stage of the input buffer is a NOR logic gate which can be set such that it conserves power. PDA signal 225 selectively sets the first stage of the input buffer when signals are not being received by the invention. PDA signal has a voltage of CVDD as its high logic level. If PDA signal is high it forces the CO output 207 to be high, regardless of the signal at the PAD. In this case the PAD level could be floating in a range of values and not disturb the logic level within the device. This also minimizes power consumption for PADs that actually do float.

This power savings is accomplished in the invention by the use of a NOR gate (consisting of transistors 260, 261, 262, and 263 in FIG. 2) as the first stage of the input buffer. If input 205 of the NOR gate floats, PDA input 225 when set high forces the NOR gate output into a fixed state so that it does not actively draw power. When reading signals from the PAD, PDA signal 225 is low and does not affect the logic values received by the input buffer. The PDA signal 225 can control all pins or selected groups of pins within an integrated circuit with the use of either soft-ware (control register bit(s)) or hard-ware (a dedicated pin).

Those skilled in the art will recognize that a NAND gate can be used in place of the NOR gate. This reduces power consumption by ignoring signals at the PAD and forcing the NAND output to a fixed state. In this case CO output 207 is forced low if the second input to the NAND, input enable (IEN), is set low.

Output Buffer

In general the output buffer translates low level voltage signals from the core logic into the desired logic level signals at the PAD. In FIG. 2 the desired output level is selected by setting GVDD 220 to the appropriate DC supply voltage such as 5 V or 3.3 V. Translation first starts by converting the core logic level signals into the highest power supply level of the system. The highest power supply voltage must be applied as the NVDD connection for transistors in FIG. 2. Thus the core logic level signals DO 202 and OEN* 203 must first be converted to the NVDD level in the system.

To select the desired output logic level, the final P channel transistor 250 has GVDD tied to its source 220.

However the N-WELL of transistor 250, is tied to NVDD for reasons that are discussed below. Other logic gates before the final output stage of transistors 250 and 251 are also powered by NVDD. If this were not the case, the voltage present at gates 210 and 211 of transistors 250 and 251 would not provide the proper drive levels to meet output specifications of VOH, VOL, rise, fall, or propagation delay.

Signal DO 202 is the data that is desired to be transferred from the core logic out to the PAD. OEN* signal 203 represents the output enable signal that tristates the output when OEN* is high. The * after the signal name represents that the signal is active low. Thus, the invention ensures that if OEN* is low, the logic value asserted at DO 202 is output to the PAD. In the case that OEN* is high, the final stage of the output buffer is disabled. Transistors 250 and 251 are off and do not source or sink current into or out of the PAD.

Voltage Translation

Voltage levels of the core logic signals DO and OEN* need to be translated into voltage levels that may be used to drive the final stage of the output buffer. Logical zero (also referred to as a low logic level) is represented by 0 V and does not require translation. However logical one (also referred to as a high logic level) of signals DO and OEN* is represented by a voltage of CVDD which must be translated into a voltage level of NVDD. This is accomplished by the use of voltage translators. In FIG. 2 the inverter consisting of transistors 270 and 271 in conjunction with the cross wired transistors of 266, 267, 268, and 269 represents the voltage translator for the signal DO. The inverter consisting of transistors 276 and 277 in conjunction with the cross wired transistors of 272, 273, 274, and 275 represents the voltage translator for the signal OEN*.

The N-type transistor threshold in a typical semiconductor fabrication process varies from 0.6 to 1.2 V. The N-type transistors 268, 269, 274, and 275 will turn on for a voltage applied to their respective gates that is greater than the N-type transistor threshold voltage. This places an operational limit on the core voltage CVDD such that it must be greater than the N-type transistor threshold voltage of the specified semiconductor process. Typical maximum N-type transistor threshold voltage is 1.2 V. Thus the voltage translators will operate correctly with any CVDD DC supply voltage that is greater than 1.2 V. This allows chips to be designed with voltage translators that operate with a CVDD DC supply voltage from below 2.0 V up to NVDD volts, which is typically 5 V or 6 V.

N-type transistors 268, 269, 274, and 275 and P-type transistors 272, 273, 274, and 275 are respectively ratioed such that for a worst case value of CVDD equal to 3.0 V and a worst case value of NVDD equal to 5.5 V the N-type transistor (such as transistor 268) can overcome the current supplied by the P-type transistor (such as transistor 267) to flip the voltage translator to the opposite state. This assures that the design of the voltage translator can translate 3.3 V CMOS logic levels into 5 V CMOS logic levels or 3.3 V CMOS logic levels into 3.3 V CMOS logic levels or 5 V CMOS logic levels into 5 V CMOS logic levels. Thus, CVDD can be set to a 3.3 V DC supply voltage and NVDD can be set to a 5 V DC supply voltage, or CVDD can be set to a 3.3 V DC supply voltage and NVDD can be set to a 3.3 V DC supply voltage, or CVDD can be set to a 5 V DC supply voltage and NVDD can be set to a 5 V DC supply voltage, all with power supply tolerances of plus or minus ten percent and in each case the voltage translator properly translates the respective logic levels.

The cross wired transistors of 272, 273, 274, and 275 logically operate similar to a pair of cross coupled inverters in a RAM cell or latch. The signal DO is inverted by transistors 270 and 271 to generate DO* signal 204. The signals DO and DO* driving opposites sides of the cross wired transistors tip the balance of the logical state of the cross wired transistors. For example assume initially that DO is a logical zero such that DO signal is 0 V. Therefore DO* initially is a logical one such that the DO* signal is CVDD volts. P-type transistors 267 and 266 are tied to the NVDD voltage supply at their source connection so that output nodes 231 and 232 vary in a range from 0 V to NVDD volts. Thus the initial states of DO and DO* set the cross coupled transistors such that node 232 is NVDD volts and node 231 is 0 V. For DO to logically change state from a zero to a one, signal DO transitions from 0 V to CVDD volts while DO* transitions from CVDD volts to 0 V. As DO transitions from 0 V to CVDD it begins to turn on transistor 268 such that node 232 begins to transition from NVDD volts to 0 V. Since DO* is transitioning from CVDD to 0 V this turns off transistor 269 and allows node 231 to transition from 0 V to NVDD volts.

For DO to logically change state from a one to a zero, signal DO transitions from CVDD volts to 0 V while DO* transitions from 0 V to CVDD volts. As DO transitions from CVDD volts to 0 V it begins to turn off transistor 268 such that node 232 is allowed to transition from 0 V to NVDD volts. Since DO* is transitioning from 0 to CVDD volts this turns on transistor 269 and causes node 231 to transition from NVDD volts to 0 V. In this manner, logical zero represented by 0 V and logical one represented by CVDD volts within the core logic are respectively translated into 0 V and NVDD volts. Note that node 231 represents the logical equivalent of DO and is connected to the tristate output buffer NAND gate and NOR gate pre-drivers to drive the logic state out to the PAD.

The voltage translator for OEN* signal 203 is nearly identical and operates in the same way. The only difference is that both outputs of this voltage translator are used to enable or disable the tristate output buffer. Note that node 222 logically represents OEN and node 223 logically represents OEN*.

Power Transistors

Figure 7:
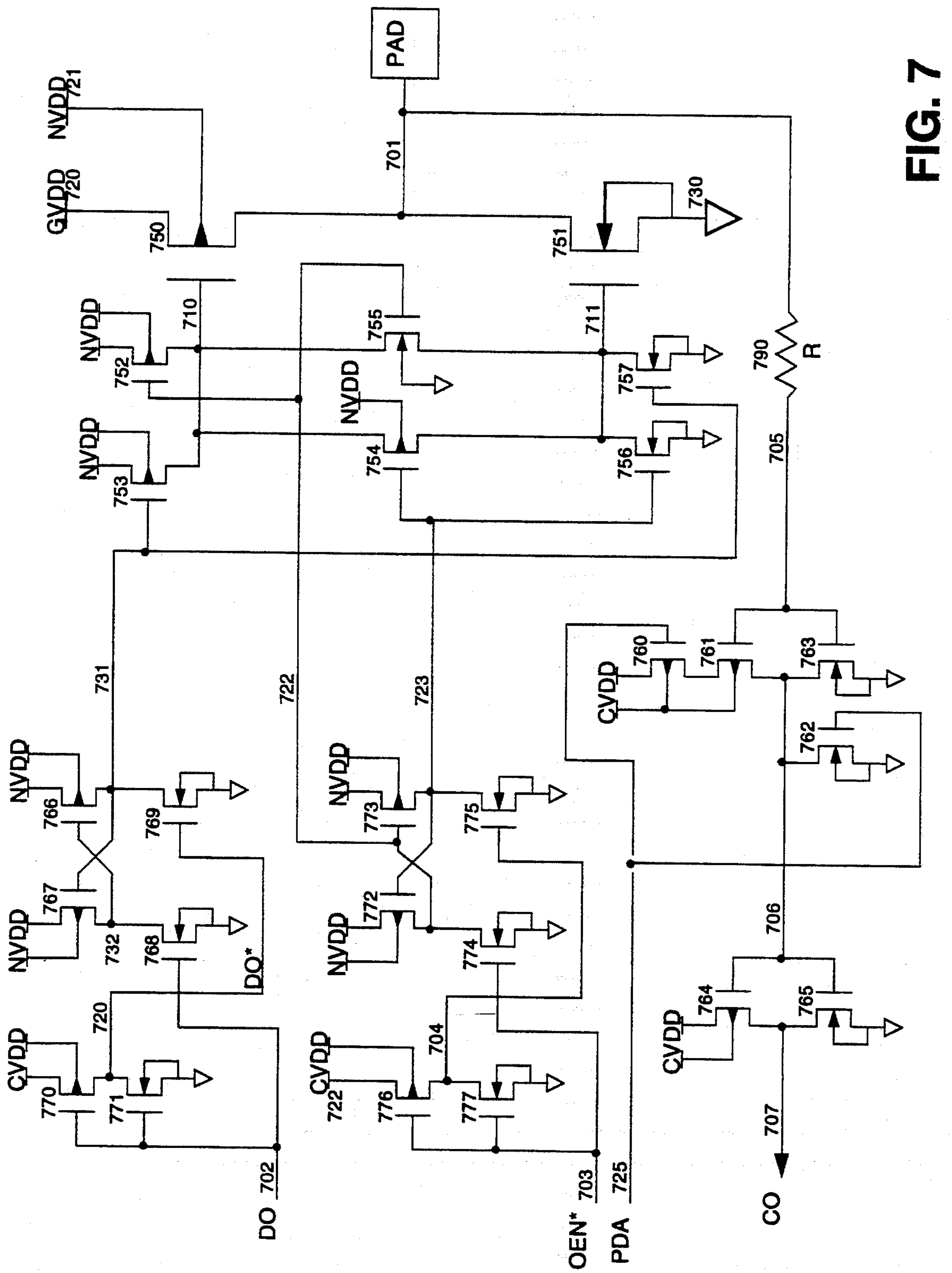
FIG. 7 illustrates an alternative embodiment of the invention of FIGS. 2–7.

Outputs of the two voltage translators are input to a NAND gate, consisting of transistors 252, 253, 254, and 255, and a NOR gate, consisting of transistors 256, 257, 258, and 259. The NAND gate controls the power P-type pull-up and the NOR gate controls the power N-type pull-down. These two logic gates are the pre-drivers for the power transistors and facilitate the tristate mechanism as well as provide the correct polarity of DO to the PAD. The NAND gate is also referred to as the NAND pre-driver. The NOR gate is also referred to as the NOR pre-driver. An alternative embodiment of the invention replaces the NAND and NOR gate pre-drivers with transistors 752 through 757 as illustrated by FIG. 7.

Figure 3:
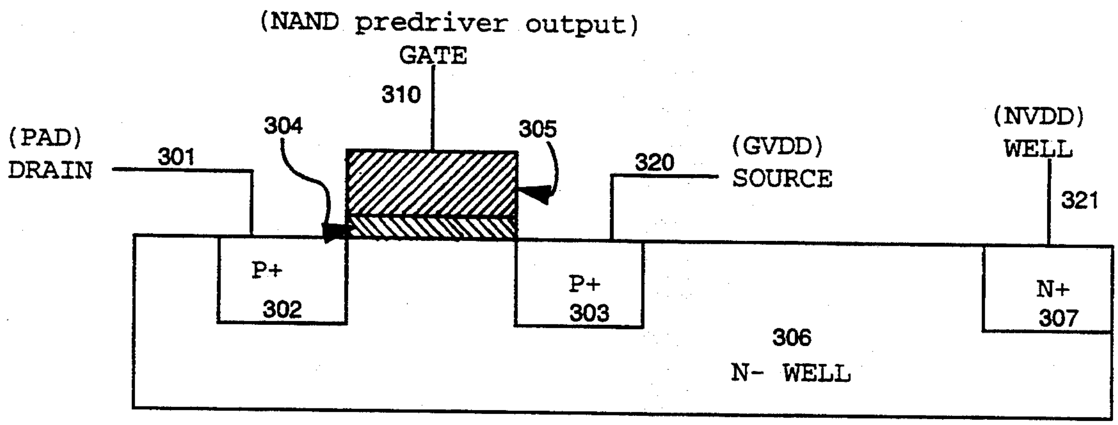
FIG. 3 illustrates a cross section of a P-type transistor in a silicon substrate.
Figure 4:
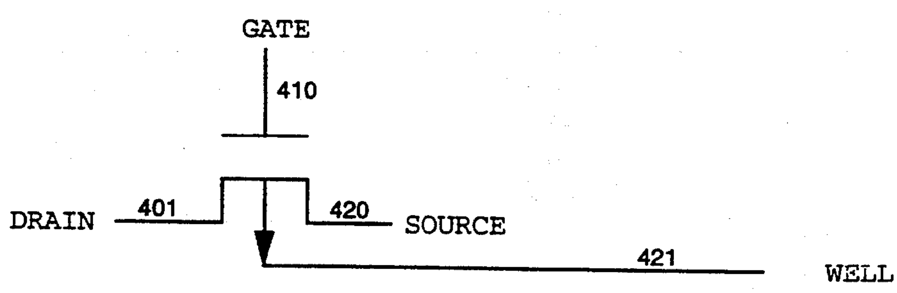
FIG. 4 illustrates the schematic representation of the P-type transistor as illustrated by FIG. 3.

The P-type power transistor 250 can be illustrated by FIG. 3 and FIG. 4. FIG. 3 shows the cross section of the transistor in a silicon substrate. The well connection 321 is tied to NVDD 221 of FIG. 2. The source connection 320 is tied to GVDD 220 of FIG. 2. The gate connection 310 is tied to the output 210 of the NAND pre-driver. The drain connection 301 is tied to the PAD at output 201. FIG. 4 represents the transistor schematic of FIG. 3.

Recall that NVDD is the highest voltage power supply within the system. The source, GVDD 220, of transistor 250 may be less than or equivalent to NVDD. The power supplied to the pre-driver NAND and NOR gates is NVDD. Thus this level of voltage can be applied to gates 210 and 211 of the power transistors 250 and 251. Since NVDD is greater or equal in voltage to GVDD the NAND pre-driver will correctly drive the P-type power transistor into the appropriate switching region. This is the case regardless whether GVDD is set to 3.3 V or 5 V so long as it is less than or equal to NVDD. The N-type power transistor operates similar to the prior-art method of switching characteristics.

Assume that in FIG. 2 the overall I/O buffer is in an input mode such that the output buffer is tristated and the input buffer is enabled. The P-type power transistor is configured in this invention so that its n-well is tied to NVDD. Inherent to the P-type transistor are diodes between the drain and n-well as well as the source and n-well. The drain diode is illustrated in FIG. 3 at the junction of the P+ 302 and the N− WELL 306. The source diode is illustrated by the junction of the P+ 303 and the N− WELL 306. Both of these diodes will not turn on (forward bias) until the drain 301 or source 320 is typically 0.6 V greater than the voltage tied to the WELL 321. The drain diode is normally reversed bias so that it will not draw current from the pin until the voltage on the PAD is greater than a diode threshold above NVDD. For example if NVDD is 5 V and the diode threshold is 0.6 V, the diode will not draw current until the voltage at the PAD is 5.6 V. Recall that the invention requires that NVDD be the highest voltage power supply. Thus GVDD is less than or equal to NVDD which keeps the source diode in a reverse bias such that only leakage currents consume power. With the I/O buffer in an input mode the NAND pre-driver has tristated transistor 250 so that the gate voltage is set to NVDD. This keeps the P-type power transistor turned off for PAD voltages up to NVDD plus the P-type gate threshold voltage. Therefore, GVDD may be set to a range of voltages below NVDD, such as 3.3 V, and will not effect power consumption. In general, this configuration of the P-type power transistor, allows the PAD voltage to reach a level of NVDD plus a diode threshold without an increase in power consumption. This configuration of the P-type transistor is an element of the invention that conserves power for a system of mixed power supply voltages.

In comparison to the invention, the prior-art P-type power transistor's (150) n-well and source are both tied to VDD (120) as illustrated in FIG. 1. If the PAD input voltage is above VDD, the drain diode, represented by the junction of P+ 302 and the N− WELL 306, is forward biased. If the PAD input voltage is 0.6 V or more above VDD, the diode draws current from the external device driving the PAD whereby power is consumed. Also the prior-art P-type power transistor can not source a different power supply voltage other than VDD. In the case that VDD is set to 3.3 V, the PAD can not accommodate signals that are normally driven to 5 V without considerable power consumption.

Thus the invention provides bi-directional voltage translation and low power consumption for signals input to an integrated circuit that may be greater than the desired output logic levels.

Advantages

This invention supports a bi-directional data bus that can contain various logic level signals without extra consumption of power or external components. For example the invention can support a data bus that uses both 3.3 V CMOS logic levels as well as 5 V CMOS logic levels. In the prior-art of FIG. 1 (and also in the RCA CD40116 data sheet) only single logic levels are supported. Consideration was not given to support at the same bi-directional I/O pin multiple logic level families such as 3.3 V CMOS logic levels, 5 V CMOS logic levels, and TTL logic levels. These references do not teach that the n-well and source of the P-type power transistor within an I/O buffer at a bi-directional pin (transistor 250 in FIG. 2) could be separated to support multiple logic levels and reduce power consumption.

For example assume a first peripheral CMOS part operates with a DC supply voltage of 5 V. A second peripheral CMOS part operates with a DC supply voltage of 3.3 V. The device containing the invention has the GVDD DC supply voltage set to 3.3 V. The NVDD DC supply voltage is set to 5 V. CVDD DC supply voltage is set to 3.3 V. In the case that the first peripheral CMOS device drives the data bus it attempts to output a logical one at a 5 V level. The device containing the invention allows a 5 V logical one without consuming power. However, the second peripheral CMOS device operating at 3.3 V without the invention will attempt to clamp the data bus at approximately 4 V and sink current from the first peripheral CMOS device by means of its input protection diodes. In the case that the device containing the invention is driving the data bus, a logical one will be represented by an output of 3.3 V. This properly drives the second peripheral device such that its input buffer is at its ideal value without being overdriven where its input protection diodes would turn on and sink current. The first peripheral device will consume some power because it does not have its input driven to the ideal value of 5 V. This is similar to the case that the second peripheral CMOS device is driving the data bus. Note that most 5 V CMOS components are designed to receive TTL logic levels (VIH=2.0 V, VIL=0.8 V) and thus the first peripheral device will recognize that 3.3 V represents a logical one at its input. In this manner, the device containing the invention can interface with peripheral components operating with different DC supply voltages.

PADs can be selectively grouped on the same integrated circuit to support different output voltages at different ports of the chip. For example in FIG. 5 the invention (I/O Buffer) is placed at PADs 502 through 509, 511 through 518, 520 through 527, and 529 through 537. PADs 502 through 509 have their OEN* signals tied together to OEN1* and their PDA signals tied together to PDA1. PADs 511 through 518 have their OEN* signals tied together to OEN2* and their PDA signals tied together to PDA2. PADs 520 through 527 have their OEN* signals tied together to OEN3* and their PDA signals tied together to PDA3. PADs 529 through 537 have their OEN* signals tied together to OEN4* and their PDA signals tied together to PDA4. Recall that by lowering the power supply voltage such as from 5.0 V to 3.3 V decreases power consumption by approximately forty percent. Thus, assume CVDD is set to 3.3 V to conserve power and is distributed to all transistors connected to this supply. Assume GVDD1 (520) and GVDD3 (528) are set to 3.3 V while GVDD2 (519) and GVDD4 (538) are set to 5 V. Assume that the highest system voltage is 5 V and that NVDD is set to this value and distributed to transistors connected to this supply. GVDD1 is the positive power supply voltage to each I/O Buffer at bonding PADs 502 through 509 such that their GVDD connections are tied to GVDD1. GVDD2 is the positive power supply to each I/O Buffer at bonding PADs 511 through 518 such that their GVDD connections are tied to GVDD2. GVDD3 is the positive power supply to each I/O Buffer at bonding PADs 520 through 527 such that their GVDD connections are tied to GVDD3. GVDD4 is the positive power supply to each I/O Buffer at bonding PADs 529 through 537 such that their GVDD connections are tied to GVDD4. Thus I/O Buffers at bonding PADs 511 through 518 and 529 through 537 will generate 5 V CMOS logic levels to external devices that are connected to the pins of the respective bonding PAD. I/O Buffers at bonding PADs 502 through 509 and 520 through 527 will generate 3.3 V CMOS logic levels to external devices that are connect to the pins of these respective bonding PADs. Selectively grouping bonding PADs similar to this manner allows the integrated circuit 501 to support multiple external logic levels on the same silicon die.

In the example above, enabling the input buffer and the output buffer at a group of pins that use the invention can be accomplished by an enable register 551 which can be set by software. The register contains bits that would turn on the output buffer of the respective groups of pins. The register bits represent the OEN1*, OEN2*, OEN3*, OEN4*, PDA1, PDA2, PDA3, and PDA4 enabling signals for the respective group of pins. Alternatively the output buffers or input receivers can be enabled by hardware by the use of enable input pins or by a control signal directly received from the core logic 550. The output buffer enable pins are represented by inputs received at bonding PADs OEN1*(540), OEN2* (541), OEN3* (542), and OEN4* (543) in FIG. 5. Input buffers can be hardware enabled by an input buffer enable pin as well. For example PDA2 (547) is the input buffer enable pin for PADs 511 through 518.

Figure 5:
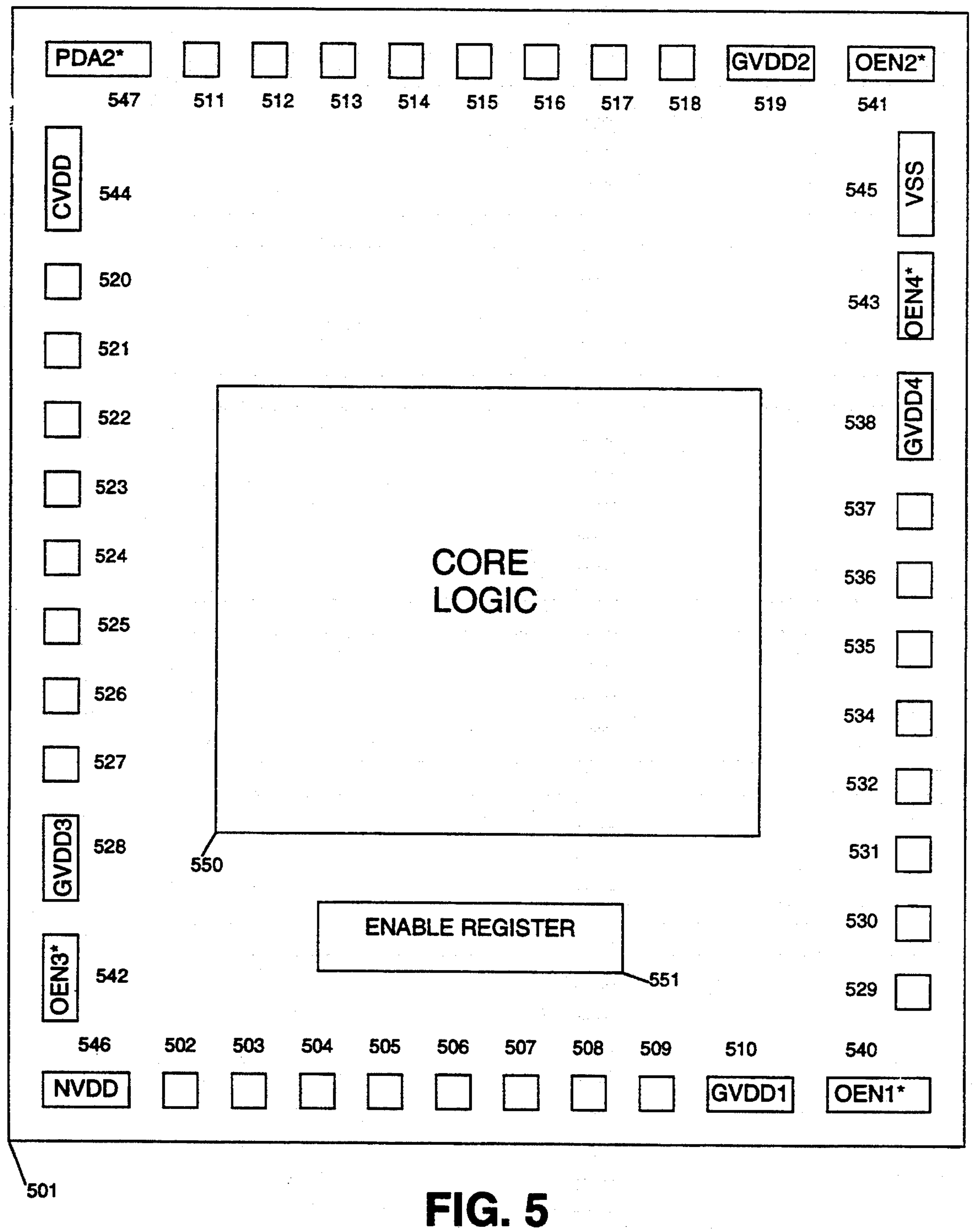
FIG. 5 illustrates an integrated circuit containing groups of the I/O Buffer as illustrated by FIG. 2 in order to support multiple voltage level outputs within the same integrated circuit.

The required DC supply voltages are also supplied to the bonding PADs in FIG. 5. The highest level of DC supply voltage NVDD is supplied at bonding PAD 546. The core logic DC supply voltage CVDD is supplied through bonding PAD 544 into the core logic 550 as well as other areas of the integrated circuit where necessary. Ground or the most negative DC supply voltage is supplied through the VSS bonding PAD 545. The output logic levels are selected for the group of I/O buffers by setting the appropriate supply voltage at GVDD1 (510), GVDD2 (519), GVDD3 (528), or GVDD4 (538) as discussed above.

Integrated circuits having the above-described I/O buffers are set forth in greater detail within Appendix A attached hereto. The integrated circuits described in Appendix A are PCMCIA host adapter circuits CL-PD6710 and CL-PD6720 available from Cirrus Logic Inc., the assignee of rights to the present application. Appendix A is a Data Sheet describing details of the CL-PD6710 and CL-PD6720 host adapters.

Multi-voltage I/O Buffer Having Multiple Selectable Input NOR Gates

Figure 8:
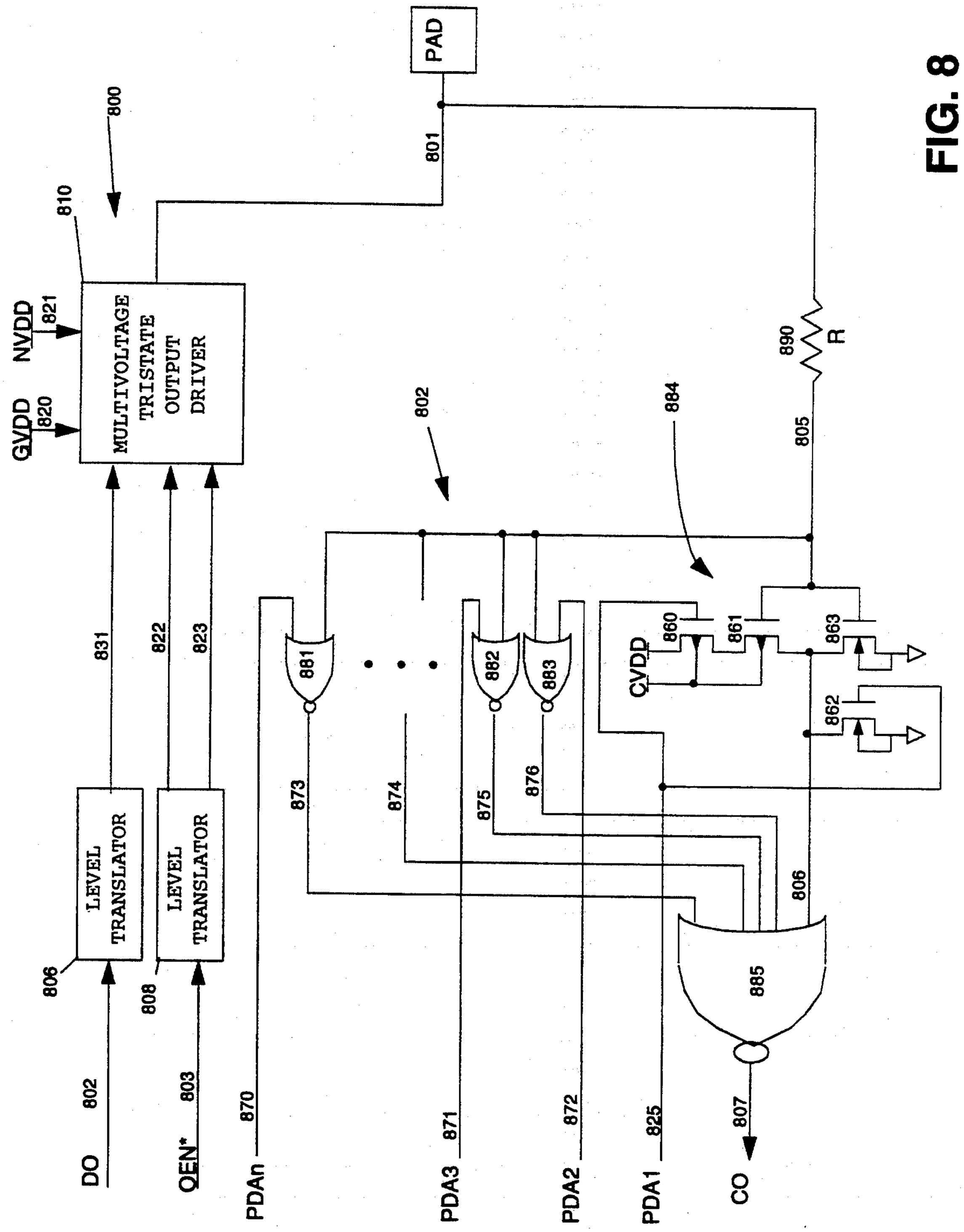
FIG. 8 is a schematic partially in block diagram form, illustrating a bi-directional I/O buffer having a set of input NOR gate receivers each having a different triggering level.
Figure 9:
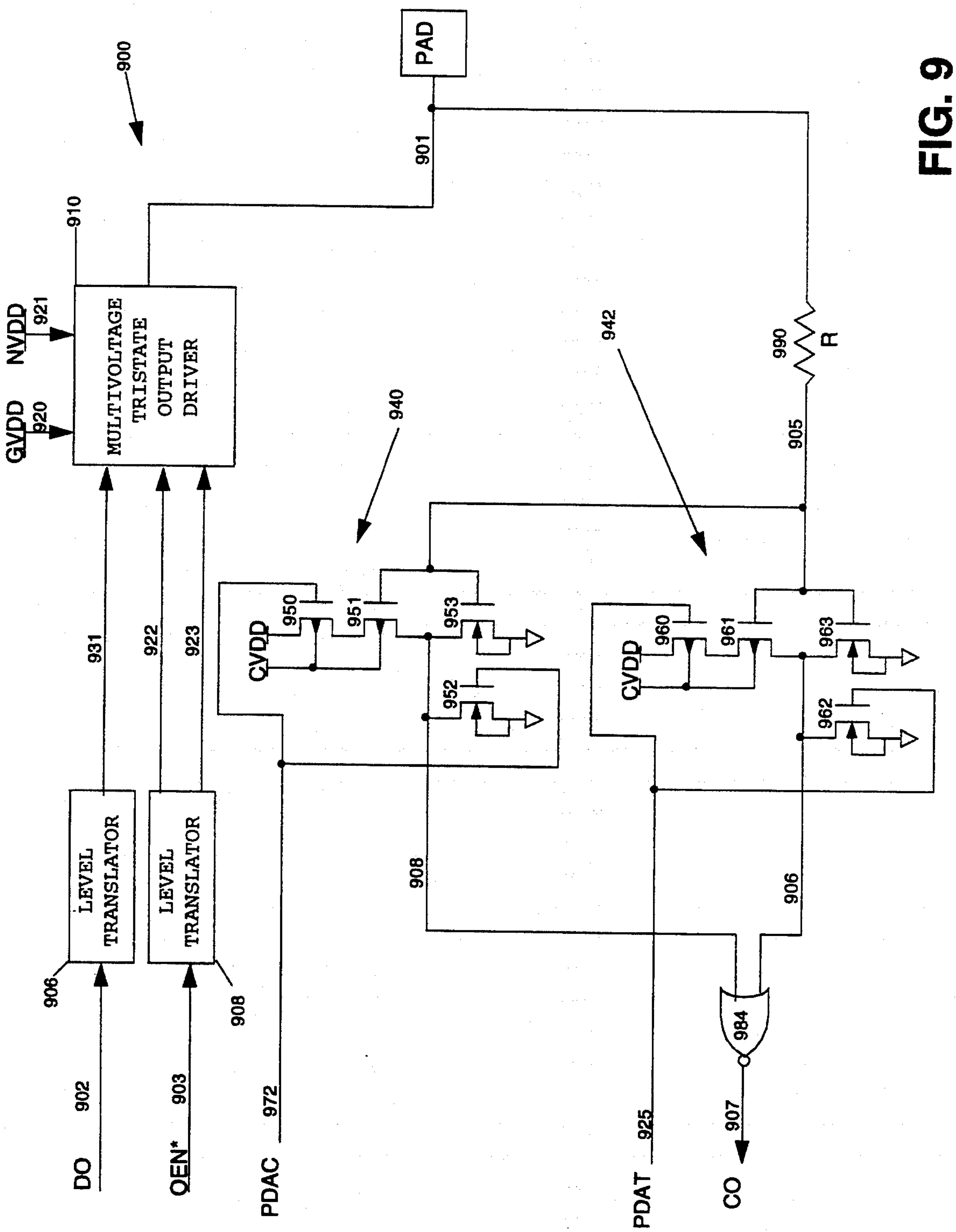
FIG. 9 is a schematic diagram, partially in block diagram form, of an alternative embodiment of the bi-directional I/O buffer of FIG. 8 having a single pair of input NOR gates.

Referring to FIGS. 8 and 9, an alternative embodiment to the multi-voltage bi-directional I/O buffer of FIGS. 2–7 will now be described. Whereas the bi-directional I/O buffer of FIGS. 2–7 includes only a single input-receiving NOR gate, the alternative embodiment of FIGS. 8 and 9 includes a set of input NOR gates connected in parallel. Triggering levels of the NOR gates are chosen to optimize input signal detection based upon, for example, the core voltage level (CVDD). For example, for an integrated circuit capable of operating either at various core voltages such as 3.3 V or 5.0 V, a pair of NOR gate receivers are provided with the triggering levels of the NOR gates optimized for receiving various input levels and either outputting the proper core voltage level signals such as 3.3 V or 5.0 V to the core. Prior to operation, the core voltage is detected, then the NOR gate having the appropriate triggering level is selected and all signals received as input are routed through the selected NOR gate.

Referring first to FIG. 8, an input buffer having an arbitrary number of NOR gates will be described. FIG. 8 illustrates a multi-voltage bi-directional I/O buffer 800 similar to the buffer described above with reference to FIGS. 2–7 but having a set of n NOR gates generally denoted 802. Individual exemplary NOR gates are identified by reference numerals 881, 882, 883 and 884. As can be seen from FIG. 8, NOR gates 802 are connected in parallel between an input line 805 and a multiple-input NOR gate 885 which has a single output line 807 connected to the core of the integrated circuit (not shown). Each NOR gate 802 has a first input connected to a respective PDA signal line and a second input connected to input line 805. In FIG. 8, NOR gate 881 represents an "nth" NOR gate receiving a PDA signal along input line 870. As the total number of NOR gates may be arbitrary, all NOR gates are not illustrated, rather a set of ellipsis are employed to denote additional NOR gates which are not shown. Also, it should be noted that, whereas NOR gates 881, 882 and 883 are illustrated symbolically with a NOR gate symbol, the internal circuit components of NOR gate 884 are set forth in detail. The circuit components of NOR gate 884 include transistor devices 860–863 which correspond to devices 260–263 described above with reference to FIG. 2 although devices 860–863 may have differing device sizes than those of FIG. 2.

The output buffer portion of the I/O buffer of FIG. 8 may be identical to the output portion of the I/O buffer of FIG. 2. For clarity, FIG. 8 illustrates the output buffer circuitry in block diagram form only. More particularly, a pair of level translators 806 and 808 are provided along input lines 802 and 803, respectively. Level translator 806 corresponds to device elements 270,271, and 266 through 269 of FIG. 2. Level translator 808 corresponds to devices 276, 277 and 272 through 275 of FIG. 2. Level translator 806 provides a single output along line 831 corresponding to line 231, whereas level translator 808 provides a pair of outputs along lines 822 and 823 corresponding to lines 222 and 223. The output buffer also includes a multi-voltage tristate output driver 810 which receives signals along lines 831, 822 and 823 and also receives GVDD and NVDD power supply signals along lines 820 and 821, respectively. Multi-voltage tristate output driver 810 corresponds to elements 250 through 259 of FIG. 2 or alternatively elements 750 through 757 of FIG. 7. A single output from multivoltage tristate output driver 810 is connected along line 801 to the I/O PAD of FIG. 8. The structure, function and operation of the output driver portion of FIG. 8 may be entirely identical to the output portion of FIG. 2 or FIG. 7 and, for brevity, no further description of the output portion is provided.

Referring to the input buffer portion of FIG. 8, as noted above, the triggering levels of NOR gates 802 are set to differing levels corresponding to, for example, different possible core voltage levels (CVDD), different silicon foundries, or different input signal levels. In other words, for the different possible core voltages, although each NOR gate is powered by the same core voltage level, for example 3.3 V, perhaps only one of the NOR gates has an input triggering level optimally set for a core voltage of 3.3 V. Other NOR gates have triggering levels optimized for other possible core voltage levels such as 5.0 V. Other NOR gates may have triggering levels optimized for the desired fabrication technologies of different foundry services that may be used. Other NOR gates may be optimized for triggering levels matched to the input signal levels. For example, the one NOR gate having the optimal triggering level for the current CVDD level is enabled by a PDA signal received along a corresponding PDA input line. If NOR gate 884 provides the optimal triggering level for a core voltage of 3.3 V, then NOR gate 884 is enabled by a signal received along line 825. None of the other NOR gates are simultaneously enabled each is individually enabled. If a different core voltage is employed such that a different NOR gate is optimal, for example NOR gate 881, then NOR gate 884 is not enabled. Rather, NOR gate 881 is enabled by a PDA enable signal received along line 870. The determination of which NOR gate is optimal is calculated by internal logic circuitry described in more detail below.

With only one NOR gate operating, an input signal received along line 805 is transmitted through only the enabled NOR gate, then inverted by multiple-input NOR gate 885. For example, if only NOR gate 883 is enabled, then an input signal is transmitted only through NOR gate 883 with the remaining NOR gates providing no output signal. NOR gate 883 toggles between high and low output signals based upon the level of input signal. Hence, NOR gate 883 outputs a signal along line 876 which is representative of the input signal, but inverted. NOR gate 885 re-inverts the signal producing a binary output signal along line 807 having high and low values optimally adjusted to match the core voltage of the integrated circuit.

FIG. 9 illustrates an embodiment having only a single pair of receiver NOR gates connected in parallel. The I/O buffer of FIG. 9 includes two NOR gate receivers 940 and 942 within the input portion of the buffer. NOR gates 940 and 942 are connected in parallel along an input line 905 between an input PAD and a multiple-input NOR gate 984. As only two NOR gates are provided in parallel, multiple-input NOR gate 984 receives only two inputs. FIG. 9 also illustrates an output portion in block diagram form which may be similar to the output portion of FIGS. 2–7. In FIG. 9, the output buffer portion 900 is represented by elements 901–903, 906, 908, 910, 920–923 and 931.

NOR gate 940 includes individual transistor elements 950–953. NOR gate 942 includes individual transistor elements 960–963. The transistor elements of NOR gates 940 and 942 function in the same manner as the corresponding NOR gates described above with reference to FIGS. 2–7, with the exception that the input triggering levels of NOR gates 940 and 942 are preferably set to different levels for optimizing the detection of input signals based upon a value of the core voltage CVDD.

NOR gate 940 receives a input signal PDAC along line 972. NOR gate 942 receives a input signal PDAT along line 925. The PDAC signal is set to an active state by internal logic circuitry (not shown), if the core voltage CVDD is a low voltage such as 3.3 V CMOS and signals are to be received by the input. PDAC is set to an inactive state otherwise. The PDAT signal is set to an active state, if the core voltage CVDD is a high voltage level such as 5.0 V and signals are to be received by the input. PDAT is set to an inactive state otherwise. In this manner, input signals received along input line 905 are transmitted either through NOR gate 942 or NOR gate 940, but not both. NOR 984 therefore receives a signal along either line 908 or line 906 for ultimate output to the core of the integrated circuit device along line 907. In cases where no signals are to be received both PDAT 925 and PDAC 972 are set to inactive states. Lines 908 and 906 are set to static levels so that power consumption is minimized in NOR gates 940, 942 and 984. Any noise sources at the PAD along lines 901 and 905 are ignored. Only when PDAC or PDAT is set to an active state will signals be received.

To provide for optimal translation of the input signals to the appropriate voltage CVDD, a triggering level of NOR gate 940 is set to about 50% of CVDD which is 1.65 volts for a CVDD of 3.3 volts. Whereas the triggering level of NOR gate 942 is set to the midpoint of the expected 5 V TTL input levels which is about 1.4 volts. Hence, if the core voltage is 3.3 V, then input signals are received through NOR gate 940 with an appropriate triggering level of 1.65 V. If the core voltage CVDD is 5.0 V, then input signals are received along line 942 with an appropriate triggering level of 1.4 V.

It should be noted that both NOR gates are capable of receiving input signals which are either 5.0 V based signals or 3.3 V based signals. In other words, the selection of the appropriate NOR gate 942 or 940 in FIG. 9 may be made based on the voltage level of the core voltage and not upon the voltage levels of the input signals. It should also be noted that one could provide a single NOR gate for receiving the input signals, as illustrated above in FIGS. 2–7, with the triggering voltage of a single NOR gate set to an average level, such as 1.5 V when operating at a core voltage of 3.3 V. However, such would not provide for an optimal triggering voltage corresponding to the voltage level of the core voltage nor would it optimally lower the consumption of power. Also if the core voltage were to change to 5 V the single NOR gate triggering level would move from the ideal level of 1.5 V. Thus, it is preferred that for different core voltages additional NOR gates be provided taylored to the appropriate core voltage and input signals to be received.

The triggering levels of NOR gates 940 and 942 are set by fabricating the component devices of the NOR gates to have appropriate device sizes. The method by which a NOR gate may be designed or fabricated to have a specific triggering level may be achieved in accordance with conventional techniques and such techniques will not be described in detail herein.

Thus, in the embodiment of FIG. 9, an input receiving NOR gate is selected based upon the voltage level of the core voltage CVDD. In use, a determination of the appropriate NOR gate is made using internal logic circuitry within the integrated circuit (not shown). For example, the integrated circuit itself or a separate device such as a host microprocessor may include some means for detecting an optimal operational core voltage. Thereafter, the integrated circuit is controlled to operate at the optimal core voltage. Input storage registers may maintain information identifying which NOR gate is appropriate for use based on the level of the core voltage. Internal circuitry then queries the storage registers to determine which NOR gate is appropriate and sends an enabling signal along an appropriate PDA line to activate the selected NOR gate.

A specific example of an integrated circuit having the above-described multiple NOR gate input buffer is set forth in Appendix A. The function and operation of the integrated circuits of Appendix A are best understood with reference also to Appendix B "A Notebook Motherboard PCMCIA Host Adapter Solution", Appendix C, "PCMCIA Card Specifications" and Appendix D, "Host Adapter VHDL".

A preferred method for detecting the core voltage to allow for enabling an optimal input receiving NOR gate can be found therein with reference to an integrated circuit adapted for controlling a PCMCIA peripheral card. In practice, the choice of the core operating voltage for the integrated circuit having the I/O buffer of FIGS. 8–9 is made by a system designer during design of a computer system incorporating the integrated circuit. A 'Misc. Control' register bit, described on page 51 of Appendix A, stores a binary value indicating whether the core voltage is 3.3 V or 5.0 V. Upon power-up, the control register bit is set to indicate the installation voltage value. This may be achieved by providing a signal from a preprogrammed external device such as a PROM indicating whether the bit of the control register is to be set to indicate 3.3 V or 5.0 V. Thereafter, internal circuits within the integrated circuit read the value within the register and transmit an appropriate signal along one of the aforementioned PDA lines.

It should be noted that the triggering levels of the NOR gates need not be set solely based upon the core voltage level. Other parameters may be employed for selecting an appropriate triggering level. For example, triggering levels may be optimized for receiving various input signals or for particular fabrication methodologies. The particular NOR gate can be taylored for the input levels that would be received. For example future input levels may switch from zero to two volts with a input triggering point of one volt. In this case the NOR gate can be designed for the particular core voltage and an input triggering point (input switching threshold) of one volt. Alternatively a single integrated circuit may be desired to be manufactured by more than one silicon foundry. As can be appreciated by those skilled in the art, the actual switching levels for transistors may vary somewhat depending upon the methods by which the transistors are fabricated and the component materials employed. As such, triggering levels for the input-receiving NOR gates may be set to optimize signal reception for any of a variety of fabrication methodologies. Thus, if the integrated circuit may be fabricated using one of two fabrication methodologies, four input receiving NOR gates may be employed with one pair having a triggering level optimized for the first fabrication methodology and the second pair having a triggering level set for the second fabrication methodology. Of course, once the integrated circuit is actually fabricated, all signals for that circuit should be received through the appropriate NOR gates corresponding to the fabrication and fabrication transistor design parameters.

What has been described in the foregoing section is an improvement to the I/O buffers of FIGS. 2–7 wherein a set of two or more input-receiving NOR gates are provided with the triggering levels of the NOR gates optimized to particular operating conditions. It should be obvious to one of ordinary skill in the art that the input receiveing NOR gates or FIGS. 8–14 may be change to input receiving NAND gates with any associated logic changes to the control signals. In the following, a system-level embodiment of the invention will now be described, wherein an integrated circuit having a bi-directional multi-voltage I/O buffer is employed as a host adapter (also referred to as card controller) for interfacing between a host computer microprocessor and a removable peripheral card, such as a PCMCIA card.

PCMCIA Host Adapter Having a Multi-voltage Power Control System

Figure 10:
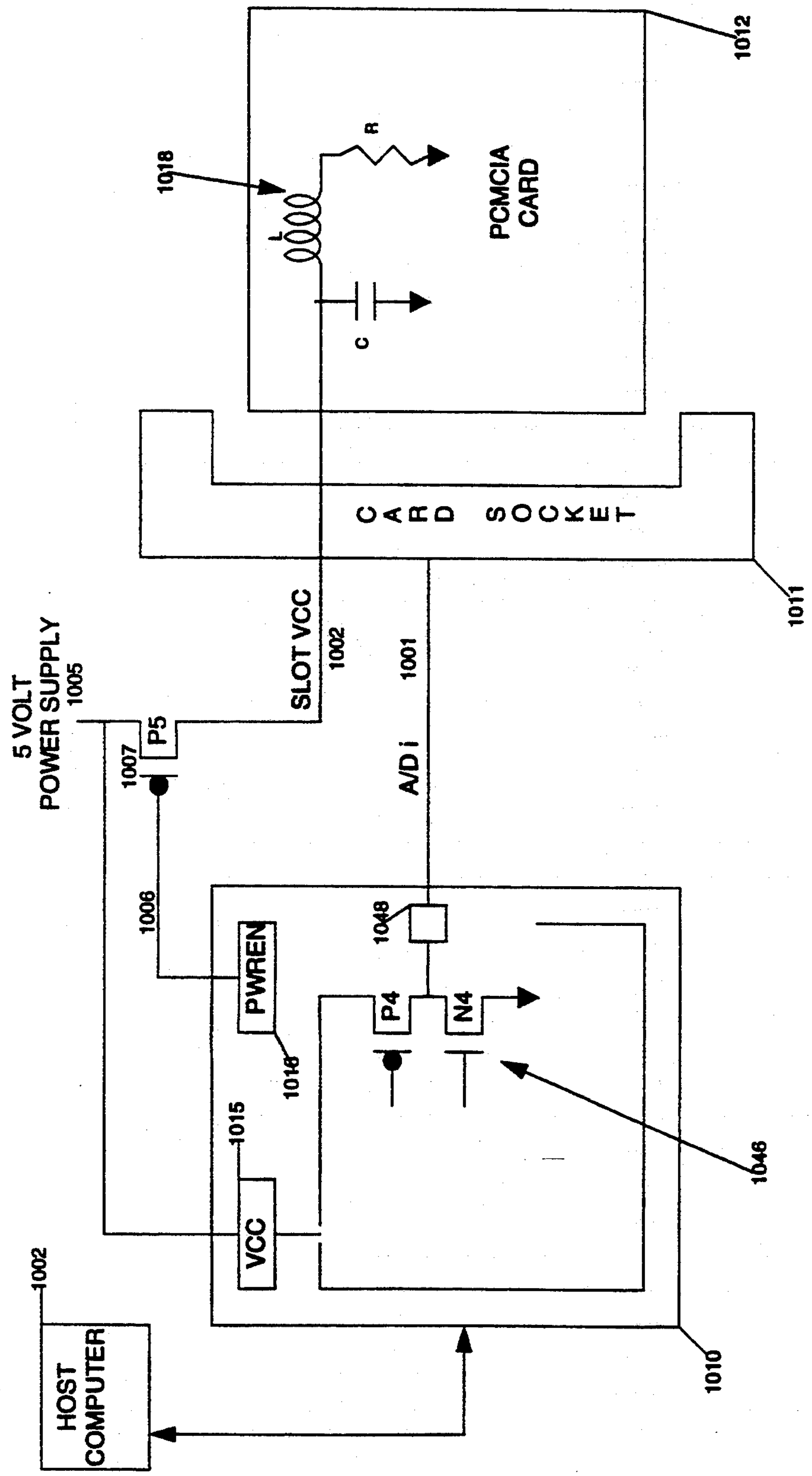
FIG. 10 is a block diagram illustrating a prior art host adapter for controlling and providing power to a PCMCIA card.

Referring to FIGS. 10–14, a host adapter, also referred to as card controller, for controlling a PCMCIA card or other plug-in integrated circuit device will now be described. Referring first to FIG. 10, a prior art host adapter will be described and certain disadvantages summarized.

FIG. 10 illustrates a host adapter system having a card controller 1010 for interfacing between a host computer 1002 and a PCMCIA card 1012. PCMCIA card 1012 is a removable card received within a card socket device 1011. The card socket supports the PCMCIA card and provides for direct electrical interconnection between the removable PCMCIA card and fixed components of the host adapter system including card controller 1010. An address/data bus 1001 interconnects card controller 1010 and PCMCIA card 1012 through card socket 1011. Power is provided to PCMCIA card 1012 through the card socket from a 5 V power supply line 1005. As only a 5 V power supply is provided, the host adapter 1010 of FIG. 10 is capable of controlling only PCMCIA cards which operate with 5.0 V interfaces. The internal voltage of the circuitry may operate at the same or different voltages from the interface voltage.

Upon insertion of the PCMCIA card it is desirable to the power up the card. Hot insertion is to be avoided in order to protect the components within the PCMCIA card from ESD, Latch-Up or other problems including data loss. While the power supply is disabled the I/O and Command signals to the PCMCIA are disabled as well. The supply of 5 V power to the PCMCIA card is controlled by controller 1010 in connection with a P-type transistor 1007 (P5). A power enable signal line interconnects a gate of transistor 1007 and a power enable output PAD 1016 (PWREN) within card controller 1010. To initiate flow of power to PCMCIA card 1012, an enable signal is asserted onto line 1006 which turns on transistor 1007. Power flows through transistor 1007 to the PCMCIA card along a slot voltage line 1002. Due to an internal impedance within PCMCIA card 1012, represented by circuit 1018, the voltage level of power supplied to the PCMCIA card does not increase instantaneously. Rather, the voltage increases gradually over, typically, a short period of time.

Card controller 1010 includes a plurality of I/O buffers in order to interface to the card. A portion of one I/O buffer is illustrated by output driver 1046 connected to data bus 1001 through I/O pad 1048. The output driver 1046 includes a pair of P-type and N-type transistors, P4 and N4, respectively. The transistors are connected in series between a 5 volt voltage source at VCC PAD 1015 and a ground. The level of VCC may vary from 5 volts, however this causes the entire integrated circuit voltage to vary such that all interfaces are required to operate at that voltage. It is desirable to have a single interface whose power supply voltages can vary independently of the other circuits and interfaces. Gates of the transistors P4 and N4 are employed to modulate and drive signals onto bus line 1001 through I/O PAD 1048. With no card inserted the output driver 1046 is tristated to disable signal transitions on data bus 1001. Once the card 1012 is inserted power may be supplied to the card as previously described. Then the I/O buffer 1046 can be enabled to communicate with the card 1012. While the hot insertion of the card has been avoided the enabling of the I/O buffer may cause the ESD, Latch-Up or other problems including data loss that one was trying to avoid. There is a mismatch between the time for which the PCMCIA becomes powered on and the time for which the I/O buffer becomes enabled. The impedance of the power supply is typically greater than the impedance of the I/O bus line. Thus the voltage of data signals provided along line 1001 may be substantially instantaneously at 5 V before there is proper power supplied to the card. While inherent circuit delays may aid in reducing this problem for one card, it may not be sufficient for all the various cards that may be inserted.

Further with regards to FIG. 10, it can be readily appreciated that the system of FIG. 10 is capable of providing only power at a single voltage and thereby lacks an ability to control a PCMCIA card requiring a different voltage level. Moreover, certain PCMCIA cards may operate in different modes at different voltages. For example, a hard disk drive card may require one voltage level during actual spin operation of the disk, and a lower voltage level when the disk is not spinning. As another example, a fax/modem card may require one voltage when operating at a BAUD rate of 2400 but may require a higher voltage when operating at a higher BAUD rate, for example 9600 BAUD. The system of FIG. 10 does not allow the power transmitted to the PCMCIA card to be selectively varied to minimize power usage with appropriate use of the enable voltage signals.

Referring now to FIGS. 11–14, preferred embodiments of a host adapter which overcome the disadvantages of the prior art host adapter of FIG. 10 will now be described.

Figure 11:
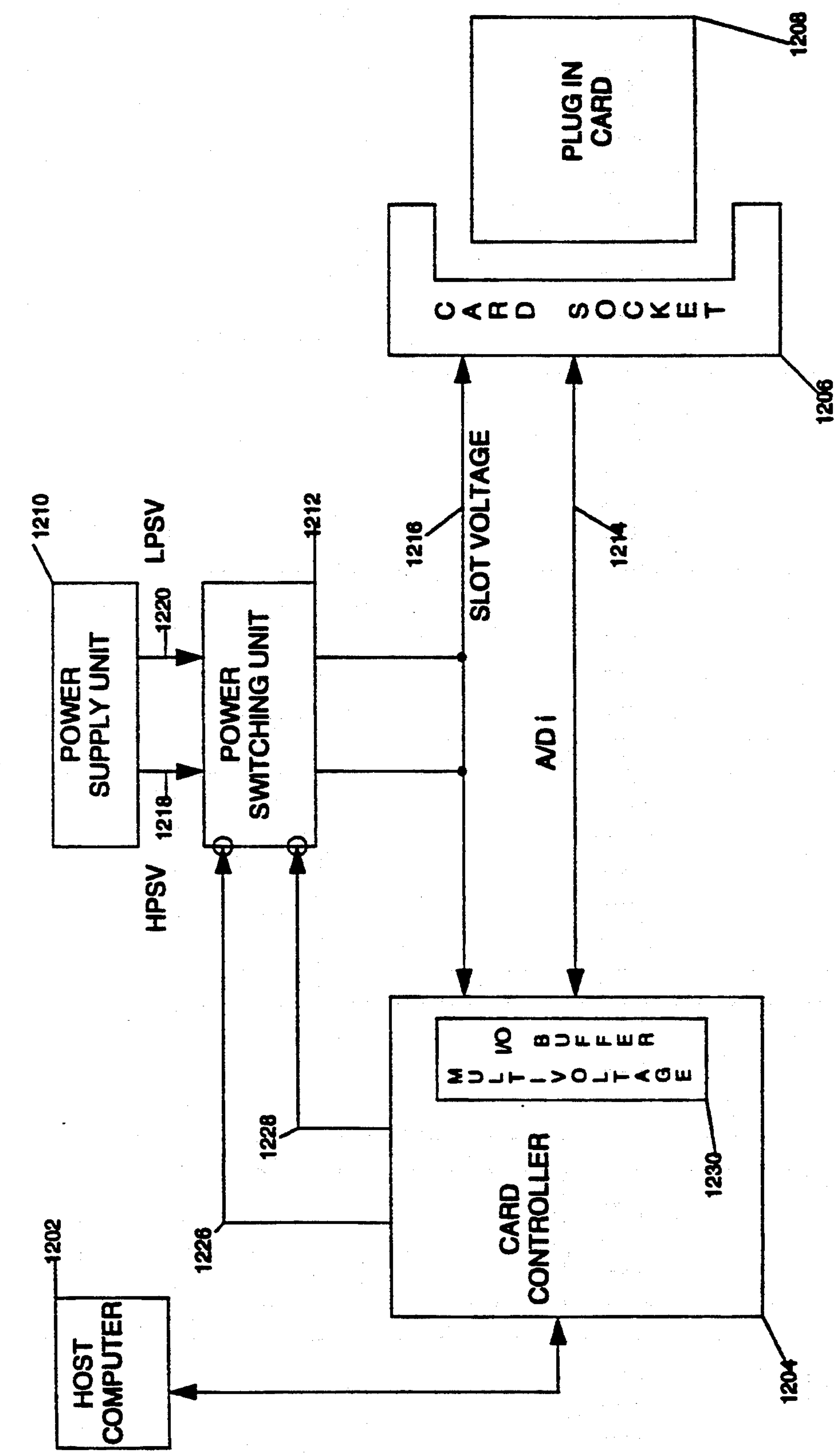
FIG. 11 is a block diagram illustrating a preferred embodiment of the invented system for controlling and providing power to a plug-in card such as a PCMCIA card.

Referring first to FIG. 11, a portion of a host adapter capable of receiving a type of plug-in card is illustrated in block diagram form. The host adapter includes a host computer 1202, a card controller 1204, a card socket 1206 and a removable PCMCIA card 1208. Also illustrated is a power supply device 1210 and power switching device 1212. Preferably the card controller 1204 is a PCMCIA card controller, plug-in card 1208 is a PCMCIA card, and host computer 1202 is a microprocessor. It should be obvious to one of ordinary skill in the art that the host adapter of the present invention can be applicable to other types of plug-in or insertable cards and circuits such as ISA, EISA, PCI, or VESA Local Bus interfacing cards.

Card controller 1204 provides an interface between host microprocessor 1202 and PCMCIA card 1208. PCMCIA card 1208 may be any type of integrated circuit card conforming to PCMCIA specifications. (As noted above, relevant portions of the PCMCIA specifications are provided in Appendix C.) PCMCIA card 1208 may be a fax/modem card, a hard drive card or any of a wide variety of other peripheral cards.

In use, control signals are transmitted from host microprocessor 1202 into card controller 1204 which in turn transmits signals to PCMCIA card 1208 for controlling or accessing the card. For example, if PCMCIA card 1208 is a hard disk drive card, then host microprocessor 1202 may access data within card 1208 by transmitting appropriate control signals to card controller 1204, which in turn routes those signals into the hard disk drive card where data is accessed. Once accessed, the data is returned from PCMCIA card 1208 through card socket 1206 into card controller 1204 for transmission to microprocessor 1202.

Data, addresses and control signals are transmitted between card controller 1204 and PCMCIA card 1208 along a bus line 1214. For brevity, bus line 1214 will hereinafter be referred to as a data bus line although it should be understood that bus line may additionally transmit control signals, as well as data and addresses. Power control unit 1210 provides power simultaneously at both a low power supply voltage and a high power supply voltage along power lines LPSV 1220 and HPSV 1218, respectively. Preferably the low power supply voltage is around 3.3 volts and the high power supply voltage is around 5.0 volts. Power may initially be received by power control unit 1210 from a rechargeable battery (not shown) but could also be some other DC or AC source wherein the power control unit 1210 would provide the proper conversions. Power supply unit 1210 provides power through power switching unit 1212 to card socket 1206 and ultimately to PCMCIA card 1208 at a voltage level appropriate for operation of the PCMCIA card.

The voltage level of the power supplied to the PCMCIA card is selected by power switching unit 1212 under the control of card controller 1204. Since PCMCIA cards are removable and can be replaced by a second card that may be operating at different voltages, controller 1204 controls switching device 1212 to transmit power from either HPSV line 1218 or LPSV line 1220 to thereby provide power to the PCMCIA card at a suitable or optimal voltage level. For example, if PCMCIA card 1208 is a plug-in ROM card, it may operate at low power supply voltages. Therefore, power switching unit 1212 is controlled to transmit power to the PCMCIA card at a low voltage from LPSV line 1220. However, if the PCMCIA card is a hard disk drive card which requires a high voltage power level, then power switching unit 1212 is controlled to transmit power to the PCMCIA card from HPSV line 1218. Power from lines 1218 or 1220 is received by PCMCIA card 1208 through card socket 1206 along a slot voltage line 1216 connected to power switching unit 1212.

In use, card controller 1204 initially determines the voltage level required by the PCMCIA card. A determination of the proper voltage for PCMCIA card 1208 is made by card controller 1204 in accordance with conventional PCMCIA techniques which will be described in more detail below. Once the correct voltage level is determined, card controller 1204 transmits a power enable signal to power switching unit 1212 along either the enable high power supply line 1226 or the enable low power supply line 1228 which causes switching unit 1212 to connect the appropriate power supply line to slot voltage line 1216. Switching unit 1212 prevents power from being transmitted onto slot voltage line 1216 until the appropriate enable signals have been received.

To allow for the proper voltage level to be selected, the card controller is preferably provided with internal circuitry capable of detecting the power supply voltage required by the PCMCIA card. For the example of the hard disk drive card, the card controller is provided with circuitry capable of determining the operational mode of the PCMCIA card. Thereafter, the card controller device transmits appropriate voltage enable signals to the power control device to select for the appropriate voltage. The foregoing is particularly advantageous in the systems such as laptop or notebook computers, wherein power usage must be minimized to the greatest extent possible. For PCMCIA cards, the initial interface voltage requirements to read the Card Information Structure ("CIS") are detected using VS1 and VS2 pins described in the update to the PCMCIA Spec. in Appendix A. These pins use a combination of pull-up or pull-down resistors to establish the initial read voltage for the PCMCIA card. The "tuple" register is then read to determine what operating voltages and interface voltages that the PCMCIA card may function with under various conditions. This information may be provided to the host computer of the system in order to determine the optimum operating characteristices for the overall system. For PCMCIA cards lacking the VS1 and VS2 pins, the "tuple" register within the PCMCIA card is accessed with a nominal voltage such as 5 V to determine the appropriate voltages that the PCMCIA card may function with as well as what voltages the PCMCIA card will interface with. The "tuple" registers are described in Card Metaformat Section of the PCMCIA Spec. at page 5–24. Circuitry within the card controller for generating an appropriate power enable signal is described by the use of VHDL (VLSI Hardware Description Language) in Appendix D.

The internal core circuitry of card controller 1204 may or may not receive power from power control unit 1210. Preferably the internal core circuitry is powered from a low voltage source such as 3.3 volts however it may also be powered from a high voltage source such as 5.0 volts. Thus the PCMCIA card may operate its interface at a voltage of 3.3 V, while portions of the card controller may operate at a voltage of 5.0 V. Card controller 1204 therefore includes a multi-voltage bi-directional I/O buffer such as described above with reference to FIGS. 2–9 for translating input and output signals from one voltage level to another to allow communications between a 5.0 V card controller and a 3.3 V PCMCIA card. However, even if provided with appropriate multi-voltage translation circuitry, the power mismatch problem described above with reference to FIG. 10 could occur. The system of FIG. 11 avoids this and other problems, by providing power switching device 1212 in combination with the control logic internal to card controller 1204 generating the power control signals 1226 and 1228 and the appropriate connections for the multivoltage I/O buffer 1230.

More specifically, power output from switching device 1212 provided onto slot voltage line 1216 and is received both by card socket 1206 and by an input pin on card controller 1204. As will be described more fully below, multivoltage I/O buffer 1230 is connected to receive power from slot voltage line 1216 such that data cannot be transmitted onto bus line 1214 until power is supplied along slot voltage line 1216. This prevents the aforementioned problem wherein data signals may be provided by the card controller 1204 along the data bus line 1214 before sufficient power is provided to the PCMCIA plug-in card 1208 along the slot voltage line 1216. Moreover, by powering multivoltage I/O buffer 1230 with power from slot voltage line 1216, the voltage level of signals transmitted along bus line 1214 match the voltage of power provided to the PCMCIA card along slot voltage line 1216.

Figure 12:
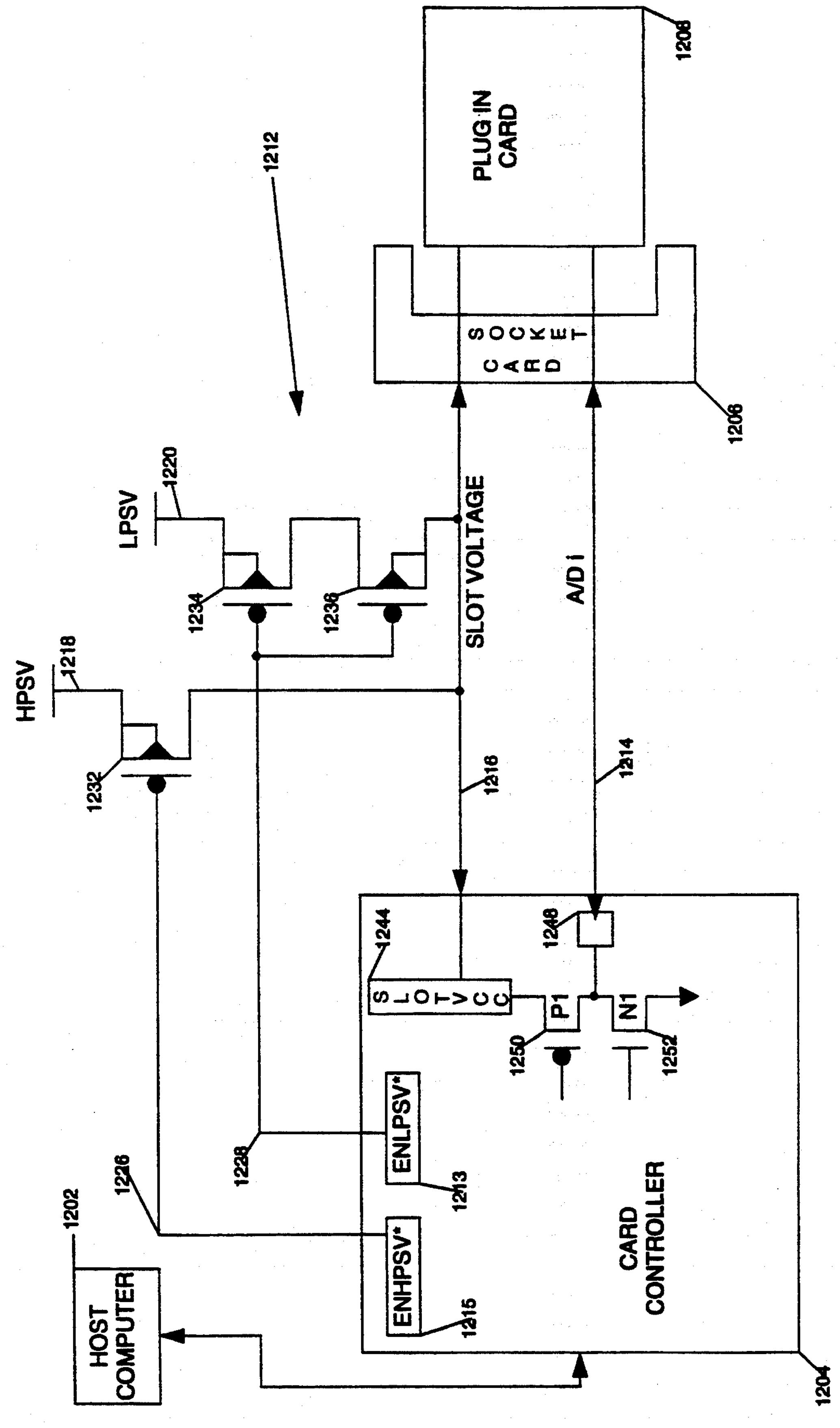
FIG. 12 is a block diagram, partly in schematic form illustrating the power distribution system for a system having a plug-in card connected to a card controller such as that illustrated by the block diagram of FIG. 11.
Figure 13:
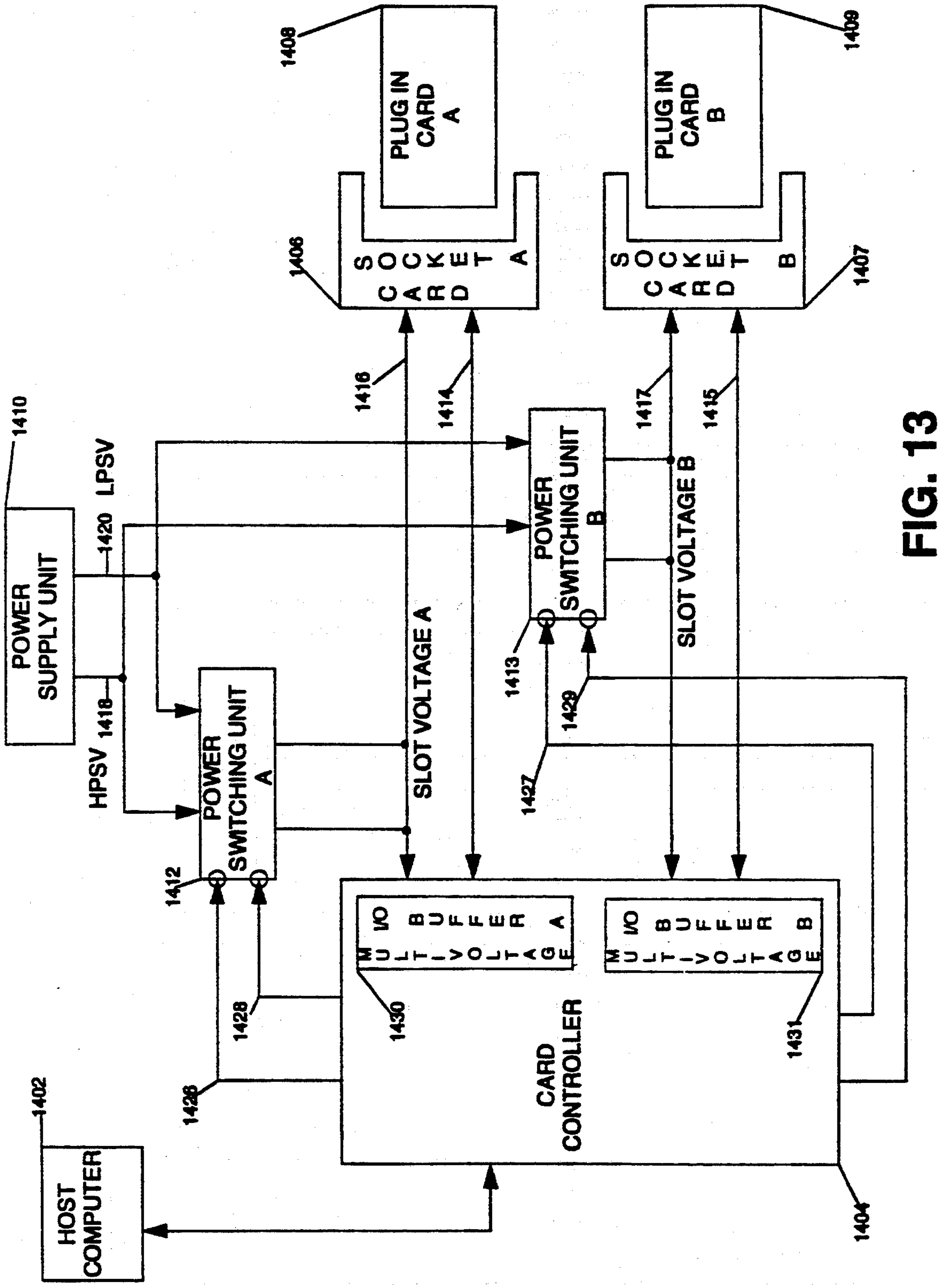
FIG. 13 is a block diagram illustrating two plug-in cards, such as PCMCIA cards, being controlled by the card controller.
Figure 14:
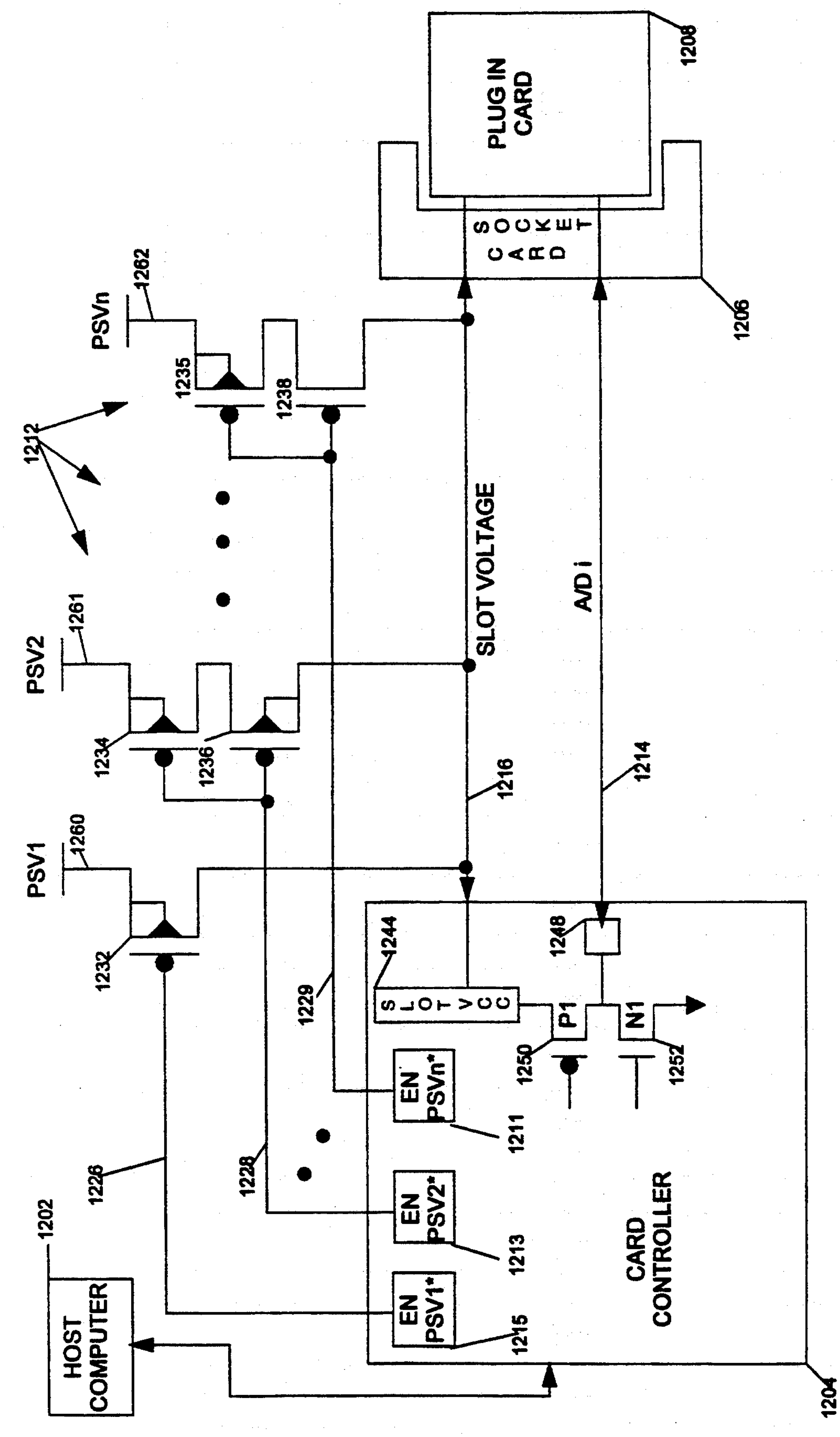
FIG. 14 is a block diagram, partly in schematic form, illustrating an alternate embodiment of the power distribution system for a system having a plug-in card connected to a card controller.

These features are more fully illustrated in FIG. 12 and FIG. 14 which illustrate a portion of the system of FIG. 11. In particular, FIG. 12 and FIG. 14 illustrates certain internal components of card controller 1204 and switching unit 1212. FIG. 14 illustrates an alternate embodiment of FIG. 12 wherein multiple supply voltages PSV1, PSV2, through PSVn are supplied to a plug-in card. Power supply voltage PSV1 1260 is illustrated as being the highest level of power supply voltage, such as 5.0 V. Multiple transistor elements, indicated by the ellipses, are employed to switch the multiple levels of power supply voltages to the slot voltage line 1216. The nth power supply voltage PSVn is switched onto the slot voltage 1216 by transistors elements 1235 and 1238. Only one power supply voltage PSV at a time is switched onto slot voltage line 1216. In the case where no plug-in card is inserted into the card socket 1206 or where no transactions or activity is occuring with the plug-in card, all power supply voltages PSV may be disconnected from the slot voltage line thereby powering down the plug-in card and the multivoltage I/O buffer 1230. Other operating characteristics of FIG. 14 will be readily apparent from the discusion below with reference to FIGS. 11–13.

Switching unit 1212 of FIG. 12 preferably includes three P-type transistors, denoted 1232, 1234, and 1236. Transistor 1232 is provided along HPSV line 1218. Transistors 1234 and 1236 are provided in series along LPSV line 1220. The gate of transistor 1232 is connected to the enable high power supply voltage line 1226 whereas gates of both transistors 1234 and 1236 are connected to enable low power supply voltage line 1228. As can be seen, transistor 1232 is turned ON only if an enable signal is received along line 1226, thereby activating the flow of power along the HPSV line 1218 to slot voltage line 1216. Likewise, transistors 1234 and 1236 are turned ON only if the enable signal is received along enable low power supply voltage line 1228. Thus, power is only provided to slot voltage line 1216 along LPSV line 1220 if the enable low power supply voltage signal is received by data switching unit 1212. It should be noted how the transistor components of power switching unit 1212 are oriented. In particular transistor 1236 is oriented so that when slot voltage line is greater than the voltage level for LPSV line 1220 the instrinsic diodes within the mosfet transistors keep any excess reverse leakage from occuring. The difference between HPSV and LPSV may cause excess reverse leakage for the case where transistor 1234 is properly turned OFF or if the voltage applied to the gates of transistors 1234 and 1236 is different than the LPSV level the transistors would be turned ON allowing the current to flow. Transistor 1234 is oriented so that when both power enable lines 1215 and 1213 are disabled and slot voltage line 1216 is near zero the LPSV 1220 does not leak current through to the slot voltage line 1216. Thus the configuration of the transistor components is such that power consumption is minimized. It should be obvious to one of skill in the art that the positions of transistor components 1234 and 1236 may be swicthed so that the sources of the transistors are connected together and still maintain the low power consumption.

Thus, power is received along slot voltage line 1216 from the HPSV or the LPSV power supply depending upon the enable signals provided by card controller 1204. Slot voltage line 1216 is connected to a SLOT VCC PAD 1244 within card controller 1204. SLOT VCC PAD 1244 is itself connected to a p-channel type transistor of the multivoltage I/O buffer 1230 which drives address, data or control signals onto data bus 1214 through I/O PAD 1248.

Multivoltage I/O buffer 1230 is the block representation of FIG. 2. Alternatively Multivoltage I/O buffer represents the schematics of FIG. 6 through FIG. 9. Preferably the Multivoltage I/O buffer 1230 represents FIG. 9. The output portion of multivoltage I/O buffer 1230 is represented by level translators 906 and 908 and the multivoltage tristate output driver 910 of FIG. 9. Referring to FIG. 2, the output portion of 1230 is represented by the transistors 250–259, 266–271, and 272–277. The input portion of 1230 is preferably represented by transistors 950–953, 960–963, and NOR gate 984 of FIG. 9. Thus P-type transistor 1250 of FIG. 12 corresponds to P-type transistor 250 of FIG. 2, or P-type transistor 650 of FIG. 6, or P-type transistor 750 of FIG. 7. The N-type transistor 1252 of FIG. 12 corresponds to N-type transistor 251 of FIG. 2, or N-type transistor 651 of FIG. 6 or N-type transistor 751 of FIG. 7. Transistors 1250 and 1252 are illustrated to show the proper connection of the final output transistors of FIGS. 2–7 of the multivoltage I/O buffer. Thus the multivoltage I/O buffer 1230 includes P-type transistor 1250 and an N-type transistor 1252 connected in series between PAD 1244 and a ground. The gates of transistors 1250 and 1252 are connected to other transistors internal to the multivoltage I/O buffer which is then connected to the internal logic of the card controller 1204 for modulating signals onto data line 1214. With the configuration illustrated, data line 1214 is disabled unless a voltage is received along slot voltage line 1216 through PAD 1244. In other words, without power along the slot voltage line 1216, P-type transistor 1250 of the multivoltage I/O buffer 1230 is inactive regardless of signal levels received at the gate of transistor 1250. Hence, data signals cannot be transmitted along line 1214 until power has been supplied to line 1216. The aforementioned circuit configuration ensures that the voltage of signals provided along data line 1214 matches the voltage of power along line 1216. As power gradually rises along voltage along line 1216, the voltage level of signals transmitted along data line 1214 also gradually rises. In this manner, the voltage of data signals gracefully matches the instantaneous voltage of the power provided along slot voltage line 1216. As noted above, this is particularly important in the event the PCMCIA card includes a significant internal impedance preventing input power from being instantaneously transmitted into the PCMCIA card.

It should be noted that a power supply unit 1210, such as that illustrated in FIG. 11, is not necessarily required. Rather, by providing the switching elements of power switching unit 1212, lines 1218 and 1220 may be connected directly to a source of HPSV and LPSV. Power switching unit 1212 provides the minimal switching logic necessary for controlling the power along lines 1218 and lines 1220. A dedicated power control device is preferred since such provides power at both a low power supply voltage such as 3.3 and a high power supply voltage such as 5.0 volts from a battery having a nominal voltage greater than 5 volts. Furthermore, depending upon power supply unit 1210 used, sometimes referred to as power controller device, power switching unit 1212 may not be required. Rather, the power supply unit 1210 may itself provide the necessary switching before outputting a voltage in response to a voltage enable signal while also providing the short circuit protection afforded by the diodes of the power switching unit 1212. Furthermore, even where both a power supply unit and a power switching unit are employed, it may be desirable to connect the power enable lines 1216 and 1228 into power supply unit 10 as well as into power switching unit 1212. Whether such can or should be provided depends upon the particular power supply unit employed. A suitable power supply unit is the MAX 782 power controller provided by MAXIM corporation of Sunnyvale, Calif.

FIG. 13 illustrates an alternative embodiment to the systems of FIGS. 11–12 wherein a single card controller 1404 is provided which is capable of simultaneously controlling two separate plug-in cards 1408 and 1409. Preferably plug-in cards A and B, 1408 and 1409, are a type of PCMCIA card. As can be seen from FIG. 13, two sockets 1406 and 1407 are provided along with two power switching units 1412 and 1413. However, card controller 1404 includes twice the number of input and output PADs, as well as appropriate internal circuitry for controlling two PCMCIA cards simultaneously. In particular controller 1404 includes two multivoltage I/O buffers 1430 and 1431, each interconnected to separate slot voltage and data bus lines. In FIG. 13, the duplicate elements are referred to as "A" elements or "B" elements. As can be seen, each set of A elements and each set of B elements correspond to the single set of elements illustrated in FIGS. 11–12. As these elements function in the same manner as corresponding elements of FIGS. 11–12, a description of the function and operation will not be repeated. It should be noted, however, that a single power supply unit 1410 is employed, rather than a pair of power supplies. If desired, two power supply units could alternatively be employed.

Although a variety of PCMCIA card controller devices may be employed as the card controller of the embodiments of FIGS. 11–13, a Cirrus Logic CL-PD6710 or PD6720 card controller is preferably employed. The PD6710 provides for control of a single PCMCIA card as illustrated in FIGS. 11–12, whereas the PD6720 provides for simultaneously controlling two PCMCIA cards as set forth in FIG. 13. Details of the function and operation of the Cirrus Logic cards are provided in the attached appendices A–D and such details will, for brevity, not be repeated herein.

Although primarily described with reference to PCMCIA cards, those skilled in the art will readily appreciate that principles of the invention can be exploited in a wide variety of multi-voltage environments.

In general, the invention can be advantageously exploited in any system having two or more integrated circuits which possibly operate at differing voltages. Other advantages of the invention will be apparent to those skilled in the art. While a preferred embodiment of the present invention has been disclosed and described in detail herein, it will be obvious to those skilled in the art that various changes in form and detail may be made therein without departing from the spirit and scope thereof.

Appendix A

Method and Apparatus for Controlling a Mixed Voltage Interface in a Multivoltage System

Docket No.: 14295.P030X

CD-PD6710/PD672X
PCMCIA Host Adaptors

PREPARED BY:
BLAKELY, SOKOLOFF, TAYLOR & ZAFMAN
12400 Wilshire Boulevard, 7th Floor
Los Angeles, California 90025.
(310) 207-3800

I hereby certify that this correspondence is being deposited with the United States Postal Service as Express Mail No. TB00637026US addressed to: Commissioner of Patents and Trademarks, Washington, DC 20231, on November 8, 1993

Margaret M. Hasson — November 8, 1993
Margaret M. Hasson Date

CIRRUS LOGIC®

CL-PD6710/PD672X

*Advance Data Sheet*

FEATURES

- Single-chip PCMCIA host adapters
- Direct connection to ISA (PC AT) bus
- Direct connection to PCMCIA socket
- Compliant with PCMCIA 2.1 and JEIDA 4.1
- 82365SL-compatible register set, ExCA™-compatible
- Automatic Low-power Dynamic mode for lowest power consumption
- Programmable Suspend mode
- Five programmable memory windows per socket
- Two programmable I/O windows per socket
- Programmable card access cycle timing
- 8- or 16-bit CPU interface
- 8- or 16-bit PCMCIA interface support
- ATA disk interface support
- DMA support (CL-PD6722)
- Easy host interface using ISA I/O addresses 03E0h and 03E1h
- Mixed-voltage (3.3V or 5V) operation
- Single-socket interface: 144-pin VQFP for smallest form factor (CL-PD6710)
- Dual-socket interface: 208-pin PQFP (CL-PD672X)

PCMCIA Host Adapters

OVERVIEW

The CL-PD6710, CL-PD6720, and CL-PD6722 are single-chip PCMCIA host adapter chips capable of controlling one (CL-PD6710) or two (CL-PD6720 and CL-PD6722) PCMCIA sockets. The chips are fully PCMCIA-2.1 and JEIDA-4.1 compliant and are optimized for use in notebook and handheld computers where reduced form factor and low power consumption are critical design objectives. With the CL-PD6710, a complete PCMCIA solution with power-control logic can occupy as little as 1.5 square inches (excluding the connector). The CL-PD672X enables a complete dual-socket PCMCIA solution with power-control logic in less than 2 square inches (excluding connectors).

The CL-PD6710 and CL-PD672X chips employ energy-efficient mixed-voltage technology that can reduce system power consumption by over 50 percent. The chips also provide a Suspend mode, which stops the internal clock, and an automatic Low-power Dynamic mode, which stops transactions on the PCMCIA bus, stops internal clock distribution, and turns off much of the internal circuitry. (cont.)

System Block Diagram

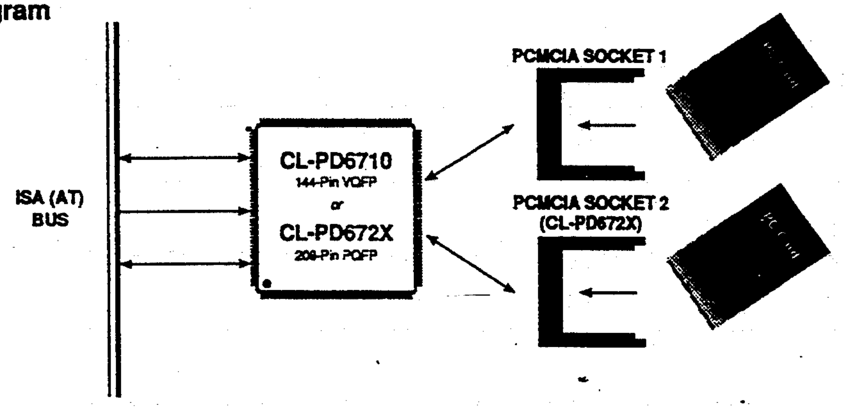

OVERVIEW (cont.)

PC applications typically access PCMCIA cards through the socket/card-services software interface. To assure full compatibility with existing socket/card-services software and PC-card applications, the register set in the CL-PD6710 and CL-PD672X is a superset of the Intel® 82365SL register set.

Both chips provide fully buffered PCMCIA interfaces, meaning that no external logic is required for buffering signals to/from the interface, and power consumption can be controlled by limiting signal transitions on the PCMCIA bus.

| *Notebook Computer Design Priorities* | *Supporting Features* |
|---|---|
| ■ Small Form Factor | ❒ Single-chip solutions<br>❒ No external buffers for host or socket<br>❒ Efficient board layout |
| ■ Minimum Power Consumption | ❒ Automatic Low-power Dynamic mode<br>❒ Suspend mode<br>❒ Mixed-voltage operation |
| ■ High Performance | ❒ Write cache<br>❒ Programmable timing supports more cards, faster reads and writes<br>❒ Automatic bus sizing for 8- or 16-bit<br>❒ Direct Memory Access (DMA) available with the CL-PD6722 |
| ■ Compatibility | ❒ Compliant with PCMCIA 2.1 and JEIDA 4.1<br>❒ 82365SL A-step register-compatible, ExCA-compatible |

Host Adapter Form Factor

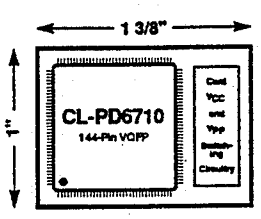

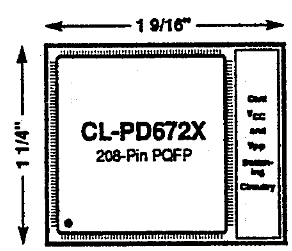

Table of Contents

1. GENERAL CONVENTIONS .................. 5
1.1 Numeric Naming .................. 5
1.2 Register Description Notation .................. 5
2. PIN INFORMATION .................. 7
2.1 Pin Diagrams .................. 7
2.2 Pin Description .................. 9
2.3 Power-On Configuration Summary .................. 18
3. INTRODUCTION TO THE CL-PD6710 AND CL-PD672X .................. 19
3.1 System Architecture .................. 19
3.1.1 PCMCIA Basics .................. 19
3.1.2 Windowing .................. 19
3.1.3 Socket Power Management Features .................. 21
3.1.4 Interrupts .................. 21
3.1.5 Power Management .................. 21
3.1.6 Write FIFO .................. 23
3.1.7 Bus Sizing .................. 23
3.1.8 Programmable PCMCIA Timing .................. 23
3.1.9 ATA Mode Operation .................. 24
3.1.10 DMA Mode Operation for the CL-PD6722 .................. 24
3.1.11 Selective Data Drive for I/O Windows for the CL-PD6722 .................. 24
3.2 Host Access to Registers .................. 24
3.3 Power-On Setup .................. 25
4. ACCESS REGISTERS .................. 26
4.1 Index .................. 26
4.2 Data .................. 27
5. CHIP CONTROL REGISTERS .................. 29
5.1 Chip Revision .................. 29
5.2 Interface Status .................. 30
5.3 Power Control .................. 32
5.4 Interrupt and General Control .................. 34
5.5 Card Status Change .................. 36
5.6 Management Interrupt Configuration .................. 37
5.7 Mapping Enable .................. 38
6. I/O WINDOW MAPPING REGISTERS 40
6.1 I/O Window Control .................. 40
6.2 I/O Map 0-1 Start Address Low .................. 41
6.3 I/O Map 0-1 Start Address High .................. 41
6.4 I/O Map 0-1 End Address Low .................. 42
6.5 I/O Map 0-1 End Address High .................. 42
6.6 I/O Map 0-1 Address Offset Low .................. 43
6.7 I/O Map 0-1 Address Offset High .................. 43
7. MEMORY WINDOW MAPPING REGISTERS .................. 44
7.1 Memory Map 0-4 Start Address Low .................. 44
7.2 Memory Map 0-4 Start Address High .................. 45
7.3 Memory Map 0-4 End Address Low .................. 45
7.4 Memory Map 0-4 End Address High .................. 46
7.5 Memory Map 0-4 Address Offset Low .................. 47
7.6 Memory Map 0-4 Address Offset High .................. 47
8. EXTENSION REGISTERS .................. 49
8.1 Misc Control 1 .................. 49
8.2 FIFO Control .................. 50
8.3 Misc Control 2 .................. 51
8.4 Chip Information .................. 53
8.5 ATA Control .................. 53
8.6 Extension Index (CL-PD6722 only) .................. 55
8.7 Extension Data (CL-PD6722 only) .................. 55
8.7.1 Data Mask 0 .................. 55
8.7.2 Data Mask 1 .................. 56
8.7.3 DMA Control .................. 56
9. TIMING REGISTERS .................. 57
9.1 Setup Timing 0-1 .................. 57
9.2 Command Timing 0-1 .................. 58
9.3 Recovery Timing 0-1 .................. 59
10. ATA MODE OPERATION .................. 60
11. DMA OPERATION (CL-PD6722) .................. 64
11.1 DMA Capabilities of the CL-PD6722 .................. 64
11.2 DMA-Type PCMCIA Cycles .................. 64
11.3 ISA Bus DMA Handshake Signal .................. 64
11.4 Configuring the CL-PD6722 Registers for a DMA Transfer .................. 65
11.4.1 Programming the DMA Request Pin from the Card .................. 65
11.4.2 Configuring the Socket Interface for I/O .................. 66
11.4.3 Preventing Dual Interpretation of DMA Handshake Signals .................. 66
11.4.4 Turning On DMA System .................. 67
11.5 The DMA Transfer Process .................. 67
11.6 Terminal Count to Card at Conclusion of Transfer .................. 67
12. ELECTRICAL SPECIFICATIONS .................. 68
12.1 Absolute Maximum Ratings .................. 68
12.2 DC Specifications .................. 68
12.3 AC Timing Specifications .................. 72
12.3.1 Bus Timing — ISA Bus .................. 73
12.3.2 Reset Timing .................. 75
12.3.3 Input Clock Specification .................. 76

12.3.4 PCMCIA Bus Timing Calculations ..................77
12.3.5 Bus Timing — PCMCIA Bus ..........................78

13. PAKAGE DIMENSIONS ...................... 87
13.1 144-Pin VQFP Package ......................................87
13.2 208-Pin PQFP Package .....................................88

14. ORDERING INFORMATION ................ 89

15. REGISTER SUMMARY TABLES ........ 90
15.1 Access Registers.................................................90
15.2 Chip Control Registers .......................................90
15.3 I/O Window Mapping Registers ..........................92
15.4 Memory Window Mapping Registers .................93
15.5 Extension Registers ...........................................94
15.6 Timing Registers.................................................96

Index ........................................................ 97

Document Revision History

Following are major changes between January 1993 and October 1993 versions of this data sheet:

General

A new chip was added: the CL-PD6722.

The CL-PD672X packaging name was changed to PQFP; the physical package is the same.

The chips are also compatible with PCMCIA 2.1.

Section

2.2 SPKR_OUT*/CSEL pin description in Table 2–1 was changed from TO-PU type to IO-PU type.

Addition of the CL-PD6722 chip changed description in Tables 2–1 and 2–2 of the following pins: IRQ9, IRQ10, -VPP_VALID, -REG, -OE, -WE, WP/-IOIS16, -INPACK, and BVD2/-SPKR.

3.1 The typical power consumption values in Table 3–1 were updated (reduced) to more closely reflect expected values.

Sections 3.1.10 and 3.1.11 are new sections describing the CL-PD6722.

5-9 Many indications of Constant bits in registers were changed from "0" to "Scratch Bit".

5 In the Card Status Change register, the Battery Dead/STSCHG Enable bit name was renamed Battery Dead Or Status Change Enable.

8 The Misc Control 2 register bit 6 is not reserved on the CL-PD6722. Its functionality is described.

Sections 8.6 and 8.7 were added to describe CL-PD6722-specific registers.

9 The Setup, Command, and Recovery field names were altered. The default state for the Command Multiplier Value field was corrected. The timing formula for all three timing register sets were reformatted. The timing with 11b Prescaler selected will calculate differently. The formula for Recovery Timing had additional changes.

11 This new chapter describes DMA on the CL-PD6722.

12 Extensive changes were made throughout this chapter. Please review carefully.

1. GENERAL CONVENTIONS

Throughout this document, bits within words and words within various memory spaces are generally started with a '0' as the least-significant bit or word. For example, the least-significant bit of a byte is bit 0, while the most-significant bit is bit 7.

In addition, bit and word number ranges are given with the *most-significant value* on the left. Thus, when discussing a bit field within a register or memory word, the bit number of the most-significant bit is given on the left, followed by a hyphen (-) and the bit number of the least-significant bit, for example: bits 7-0.

A field consists of a set of adjoining bits with common functionality. Registers are made up of fields of one or more bits. The names of all the CL-PD67XX internal registers are bold-faced. For example, Chip Revision and Power Control are register names.

The unit 'K byte' designates 1024 bytes. The unit 'Mbyte' designates 1,048,576 bytes (1024 squared). The unit 'Gbytes' designates 1024 megabytes. The unit 'Hz' designates hertz. The unit 'kHz' designates 1000 hertz. The unit 'MHz' designates 1000 kilohertz. The unit 'ns' designates nanosecond. The unit 'µs' designates microsecond. The unit 'ms' designates millisecond. The unit 'mA' designates milliampere.

1.1 Numeric Naming

Throughout this document, 'CL-PD67XX' means CL-PD6710, CL-PD6720, and CL-PD6722; and 'CL-PD672X' means CL-PD6720 and CL-PD6722.

Hexadecimal numbers are represented with all letters in upper case and a lower-case 'h' is appended to them. For example, '14h', '3A7h', and 'C000h' are hexadecimal numbers.

Binary numbers have the letter 'b' appended to them. In addition, a capital letter 'X' is used within binary numbers to indicate digits *ignored* by the CL-PD67XX within the current context. For example, '101XX01b' is a binary number with bits 3-2 ignored.

Numbers not indicated by an 'h' or 'b' are decimal. Octal numbers are not used.

1.2 Register Description Notation

*Reserved and Constant*

Throughout this document the word 'Reserved' is used in two ways, described below:

- When a system memory or I/O address is referred to as 'Reserved', it means that writing to that address will be ignored.
- When describing multi-bit register fields (including the values of Index registers), some encodings may be marked Reserved. This indicates that writing that field with the Reserved value will cause the CL-PD67XX to enter an indeterminate state. The system must *not* write fields with values that are Reserved.

There are also bits within the CL-PD67XX registers which are marked 'Constant' and in register summary tables are indicated by a numeral '1' or '0'.

- When registers containing Constant bits are read, the value of the Constant bits may be either a '1' or a '0'. Thus, for determinate software behavior, the values of Constant bits which are read must be masked *before* the value read is used.
- When registers containing Constant bits are written, either the Constant values '1' or '0' must be written to each Constant bit, *as specified in the description of the register containing the bit.* If the incorrect value is written to a Constant bit, the CL-PD67XX will enter an indeterminate state. The system *must* write Constant bits with the specified value.

*Read-Only*

The word 'Read-only' is used to indicate registers and bits Reserved or Constant for only one type of operation.

- If a Read-only (Reserved-on-write) *register* is written, the register will be ignored.
- If a Read-only (Constant-on-write) *bit* is written with a value other than the value specified, the bit will be ignored.

Bit Descriptions

When used to describe an action taken by the host system, the phrase "the system *sets* a bit" is the same as stating "the system writes the appropriate register with a *'1' (one)* in the bit".

Similarly, the phrase "the system *clears* a bit" is the same as stating "the system writes the appropriate register with a *'0' (zero)* in the bit".

Bit Naming Conventions

The following keywords are used within bit and bit field names:

| Keyword | Description |
|---|---|
| Enable | Indicates that the function described in the rest of the bit name is *active when the bit is a '1'*. |
| Disable | Indicates that the function described in the rest of the bit name is *active when the bit is a '0'*. |
| Mode | Indicates that the function of the bit alters the interpretation of the values in other registers. |
| Select | Indicates that the bit or field selects between multiple alternatives. Fields that contain *Select* in their names have an indirect mapping between the value of the field and the effect. In particular, the value of multi-bit fields that do not contain *Select* in their names is used directly as a number. |
| Input | Indicates a bit or field which is read from a pin. |
| Output | Indicates a bit or field which is driven to a pin. |
| Status | Indicates either one of two types of bit: Status bits are either read-only bits used by the CL-PD67XX to report information to the system or bits set by the CL-PD67XX in response to an event, and may be cleared by the system. In no case can the system directly cause a Status bit to become a '1'. |

Register Heading Description

Throughout this document, the description of each register starts with a header containing the following information:

| Header Field | Description |
|---|---|
| Index | This is the Index value through which an internal register in an indexed register set is accessed. |
| Register Per | This indicates whether the register is associated with individual sockets, marked 'socket' or whether the register affects both sockets in the CL-PD672X, marked 'chip'. |
| Register Compatibility Type | This indicates whether the register is 82365SL-compatible, marked "365" or a CL-PD67XX extension, marked "ext.". |

2. PIN INFORMATION

The CL-PD6710 chip is packaged as a 144-pin Very tight-pitch Quad Flat Pack (VQFP) component and the CL-PD672X is packaged as a 208-pin Plastic Quad Flat Pack (PQFP, also known as QFP) component. The interface pins on both chips can be divided into three groups:

- ISA interface pins
- PCMCIA socket interface pins
- Power, ground, and Reserved pins Refer to Figure 2–1 for the CL-PD6710 and Figure 2–2 for the CL-PD672X pin diagrams. The pin assignments for all three groups, for both chips, are shown in Table 2–1, Table 2–2, and Table 2–3.

2.1 Pin Diagrams

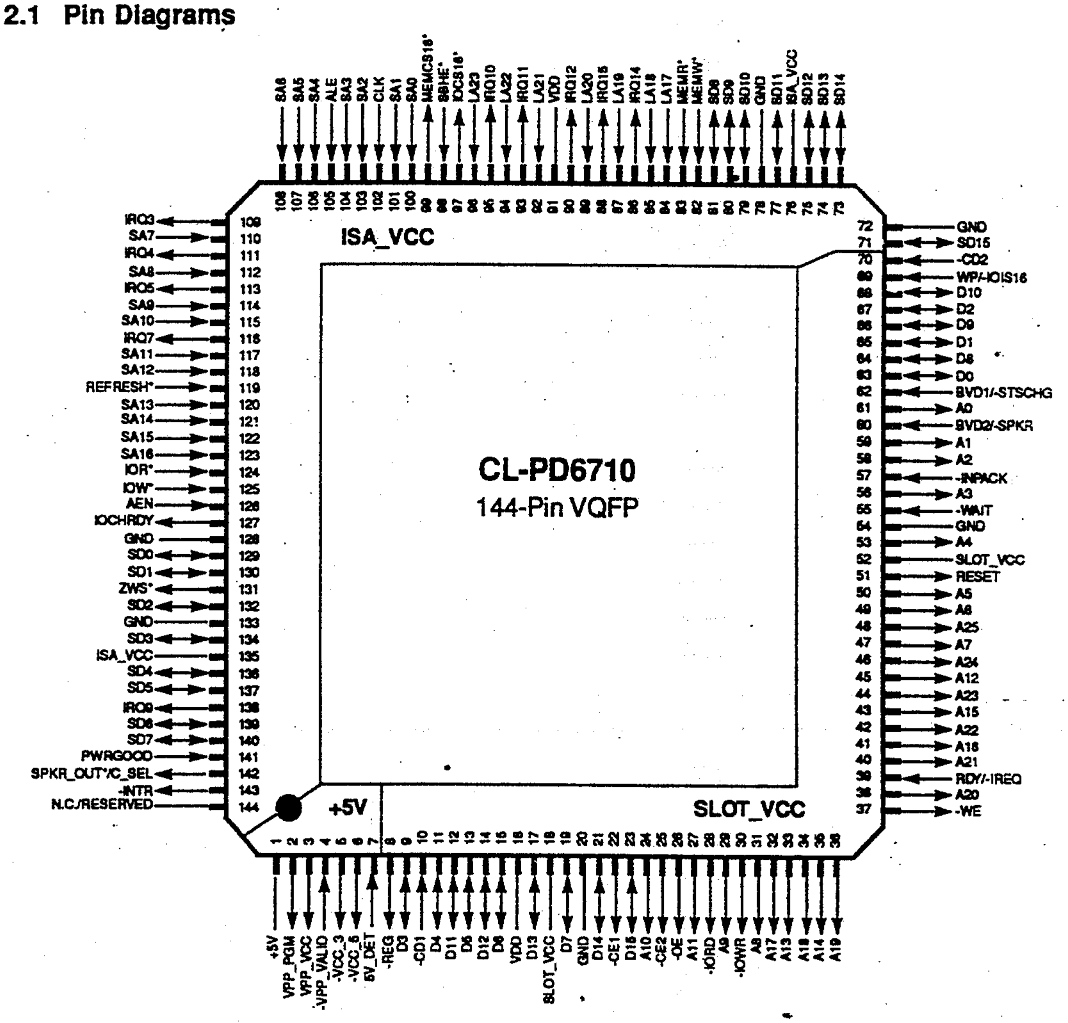

Figure 2–1. CL-PD6710 Pin Diagram (top view, with pin names)

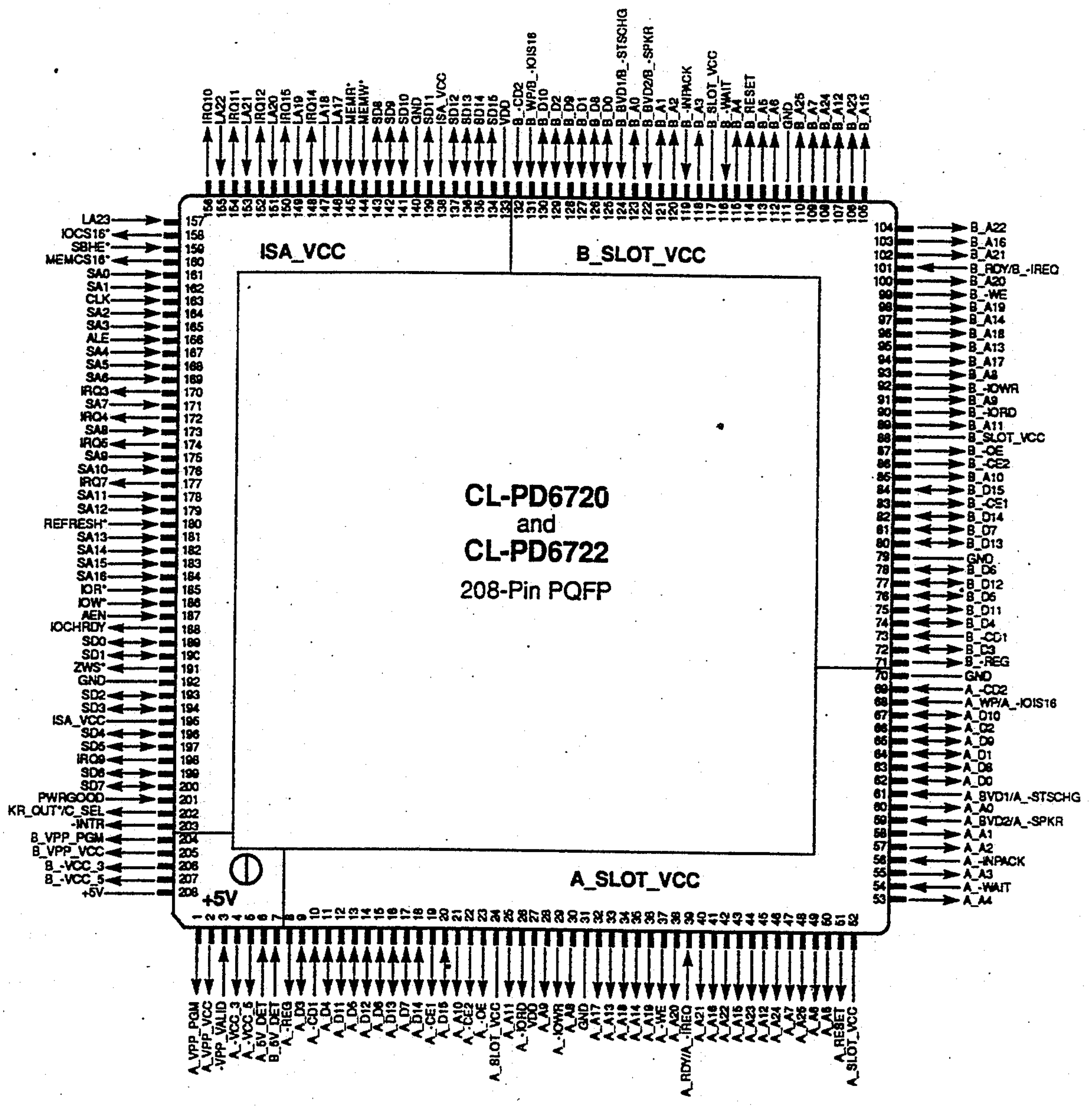
Figure 2–2. CL-PD672X Pin Diagram (top view, with pin names)

2.2 Pin Description

This section describes each CL-PD67XX pin and its use.

The following conventions apply to pin descriptions in this document:

- The CL-PD6710 and CL-PD672X columns show the separate connections on both chips.
- The pin number (pin #) column indicates the package pin that carries the listed signal. Note that multi-pin buses are listed with the first pin number corresponding to the *most-significant* bit of the bus. For example, pin numbers 123-120, 118-117, 115-114, 112, 110, 108-106, 104-103, 101-100 associated with CPU Address inputs SA[16:0] indicate that:
  - — SA[16] is pin 123
  - — SA[9] is pin 114
  - — SA[8] is pin 112
  - — SA[1] is pin 101
  - — SA[0] is pin 100
- The quantity (qty.) column indicates the number of pins used on each chip.
- The type column describes how each pin is configured for each mode and the corresponding power type. The possible types include:

| Mode Type | Description |
|---|---|
| I | Input pin |
| I-PU | Input pin with an internal pull-up resistor |
| O | Constant-driven, output-only pin |
| OD | Open-drain output pin |
| TO | Three-state output pin |
| TO-PU | Three-state output pin with an internal pull-up resistor |
| OD-PU | Open-drain output pin with internal pull-up resistor |
| PW | Power pin |

| Power Type | Outputs Powered By |
|---|---|
| 1 | +5V: connects to a +5V power supply |
| 2 | A_SLOT_VCC: connects to PCMCIA pins 17 and 51, Socket A |
| 3 | B_SLOT_VCC: connects to PCMCIA pins 17 and 51, Socket B |
| 4 | ISA_VCC: connects to the ISA bus power supply |
| 5 | VDD: connects to the lowest available logic supply; in most systems — 3.3V |

- The drive column describes the drive capability of the pin. Note that the drive listed for an input (I) pin is N/A (not applicable).
- Colon separated digits [#:#] at the end of a pin name indicate a multi-pin bus.
- An asterisk (*) at the end of a pin name indicates an active-low signal.
- A dash (-) at the beginning of a pin name indicates an active-low signal on the PCMCIA bus.
- Pins marked with a dagger (†) switch between CMOS and TTL levels; all other pins use CMOS levels.

Table 2–1. ISA Interface Pins

| Pin Name | Description | CL-PD6710 | | | | CL-PD672X | | | |
|---|---|---|---|---|---|---|---|---|---|
| | | pin # | qty. | type/ pwr. # | drive | pin # | qty. | type/ pwr. # | drive |
| LA[23:17] | **CPU Address Inputs:** Connect to ISA signals LA[23:17] or, for 1-Mbyte address systems, tie ALE high, ground LA[23:20] and connect LA[19:17] to ISA signals SA[19:17]. | 96, 94, 92, 89, 87, 85, 84 | 7 | I/4 | N/A | 157, 155, 153, 151, 149, 147, 146 | 7 | I/4 | N/A |
| SA[16:0] | **CPU Address Inputs:** Connect to ISA signals SA[16:0]. | 123-120, 118, 117, 115, 114, 112, 110, 108-106, 104, 103, 101, 100 | 17 | I/4 | N/A | 184-181, 179, 178, 176, 175, 173, 171, 169-167, 165, 164, 162, 161 | 17 | I/4 | N/A |
| SD[15:0] | **CPU Data I/O:** These pins are used to transfer data during a memory or I/O cycle. Connect to ISA signals SD[15:0]. | 71, 73-75, 77, 79-81, 140, 139, 137, 136, 134, 132, 130, 129 | 16 | I/O/4 | 12 mA | 134-137, 139, 141-143, 200, 199, 197, 196, 194, 193, 190, 189 | 16 | I/O/4 | 12 mA |
| SBHE* | **Byte High Enable:** This input is used in conjunction with SA[0] to specify the width and alignment of a data transfer. Connect to ISA signal SBHE*. | 98 | 1 | I/4 | N/A | 159 | 1 | I/4 | N/A |
| IOR* | **I/O Read:** This input indicates that a host I/O read cycle is occurring. Connect to ISA signal IOR*. | 124 | 1 | I/4 | N/A | 185 | 1 | I/4 | N/A |
| IOW* | **I/O Write:** This input indicates that a host I/O write cycle is occurring. Connect to ISA signal IOW*. | 125 | 1 | I/4 | N/A | 186 | 1 | I/4 | N/A |
| MEMR* | **Memory Read:** This input indicates that a host memory read cycle is occurring. Connect to ISA signal MEMR*. | 83 | 1 | I/4 | N/A | 145 | 1 | I/4 | N/A |
| MEMW* | **Memory Write:** This input indicates that a host memory write cycle is occurring. Connect to ISA signal MEMW*. | 82 | 1 | I/4 | N/A | 144 | 1 | I/4 | N/A |
| REFRESH* | **Refresh:** This input indicates a memory refresh cycle is occurring and will cause the CL-PD67XX to ignore memory accesses on the bus. Connect to ISA signal REFRESH*. | 119 | 1 | I/4 | N/A | 180 | 1 | I/4 | N/A |
| ALE | **Address Latch Enable:** A high on this input indicates a valid memory address on the LA[23:17] bus lines. Connect to ISA signal BALE. | 105 | 1 | I/4 | N/A | 166 | 1 | I/4 | N/A |
| PWRGOOD | **Power Good:** The CL-PD67XX will be reset when the POWERGOOD input is low. Connect to the POWERGOOD signal from the system power supply. | 141 | 1 | I/4 | N/A | 201 | 1 | I/4 | N/A |

Table 2–1. ISA Interface Pins *(cont.)*

| Pin Name | Description | CL-PD6710 | | | | CL-PD672X | | | |
|---|---|---|---|---|---|---|---|---|---|
| | | pin # | qty. | type/ pwr. # | drive | pin # | qty. | type/ pwr. # | drive |
| AEN | **Address Enable:** This is an input from the host CPU bus signal that distinguishes between DMA and non-DMA bus cycles. This input should be high for a DMA cycle and will cause the CL-PD67XX to ignore IOR* and IOW*. When CL-PD67XX is in Suspend mode, see Misc Control 2, bit 2 on page 51. Pull this input high during system power-down for lowest power consumption. Connect to ISA signal AEN. | 126 | 1 | I/4 | N/A | 187 | 1 | I/4 | N/A |
| MEMCS16* | **Memory Select 16:** This output is an acknowledge of 16-bit-wide access support and is generated by the CL-PD67XX when a valid 16-bit-word-accessible memory address has been decoded. Connect to ISA signal MEMCS16*. | 99 | 1 | OD/4 | 16 mA | 160 | 1 | OD/4 | 16 mA |
| IOCS16* | **I/O Select 16:** This output is an acknowledge for 16-bit-wide access support and is generated by the CL-PD67XX when a valid 16-bit word accessible I/O address has been decoded. Connect to ISA signal IOCS16*. | 97 | 1 | OD/4 | 16 mA | 158 | 1 | OD/4 | 16 mA |
| IOCHRDY | **I/O Channel Ready:** This output is driven low by the CL-PD67XX to lengthen host cycles. Connect to the ISA bus IOCHRDY signal. | 127 | 1 | TO/4 | 16 mA | 188 | 1 | TO/4 | 16 mA |
| IRQ[14, 11, 7, 5-3] | **Interrupt Request:** These outputs indicate an interrupt request from one of the cards. As desired, connect to corresponding ISA bus signals. | 86, 93, 116, 113, 111, 109 | 6 | TO/4 | 2 mA | 148, 154, 177, 174, 172, 170 | 6 | TO/4 | 2 mA |
| IRQ9 | **Interrupt Request 9:** In default mode this output indicates an interrupt request from one of the cards. When the CL-PD6722 is in DMA mode (see Misc Control 2, bit 6), IRQ9 becomes an input and is connected to the DACK* line corresponding to the DREQ that the IRQ10 pin is connected to. In DMA mode this signal is active low. | 138 | 1 | I/TO/ 4 | 2 mA | 198 | 1 | TO/4 | 2 mA |
| IRQ10 | **Interrupt Request 10:** In IRQ mode this output indicates an interrupt request from one of the cards. When the CL-PD6722 is in DMA mode (see Misc Control 2, bit 6), IRQ10 is the DREQ to be connected to DREQ0, 1, 2, 3, 5, 6, 7 of the ISA bus. In DMA mode this signal is active high. | 95 | 1 | TO/4 | 2 mA | 156 | 1 | TO/4 | 2 mA |

Table 2–1. ISA Interface Pins *(cont.)*

| Pin Name | Description | CL-PD6710 | | | | CL-PD672X | | | |
|---|---|---|---|---|---|---|---|---|---|
| | | pin # | qty. | type/ pwr. # | drive | pin # | qty. | type/ pwr. # | drive |
| IRQ12 | **Interrupt Request 12:** In default IRQ mode this output indicates an interrupt request from one of the cards, and is connected to the ISA bus IRQ12 signal. When Drive LED Enable (see page 51) is set this output becomes an open-drain driver for disk-active LED. | 90 | 1 | TO/4 or OD-PU/4 | 12 mA | 152 | 1 | TO/4 or OD-PU/4 | 12 mA |
| IRQ15 | **Interrupt Request 15:** In IRQ mode this output indicates an interrupt request from one of the cards. When IRQ15 Is RI Out (see page 52) is set to '1', this output is used to resume the CPU using the -RI pin of the 80360SL set. | 88 | 1 | TO/4 | 2 mA | 150 | 1 | TO/4 | 2 mA |
| -INTR | **Interrupt:** This output indicates a management interrupt. This should be connected to either the system processor's SMI or NMI interrupt input, depending on the type of processor used. | 143 | 1 | TO/4 | 2 mA | 203 | 1 | TO/4 | 2 mA |
| ZWS* | **Zero Wait State:** This output is connected to the ISA ZWS signal. It is driven low whenever the CL-PD67XX is able to complete the current cycle in zero wait states. | 131 | 1 | OD/4 | 16 mA | 191 | 1 | OD/4 | 16 mA |
| SPKR_OUT*/ C_SEL | **Speaker Out/Chip Select:** This I/O pin can be used as a digital output to a speaker to allow a system to support PC card, fax/modem/voice, and audio. During reset operations this pin also serves as a chip-configuration input.<br>If the level on this pin is low when PWRGOOD rises, the CL-PD6710 is configured to support cards as a PCMCIA Socket 2 device and the CL-PD672X is configured to support cards as PCMCIA Socket 2 and Socket 3 devices.<br>If the level on this pin is high when PWRGOOD rises, the CL-PD6710 is configured to support cards as a PCMCIA Socket 0 device and the CL-PD672X is configured to support cards as PCMCIA Socket 0 and Socket 1 devices.<br>This pin is internally pulled up during reset so that default configuration of the chip as a Socket 0 (and Socket 1 for CL-PD672X) is facilitated.<br>Refer to the Socket Index field on page 26 for more information on chip configuration. | 142 | 1 | IO-PU/4 | 12 mA | 202 | 1 | IO-PU/4 | 12 mA |

Table 2–1. ISA Interface Pins *(cont.)*

| Pin Name | Description | CL-PD6710 | | | | CL-PD672X | | | |
|---|---|---|---|---|---|---|---|---|---|
| | | pin # | qty. | type/ pwr. # | drive | pin # | qty. | type/ pwr. # | drive |
| SPKR_OUT*/ C_CEL *(cont.)* | After reset operations have completed, this pin defaults to high-impedance, and may then be enabled as a totem-pole speaker output by the setting of a card socket's Speaker Enable bit (Misc Control 1 register, bit 4). This output then becomes the negative polarity XOR of each socket's BVD2/-SPKR input that has its Speaker Enable bit set. Refer to the Section 4.1 description of socket index values for more details. | | | | | | | | |
| CLK | **Clock:** This input is connected to the ISA bus 14.31818-MHz clock. It is used to derive the internal clock used for all socket timing. | 102 | 1 | I/4 | N/A | 163 | 1 | I/4 | N/A |
| -VPP_VALID | In default mode this status input indicates that the $V_{PP}$ power supply is stable. When the CL-PD6722 is in DMA mode (see Misc Control 2, bit 6), this input is connected to the TC (Terminal Count) signal of the ISA bus. In DMA mode, this signal is active high. | 4 | 1 | I/1 | N/A | 3 | 1 | I/1 | N/A |
| ISA_VCC | **Host Bus $V_{cc}$ Pin:** This supply pin can be set to 3.3V or 5V. The ISA Interface pin group will operate at the voltage applied to this pin independent of the voltage applied to other pin groups. | 76, 135 | 2 | PW | N/A | 138, 195 | 2 | PW | N/A |

Table 2–2. Socket Interface Pins

| Pin Name[1, 2] | Description | CL-PD6710 pin # | CL-PD6710 qty. | CL-PD6710 type/ pwr. # | CL-PD6710 drive | CL-PD672X pin # | CL-PD672X qty. | CL-PD672X type/ pwr. # | CL-PD672X drive |
|---|---|---|---|---|---|---|---|---|---|
| -REG | **Register Access:** During PCMCIA memory cycles, this output chooses between attribute and common memory. During I/O cycles for non-DMA transfers, this signal is active (low). During ATA mode, this signal is always inactive. For DMA cycles on the CL-PD6722 to a DMA-capable card, -REG is inactive during I/O cycles to indicate DACK to the PCMCIA card. | 8 | 1 | TO/2 | 2 mA | 8 – 71 | 2 | TO/ 2or3 | 2 mA |
| A[25:0] | PCMCIA socket address outputs. | 48, 46, 44, 42, 40, 38, 36, 34, 32, 41, 43, 35, 33, 45, 27, 24, 29, 31, 47, 49, 50, 53, 56, 58, 59, 61 | 26 | TO/2 | 2 mA | 48, 46, 44, 42, 40, 38, 36, 34, 32, 41, 43, 35, 33, 45, 25, 21, 28, 30, 47, 49, 50, 53, 55, 57, 58, 60 – 110, 108, 106, 104, 102, 100, 98, 96, 94, 103, 105, 97, 95, 107, 89, 85, 91, 93, 109, 112, 113, 115, 118, 120, 121, 123 | 52 | TO/ 2or3 | 2 mA |
| D[15:0] † | PCMCIA socket data I/O signals. | 23, 21, 17, 14, 12, 68, 66, 64, 19, 15, 13, 11, 9, 67, 65, 63 | 16 | I/O/2 | 2 mA | 20, 18, 16, 14, 12, 67, 65, 63, 17, 15, 13, 11, 9, 66, 64, 62 – 84, 82, 80, 77, 75, 130, 128, 126, 81, 78, 76, 74, 72, 129, 127, 125 | 32 | I/O/ 2or3 | 2 mA |

[1] When a card socket is configured as an ATA drive interface, socket interface pin functions change as outlined in Table 10–1 on page 60.

[2] Note that for all CL-PD672X pin names, A_ and B_ must be prepended to the pin name. For example, A_A[25:0] and B_A[25:0] are the independent address buses to the sockets. Note that A_ pin numbers are listed first.

Table 2-2. Socket Interface Pins *(cont.)*

| Pin Name[1, 2] | Description | CL-PD6710 pin # | qty. | type/ pwr. # | drive | CL-PD672X pin # | qty. | type/ pwr. # | drive |
|---|---|---|---|---|---|---|---|---|---|
| -OE | **Output Enable:** For non-DMA transfers, this output goes active (low) to indicate a memory read from the socket. During a DMA write (when IORD is active) this output will go low when the ISA signal TC is high. During DMA reads (IOWR active), this output will remain high. | 26 | 1 | TO/2 | 2 mA | 23 – 87 | 2 | TO/ 2or3 | 2 mA |
| -WE | **Write Enable:** For non-DMA transfers, this signal goes active (low) to indicate a memory write to the socket. During a DMA read (when IOWR is active), this signal will go low when the ISA output TC is high. During DMA writes (IORD active), this output will remain high. | 37 | 1 | TO/2 | 2 mA | 37 – 99 | 2 | TO/ 2or3 | 2 mA |
| -IORD | **I/O Read:** This output will be driven low for I/O reads from the socket. | 28 | 1 | TO/2 | 2 mA | 26 – 90 | 2 | TO/ 2or3 | 2 mA |
| -IOWR | **I/O Write:** This output will be driven low for I/O writes to the socket. | 30 | 1 | TO/2 | 2 mA | 29 – 92 | 2 | TO/ 2or3 | 2 mA |
| WP/ -IOIS16 † | **Write Protect/ I/O is 16 Bit:** In Memory Card Interface mode (Interrupt and General Control register, bit 5 is equal to a '0'), this input is the status of the PC card write protect switch. In I/O Card Interface mode, this input indicates that the I/O address being accessed is capable of 16-bit operation. In DMA Mode, this pin may be used for the DREQ signal from the PCMCIA DMA-capable card. | 69 | 1 | I-PU/ 2 | N/A | 68 – 131 | 2 | I-PU/ 2or3 | N/A |
| -INPACK † | **Input Acknowledge:** This input indicates to the CL-PD67XX that the PC card supports I/O access at the current address. A PC card activates this input during IORD cycles to which the card can respond. In DMA mode, this pin may be used for the DREQ signal from the PCMCIA DMA-capable card. | 57 | 1 | I-PU/ 2 | N/A | 56 – 119 | 2 | I-PU/ 2or3 | N/A |
| RDY/ -IREQ † | **Ready/Interrupt Request:** In Memory Card Interface mode, this input indicates to the CL-PD67XX that the card is either ready or busy. In I/O Card Interface mode, this input indicates an interrupt request. | 39 | 1 | I-PU/ 2 | N/A | 39 – 101 | 2 | I-PU/ 2or3 | N/A |

[1] When a card socket is configured as an ATA drive interface, socket interface pin functions change as outlined in Table 10–1 on page 60.

[2] Note that for all CL-PD672X pin names, A_ and B_ must be prepended to the pin name. For example, A_A[25:0] and B_A[25:0] are the independent address buses to the sockets. Note that A_ pin numbers are listed first.

Table 2–2. Socket Interface Pins *(cont.)*

| Pin Name[1, 2] | Description | CL-PD6710 pin # | qty. | type/ pwr. # | drive | CL-PD672X pin # | qty. | type/ pwr. # | drive |
|---|---|---|---|---|---|---|---|---|---|
| -WAIT † | **Wait:** This input indicates to the CL-PD67XX that the current card access cycle is to be extended. | 55 | 1 | I-PU/ 2 | N/A | 54 – 116 | 2 | I-PU/ 2or3 | N/A |
| -CD[2:1] | **Card Detect:** These inputs indicate to the CL-PD67XX the presence of a card in the socket. They are pulled high internally in the chip. | 70, 10 | 2 | I-PU/ 1 | N/A | 69, 10 – 132, 73 | 4 | I-PU/ 1 | N/A |
| -CE[2:1] | **Card Enable:** These outputs are driven low by the CL-PD67XX during card access cycles to control byte/word card access. -CE1 enables even-numbered address bytes and -CE2 enables odd-numbered address bytes. When configured for 8-bit cards, only -CE1 will be active and A0 will be used to access odd-numbered bytes. | 25, 22 | 2 | TO/2 | 2 mA | 22, 19 – 86, 83 | 4 | TO/ 2or3 | 2 mA |
| RESET | This output will be high to reset the card and low for normal operation. To prevent reset glitches to a card, this signal is high-impedance unless a card is fully seated in the socket and card interface signals are enabled. | 51 | 1 | TO/2 | 2 mA | 51 – 114 | 2 | TO/ 2or3 | 2 mA |
| BVD2/ -SPKR † | **Battery Voltage Detect 2/Speaker:** In Memory Card Interface mode, this input serves as the BVD2 or battery warning status input. In I/O Card Interface mode, this input can be configured as a card's -SPKR binary audio input. For disk-drive support, BVD2/-SPKR can also be configured as a drive-status LED input. In DMA mode, this pin may be used for the DREQ signal from the PCMCIA DMA-capable card. | 60 | 1 | I-PU/ 2 | N/A | 59 – 122 | 2 | I-PU/ 2or3 | N/A |
| BVD1/ -STSCHG † | **Battery Voltage Detect 1/Status Change:** In Memory Card Interface mode, this input serves as the BVD1 or Battery Dead Status. In I/O Card Interface mode, this input is the -STSCHG input, which indicates to the CL-PD67XX that the card's internal status has changed. This input may also be used as -RI ring indicate when IRQ15 is configured for RI Out (see page 52). | 62 | 1 | I-PU/ 2 | N/A | 61 – 124 | 2 | I-PU/ 2or3 | N/A |

[1] When a card socket is configured as an ATA drive interface, socket interface pin functions change as outlined in Table 10–1 on page 60.

[2] Note that for all CL-PD672X pin names, A_ and B_ must be prepended to the pin name. For example, A_A[25:0] and B_A[25:0] are the independent address buses to the sockets. Note that A_ pin numbers are listed first.

Table 2–2. Socket Interface Pins *(cont.)*

| Pin Name[1, 2] | Description | CL-PD6710 | | | | CL-PD672X | | | |
|---|---|---|---|---|---|---|---|---|---|
| | | pin # | qty. | type/ pwr. # | drive | pin # | qty. | type/ pwr. # | drive |
| VPP_VCC | This output is used to enable the socket $V_{CC}$ supply onto the $V_{PP}$ pin. This pin is mutually exclusive with VPP_PGM. | 3 | 1 | O/1 | 12 mA | 2 – 205 | 2 | O/1 | 12 mA |
| VPP_PGM | This output is used to enable the programming voltage supply onto the $V_{PP}$ pin. This pin is mutually exclusive with VPP_VCC. | 2 | 1 | O/1 | 12 mA | 1 – 204 | 2 | O/1 | 12 mA |
| -VCC_3 | This output is used to enable a 3.3V supply onto the $V_{DD}$ socket. This pin is mutually exclusive with -VCC_5. | 5 | 1 | O/1 | 12 mA | 4 – 206 | 2 | O/1 | 12 mA |
| -VCC_5 | This output is used to enable a 5V supply onto the $V_{DD}$ socket. This pin is mutually exclusive with -VCC_3. | 6 | 1 | O/1 | 12 mA | 5 – 207 | 2 | O/1 | 12 mA |
| 5V_DET | **5V Detect:** This status input is used to detect 5V/3.3V on PCMCIA pin 57. | 7 | 1 | I-PU/ 1 | N/A | 6 – 7 | 2 | I-PU/ 1 | N/A |
| SLOT_VCC | This supply pin can be set to 3.3V or 5V. The Socket interface pins will operate at the voltage applied to this pin, independent of the voltage applied to other pin groups. Connect SLOT_VCC to pins 17 and 51 of the PCMCIA socket. | 18, 52 | 2 | PW | N/A | 24, 52 – 88, 117 | 4 | PW | N/A |

[1] When a card socket is configured as an ATA drive interface, socket interface pin functions change as outlined in Table 10–1 on page 60.

[2] Note that for all CL-PD672X pin names, A_ and B_ must be prepended to the pin name. For example, A_A[25:0] and B_A[25:0] are the independent address buses to the sockets. Note that A_ pin numbers are listed first.

Table 2–3. Power, Ground Supply, and Reserved Pins

| Pin Name | Description | CL-PD6710 | | | | CL-PD672X | | | |
|---|---|---|---|---|---|---|---|---|---|
| | | pin # | qty. | type | drive | pin # | qty. | type | drive |
| VDD | These $V_{DD}$ supply pins are connected to either 3.3V or 5V. They drive the core of the CL-PD67XX chip. If 3.3V is available in the system, these pins must be connected to 3.3V. | 16, 91 | 2 | PW | N/A | 27, 133 | 2 | PW | N/A |
| GND | The GND pins should be connected to system ground. | 20, 54, 72, 78, 128, 133 | 6 | PW | N/A | 31, 70, 79, 111, 140, 192 | 6 | PW | N/A |
| +5V | This supply pin is connected to 5V, unless 5V is not available in the system. In systems where 5V is not available, this pin is connected to 3.3V. | 1 | 1 | PW | N/A | 208 | 1 | PW | N/A |
| Reserved | Reserved pins are not connected. | 144 | 1 | N/A | N/A | — | 0 | N/A | N/A |

Table 2–4 below summarizes the pin usage for both the CL-PD6710 and CL-PD672X.

Table 2–4. Pin Usage Summary

| Pin Group | Pin Quantity CL-PD6710 | Pin Quantity CL-PD672X |
|---|---|---|
| ISA interface pins | 69 | 69 |
| Socket interface pins | 65 | 130 |
| Power, ground, and Reserved pins | 10 | 9 |
| **Total:** | 144 | 208 |

2.3 Power-On Configuration Summary

On the rising edge of PWRGOOD, the CL-PD67XX latches the configuration pin SPKR_OUT*/C_SEL to determine which sockets are addressed by this device. A '1' on the SPKR_OUT*/C_SEL pin will cause the device to address Socket 0 (and Socket 1 for the CL-PD672X). A '0' on this pin will cause the device to address Socket 2 (and Socket 3 for the CL-PD672X).

Table 2–5. Chip Configuration at Power-up for Socket Support

| SPKR_OUT*/C_SEL Level at Rising Edge of PWRGOOD | CL-PD6710 | CL-PD672X | |
|---|---|---|---|
| | Socket Interface Support | Socket A Interface Support | Socket B Interface Support |
| High | PCMCIA Socket 0<br>3E0 Index 00-3Fh | PCMCIA Socket 0<br>3E0 Index 00-3Fh | PCMCIA Socket 1<br>3E0 Index 40-7Fh |
| Low | PCMCIA Socket 2<br>3E0 Index 80-BFh | PCMCIA Socket 2<br>3E0 Index 80-BFh | PCMCIA Socket 3<br>3E0 Index C0-FFh |

3. INTRODUCTION TO THE CL-PD6710 AND CL-PD672X

3.1 System Architecture

This section describes PCMCIA basics, windowing, socket power management features, interrupts, power management, write FIFO, bus sizing, programmable PCMCIA timing, and ATA mode operation.

3.1.1 PCMCIA Basics

The PCMCIA 2.1[1] standard enables memory and I/O devices to be inserted as exchangeable peripherals into personal computers (PCs) and handheld computers. To ease end-user and vendor implementation of the standard, it is desirable that systems employing PCMCIA 2.1 be backward-compatible with PC hardware. Attempting to deliver this compatibility poses many difficulties for system designers.

It is desirable to be able to directly address memory cards, which means that when a memory card is installed in the system, its memory must be mapped into the system address space. This is accomplished with 'windowing' (see below), which is similar to expanded memory schemes used previously in PC systems (for example, LIM 4.0 memory manager).

PCMCIA cards can have both *attribute* and *common* memory. Attribute memory is used to indicate to host software the capabilities of the PCMCIA card and to allow host software to change the configuration of the PCMCIA card. Common memory can be used for any purpose that the host software can interpret (flash file system, system memory, floppy emulation, etc.).

It is recommended that I/O cards be accessed as if they were installed on the motherboard. For instance, if a PCMCIA modem card is to be used, it would be highly desirable to have it accessible to standard communications software as if it were COM1 (other COM ports are also possible). This would require that the modem be accessed at I/O Address 3F8h-3FFh. This method of I/O windowing is also handled in a manner similar to memory windowing, described below.

I/O cards typically have interrupts that need to be serviced by host software. In the previous modem application example provided, being accessed as COM1, software will expect the modem to generate interrupts on the IRQ4 line. To accomplish this, interrupt steering has been provided to steer the interrupt from the PCMCIA card to several of the standard PC interrupts (see Interrupt and General Control on page 34).

3.1.2 Windowing

For PC cards to be used with existing software, and to ensure compatibility with future memory cards and software, the CL-PD67XX provides memory and I/O windows in which to map an installed PCMCIA card into system memory and I/O space. Five memory windows and two I/O windows are provided.

Five memory windows allow a memory card to be accessed with four independent windows into common memory, which can be used as expanded-memory-style-compatible windows. The fifth window is then available to access the attribute memory in the card without re-configuring any of the expanded memory windows.

[1] The CL-PD67XX is backward-compatible with PCMCIA standards 1.0, 2.0, 2.01, and 2.1 as well as JEIDA 4.1.

Each memory window has several attributes that can be assigned to it, including:

| Attribute | Description |
|---|---|
| Enabled | Each window can be individually enabled. Disabled windows are not responded to. |
| Start Address | The starting address of the window is programmable on 4K byte boundaries starting at 64K byte (1000:0) with a maximum address of 16 Mbyte. |
| End Address | The ending address of the window is programmable on 4K byte boundaries starting at 64K (1000:0) with a maximum address of 16 Mbyte. Only memory accesses between the starting and ending address are responded to. |
| Address Offset | The offset is added to the CPU address in order to compute the address which is used for accessing the PCMCIA card. This allows the addresses in the PCMCIA address space to be different from the CPU address space. |
| Data Size | The size of accesses made in the window can be either 8- or 16-bit. |
| Timing | The timing of accesses (Setup/Command/Recovery) can be set to either of the two timing register sets. |
| Reg. Setting | The -REG pin (see page 14) can be enabled on a per-window basis so that any of the windows can be used for accessing attribute memory. |
| Write Protect | If the window is programmed to be write-protected, then writes to the memory window are ignored (reads are still performed normally). |

Two I/O windows are available to provide accesses to the I/O space of a PCMCIA card. Each I/O window also has several attributes that can be assigned, including:

| Attribute | Description |
|---|---|
| Enabled | Each I/O window can be individually enabled. |
| Start Address | The starting address of the window is programmable on single-byte boundaries from 0 to 64K byte. |
| End Address | The ending address of the window is also programmable on single-byte boundaries from 0 to 64K byte. |
| Address Offset | The offset is added to the CPU address in order to compute the address used for accessing the PCMCIA card. |
| Auto Size | The size of accesses can be made automatically based on the PCMCIA -IOIS16 signal. |
| Data Size | The size of accesses can manually be made either 8- or 16-bit. |
| Timing | The timing of accesses (Setup/Command/Recovery) can be set to either of the two timing register sets. |

Care must be taken to ensure that none of the windows of the CL-PD6710 or CL-PD672X overlap with each other or other devices in the system. This would cause collisions in the IOCS16*, MEMCS16*, IOCHRDY, and SD[15:0] signals (see page 11), resulting in erratic behavior.

3.1.3 Socket Power Management Features

At power-on, and whenever there is no card plugged into a socket, power to the socket is off. When a card is detected (via the Card Detect pins, -CD1 and -CD2, see page 16), one of two things occur. If the CL-PD67XX has been set for automatic power-on, the CL-PD67XX automatically enables the socket $V_{CC}$ (and possibly $V_{PP}1$ and $V_{PP}2$) supplies. If the CL-PD67XX has been configured to cause management interrupts for card-detection events, a management interrupt is generated to inform system software that a card was installed. System software can then initialize the card, or in the case of manual power detection, power-up the socket manually and then initialize it.

When a card is removed from a socket, and if the CL-PD67XX has been configured for automatic power-on, the CL-PD67XX automatically disables $V_{CC}$ and $V_{PP}$ supplies to the socket. The CL-PD67XX can also be configured to cause interrupts to notify software of this event.

3.1.4 Interrupts

Interrupts in PC systems are not generally shared by hardware. Therefore, each device in the system must have a unique interrupt line. Additionally, many software applications are dependent on certain I/O devices having interrupts located at specific interrupt locations. To allow PCMCIA cards with unknown I/O functionality to be connected to appropriate non-conflicting interrupt locations, the CL-PD67XX can steer the interrupt from a PCMCIA card to one of ten different hardware interrupt lines.

For some I/O devices, software can be written so that interrupts can be shared. The CL-PD67XX contains unique logic that allows interrupts to be shared under software control. This is accomplished by programming the CL-PD67XX to pulse the desired interrupt and then three-stating the interrupt line. This unique interrupt technique can be enabled through software so that systems incapable of this compatibility have no loss of functionality.

In addition to normal ISA bus interrupts, a management interrupt is also available. This management interrupt is used by system software to manage the socket itself. There are four management interrupt functions: card insertion/removal recognition and handling, battery warning, status change/battery dead, and card-ready change. The management interrupt can be steered to one of eleven system hardware interrupts, which include the same standard ten for normal interrupts, along with a special interrupt that serves as an SMI, NMI, or some other processor-specific interrupt.

The CL-PD67XX has two dual-function interrupt pins: IRQ12 and IRQ15 (see page 12). In Interrupt mode, both of these pins are used to indicate an interrupt request from a card. IRQ12 can be configured to function as an LED indicator for disk activity from a socket. When configured in LED mode, IRQ12 becomes an open-drain driver for an LED circuit. Similarly, IRQ15 can be configured to function as an RI (ring indicator) output to the 80360 set. When IRQ15 is configured in RI_OUT mode, outputs from the I/O card -STSCHG (pin 63 of the PCMCIA I/O card) are passed through to the IRQ15 pin of the CL-PD67XX.

3.1.5 Power Management

To provide the longest possible battery life, the CL-PD67XX provides many power management features, including: Low-power Dynamic mode, Suspend mode, and control of PCMCIA socket power.

Low-power Dynamic mode is transparent to the ISA bus. After reset, the CL-PD67XX is configured for Low-power Dynamic mode. This mode can be turned off by writing to the Misc Control 2 register (see page 51), resetting bit 1 to a '0'. When in Low-power Dynamic mode, periods of inactivity cause the CL-PD67XX to enter a low-power state where the clock is turned off to most of the chip and the PCMCIA address and data lines are set to a static value. $V_{CC}$ and $V_{PP}$ power to the card is left unchanged. When there is activity present on the PCMCIA bus, or system accesses to chip registers or inserted cards begin, the CL-PD67XX will return from this low-power state to normal operating mode until there is no activity on the PCMCIA bus, or system accesses to chip registers or inserted cards being performed.

A Suspend mode can also be programmed. The CL-PD67XX Suspend mode is the chip's lowest power mode. The CL-PD67XX is put into Suspend mode by writing to the Misc Control 2 register, setting bit 2 to a '1'. In Suspend mode, all the internal clocks are turned off and only access to the Misc Control 2 register is supported. All accesses to the PCMCIA cards are ignored when in Suspend mode. $V_{CC}$ and $V_{PP}$ power to the card is left unchanged (the system power management software is responsible for turning off power to the socket and exiting Suspend mode). Interrupts are passed through to the processor when in Suspend mode. To exit Suspend mode, the Misc Control 2 register, bit 2 must be set to a '0'. It requires 50 ms for the CL-PD67XX to restart the internal clock synthesizer and become active again.

In addition to the software suspend, if the system hold's the AEN signal of the CL-PD67XX high, a Super-suspend mode occurs where ISA inputs to the chip are internally shut off. Internal in the CL-PD67XX, the ISA inputs are ignored and floating conditions on the ISA bus will not cause high current flow in the CL-PD67XX ISA input receivers. Since the ISA bus inputs to the core logic of the CL-PD67XX are also not toggling when AEN is set high, power consumption is further reduced.

The CL-PD67XX power can further be managed by controlling socket power as outlined in Section 3.1.3. Socket power can be turned on and off through software control or automatically when cards are inserted/removed. The CL-PD67XX provides six power control pins per socket for controlling external logic to switch $V_{CC}$ and $V_{PP}$ voltages on and off. Cards can be turned off when they are not in use.

Table 3–1. CL-PD67XX Power-Management Modes

| Mode Name | PWRGOOD Level | AEN | Misc Control 2 Register: Bit 2 Suspend Mode | Misc Control 2 Register: Bit 1 Low-power Dynamic Mode | Functionality | Typical Power Consumption |
|---|---|---|---|---|---|---|
| Low-power Dynamic (Default) | High | Normal | 0 | 1 | Full functionality | < 45 mW high activity, 9-14 mW normal system activity |
| Normal | High | Normal | 0 | 0 | Full functionality | < 85 mW high activity, 18 mW normal system activity |
| Suspend (Software Suspend) | High | Normal | 1 | – | 8-bit access to Misc Control 2 register. No other register access. No card in socket(s). | < 2 mW |
| Super-suspend (Hardware Suspend) | High | Static High | 1 | – | No register access. No card in socket(s). System bus signals disabled. | < 1 mW |
| Reset | Low[a] | – | – | – | No register access. No card in socket(s). System bus signals disabled. | 9-14 mW |

[a] IOR*, IOW*, MEMR*, and MEMW* must be held high when PWRGOOD is low to prevent manufacturing test mode outputs from driving the system data bus.

3.1.6 Write FIFO

To increase performance when writing to PCMCIA cards, a write FIFO is available. Writes will complete in zero wait states until the FIFO is full.

3.1.7 Bus Sizing

The CL-PD6710 and CL-PD672X incorporate logic to automatically detect its connection to 8- or 16-bit buses. This is accomplished by sensing SBHE* input activity. If the SBHE* pin is always high (i.e., tied to ISA_VCC), the CL-PD67XX operates in 8-bit mode where all transfers occur on the lower data bus, bits 7-0. Any occurrence of the SBHE* going low triggers the CL-PD67XX to operate thereafter as a 16-bit device. 16-bit operation of the CL-PD67XX is properly triggered when the SBHE* input is connected to the system's SBHE* signal. When the CL-PD67XX is operating in 16-bit mode, all ISA bus transactions are 16-bit whenever possible, even if installed PC cards only support 8-bit transfers. In 16-bit mode, the signals SBHE* and SA0 are used to specify the width of the data transfer and the location of data on the bus (which byte lane has the data) during 8-bit transfers. The possible combinations for SBHE* and SA0 are as follows:

Table 3–2. 16-Bit Mode Operation

| 16-Bit Mode Transfer Types | SBHE* | SA0 |
|---|---|---|
| Word | 0 | 0 |
| Upper Byte/Odd Address | 0 | 1 |
| Low Byte/Even Address | 1 | 0 |
| Not Valid | 1 | 1 |

Table 3–3. 8-Bit Mode Operation

| 8-Bit Mode Transfer Types[a] | SA0 |
|---|---|
| Even Address | 0 |
| Odd Address | 1 |

[a] The SBHE* signal is pulled up. If the SBHE* signal remains high, the CL-PD67XX causes all transfers to occur on D7-D0 only.

There are typically three types of data transfers to and from the CL-PD67XX, explained below.

- 16-Bit Transfer from 16-Bit Processor — The CPU puts the address on the bus. The CL-PD67XX then identifies the address on the bus as either an 8- or 16-bit transfer. If the transfer is identified as 16-bit, the host acknowledges with the appropriate signal, either MEMCS16* or IOCS16*. Data is transferred to/from the data bus as a word on both byte lanes.
- 8-Bit Transfer from 16-Bit Processor — The CPU puts the address on the bus. The CL-PD67XX then identifies the address on the bus as either an 8- or 16-bit transfer. In this case, the transfer is identified as an 8-bit transfer. The host queries SA0 and SBHE* to determine the byte lane on which the transfer is to occur. The data is transferred to/from the data bus (see Table 3–2).
- 8-Bit Transfer from 8-Bit Processor — The CPU puts the address on the bus. The host determines that it will be an 8-bit transfer since the SBHE* signal has been tied high. The CL-PD67XX queries SA0 to determine if the byte is odd/even. The data is transferred to/from the Data bus (D0-D7).

3.1.8 Programmable PCMCIA Timing

The timing for Setup, Command, and Recovery time for the PCMCIA bus is programmable (see Section 9 on page 57). This allows the CL-PD67XX to be programmed to match the timing requirements of any PCMCIA card. There are two sets of timing registers that can be selected on a per-window basis for both I/O and memory windows.

By setting one of the timing sets for a Recovery time equal to flash memory programming time and utilizing the write FIFO, algorithms can be created to relieve system software of the necessity to do timing loops and allow for flash programming in the background.

To be compatible with the 82365SL, the two timing sets are programmed at the rising edge of PWRGOOD to include normal-wait and one-wait-state timing.

3.1.9 ATA Mode Operation

The CL-PD67XX supports direct connection to AT-attached-interface hard drives. ATA drives use an interface very similar to the IDE interface found on many popular portable computers. In this mode, the address and data conflict with the floppy drive is handled automatically.

3.1.10 DMA Mode Operation for the CL-PD6722

Direct Memory Access (DMA) mode is available on the CL-PD6722 only. To use DMA mode, the Interrupt and General Control register, bit 5 must be set to a '1' to operate the PCMCIA card in I/O Card Interface mode. PCMCIA interface DMA handshake signal options must also be selected. Refer to the description of the DMA Control register on page 56 as well as Chapter 11.

3.1.11 Selective Data Drive for I/O Windows for the CL-PD6722

The CL-PD6722 can be programmed to drive only some of the ISA bus data pins on reads from I/O windows to alleviate data contention for I/O addresses that include more than one peripheral. In the standard IBM® PC AT, I/O map, floppy disk, and hard disk share address 3F7h. The floppy disk drives ISA-data-bus bit 7 on a read from 3F7h, and the hard disk drives bits 6-0. To allow both floppy disk controllers on the motherboard and hard disks on the PCMCIA bus (or vice versa) to coexist, the CL-PD6720 can be programmed through use of its Data Mask registers to disable bit 7 on I/O reads at addresses 3F7h and 377h by programming up I/O windows to these addresses as part of the task of configuring a socket for ATA drive support (see page 55).

3.2 Host Access to Registers

The CL-PD67XX registers are accessed through an 8-bit indexing mechanism. An indexed register scheme allows a large number of internal registers to be accessed by the CPU while using only two I/O addresses.

The Index register (see page 26) is used to specify which of the internal registers the CPU will access next. The value in the Index register is called the Register Index and is the number that specifies a unique internal register. The Data register (see page 27) is used by the CPU to read and write the internal register specified by the Index register.

To access an internal register in an indexed 8-bit register set, the CPU must first write the appropriate Register Index to the Index I/O address. Next, the CPU may read or write the I/O address of the Data register. The CL-PD67XX responds to Data register reads by returning the data stored in the specified internal register to the CPU. The CL-PD67XX responds to Data register writes by storing the data written from the CPU into the specified internal register.

The Index and Data registers are contiguous in the I/O address space and aligned on a 16-bit address boundary. This alignment allows a single 16-bit instruction to be executed by the CPU, simultaneously writing to the Index and Data registers. For this type of write access, the CL-PD67XX guarantees that the 8-bit Register Index contained within the write access will be processed as if it had been written *before* the Data value, when in actuality, both the Index and the Data registers are written simultaneously.

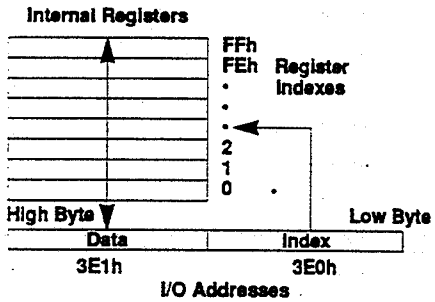

Figure 3–1. Indexed 8-Bit Register Structure

The following code segment demonstrates use of an indexed 8-bit register:

```
MOV DX, 3E0h
MOV AL, 2
MOV AH, 3Ch
OUT DX, AX
```

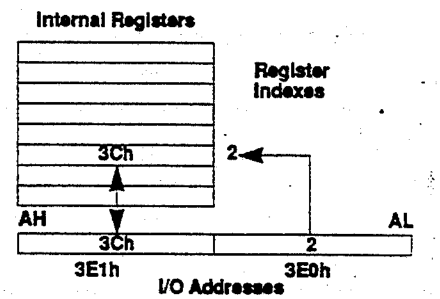

Figure 3–2. Indexed 8-Bit Register Example

3.3 Power-On Setup

Following reset, the CL-PD67XX must be configured by host software. The host software's setup procedure is different depending on its PC system configuration, in particular, the power supply arrangement.

The application of the RESET signal (see page 16) on power-up causes initialization of all the CL-PD67XX register bits and fields to their reset values. Not all registers have reset values; only registers with bits and fields specified to have reset values are initialized.

One bit, which is loaded on hardware reset from the SPKR_OUT*/C_SEL pin (see page 12), is used to determine which socket the CL-PD67XX will respond to.

4. ACCESS REGISTERS

4.1 Index

| Register Name: **Index**<br>Index: **N/A** | | | | | | | Register Per: chip<br>Register Compatibility Type: 365 |
|---|---|---|---|---|---|---|---|
| Bit 7 | Bit 6 | Bit 5 | Bit 4 | Bit 3 | Bit 2 | Bit 1 | Bit 0 |
| Device Index | Socket Index | Register Index | | | | | |
| RW:X | RW:X | RW:XXXXXX | | | | | |

The Index register is accessed at address 03E0h, and the Data register (see page 27) is accessed at 03E1h.

The value of this register is used by the CL-PD67XX to determine which internal register should be accessed (read or written) in response to each CPU access of the Data register. Each of the four possible PCMCIA sockets is allocated a 64-location internal register address space. The socket register space that will be accessed is determined by the Socket Index and Device Index bits. Similarly, the register within a particular socket's space that will be accessed is determined by the Register Index field (bits 5-0 of this register).

When viewed as an 8-bit value, the contents of this register completely specify a single internal-register byte. For example, when the value of this register is in the range 0h to 3Fh, a Socket 0 register is selected (Socket Index bit is a '0' and Device Index bit is a '0'), and when the value of this register is in the range C0h to FFh, a Socket 3 register is selected (Socket Index bit is a '1' and Device Index bit is a '1'):

This register only reads back for Chip 0. Chip 1 will read back only the upper data byte when 16-bit reads occur at 3E0h.

Bits 5-0: Register Index

These bits determine which of the 64 possible socket-specific registers will be accessed when the Data register is next accessed by the processor. Note that some values of the Register Index field are reserved, see Table 4–1.

Bit 6: Socket Index

This bit determines which set of socket-specific registers are currently selected. Note that the CL-PD6710 supports one socket and the CL-PD672X supports two sockets.

Bit 7: Device Index

In systems where two CL-PD67XXs are used, this bit is used to differentiate between them. Table 4–1 shows how the sockets are addressed.

4.2 Data

| | |
|---|---|
| *Register Name:* **Data** | *Register Per:* chip |
| *Index:* **N/A** | *Register Compatibility Type:* 365 |

The Data register is accessed at 03E1h. This register allows the internal registers to be read and written. The internal register that is accessed when the CPU reads or writes the Data register is determined by the current value of the Index register, as follows:

Table 4–1. Index Registers

| Register Name | Index | Page Number |
|---|---|---|
| Chip Revision | 0h | 29 |
| Interface Status | 1h | 30 |
| Power Control | 2h | 32 |
| Interrupt and General Control | 3h | 34 |
| Card Status Change | 4h | 36 |
| Management Interrupt Configuration | 5h | 37 |
| Mapping Enable | 6h | 38 |
| I/O Window Control | 7h | 40 |
| I/O Map 0 Start Address Low | 8h | 41 |
| I/O Map 0 Start Address High | 9h | 41 |
| I/O Map 0 End Address Low | Ah | 42 |
| I/O Map 0 End Address High | Bh | 42 |
| I/O Map 1 Start Address Low | Ch | 41 |
| I/O Map 1 Start Address High | Dh | 41 |
| I/O Map 1 End Address Low | Eh | 42 |
| I/O Map 1 End Address High | Fh | 42 |
| Memory Map 0 Start Address Low | 10h | 44 |
| Memory Map 0 Start Address High | 11h | 45 |
| Memory Map 0 End Address Low | 12h | 45 |
| Memory Map 0 End Address High | 13h | 46 |
| Memory Map 0 Address Offset Low | 14h | 47 |
| Memory Map 0 Address Offset High | 15h | 47 |
| Misc Control 1 | 16h | 49 |
| FIFO Control | 17h | 50 |
| Memory Map 1 Start Address Low | 18h | 44 |
| Memory Map 1 Start Address High | 19h | 45 |
| Memory Map 1 End Address Low | 1Ah | 45 |
| Memory Map 1 End Address High | 1Bh | 46 |
| Memory Map 1 Address Offset Low | 1Ch | 47 |

Table 4–1. Index Registers *(cont.)*

| Register Name | Index | Page Number |
|---|---|---|
| Memory Map 1 Address Offset High | 1Dh | 47 |
| Misc Control 2 | 1Eh | 51 |
| Chip Information | 1Fh | 53 |
| Memory Map 2 Start Address Low | 20h | 44 |
| Memory Map 2 Start Address High | 21h | 45 |
| Memory Map 2 End Address Low | 22h | 45 |
| Memory Map 2 End Address High | 23h | 46 |
| Memory Map 2 Address Offset Low | 24h | 47 |
| Memory Map 2 Address Offset High | 25h | 47 |
| ATA Control | 26h | 53 |
| Reserved | 27h | — |
| Memory Map 3 Start Address Low | 28h | 41 |
| Memory Map 3 Start Address High | 29h | 45 |
| Memory Map 3 End Address Low | 2Ah | 45 |
| Memory Map 3 End Address High | 2Bh | 46 |
| Memory Map 3 Address Offset Low | 2Ch | 47 |
| Memory Map 3 Address Offset High | 2Dh | 47 |
| Extension Index (CL-PD6722 only) | 2Eh | 55 |
| Extension Data (CL-PD6722 only) | 2Fh | 55 |
| Memory Map 4 Start Address Low | 30h | 41 |
| Memory Map 4 Start Address High | 31h | 45 |
| Memory Map 4 End Address Low | 32h | 45 |
| Memory Map 4 End Address High | 33h | 46 |
| Memory Map 4 Address Offset Low | 34h | 47 |
| Memory Map 4 Address Offset High | 35h | 47 |
| I/O Map 0 Address Offset Low | 36h | 43 |
| I/O Map 0 Address Offset High | 37h | 43 |
| I/O Map 1 Address Offset Low | 38h | 43 |
| I/O Map 1 Address Offset High | 39h | 43 |
| Setup Timing 0 | 3Ah | 57 |
| Command Timing 0 | 3Bh | 58 |
| Recovery Timing 0 | 3Ch | 59 |
| Setup Timing 1 | 3Dh | 57 |
| Command Timing 1 | 3Eh | 58 |
| Recovery Timing 1 | 3Fh | 59 |

5. CHIP CONTROL REGISTERS

5.1 Chip Revision

| *Register Name:* **Chip Revision**<br>*Index:* **0h** | | | | *Register Per:* chip<br>*Register Compatibility Type:* 365 | | | |
|---|---|---|---|---|---|---|---|
| *Bit 7* | *Bit 6* | *Bit 5* | *Bit 4* | *Bit 3* | *Bit 2* | *Bit 1* | *Bit 0* |
| Interface ID | | *0* | *0* | Revision | | | |
| R:10 | | R:0 | R:0 | R:0010[a] | | | |

[a] Value for the current stepping only.

Bits 3-0: Revision

This field indicates compatibility with the 82365SL.

Bits 7-6: Interface ID

| | |
|---|---|
| 00 | I/O only. |
| 01 | Memory only. |
| 10 | Memory and I/O. |
| 11 | Reserved. |

These bits identify what type of interface this controller supports.

5.2 Interface Status

| *Register Name:* **Interface Status** | | | | | | | | *Register Per:* socket |
|---|---|---|---|---|---|---|---|---|
| *Index:* 1h | | | | | | | | *Register Compatibility Type:* 365 |
| *Bit 7* *-VPP_VALID* | *Bit 6* | *Bit 5* *RDY* | *Bit 4* *WP* | *Bit 3* *-CD2* | *Bit 2* *-CD1* | *Bit 1* *BVD2* | *Bit 0* *BVD1* | |
| $V_{PP}$ Valid | Card Power On | Ready/Busy* | Write Protect | Card Detect | | Battery Voltage Detect | | |
| R[a] | R:0 | R[b] | R[c] | R[d] | | R[e] | | |

[a] Bit 7 is the inversion of the value of the -VPP_VALID pin (see page 13).
[b] Bit 5 is the value of the RDY/-IREQ pin (see page 15).
[c] Bit 4 is the value of the WP/-IOIS16 pin (see page 15).
[d] Bits 3-2 are the inversion of the values of the -CD1 and -CD2 pins (see page 16).
[e] Bits 1-0 are the values of the BVD1/-STSCHG and BVD2/-SPKR pins (see page 16).

Bits 1-0: Battery Voltage Detect

| BVD2 Input Level | BVD1 Input Level | Bit 0 | Bit 1 | PCMCIA 2.1 Interpretation |
|---|---|---|---|---|
| Low | Low | 0 | 0 | Card data lost |
| Low | High | 0 | 1 | Battery low warning |
| High | Low | 1 | 0 | Card data lost |
| High | High | 1 | 1 | Battery/data okay |

These bits are used by PCMCIA support software and firmware to indicate the amount of capacity left in the battery in battery-backed cards in Memory Card Interface mode only. In I/O Card Interface mode, bit 0 indicates the state of the BVD1/-STSCHG pin (see page 16). Bit 1 status should be ignored in I/O Card Interface mode.

Bits 3-2: Card Detect

| -CD2 Level | -CD1 Level | Bit 3 | Bit 2 | Card Detect Status |
|---|---|---|---|---|
| High | High | 0 | 0 | Either no card or card is not fully inserted |
| High | Low | 0 | 1 | Card is not fully inserted |
| Low | High | 1 | 0 | Card is not fully inserted |
| Low | Low | 1 | 1 | Card is fully inserted |

These bits indicate the state of the -CD1 and -CD2 pins (see page 16).

Bit 4: Write Protect

| | |
|---|---|
| 0 | Card is not write protected. |
| 1 | Card is write protected. |

This bit indicates the state of the WP/-IOIS16 pin (see page 15) on the card and has meaning only in Memory Card Interface mode.

Bit 5: Ready/Busy*

| | |
|---|---|
| 0 | Card is not ready. |
| 1 | Card is ready. |

This bit indicates the state of the RDY/-IREQ pin (see page 15) on the card. If the card has been configured for I/O, then this bit will not be valid.

Bit 6: Card Power On

| | |
|---|---|
| 0 | Power to the card is not on. |
| 1 | Power to the card is on. |

This status bit indicates whether power to the card is on. Refer to the Table 5–1 for details.

Bit 7: $V_{PP}$ Valid

| | |
|---|---|
| 0 | This status bit indicates a logic high at the -VPP_VALID pin. |
| 1 | This status bit indicates a logic low at the -VPP_VALID pin. |

This bit indicates the status of the -VPP_VALID pin (see page 13).

CIRRUS LOGIC

5.3 Power Control

| *Register Name:* **Power Control**<br>*Index:* **2h** | | | | | | *Register Per:* socket<br>*Register Compatibility Type:* 365 | |
|---|---|---|---|---|---|---|---|
| *Bit 7* | *Bit 6* | *Bit 5* | *Bit 4* | *Bit 3* | *Bit 2* | *Bit 1* | *Bit 0* |
| Card Enable | *Scratch Bit* | Auto-Power | $V_{CC}$ Power | *Scratch Bit* | *Scratch Bit* | $V_{PP}$1 Power | |
| RW:0 | RW:0 | RW:0 | RW:0 | RW:0 | RW:0 | RW:00 | |

Table 5–1. Enabling of Socket Power Controls

| PWRGOOD Level | Power Control Register | | -CD1 and -CD2 Both Active Low | Interface Status Register (see page 30) | -VCC_3 and -VCC_5 Levels | VPP1_PGM and VPP1_VCC Levels |
|---|---|---|---|---|---|---|
| | Bit 4: $V_{CC}$ Power | Bit 5: Auto-Power | | Bit 6: Card Power On | | |
| Low | X | X | X | 0 | Inactive high | Inactive low |
| High | 0 | X | X | 0 | Inactive high | Inactive low |
| High | 1 | 0 | X | 1 | Activated per **Misc Control 1** register, bit 1 | Activated per **Power Control** register, bits 1 and 0 |
| High | 1 | 1 | No | 0 | Inactive high | Inactive low |
| High | 1 | 1 | Yes | 1 | Activated per **Misc Control 1** register, bit 1 | Activated per **Power Control** register, bits 1 and 0 |

Table 5–2. Enabling of Outputs to Card Socket

| PWRGOOD Level | -CD1 and -CD2 Both Active Low | Power Control Register | | CL-PD67XX Signal Outputs to Socket |
|---|---|---|---|---|
| | | Bit 4: $V_{CC}$ Power | Bit 7: Card Enable | |
| Low | X | X | X | High impedance |
| High | no | X | X | High impedance |
| High | yes | 0 | 0 | High impedance |
| High | yes | 0 | 1 | Enabled |
| High | yes | 1 | 0 | High impedance |
| High | yes | 1 | 1 | Enabled |

| Bit Name | Value | Description |
|---|---|---|
| $V_{CC}$ Power | 1 | Enables $V_{CC}$ to level described by $V_{CC}$ 3.3V (see page 49) |
| Auto-Power | 1 | Enables Auto-power mode |
| Card Enable | 1 | Enables socket output drivers |

Bits 1-0: $V_{PP}1$ Power

| $V_{PP}1$ Power Bit 1 | Bit 0 | VPP_PGM | VPP_VCC | PCMCIA Intended Socket Function |
|---|---|---|---|---|
| 0 | 0 | Inactive low | Inactive low | Zero volts to PCMCIA socket $V_{PP}1$ pin |
| 0 | 1 | Inactive low | Active high [a] | Selected card $V_{CC}$ to PCMCIA socket $V_{PP}1$ pin |
| 1 | 0 | Active high [a] | Inactive low | +12V to PCMCIA socket $V_{PP}1$ pin |
| 1 | 1 | Inactive low | Inactive low | Zero volts to PCMCIA socket $V_{PP}1$ pin |

[a] Under conditions where $V_{PP}1$ power is activated. See Table 5.3.

These bits are intended to be used to control the power to the $V_{PP}1$ pin of the PCMCIA card.

Bit 4: $V_{CC}$ Power

| | |
|---|---|
| 0 | Power is not applied to the card: the -VCC_3 and -VCC_5 socket power control pins are inactive high. |
| 1 | Power is applied to the card: if bit 5 is a '0', or bit 5 is a '1' and -CD2 and -CD1 are active low, then the selected -VCC_3 or -VCC_5 socket power control pin is active low. |

Depending on the value of bit 5 below, setting this bit to a '1' will cause power to be applied to the card. The $V_{CC}$ 3.3V bit (see page 49) determines whether 3.3V or 5V power is applied.

Bit 5: Auto-Power

| | |
|---|---|
| 0 | $V_{CC}$ and $V_{PP}1$ power control signals are only activated if the socket's -CD2 and -CD1 inputs are active low. |
| 1 | $V_{CC}$ and $V_{PP}1$ power control signals are activated independent of the socket's -CD2 and -CD1 input levels. |

When this bit is set to a '1', the CL-PD67XX causes power to the card to be turned on and off automatically with the insertion and removal of a PC card from the socket.

Bit 7: Card Enable

| | |
|---|---|
| 0 | Outputs to card socket are not enabled and are floating. |
| 1 | Outputs to card socket are enabled if -CD1 and -CD2 are active low and bit 4 is a '1'. |

When this bit is a '1', the outputs to the PCMCIA card are enabled if a card is present and card power is being supplied. The pins affected include: -CE2, -CE1, -IORD, -IOWR, -OE, -REG, RESET, A[25:0], D[15:0], and -WE (see page 14).

5.4 Interrupt and General Control

| *Register Name:* **Interrupt and General Control** | | | | *Register Per:* socket | | | |
|---|---|---|---|---|---|---|---|
| *Index:* **3h** | | | | *Register Compatibility Type:* 365 | | | |
| *Bit 7* | *Bit 6* | *Bit 5* | *Bit 4* | *Bit 3* | *Bit 2* | *Bit 1* | *Bit 0* |
| Ring Indicate Enable | Card Reset* | Card Is I/O | Enable Manage Int | IRQ Level | | | |
| RW:0 | RW:0 | RW:0 | RW:0 | RW:0000 | | | |

Bits 3-0: IRQ Level

| | |
|---|---|
| 0000 | IRQ disabled |
| 0001 | Reserved |
| 0010 | Reserved |
| 0011 | IRQ 3 |
| 0100 | IRQ 4 |
| 0101 | IRQ 5 |
| 0110 | Reserved |
| 0111 | IRQ 7 |
| 1000 | Reserved |
| 1001 | IRQ 9 (On the CL-PD6722, this output may alternately be used for DMA DACK) |
| 1010 | IRQ 10 (On the CL-PD6722, this output may alternately be used for DMA DREQ) |
| 1011 | IRQ 11 |
| 1100 | IRQ 12 (This output may alternately be used for LED) |
| 1101 | Reserved |
| 1110 | IRQ 14 |
| 1111 | IRQ 15 (This output may alternately be used for ring indicate) |

These bits determine which IRQ will occur when the card causes an interrupt through the RDY/-IREQ pin on the PCMCIA connector.

Bit 4: Enable Manage Int

| | |
|---|---|
| 0 | Management IRQ (see page 38) specifies management interrupt bits. |
| 1 | Management interrupts occur on the -INTR line. |

This bit determines how management interrupts will occur.

Bit 5: Card Is I/O

| | |
|---|---|
| 0 | Memory Card Interface mode: card socket configured to support memory cards. Dual-function socket interface pins perform memory card-type interface functions. |
| 1 | I/O Card Interface mode: card socket configured to support I/O/memory card-type interface functions. Dual-function socket interface pins perform I/O/memory card-type interface functions. |

This bit determines how dual-function socket interface pins will be used.

Bit 6: Card Reset*

| | |
|---|---|
| 0 | The RESET signal to the card socket is set active (high for normal, low for ATA mode). |
| 1 | The RESET signal to the card socket is set inactive (low for normal, high for ATA mode). |

This bit determines whether the RESET signal (see page 16) to the card is active or inactive. When the Card Enable bit (see page 33) is a '0', the RESET signal to the card will be high-impedance. See Chapter 10 for further description of ATA mode functions.

Bit 7: Ring Indicate Enable

| | |
|---|---|
| 0 | BVD1/-STSCHG pin is status change function. |
| 1 | BVD1/-STSCHG pin is ring indicate input pin from card. |

This bit determines whether the -STSCHG input pin is used to activate the IRQ15 pin in conjunction with Misc Control 2, IRQ15 Is RI Out (see page 52). This bit has no significance when the card socket is configured for memory card operation.

5.5 Card Status Change

| *Register Name:* **Card Status Change**<br>*Index:* **4h** | | | | | | *Register Per:* socket<br>*Register Compatibility Type:* 365 | |
|---|---|---|---|---|---|---|---|
| *Bit 7* | *Bit 6* | *Bit 5* | *Bit 4* | *Bit 3* | *Bit 2* | *Bit 1* | *Bit 0* |
| *0* | *0* | *0* | *0* | Card Detect Change | Ready Change | Battery Warning Change | Battery Dead Or Status Change |
| R:0 | R:0 | R:0 | R:0 | R:0 | R:0 | R:0 | R:0 |

This register indicates the source of a management interrupt generated by the CL-PD67XX.

NOTE: The corresponding bit in the Management Interrupt Configuration register must be set to a '1' to enable each specific status change detection.

Bit 0: Battery Dead Or Status Change

| | |
|---|---|
| 0 | A transition (from high to low for memory card support or either high to low or low to high for I/O card support) on the BVD1/-STSCHG pin has not occurred since this register was last read. |
| 1 | A transition on the BVD1/-STSCHG pin has occurred. |

When the socket is configured for memory card support, this bit is set to a '1' when a BVD1 battery dead high-to-low transition has been detected. When the socket is configured for I/O card support, this bit is set to a '1' when the BVD1/-STSCHG pin (see page 16) changes from either high to low or low to high. This bit is reset to a '0' whenever this register is read. In I/O Card Interface mode, function of this bit is not affected by bit 7 of the Interrupt and General Control register.

Bit 1: Battery Warning Change

| | |
|---|---|
| 0 | A transition (from high to low) on the BVD2 pin has not occurred since this register was last read. |
| 1 | A transition on the BVD2 pin has occurred. |

When a socket is configured for memory card support, this bit is set to a '1' when a high-to-low transition on BVD2 occurs indicating a battery warning was detected. This bit should be ignored when the socket is configured for I/O card support. This bit is reset to a '0' whenever this register is read.

Bit 2: Ready Change

| | |
|---|---|
| 0 | A transition on the RDY/-IREQ pin has not occurred since this register was last read. |
| 1 | A transition on the RDY/-IREQ pin has occurred. |

When this bit is a '1', a change has occurred in the card RDY/-IREQ pin (see page 15). This bit will always read 0 when the card is configured as an I/O card. This bit is reset to a '0' whenever this register is read.

Bit 3: Card Detect Change

| | |
|---|---|
| 0 | A transition on the -CD1 or -CD2 pins has not occurred since this register was last read. |
| 1 | A transition on the -CD1 or -CD2 pins has occurred. |

When this bit is a '1', a change has occurred on the -CD1 or -CD2 pins (see page 16). This bit is reset to a '0' whenever this register is read.

5.6 Management Interrupt Configuration

| *Register Name:* **Management Interrupt Configuration**<br>*Index:* 5h | | | | | | *Register Per:* socket<br>*Register Compatibility Type:* 365 | |
|---|---|---|---|---|---|---|---|
| *Bit 7* | *Bit 6* | *Bit 5* | *Bit 4* | *Bit 3* | *Bit 2* | *Bit 1* | *Bit 0* |
| Management IRQ | | | | Card Detect Enable | Ready Enable | Battery Warning Enable | Battery Dead Or Status Change Enable |
| RW:0000 | | | | RW:0 | RW:0 | RW:0 | RW:0 |

This register controls which status changes may cause management interrupts and at which pin the management interrupts will appear.

Bit 0: Battery Dead Or Status Change Enable

| | |
|---|---|
| 0 | Battery Dead Or Status Change management interrupt disabled. |
| 1 | If Battery Dead Or Status Change is a '1', a management interrupt will occur. |

When this bit is a '1', a management interrupt will occur when the Card Status Change register's Battery Dead Or Status Change bit (see page 36) is a '1'. This allows management interrupts to be generated on changes in level of the BVD1/-STSCHG pin.

Bit 1: Battery Warning Enable

| | |
|---|---|
| 0 | Battery Warning Change management interrupt disabled. |
| 1 | If Battery Warning Change is a '1', a management interrupt will occur. |

When this bit is a '1', a management interrupt will occur when the Card Status Change register's Battery Warning Change bit (see page 36) is a '1'. This bit is ignored when the card socket is in I/O mode.

Bit 2: Ready Enable

| | |
|---|---|
| 0 | Ready Change management interrupt disabled. |
| 1 | If Ready Change is a '1', a management interrupt will occur. |

When this bit is a '1', a management interrupt will occur when the Card Status Change register's Ready Change bit (see page 36) is a '1'.

Bit 3: Card Detect Enable

| | |
|---|---|
| 0 | Card Detect Change management interrupt disabled. |
| 1 | If Card Detect Change is a '1', a management interrupt will occur. |

When this bit is a '1', a management interrupt will occur when the Card Status Change register's Card Detect Change bit (see page 36) is a '1'.

Bits 7-4: Management IRQ

| | |
|---|---|
| 0000 | IRQ disabled |
| 0001 | Reserved |
| 0010 | Reserved |
| 0011 | IRQ 3 |
| 0100 | IRQ 4 |
| 0101 | IRQ 5 |
| 0110 | Reserved |
| 0111 | IRQ 7 |
| 1000 | Reserved |
| 1001 | IRQ 9 |
| 1010 | IRQ 10 |
| 1011 | IRQ 11 |
| 1100 | IRQ 12 (This output may alternately be used for LED) |
| 1101 | Reserved |
| 1110 | IRQ 14 |
| 1111 | IRQ 15 (This output may alternately be used for ring indicate) |

These bits determine which interrupt pin will be used for card status change management interrupts.

5.7 Mapping Enable

| *Register Name:* **Mapping Enable**<br>*Index:* **6h** | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| I/O Map 1 Enable | I/O Map 0 Enable | MEMCS16 Full Decode | Memory Map 4 Enable | Memory Map 3 Enable | Memory Map 2 Enable | Memory Map 1 Enable | Memory Map 0 Enable |
| RW:0 | RW:0 | RW:0 | RW:0 | RW:0 | RW:0 | RW:0 | RW:0 |

Bit 0: Memory Map 0 Enable

| | |
|---|---|
| 0 | Memory Mapping registers for Memory Space 0 disabled. |
| 1 | Memory Mapping registers for Memory Space 0 enabled. |

When this bit is a '1', the Memory Mapping registers for Memory Space 0 will be enabled and the controller will respond to memory accesses in the memory space defined by those registers.

Bit 1: Memory Map 1 Enable

| | |
|---|---|
| 0 | Memory Mapping registers for Memory Space 1 disabled. |
| 1 | Memory Mapping registers for Memory Space 1 enabled. |

When this bit is a '1', the Memory Mapping registers for Memory Space 1 will be enabled and the controller will respond to memory accesses in the memory space defined by those registers.

Bit 2: Memory Map 2 Enable

| | |
|---|---|
| 0 | Memory Mapping registers for Memory Space 2 disabled. |
| 1 | Memory Mapping registers for Memory Space 2 enabled. |

When this bit is a '1', the Memory Mapping registers for Memory Space 2 will be enabled and the controller will respond to memory accesses in the memory space defined by those registers.

Bit 3: Memory Map 3 Enable

| | |
|---|---|
| 0 | Memory Mapping registers for Memory Space 3 disabled. |
| 1 | Memory Mapping registers for Memory Space 3 enabled. |

When this bit is a '1', the Memory Mapping registers for Memory Space 3 will be enabled and the controller will respond to memory accesses in the memory space defined by those registers.

Bit 4: Memory Map 4 Enable

| | |
|---|---|
| 0 | Memory Mapping registers for Memory Space 4 disabled. |
| 1 | Memory Mapping registers for Memory Space 4 enabled. |

When this bit is a '1', the Memory Mapping registers for Memory Space 4 will be enabled and the controller will respond to memory accesses in the memory space defined by those registers.

Bit 5: MEMCS16 Full Decode

This bit is not used. All addresses are used to determine the level of MEMCS16*.

Bit 6: I/O Map 0 Enable

| | |
|---|---|
| 0 | I/O Mapping registers for I/O Space 0 disabled. |
| 1 | I/O Mapping registers for I/O Space 0 enabled. |

When this bit is a '1', the I/O Mapping registers for I/O Space 0 will be enabled and the controller will respond to I/O accesses in the I/O space defined by those registers.

Bit 7: I/O Map 1 Enable

| | |
|---|---|
| 0 | I/O Mapping registers for I/O Space 1 disabled. |
| 1 | I/O Mapping registers for I/O Space 1 enabled. |

When this bit is a '1', the I/O Mapping registers for I/O Space 1 will be enabled and the controller will respond to I/O accesses in the I/O space defined by those registers.

6. I/O WINDOW MAPPING REGISTERS

The I/O windows must never include 3E0h and 3E1h.

6.1 I/O Window Control

| *Register Name:* I/O Window Control<br>*Index:* 7h | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Timing Register Select 1 | *Scratch Bit* | Auto-Size I/O Window 1 | I/O Window 1 Size | Timing Register Select 0 | *Scratch Bit* | Auto-Size I/O Window 0 | I/O Window 0 Size |
| RW:0 | RW:0 | RW:0 | RW:0 | RW:0 | RW:0 | RW:0 | RW:0 |

Bit 0: I/O Window 0 Size

| | |
|---|---|
| 0 | 8-bit data path to I/O Window 0. |
| 1 | 16-bit data path to I/O Window 0. |

When bit 1 below is a '0', this bit determines the size of the data path to I/O Window 0. When bit 1 is a '1', this bit is ignored.

Bit 1: Auto-Size I/O Window 0

| | |
|---|---|
| 0 | I/O Window 0 Size (see bit 0 above) determines the data path to I/O Window 0. |
| 1 | The data path to I/O Window 0 will be determined based on -IOIS16 returned by the card. |

This bit determines the data path to I/O Window 0. Note that when this bit is a '1', the -IOIS16 signal (see page 15) determines the width of the data path to the card.

Bit 3: Timing Register Select 0

| | |
|---|---|
| 0 | Accesses made with timing specified in Timing Set 0. |
| 1 | Accesses made with timing specified in Timing Set 1. |

This bit determines the access timing specification for I/O Window 0 (see page 57).

Bit 4: I/O Window 1 Size

| | |
|---|---|
| 0 | 8-bit data path to I/O Window 1. |
| 1 | 16-bit data path to I/O Window 1. |

When bit 5 below is a '0', this bit determines the size of the data path to I/O Window 1. When bit 5 is a '1', this bit is ignored.

Bit 5: Auto-Size I/O Window 1

| | |
|---|---|
| 0 | I/O Window 1 Size (see bit 4) determines the data path to I/O Window 1. |
| 1 | The data path to I/O Window 1 will be determined based on -IOIS16 returned by the card. |

This bit determines the width of the data path to I/O Window 1. Note that when this bit is a '1', the -IOIS16 signal (see page 15) determines the window size. This bit must be set for proper ATA mode operation (see Configuring a Socket as an ATA Drive Interface on page 61).

Bit 7: Timing Register Select 1

| | |
|---|---|
| 0 | Accesses made with timing specified in Timing Set 0. |
| 1 | Accesses made with timing specified in Timing Set 1. |

This bit determines the access timing specification for I/O Window 1 (see page 57).

6.2 I/O Map 0-1 Start Address Low

| *Register Name:* **I/O Map 0-1 Start Address Low** *Index:* **8h, Ch** | | | | | | | *Register Per:* socket *Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Start Address 7-0<br>RW:00000000 | | | | | | | |

There are two separate I/O Map Start Address Low registers, each with identical fields. These registers are located at the following indexes:

| **Index** | **I/O Map Start Address Low** |
|---|---|
| 8h | I/O Map 0 Start Address Low |
| Ch | I/O Map 1 Start Address Low |

Bits 7-0: Start Address 7-0

This register contains the least-significant byte of the address that specifies the beginning of the I/O space within the corresponding I/O map. I/O accesses that are equal or above this address and equal or below the corresponding I/O Map End Address will be mapped into the I/O space of the corresponding PCMCIA card.

The most-significant byte is located in the I/O Map 0-1 Start Address High register (see page 41).

6.3 I/O Map 0-1 Start Address High

| *Register Name:* **I/O Map 0-1 Start Address High** *Index:* **9h, Dh** | | | | | | | *Register Per:* socket *Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Start Address 15-8<br>RW:00000000 | | | | | | | |

There are two separate I/O Map Start Address High registers, each with identical fields. These registers are located at the following indexes:

| **Index** | **I/O Map Start Address High** |
|---|---|
| 9h | I/O Map 0 Start Address High |
| Dh | I/O Map 1 Start Address High |

Bits 15-8: Start Address 15-8

This register contains the most-significant byte of the Start Address. See the description of the Start Address field associated with bits 7-0 of the I/O Map 0-1 Start Address Low register (see page 41).

6.4 I/O Map 0-1 End Address Low

| *Register Name:* **I/O Map 0-1 End Address Low** *Index:* **Ah, Eh** | | | | | | | *Register Per:* socket *Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| End Address 7-0 RW:00000000 | | | | | | | |

There are two separate I/O Map End Address Low registers, each with identical fields. These registers are located at the following indexes:

| **Index** | **I/O Map End Address Low** |
|---|---|
| Ah | I/O Map 0 End Address Low |
| Eh | I/O Map 1 End Address Low |

Bits 7-0: End Address 7-0

This register contains the least-significant byte of the address that specifies the termination of the I/O space within the corresponding I/O map. I/O accesses that are equal or below this address and equal or above the corresponding I/O Map Start Address will be mapped into the I/O space of the corresponding PCMCIA card.

The most-significant byte is located in the I/O Map 0-1 End Address High register (see page 42).

6.5 I/O Map 0-1 End Address High

| *Register Name:* **I/O Map 0-1 End Address High** *Index:* **Bh, Fh** | | | | | | | *Register Per:* socket *Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| End Address 15-8 RW:00000000 | | | | | | | |

There are two separate I/O Map End Address High registers, each with identical fields. These registers are located at the following indexes:

| **Index** | **I/O Map End Address High** |
|---|---|
| Bh | I/O Map 0 End Address High |
| Fh | I/O Map 1 End Address High |

Bits 15-8: End Address 15-8

This register contains the most-significant byte of the End Address. See the description of the End Address field associated with bits 7-0 of the I/O Map 0-1 End Address Low register (see page 42).

6.6 I/O Map 0-1 Address Offset Low

| *Register Name:* **I/O Map 0-1 Address Offset Low**<br>*Index:* **36h, 38h** | | | | | | | *Register Per:* socket<br>*Register Compatibility Type:* ext. |
|---|---|---|---|---|---|---|---|
| *Bit 7* | *Bit 6* | *Bit 5* | *Bit 4* | *Bit 3* | *Bit 2* | *Bit 1* | *Bit 0* |
| Offset Address 7-1<br>RW:0000000 | | | | | | | *Scratch Bit*<br>RW:0 |

There are two separate I/O Map Address Offset Low registers, each with identical fields. These registers are located at the following indexes:

| Index | I/O Map Address Offset Low |
|---|---|
| 36h | I/O Map 0 Address Offset Low |
| 38h | I/O Map 1 Address Offset Low |

Bits 7-1: Offset Address 7-1

This register contains the least-significant byte of the quantity that will be added to the host I/O address; this will determine the PCMCIA card I/O map location where the I/O access will occur.

The most-significant byte is located in the I/O Map 0-1 Address Offset High register (see page 43).

6.7 I/O Map 0-1 Address Offset High

| *Register Name:* **I/O Map 0-1 Address Offset High**<br>*Index:* **37h, 39h** | | | | | | | *Register Per:* socket<br>*Register Compatibility Type:* ext. |
|---|---|---|---|---|---|---|---|
| *Bit 7* | *Bit 6* | *Bit 5* | *Bit 4* | *Bit 3* | *Bit 2* | *Bit 1* | *Bit 0* |
| Offset Address 15-8<br>RW:00000000 | | | | | | | |

There are two separate I/O Map Address Offset High registers, each with identical fields. These registers are located at the following indexes:

| Index | I/O Map Address Offset High |
|---|---|
| 37h | I/O Map 0 Address Offset High |
| 39h | I/O Map 1 Address Offset High |

Bits 15-8: Offset Address 15-8

This register contains the most-significant byte of the Offset Address. See the description of the End Address field associated with bits 7-1 of the I/O Map 0-1 Address Offset Low register (see page 43).

7. MEMORY WINDOW MAPPING REGISTERS

The following information about the memory map windows is important:

- The memory window mapping registers determine where in the ISA memory space and PC card memory space accesses will occur. There are five memory windows that can be used independently.
- The memory windows are enabled and disabled using the Mapping Enable register (see page 38).
- To specify where in the ISA space a memory window is mapped, start and end addresses are specified. A memory window is selected whenever the appropriate Memory Map Enable bit (see page 38) is set, and when the ISA address is greater than or equal to the appropriate Memory Map Start Address register (see page 44) and the ISA address is less than or equal to the appropriate Memory Map End Address register (see page 45).
- Start and end addresses are specified with ISA Address bits 23-12. This sets the minimum size of a memory window to 4K bytes. Memory windows are specified in the ISA address from 64K bytes to 16 Mbytes (0010000h-FFFFFFh). Note that no memory window can be mapped in the first 64K bytes of the ISA address space.
- To ensure proper operation, none of the windows can overlap in the ISA address space.

7.1 Memory Map 0-4 Start Address Low

| *Register Name:* **Memory Map 0-4 Start Address Low** | | | | | | | *Register Per:* socket |
|---|---|---|---|---|---|---|---|
| *Index:* **10h, 18h, 20h, 28h, 30h** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| Start Address 19-12 | | | | | | | |
| RW:00000000 | | | | | | | |

There are five separate Memory Map Start Address Low registers, each with identical fields. These registers are located at the following indexes:

| **Index** | **Memory Map Start Address Low** |
|---|---|
| 10h | Memory Map 0 Start Address Low |
| 18h | Memory Map 1 Start Address Low |
| 20h | Memory Map 2 Start Address Low |
| 28h | Memory Map 3 Start Address Low |
| 30h | Memory Map 4 Start Address Low |

Bits 7-0: Start Address 19-12

This register contains the least-significant byte of the address that specifies where in the memory space the corresponding memory map will begin. Memory accesses that are equal or above this address and equal or below the corresponding Memory Map End Address will be mapped into the memory space of the corresponding PCMCIA card.

The most-significant four bits are located in the Memory Map 0-4 Start Address High register (see page 45).

7.2 Memory Map 0-4 Start Address High

| Register Name: **Memory Map 0-4 Start Address High**<br>Index: **11h, 19h, 21h, 29h, 31h** | | | | Register Per: socket<br>Register Compatibility Type: 365 | | | |
|---|---|---|---|---|---|---|---|
| Bit 7 | Bit 6 | Bit 5 | Bit 4 | Bit 3 | Bit 2 | Bit 1 | Bit 0 |
| Window Data Size | Scratch Bit | Scratch Bit | Scratch Bit | Start Address 23-20 | | | |
| RW:0 | RW:0 | RW:0 | RW:0 | RW:0000 | | | |

There are five separate Memory Map Start Address High registers, each with identical fields. These registers are located at the following indexes:

| Index | Memory Map Start Address High |
|---|---|
| 11h | Memory Map 0 Start Address High |
| 19h | Memory Map 1 Start Address High |
| 21h | Memory Map 2 Start Address High |
| 29h | Memory Map 3 Start Address High |
| 31h | Memory Map 4 Start Address High |

Bits 3-0: Start Address 23-20

This field contains the most-significant four bits of the Start Address. See the description of the Start Address field associated with bits 7-0 of the Memory Map 0-4 Start Address Low register (see page 44).

Bit 7: Window Data Size

| | |
|---|---|
| 0 | 8-bit data path to the card. |
| 1 | 16-bit data path to the card. |

This bit determines the data path size to the card.

7.3 Memory Map 0-4 End Address Low

| Register Name: **Memory Map 0-4 End Address Low**<br>Index: **12h, 1Ah, 22h, 2Ah, 32h** | | | | Register Per: socket<br>Register Compatibility Type: 365 | | | |
|---|---|---|---|---|---|---|---|
| Bit 7 | Bit 6 | Bit 5 | Bit 4 | Bit 3 | Bit 2 | Bit 1 | Bit 0 |
| End Address 19-12 | | | | | | | |
| RW:00000000 | | | | | | | |

There are five separate Memory Map End Address Low registers, each with identical fields. These registers are located at the following indexes:

| Index | Memory Map End Address Low |
|---|---|
| 12h | Memory Map 0 End Address Low |
| 1Ah | Memory Map 1 End Address Low |
| 22h | Memory Map 2 End Address Low |
| 2Ah | Memory Map 3 End Address Low |
| 32h | Memory Map 4 End Address Low |

Bits 7-0: End Address 19-12

This register contains the least-significant byte of the address that specifies where in the memory space the corresponding memory map will end. Memory accesses that are equal or below this address and equal or above the corresponding Memory Map Start Address will be mapped into the memory space of the corresponding PCMCIA card.

The most-significant four bits are located in the Memory Map 0-4 End Address High register (see below).

7.4 Memory Map 0-4 End Address High

| *Register Name:* **Memory Map 0-4 End Address High** | | | | *Register Per:* socket | | | |
|---|---|---|---|---|---|---|---|
| *Index:* **13h, 1Bh, 23h, 2Bh, 33h** | | | | *Register Compatibility Type:* 365 | | | |
| *Bit 7* | *Bit 6* | *Bit 5* | *Bit 4* | *Bit 3* | *Bit 2* | *Bit 1* | *Bit 0* |
| Card Timer Select | | *Scratch Bit* | *Scratch Bit* | End Address 23-20 | | | |
| RW:00 | | RW:0 | RW:0 | RW:0000 | | | |

There are five separate Memory Map End Address High registers, each with identical fields. These registers are located at the following indexes:

| **Index** | **Memory Map End Address High** |
|---|---|
| 13h | Memory Map 0 End Address High |
| 1Bh | Memory Map 1 End Address High |
| 23h | Memory Map 2 End Address High |
| 2Bh | Memory Map 3 End Address High |
| 33h | Memory Map 4 End Address High |

Bits 3-0: End Address 23-20

This field contains the most-significant four bits of the End Address. See the description of the End Address field associated with bits 7-0 of the Memory Map 0-4 End Address Low register (see page 45).

Bits 7-6: Card Timer Select

| | |
|---|---|
| 00 | Selects Timer Set 0. |
| 01 | Selects Timer Set 1. |
| 10 | Selects Timer Set 1. |
| 11 | Selects Timer Set 1. |

This field selects the timer set. Timer Set 0 and 1 reset to values compatible with standard ISA and three-wait-state cycles (see page 57).

7.5 Memory Map 0-4 Address Offset Low

| *Register Name:* **Memory Map 0-4 Address Offset Low**<br>*Index:* **14h, 1Ch, 24h, 2Ch, 34h** | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Offset Address 19-12<br>RW:00000000 | | | | | | | |

There are five separate Memory Map Address Offset Low registers, each with identical fields. These registers are located at the following indexes:

| **Index** | **Memory Map Address Offset Low** |
|---|---|
| 14h | Memory Map 0 Address Offset Low |
| 1Ch | Memory Map 1 Address Offset Low |
| 24h | Memory Map 2 Address Offset Low |
| 2Ch | Memory Map 3 Address Offset Low |
| 34h | Memory Map 4 Address Offset Low |

Bits 7-0: Offset Address 19-12

This register contains the least-significant byte of the quantity that will be added to the host memory address that will determine where in the PCMCIA card's memory map the memory access will occur.

The most-significant six bits are located in the Memory Map 0-4 Address Offset High register (see page 47).

7.6 Memory Map 0-4 Address Offset High

| *Register Name:* **Memory Map 0-4 Address Offset High**<br>*Index:* **15h, 1Dh, 25h, 2Dh, 35h** | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Write Protect<br>RW:0 | REG Setting<br>RW:0 | Offset Address 25-20<br>RW:000000 | | | | | |

There are five separate Memory Map Address Offset High registers, each with identical fields. These registers are located at the following indexes:

| **Index** | **Memory Map Address Offset High** |
|---|---|
| 15h | Memory Map 0 Address Offset High |
| 1Dh | Memory Map 1 Address Offset High |
| 25h | Memory Map 2 Address Offset High |
| 2Dh | Memory Map 3 Address Offset High |
| 35h | Memory Map 4 Address Offset High |

Bits 5-0: Offset Address 25-20

This field contains the most-significant six bits of the Offset Address. See the description of the Offset Address field associated with bits 7-0 of the Memory Map 0-4 Address Offset Low register (see page 47).

Bit 6: REG Setting

| | |
|---|---|
| 0 | -REG (see page 14) is not active for accesses made through this window. |
| 1 | -REG is active for accesses made through this window. |

This bit determines whether -REG (see page 14) will be active for accesses made through this window. Card Information Structure (CIS) memory is accessed by setting this bit to a '1'.

Bit 7: Write Protect

| | |
|---|---|
| 0 | Writes to the card through this window are allowed. |
| 1 | Writes to the card through this window are inhibited. |

This bit determines whether writes to the card through this window are allowed.

8. EXTENSION REGISTERS

8.1 Misc Control 1

| *Register Name:* **Misc Control 1**<br>*Index:* **16h** | | | | | | | *Register Per:* socket<br>*Register Compatibility Type:* ext. |
|---|---|---|---|---|---|---|---|
| *Bit 7* | *Bit 6* | *Bit 5* | *Bit 4* | *Bit 3* | *Bit 2* | *Bit 1* | *Bit 0* |
| Inpack Enable | *Scratch Bit* | *Scratch Bit* | Speaker Enable | Pulse System IRQ | Pulse Management Interrupt | $V_{CC}$ 3.3V | 5V Detect |
| RW:0 | RW:0 | RW:0 | RW:0 | RW:0 | RW:0 | RW:0 | R |

Bit 0: 5V Detect

| | |
|---|---|
| 0 | 3.3V card detected. |
| 1 | Old or 5V card detected. |

This bit is connected to PCMCIA pin 43. Cards that will only operate at 3.3V will drive this pin to a '0'. Note that this bit is provided for possible future PCMCIA specifications.

Bit 1: $V_{CC}$ 3.3V

| | |
|---|---|
| 0 | -VCC_5 activated when card power is to be applied. |
| 1 | -VCC_3 activated when card power is to be applied. |

This bit determines which output pin is to be used to enable $V_{CC}$ power to the socket when card power is to be applied; it is used in conjunction with bits 5-4 of the Power Control register (see page 32).

Bit 2: Pulse Management Interrupt

| | |
|---|---|
| 0 | Interrupts are passed to the -INTR pin as level-sensitive. |
| 1 | When an interrupt occurs, the -INTR pin is driven with the pulse train shown in Figure 8–1 and allows for interrupt sharing. |

This bit selects Level or Pulse mode operation of the -INTR pin (see page 12). Note that a clock must be present on CLK_IN for pulsed interrupts to work.

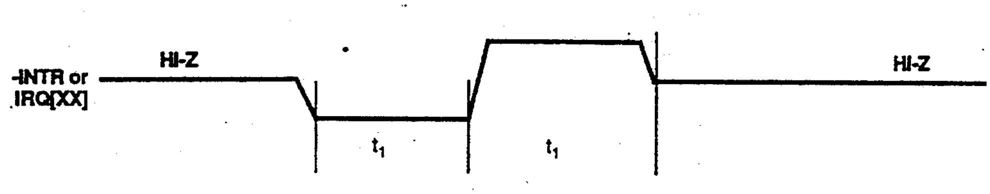

Figure 8–1. Pulse Mode Interrupts

Bit 3: Pulse System IRQ

| | |
|---|---|
| 0 | Interrupts are passed to the IRQ[XX] pin as level-sensitive. |
| 1 | When an interrupt occurs, the IRQ[XX] pin is driven with the pulse train shown in Figure 8–1 and allows for interrupt sharing. |

This bit selects Level or Pulse mode operation of the IRQ[XX] pins (see page 11).

Bit 4: Speaker Enable

| | |
|---|---|
| 0 | SPKR_OUT* is three-stated. |
| 1 | SPKR_OUT* is driven from the XOR of -SPKR from each enabled socket. |

This bit determines whether the card -SPKR pin will drive SPKR_OUT* (see page 12).

Bit 7: Inpack Enable

| | |
|---|---|
| 0 | -Inpack pin (see page 15) ignored. |
| 1 | -Inpack pin used to control data bus drivers during I/O read from the socket. |

This bit is used to determine when to drive data onto the ISA bus.

8.2 FIFO Control

| *Register Name:* **FIFO Control** *Index:* **17h** | | | | | | | *Register Per:* socket *Register Compatibility Type:* ext. |
|---|---|---|---|---|---|---|---|
| *Bit 7* | *Bit 6* | *Bit 5* | *Bit 4* | *Bit 3* | *Bit 2* | *Bit 1* | *Bit 0* |
| Empty Write FIFO | *Scratch Bit* | *Scratch Bit* | *Scratch Bit* | *Scratch Bit* | *Scratch Bit* | *Scratch Bit* | *Scratch Bit* |
| RW | RW:0 | RW:0 | RW:0 | RW:0 | RW:0 | RW:0 | RW:0 |

Bit 7: Empty Write FIFO

| Value | I/O Read | I/O Write |
|---|---|---|
| 0 | FIFO not empty | No operation occurs; default on reset |
| 1 | FIFO empty | Flush the FIFO |

This bit controls FIFO operation and reports FIFO status. When this bit is written to a '1', all data in the FIFO is lost. During read operations when this bit is a '1', the FIFO is empty. During read operations when this bit is a '0', data is still in the FIFO. This bit is used to ensure the FIFO is empty before changing timing registers.

FIFO contents will be lost whenever any of the following occur:

- PWRGOOD pin (see page 10) is a '0'.
- The card is removed.
- $V_{CC}$ Power bit (see page 33) is programmed to a '0'.

8.3 Misc Control 2

| Register Name: **Misc Control 2**<br>Index: 1Eh | | | | | | Register Per: chip<br>Register Compatibility Type: ext. | |
|---|---|---|---|---|---|---|---|
| *Bit 7* | *Bit 6* | *Bit 5* | *Bit 4* | *Bit 3* | *Bit 2* | *Bit 1* | *Bit 0* |
| IRQ15 Is RI Out | DMA System *(CL-PD6722)* | Three-State Bit 7 | Drive LED Enable | 5V Core | Suspend | Low-Power Dynamic Mode | Bypass Frequency Synthesizer |
| RW:0 | RW:0 | RW:0 | RW:0 | RW:0 | RW:0 | RW:1 | RW:0 |

Bit 0: Bypass Frequency Synthesizer

| | |
|---|---|
| 0 | Normal operation, internal clock = CLK input frequency x 7/4. |
| 1 | Internal clock = CLK input frequency (see page 13). |

This bit determines internal time base.

Bit 1: Low-Power Dynamic Mode

| | |
|---|---|
| 0 | Clock runs always. |
| 1 | Normal operation, stop clock when possible. |

This bit determines whether Low-power mode is enabled.

Bit 2: Suspend

| | |
|---|---|
| 0 | Normal operation. |
| 1 | Stop Frequency Synthesizer, enable all Low-power modes and disable socket access. |

This bit enables Suspend mode. After entering Suspend, AEN should be pulled high for lowest power consumption. When this bit is high and AEN is high, all ISA bus interface inputs are turned off. In 82386SL systems when the processor is in Suspend mode, the ISA bus interface signals float; this feature will prevent high current flow in the CL-PD67XX inputs.

Bit 3: 5V Core

| | |
|---|---|
| 0 | Normal operation: use when $V_{DD}$ pin is connected to 3.3 volts. |
| 1 | Selects input thresholds for use when 5.0 volts is connected to the CL-PD67XX $V_{DD}$ pins. |

This bit selects input threshold circuits for use when 3.3 or 5.0 volts is connected to the CL-PD67XX $V_{DD}$ pins. This bit must be set to a '1' when the $V_{DD}$ pins are connected to 5.0 volts to preserve TTL-compatible input thresholds to the card socket.

Bit 4: Drive LED Enable

| | |
|---|---|
| 0 | IRQ12 operates normally. |
| 1 | IRQ12 becomes an open-drain output suitable for driving an LED (driven whenever the card -SPKR output is turned on, and the corresponding Speaker Is LED input bit (see page 54) is set). |

NOTE: This bit should be set to a '0' if in Memory Card Interface mode.

This bit determines whether -SPKR is used to drive an LED on the IRQ12 (see page 12) for disk drives.

Bit 5: Three-State Bit 7

| | |
|---|---|
| 0 | Normal operation. |
| 1 | For socket I/O at address 03F7h and 0377h, do not drive bit 7. |

This bit enables floppy change bit compatibility.

Bit 6: DMA System (CL-PD6722 only)

| | |
|---|---|
| 0 | Configured for non-DMA mode on the CL-PD6722. |
| 1 | Configured for DMA mode on the CL-PD6722. |

This bit is reserved for the CL-PD6710 and CL-PD6720. On the CL-PD6722, this bit is used to configure system interface signals for normal or DMA operation. At reset, the signals IRQ9, IRQ10, and -VPP_VALID are in non-DMA mode, and this bit is set to a '0'. When this bit is set to a '1', the IRQ9, IRQ10, and -VPP_VALID pins are reconfigured for DMA operation. Refer to Chapter 11 for a funtional description of these pins during DMA operation.

Bit 7: IRQ15 Is RI Out

| | |
|---|---|
| 0 | Normal IRQ15 operation. |
| 1 | IRQ15 is connected to Ring Indicate pin on the host processor. |

This bit determines the function of the IRQ15 pin. When configured for ring indicate, IRQ15 is used to resume the 82386SL processor when a high-to-low change is detected on the -STSCHG pin.

8.4 Chip Information

| *Register Name:* **Chip Information** *Index:* **1Fh** | | | | | | | *Register Per:* chip *Register Compatibility Type:* ext. |
|---|---|---|---|---|---|---|---|
| *Bit 7* | *Bit 6* | *Bit 5* | *Bit 4* | *Bit 3* | *Bit 2* | *Bit 1* | *Bit 0* |
| Chip Identification | | Dual/Single Slot* | CL-PD67XX Revision Level | | | *Scratch Bit* | *Scratch Bit* |
| R:11 | | R[a] | R:111 | | | RW:0 | RW:0 |

[a] The value for CL-PD6710 is a '0', and the value for CL-PD672X is '1'.

Bits 4-2: CL-PD67XX Revision Level

This field identifies the revision of the controller. The initial value is 111b. Contact Cirrus Logic for more information on revision levels for the CL-PD6710, CL-PD6720 and CL-PD6722.

Bit 5:Dual/Single Slot*

| | |
|---|---|
| 0 | Chip identified as a single-socket controller. |
| 1 | Chip identified as a dual-socket controller. |

This bit specifies the number of sockets supported by the CL-PD67XX.

Bits 7-6: Chip Identification

| | |
|---|---|
| 00 | Second read after I/O write to this register. |
| 11 | First read after I/O write to this register. |

This field identifies the CL-PD67XX device. After chip reset or doing an I/O write to this register, the first read of this register will return a 11b. On the next read, this field will be 00b. This pattern of toggling data on subsequent reads may be used by software to determine presence of the device in a system.

8.5 ATA Control

| *Register Name:* **ATA Control** *Index:* **26h** | | | | | | | *Register Per:* socket *Register Compatibility Type:* ext. |
|---|---|---|---|---|---|---|---|
| *Bit 7* | *Bit 6* | *Bit 5* | *Bit 4* | *Bit 3* | *Bit 2* | *Bit 1* | *Bit 0* |
| A25/CSEL | A24/M/S* | A23/VU | A22 | A21 | *Scratch Bit* | Speaker is LED Input | ATA Mode |
| RW:0 | RW:0 | RW:0 | RW:0 | RW:0 | RW:0 | RW:0 | RW:0 |

Bit 0: ATA Mode

| | |
|---|---|
| 0 | Normal operation. |
| 1 | Configures the socket interface to handle ATA-type disk drives. |

This bit re-configures the particular socket as an ATA drive interface. Refer to Table 10–1 on page 60 for PCMCIA socket pin definitions in ATA mode.

Bit 1: Speaker Is LED Input

| | |
|---|---|
| 0 | Normal operation. |
| 1 | The PCMCIA -SPKR pin will be used to drive IRQ12 if Drive LED Enable (see page 51) is set. |

This bit changes the function of the PCMCIA pin -SPKR (see page 16) from digital speaker input to disk status LED input.

When in I/O Card or ATA mode, setting this bit to a '1' reconfigures the socket BVD2/-SPKR input to serve as a socket's -LED input. In this function, activity on the socket BVD2/-SPKR input affects neither -SPKR_OUT nor IRQ12.

NOTE: This bit should be set to a '0' if in Memory Card Interface mode.

Bit 3: A21

In ATA mode, the value in this bit is applied to the ATA A21 pin and is vendor-specific. Certain ATA drive vendor-specific performance enhancements beyond the PCMCIA 2.1 standard may be controlled through use of this bit.

This bit has no hardware control function when not in ATA mode.

Bit 4: A22

In ATA mode, the value in this bit is applied to the ATA A22 pin and is vendor-specific. Certain ATA drive vendor-specific performance enhancements beyond the PCMCIA 2.1 standard may be controlled through use of this bit.

This bit has no hardware control function when not in ATA mode.

Bit 5: A23/VU

In ATA mode, the value in this bit is applied to the ATA A23 pin and is vendor-specific. Certain ATA drive vendor-specific performance enhancements beyond the PCMCIA 2.1 standard may be controlled through use of this bit.

This bit has no hardware control function when not in ATA mode.

Bit 6: A24/M/S*

In ATA mode, the value in this bit is applied to the ATA A24 pin and is vendor-specific. Certain ATA drive vendor-specific performance enhancements beyond the PCMCIA 2.1 standard may be controlled through use of this bit.

This bit has no hardware control function when not in ATA mode.

Bit 7: A25/CSEL

In ATA mode, the value in this bit is applied to the ATA A25 pin and is vendor-specific. Certain ATA drive vendor-specific performance enhancements beyond the PCMCIA 2.1 standard may be controlled through use of this bit.

This bit has no hardware control function when not in ATA mode.

8.6 Extension Index (CL-PD6722 only)

| Register Name: **Extension Index** Index: 2Eh | | | | | | | Register Per: socket Register Compatibility Type: ext. |
|---|---|---|---|---|---|---|---|
| Bit 7 | Bit 6 | Bit 5 | Bit 4 | Bit 3 | Bit 2 | Bit 1 | Bit 0 |
| Extension Register Index<br>RW:00000000 | | | | | | | |

This register applies to the CL-PD6722 only. It controls which of the following three registers at index 2Fh can be written to:

| Register Name at Index 2Fh | Extension Register Index |
|---|---|
| Data Mask 0 | 01h |
| Data Mask 1 | 02h |
| DMA Control | 03h |

8.7 Extension Data (CL-PD6722 only)

This register applies to the CL-PD6722 only.

8.7.1 Data Mask 0

| Register Name: **Data Mask 0** Index: 2Fh | | | Extension: 01h | | | | Register Per: socket Register Compatibility Type: ext. |
|---|---|---|---|---|---|---|---|
| Bit 7 | Bit 6 | Bit 5 | Bit 4 | Bit 3 | Bit 2 | Bit 1 | Bit 0 |
| Data Mask Select 0<br>RW:00000000 | | | | | | | |

On the CL-PD6722, Data Mask 0 is the mask register for I/O Map 0. For each bit set in the Data Mask Select 0 field, the corresponding data bit will not be driven when the host addresses PCMCIA I/O addresses in the I/O Map 0 range. If this register is set to 00h, then all data bits will be driven from the PCMCIA card to the ISA bus (this is the reset condition). If any bits are set to a '1', accesses to the I/O Map 0 range of I/O on the PCMCIA card will be forced to 8-bit operation on the ISA side. If, for example, I/O Map 0 registers are set for the range 3F7h to 3F7h, I/O Map 1 registers are set for the range 3F0h to 3F6h, Data Mask Select 0 is set to 7Fh, and a floppy drive is the PCMCIA device, then the conflict between the floppy address 3F7h and the hard disk register at 3F7h would not cause a conflict on the ISA bus — the floppy change bit would be correctly presented to the host.

8.7.2 Data Mask 1

| Register Name: **Data Mask 1**<br>Index: **2Fh** | | | Extension: 02h | | | Register Per: socket<br>Register Compatibility Type: ext. | |
|---|---|---|---|---|---|---|---|
| Bit 7 | Bit 6 | Bit 5 | Bit 4 | Bit 3 | Bit 2 | Bit 1 | Bit 0 |
| Data Mask Select 1<br>RW:00000000 | | | | | | | |

On the CL-PD6722, the Data Mask 1 register operates the same as the Data Mask 0 register but acts on I/O addresses in the range indicated by the I/O Map 1 registers.

8.7.3 DMA Control

| Register Name: **DMA Control**<br>Index: **2Fh** | | | Extension: 03h | | | Register Per: socket<br>Register Compatibility Type: ext. | |
|---|---|---|---|---|---|---|---|
| Bit 7 | Bit 6 | Bit 5 | Bit 4 | Bit 3 | Bit 2 | Bit 1 | Bit 0 |
| DMA Enable<br>RW:00 | | Disable Socket Pull-Ups<br>RW:0 | 0<br>RW:0 | 0<br>RW:0 | 0<br>RW:0 | 0<br>RW:0 | 0<br>RW:0 |

Bit 5: Disable Socket Pull-Ups

| | |
|---|---|
| 0 | Enable socket pull-ups on the -CD2, -CD1, and 5V_DET pins. |
| 1 | Disable socket pull-ups on the -CD2, -CD1, and 5V_DET pins. |

On the CL-PD6722, this bit can be used in conjunction with suspend actions to further reduce power when a card is installed in the socket. Normally the -CD2, -CD1, and 5V_DET socket interface pins are internally pulled up to the +5V supply pin's level, which is necessary for card insertion and card voltage detection. During conditions such as system power down, where no detection of card insertion is needed, these pull-ups can be turned off.

NOTE: It is recommended that this bit only be set to '1' if a card is present in the socket to prevent floating input conditions on -CD2 and -CD1. When this bit is set to '1', and the management interrupt is configured for Card Detect Enable, management interrupts might also occur if no card is installed.

Bit 7-6: DMA Enable

On the CL-PD6722, DMA Enable bits 6 and 7 enable the DMA operation of the PCMCIA socket. At reset these bits are set to a '0', and this is non-DMA mode. If either or both of these bits is set, the socket is in DMA mode. The three codes that cause DMA mode also select the use of one of three pins for the active-low -DREQ input at the PCMCIA interface.

| Bit 7 | Bit 6 | Pin Used |
|---|---|---|
| 0 | 1 | -INPACK |
| 1 | 0 | WP/-IOIS16 |
| 1 | 1 | BVD2/-SPKR |

For cards requiring DMA services but also needing input acknowledge functionality, or needing to indicate the size of I/O registers within a window, or needing digital speaker or LED operation, the selection of the -DREQ signal to the socket is made to be as flexible as possible.

9. TIMING REGISTERS

The following information about the timing registers is important:

- All timing registers take effect immediately and should only be changed when the FIFO is empty (see the FIFO Control register on page 50).
- Selection of Timing 0 or Timing 1 register sets is controlled by I/O Window Control, bit 3 and/or bit 7 (see page 40).

9.1 Setup Timing 0-1

| *Register Name:* **Setup Timing 0-1**<br>*Index:* **3Ah, 3Dh** | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Setup Prescaler Select | | Setup Multiplier Value | | | | | |
| RW:00 | | RW:000001 | | | | | |

There are two separate Setup Timing registers, each with identical fields. These registers are located at the following indexes:

| **Index** | **Setup Timing** |
|---|---|
| 3Ah | Setup Timing 0 |
| 3Dh | Setup Timing 1 |

The Setup Timing register for each timing set controls how long a PCMCIA cycle's command (i.e., -OE, -WE, -IORD, -IOWR; see page 15) setup will be, in terms of the number of internal clock cycles.

The overall command setup timing length S is programmed by selecting a 2-bit prescaling value (bits 7-6 of this register) representing weights of 1, 16, 256, or 4096, and then selecting a multiplier value (bits 5-0) to which that prescaler is multiplied to produce the overall command setup timing length according to the following formula:

$$S = (N_{pres} \times N_{val}) + 1$$

The value of S, representing the number of clock cycles for command setup, is then multiplied by the clock period to determine the actual command setup time (see Section 12.3.4 for further discussion).

Bits 5-0: Setup Multiplier Value

This field indicates an integer value $N_{val}$ from 0 to 63; it is combined with a prescaler value (bits 7-6) to control the length of setup time before a command becomes active.

Bits 7-6: Setup Prescaler Select

| | |
|---|---|
| 00 | $N_{pres} = 1$ |
| 01 | $N_{pres} = 16$ |
| 10 | $N_{pres} = 256$ |
| 11 | $N_{pres} = 4096$ |

This field chooses one of four prescaler values $N_{pres}$ that are combined with the value of the Setup Multiplier Value (bits 5-0) to control the length of setup time before a command becomes active.

9.2 Command Timing 0-1

| *Register Name:* **Command Timing 0-1** | | | | | | | *Register Per:* socket |
|---|---|---|---|---|---|---|---|
| *Index:* **3Bh, 3Eh** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| Command Prescaler Select | | Command Multiplier Value | | | | | |
| RW:00 | | RW:001111/000110[a] | | | | | |

[a] Timing set 0 (index 3Bh) resets to 06h for socket timing equal to standard AT-bus-based cycle times. Timing set 1 (3Eh) resets to 0Fh for socket timings equal to standard AT-bus timing using one additional wait state.

There are two separate Command Timing registers, each with identical fields. These registers are located at the following indexes:

| **Index** | **Command Timing** |
|---|---|
| 3Bh | Command Timing 0 |
| 3Eh | Command Timing 1 |

The Command Timing register for each timing set controls how long a PCMCIA cycle's command (i.e., -OE, -WE, -IORD, -IOWR; see page 15) active time will be, in terms of the number of internal clock cycles.

The overall command timing length C is programmed by selecting a 2-bit prescaling value (bits 7-6 of this register) representing weights of 1, 16, 256, or 4096, and then selecting a multiplier value (bits 5-0) to which that prescaler is multiplied to produce the overall command timing length according to the following formula:

$$C = (N_{pres} \times N_{val}) + 1$$

The value of C, representing the number of clock cycles for a command, is then multiplied by the clock period to determine the actual command active time (see Section 12.3.4 for further discussion).

Bits 5-0: Command Multiplier Value

This field indicates an integer value $N_{val}$ from 0 to 63; it is combined with a prescaler value (bits 7-6) to control the length that a command is active.

Bits 7-6: Command Prescaler Select

| | |
|---|---|
| 00 | $N_{pres} = 1$ |
| 01 | $N_{pres} = 16$ |
| 10 | $N_{pres} = 256$ |
| 11 | $N_{pres} = 4096$ |

This field chooses one of four prescaler values $N_{pres}$ that are combined with the value of the Command Multiplier Value (bits 5-0) to control the length that a command is active.

9.3 Recovery Timing 0-1

| *Register Name:* **Recovery Timing 0-1** | | | | | | | *Register Per:* socket |
|---|---|---|---|---|---|---|---|
| *Index:* **3Ch, 3Fh** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| Recovery Prescaler Select | | Recovery Multiplier Value | | | | | |
| RW:00 | | RW:000000 | | | | | |

There are two separate Recover Timing registers, each with identical fields. These registers are located at the following indexes:

| **Index** | **Recovery Timing** |
|---|---|
| 3Ch | Recovery Timing 0 |
| 3Fh | Recovery Timing 1 |

The Recovery Timing register for each timing set controls how long a PCMCIA cycle's command (i.e., -OE, -WE, -IORD, -IOWR; see page 15) recovery will be, in terms of the number of internal clock cycles.

The overall command recovery timing length R is programmed by selecting a 2-bit prescaling value (bits 7-6 of this register) representing weights of 1, 16, 256, or 4096, and then selecting a multiplier value (bits 5-0) to which that prescaler is multiplied to produce the overall command recovery timing length according to the following formula:

$$R = (N_{pres} \times N_{val}) + 2$$ [1]

NOTE: Notice that this formula is slightly different than those for setup and command.

The value of R, representing the number of clock cycles for command recovery, is then multiplied by the clock period to determine the actual command recovery time (see Section 12.3.4 for further discussion).

Bits 5-0: Recovery Multiplier Value

This field indicates an integer value $N_{val}$ from 0 to 63; it is combined with a prescaler value (bits 7-6) to control the length of recovery time after a command is active.

Bits 7-6: Recovery Prescaler Select

| | |
|---|---|
| 00 | $N_{pres} = 1$ |
| 01 | $N_{pres} = 16$ |
| 10 | $N_{pres} = 256$ |
| 11 | $N_{pres} = 4096$ |

This field chooses one of four prescaler values $N_{pres}$ that are combined with the value of the Recovery Multiplier Value (bits 5-0) to control the length of recovery time after a command is active.

[1] If socket cycles are back-to-back, $R = (N_{pres} \times N_{val}) + 1$.

10. ATA MODE OPERATION

The CL-PD6710 and CL-PD672X card interfaces can be dynamically configured to support a PCMCIA 2.1-compatible ATA disk interface instead of the standard PCMCIA 2.1 PC card interface. The ATA interface allows disk drives that can be made mechanically-compatible with PCMCIA card dimensions to operate in the socket by using the ATA (commonly known as 'IDE') electrical interface.

Configuration of a socket to support ATA operation changes the function of certain card socket signals to support the needs of the ATA disk interface. Table 10–1 lists each interface pin and its function when a CL-PD6710 or CL-PD672X card socket is operating in ATA mode.

All register functions of the CL-PD67XX are available in ATA mode, including socket power control, interface signal disabling, and card window control.

Table 10–1. ATA Pin Cross Reference

| PCMCIA Socket Pin Number | PC Card Interface Function | ATA Interface Function | PCMCIA Socket Pin Number | PC Card Interface Function | ATA Interface Function |
|---|---|---|---|---|---|
| 1 | Ground | Ground | 35 | Ground | Ground |
| 2 | D3 | D3 | 36 | -CD1 | -CD1 |
| 3 | D4 | D4 | 37 | D11 | D11 |
| 4 | D5 | D5 | 38 | D12 | D12 |
| 5 | D6 | D6 | 39 | D13 | D13 |
| 6 | D7 | D7 | 40 | D14 | D14 |
| 7 | -CE1 | CS0* | 41 | D15 | D15 |
| 8 | A10 | N/C | 42 | -CE2 | CS1* |
| 9 | -OE | 0 | 43 | — | — |
| 10 | A11 | N/C | 44 | -IORD | -IORD |
| 11 | A9 | CS1* | 45 | -IOWR | -IOWR |
| 12 | A8 | N/C | 46 | A17 | N/C |
| 13 | A13 | N/C | 47 | A18 | N/C |
| 14 | A14 | N/C | 48 | A19 | N/C |
| 15 | -WE | N/C | 49 | A20 | N/C |
| 16 | -IREQ | IREQ | 50 | A21 | N/C |
| 17 | VCC | VCC | 51 | VCC | VCC |
| 18 | VPP1 | N/C | 52 | VPP2 | N/C |
| 19 | A16 | N/C | 53 | A22 | N/C |
| 20 | A15 | N/C | 54 | A23 | VU |

† Not supported by the CL-PD67XX.

Table 10–1. ATA Pin Cross Reference *(cont.)*

| PCMCIA Socket Pin Number | PC Card Interface Function | ATA Interface Function | PCMCIA Socket Pin Number | PC Card Interface Function | ATA Interface Function |
|---|---|---|---|---|---|
| 21 | A12 | N/C | 55 | A24 | M/S* |
| 22 | A7 | N/C | 56 | A25 | CSEL |
| 23 | A6 | N/C | 57 | N/C | N/C |
| 24 | A5 | N/C | 58 | RESET | RESET* |
| 25 | A4 | N/C | 59 | -WAIT | IOCHRDY |
| 26 | A3 | N/C | 60 | -INPACK | DREQ † |
| 27 | A2 | A2 | 61 | -REG | DACK* † |
| 28 | A1 | A1 | 62 | -SPKR | LED* |
| 29 | A0 | A0 | 63 | -STSCHG | PDIAG* † |
| 30 | D0 | D0 | 64 | D8 | D8 |
| 31 | D1 | D1 | 65 | D9 | D9 |
| 32 | D2 | D2 | 66 | D10 | D10 |
| 33 | -IOIS16 | -IOIS16 | 67 | -CD2 | -CD2 |
| 34 | Ground | Ground | 68 | Ground | Ground |

† Not supported by the CL-PD67XX.

Configuring a Socket as an ATA Drive Interface

There are three configuration operations to make a card socket serve as an ATA drive interface:

1. The first operation is to configure the pins of the selected socket as an ATA interface. This is done by setting bit 0 of the ATA Control register (see page 53) to a '1'.

This configures PCMCIA socket pins as ATA signals, described in Table 10–1.

2. The second operation is to configure the socket's registers for ATA-compatible timing and operation.

Table 10–2 lists register values to be used to configure a card socket for ATA operation. Note that table values listed below assume card Socket 0 is being configured for ATA and that appropriate index offsets would be added for card Socket 1, 2, or 3 configuration.

NOTE: For a card socket to operate in ATA mode, socket timing needs to be set to Timing Set 0's default values as described in the previous section and as controlled by I/O Window Control, bit 3 (see page 40).

Table 10–2. Register Values to Configure Card Socket 0 as ATA Interface

| Register Index | Register Value | Description |
|---|---|---|
| 07h | 02h | Auto-Size Window 0 size is based on -IOIS16 pin in **Data** register. |
| 03h | 6Eh | Sets Card Is I/O for I/O, removes Card Reset, and sets IRQ Level to IRQ14 in the **Interrupt and General Control** register. |
| 08h | F0h | I/O Map 0 Start Address Low to be used for CS0*. |
| 09h | 01h | I/O Map 0 Start Address High to be used for CS0*. |
| 0Ah | F7h | I/O Map 0 End Address Low to be used for CS0*. |
| 0Bh | 01h | I/O Map 0 End Address High to be used for CS0*. |
| 0Ch | F6h | I/O Map 1 Start Address Low to be used for CS1*. |
| 0Dh | 03h | I/O Map 1 Start Address High to be used for CS1*. |
| 0Eh | F7h | I/O Map 1 End Address Low to be used for CS1*. |
| 0Fh | 03h | I/O Map 1 End Address High to be used for CS1*. |
| 36h | 00h | Zero all I/O Map 0-1 Address Offset registers. |
| 37h | 00h | Zero all I/O Map 0-1 Address Offset registers. |
| 38h | 00h | Zero all I/O Map 0-1 Address Offset registers. |
| 39h | 00h | Zero all I/O Map 0-1 Address Offset registers. |
| 26h | 03h | Speaker output pin is configured to drive an LED, set ATA mode in **ATA Control** register. |
| 06h | C0h | Enable I/O Maps in **Mapping Enable** register. |
| 1Eh | 32h | Three-State Bit 7 when reading 03F7h, 0377h and use Low-power Dynamic mode, drive LED on IRQ12 pin in **Misc Control 2** register. |
| 02h | B0h | Turn on power to the drive in **Power Control** register. |

3. If the CL-PD67XX is to drive a disk status LED, then the third operation is to configure the CL-PD67XX for drive LED support.

Each socket configured as an ATA interface may have its -SPKR input (PCMCIA pin 62) control an open-collector LED driver; an alternate function for the CL-PD67XX IRQ12 pin. The ATA Control register, bit 1 enables the -SPKR input to be used as an active-low -LED input from the ATA drive.

The CL-PD67XX has on-chip pull-ups on each socket's -SPKR input that are enabled whenever ATA mode on that socket is activated and the socket's -SPKR input is re-configured for LED support. These pull-ups allow compatibility with drives that produce open-collector LED controls.

Once a socket input has been configured as an LED input, the alternate function of the IRQ12 pin must be selected so that it becomes the open-collector disk status LED driver. This is done by setting Misc Control 2, bit 4 (see page 51) to a '1'.

In applications where more than one socket on a CL-PD67XX is configured as an ATA interface, both LED inputs are negatively OR'ed together to create the open-collector LED drive output on the IRQ12 pin.

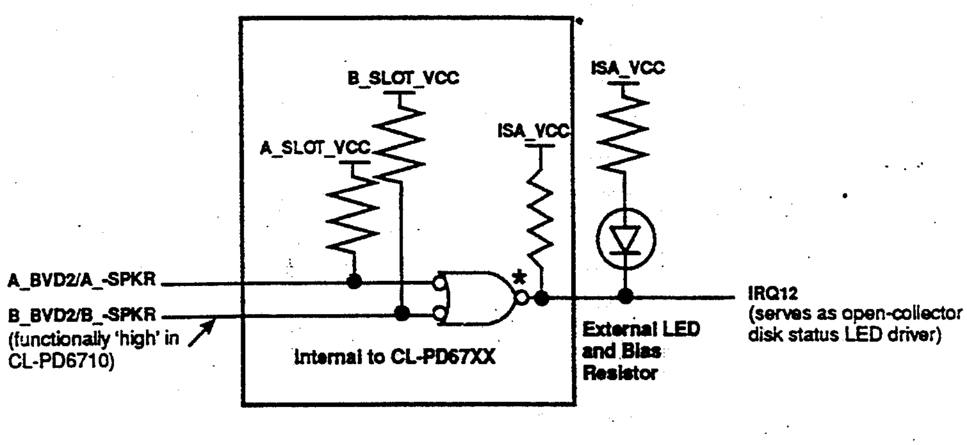
Figure 10–1. Disk-Status LED Logic for ATA Mode

11. DMA OPERATION (CL-PD6722)

11.1 DMA Capabilities of the CL-PD6722

The CL-PD6722 includes support of a DMA-capable PCMCIA card slave and the movement of DMA data to/from the card with the ISA bus as a DMA master.

Only one socket at a time should be enabled for DMA transfer because the ISA bus DMA handshake signals are shared between both socket interfaces.

DMA transfers to and from the DMA-capable PCMCIA card may be 8- or 16-bit, as indicated by the size of the ISA bus DMA cycle.[1]

11.2 DMA-Type PCMCIA Cycles

Transfer of DMA data to or from a card is achieved through use of a special DMA-type PCMCIA interface cycle. This cycle is defined in such a way as to not conflict with standard PCMCIA memory or I/O cycles.

A card that is DMA-capable is able to distinguish PCMCIA interface cycle types presented by the CL-PD6722 according to the following table:

Table 11–1. Four Card Cycle Types for DMA-Type PCMCIA Interface

| Socket Interface Cycle Type | Function of -WE/-OE | Function of -IORD/-IOWR | Function of -REG |
|---|---|---|---|
| Card Memory Read/Write | Data Transfer Signaling | Always Inactive High | Always Inactive High |
| Attribute Memory Read/Write | Data Transfer Signaling | Always Inactive High | Always Low |
| Card I/O Read/Write | Always Inactive High | Data Transfer Signaling | Low = Non-DMA I/O Cycle |
| Card DMA Data Read/Write | Terminal Count Outputs | Data Transfer Signaling | High = DMA Cycle |

NOTE: DMA Control register bits 7 and 6 must be nonzero for table to be true; otherwise only standard PCMCIA cycles will be issued to the card.

The PCMCIA address is also undefined during the DMA read or write cycle.

Card DMA data read and card DMA data write cycles are those used to transfer DMA data to or from a DMA-capable PCMCIA card. These cycles are distinguished from normal card I/O cycles by the -REG signal being high during the cycle, which is an undefined condition in the PCMCIA 2.1 specification.

11.3 ISA Bus DMA Handshake Signal

A DMA request from the card is passed to the ISA bus as long as the socket interface FIFO is empty. IRQ10 is used as the DMA request output to the ISA bus when Misc Control 2 register, bit 2 is a '1'. When Misc Control 2 register, bit 2 is a '1', IRQ9 is redefined as the active-low DMA acknowledge input from the ISA bus. This signal must remain active for all DMA transfers through the CL-PD6722.

[1] Transfer size at socket interface is the same as transfer size on an ISA bus. For 8-bit DMA transfers, connect CL-PD6722 DMA handshake signals to ISA bus DMA channels 0, 1, 2, or 3. For 16-bit transfers, connect CL-PD6722 DMA handshake signals to ISA bus DMA channels 5, 6, or 7.

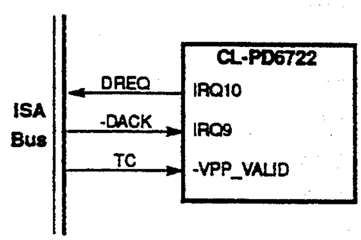

Figure 11–1. DMA Handshake Connections to the ISA Bus to Make the CL-PD6722 DMA-Capable

Terminal counts are passed through to the card from the CL-PD6722 -VPP_VALID pin when Misc Control 2 register, bit 6 is a '1'. For a DMA write process, the last-cycle terminal count condition is indicated by -WE being active-low during a card DMA data read cycle. For a DMA read process, terminal count is indicated by -OE being active-low during the last card cycle.

11.4 Configuring the CL-PD6722 Registers for a DMA Transfer

The following steps in register programming are done to configure a CL-PD6722 socket interface for DMA transfer to/from a DMA-capable PCMCIA card:

1. Select which pin on the PCMCIA interface will serve as the DMA request input.
2. Configure the socket interface as I/O-capable.
3. Prevent dual-interpretation of socket interface DMA handshake signals.
4. Set the DMA Enable bit.

11.4.1 Programming the DMA Request Pin from the Card

The CL-PD6722 allows selection of one of three PCMCIA interface inputs to be redefined as the DMA request input, and it also allows programming of the active level of the selected input. This is done by setting bits 7 and 6 of the DMA Control register to the desired values matching those of the DMA-capable PCMCIA card to be used.

Once this selection of DMA request input has been done, the PCMCIA interface is now configured at the signal level for DMA card interfacing.

The following table shows how the CL-PD6722 socket interface signals get redefined when a card is in DMA card interface mode:

| Standard I/O Card I/F Signal Name | DMA-Capable Card Interface Signal Usage | When Signal Redefinition for DMA Interface is Effective |
|---|---|---|
| -IOIS16 | -IOIS16 or may be selected as the active-low DMA request input | DMA Control register bits 7-6 = '10' |
| (BVD2/) -SPKR/-LED | -SPKR/-LED or may be selected as the active-low DMA request input | DMA Control register bits 7-6 = '11' |
| -INPACK | -INPACK or may be selected as the active-low DMA request input | DMA Controlregister bits 7-6 = '01' |
| -REG | -REG during standard cycles, active-high -DACK during DMA r/w cycles | Only during actual card DMA read or write cycle |
| -OE | -OE during standard cycles, active-low -TC during DMA read cycles | During DMA read cycles: i.e., when -REG high and -IOWR low |
| -WE | -WE during standard cycles, active-low -TC during DMA write cycles | During DMA write cycles: i.e., when -REG high and -IORD low |

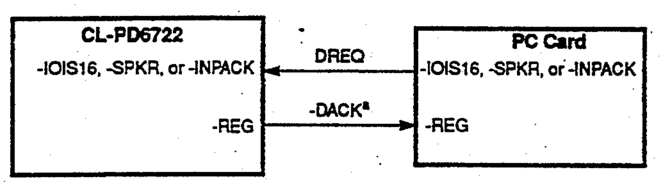

[a] A DMA cycle is the DMA acknowledge to the card.

Figure 11–2. Card DMA Request and Acknowledge Handshake

Notice that DMA acknowledge to the card as -REG high is only active during the actual DMA read or write card cycle. This means there is no mechanism to deassert DACK to the card: the card must understand that receiving the first DMA cycle is its DMA acknowledgment.

11.4.2 Configuring the Socket Interface for I/O

For DMA support, Interrupt and General Control register bit 5 must be set to '1' to put the card interface in I/O and Memory card interface mode.

11.4.3 Preventing Dual Interpretation of DMA Handshake Signals

If the WP/-IOIS16 pin is being used as the DMA request line, the following should be considered:

1) Interface Status register bit 4 is now the level of the DMA request line from the card.
2) Bit 5 in the socket's two I/O Window Control registers should be set to '0'.

If BVD2/-SPKR pin is being considered as the DMA request line, the following should be considered: speaker or LED output from this socket is not available.

If -INPACK is selected as the DMA request input, then bit 7 of the Misc Control 1 register should be set to '0' to disable use of this signal as input acknowledge control.

No other register bits require any special settings to accommodate DMA support on a socket interface.

11.4.4 Turning On DMA System

The DMA System bit (Misc Control 2 register bit 6) should be programmed to '1' to allow DMA operation and to redefine ISA bus interface pins for DMA support as in Figure 11–1.

11.5 The DMA Transfer Process

As soon as the selected DMA request input from the card goes active-low and the FIFO goes empty, IRQ10 goes active-high signifying a DMA request to the system. The system then responds with an active-low -DACK at IRQ9, which enables the CL-PD6722 to decode any ISA bus DMA transfers that may occur and perform the corresponding transfers at the card. Normal card I/O or memory reads or writes may be interspersed with DMA read and write cycles.

11.6 Terminal Count to Card at Conclusion of Transfer

At the conclusion of each transfer process, systems send active-high terminal count (TC) pulses to the -VPP_VALID pin during the last DMA cycles to the CL-PD6722.

For a DMA write cycle, TC active will be signaled at the socket interface as the -OE pin going low during DMA-type PCMCIA read cycles from the card.

For a DMA read cycle, TC active will be signaled as the -WE pin going low during DMA-type PCMCIA write cycles to the card.

12. ELECTRICAL SPECIFICATIONS

12.1 Absolute Maximum Ratings

| Description | Absolute Maximum Rating[a] |
|---|---|
| Ambient temperature under bias | 0 to 70°C |
| Storage temperature | -65 to 150°C |
| Voltage on any pin (with respect to ground) | -0.3 volts to 0.3 volts greater than voltage of +5V pin, respective to ground |
| Operating power dissipation | 500 mW |
| Suspend power dissipation | 10 mW |
| Power supply voltage | 7 volts |
| Injection current (latch up) | 25 mA |

[a] Stresses above those listed may cause permanent damage to system components. These are stress ratings only; functional operation at these or any conditions above those indicated in the operational sections of this specification is not implied. Exposure to absolute maximum rating conditions for extended periods may affect system reliability.

12.2 DC Specifications

Table 12–1. General DC Specifications

| Symbol | Parameter | MIN | MAX | Unit | Conditions |
|---|---|---|---|---|---|
| $C_{IN}$ | Input Capacitance | | 10.0 | pF | |
| $C_{OUT}$ | Output Capacitance | | 10.0 | pF | |
| $I_{IL}$ | Input Leakage | -10.0 | 10.0 | µA | $0 < V_{IN} <$ respective $V_{CC}$ supply pin |
| $I_{PU}$ | Internal Pull-up Current | -30 | -400 | µA | |

Table 12–2. PCMCIA Bus Interface DC Specifications

| Symbol | Parameter | MIN | MAX | Unit | Conditions |
|---|---|---|---|---|---|
| $SLOT\_VCC_{5V}$ | Power Supply Voltage | 4.5 | 5.5 | V | Normal operation |
| $SLOT\_VCC_{3V}$ | Power Supply Voltage | 3.0 | 3.6 | V | Normal operation |
| $V_{IH}$ | Input High Voltage | 2.0 | | V | $V_{DD}$ core voltage = 3.0V, Misc Control 2 register, bit 3 = 0 |
| | | 2.0 | | V | $V_{DD}$ core voltage = 4.5V, Misc Control 2 register, bit 3 = 1 |
| $V_{IL}$ | Input Low Voltage | | 0.8 | V | $V_{DD}$ core voltage = 3.6V, Misc Control 2 register, bit 3 = 0 |
| | | | 0.8 | V | $V_{DD}$ core voltage = 5.5V, Misc Control 2 register, bit 3 = 1 |
| $V_{IHC}$ | Input High Voltage CMOS | 0.7 $V_{DD}$ | | V | $V_{DD}$ core voltage = 4.5V, Misc Control 2 register, bit 3 = 0 |
| $V_{ILC}$ | Input Low Voltage CMOS | | 0.2 $V_{DD}$ | V | $V_{DD}$ core voltage = 5.5V, Misc Control 2 register, bit 3 = 0 |
| $V_{OH}$ | Output High Voltage | 2.4 | | V | At rated $I_{OH}$, respective SLOT_VCC = 3.0V |
| $V_{OHC}$ | Output High Voltage CMOS | SLOT_VCC – 0.5 | | V | At rated $I_{OHC}$, respective SLOT_VCC = 3.0V |
| $V_{OL}$ | Output Low Voltage | | 0.4 | V | At rated $I_{OL}$ |
| $I_{OH}$ | Output High Current | -2 | | mA | Respective SLOT_VCC = 3.0V, $V_{OH}$ = 2.4V |
| $I_{OHC}$ | Output High Current CMOS | -1 | | mA | Respective SLOT_VCC = 3.0V, $V_{OHC}$ = SLOT_VCC – 0.5 |
| $I_{OL}$ | Output Low Current | 2 | | mA | Respective SLOT_VCC = 3.0V, $V_{OL}$ = 0.4V |

Table 12-3. ISA Bus Interface DC Specifications

| Symbol | Parameter | MIN | MAX | Unit | Conditions |
|---|---|---|---|---|---|
| $ISA\_VCC_{5V}$ | Power Supply Voltage | 4.5 | 5.5 | V | Normal operation |
| $ISA\_VCC_{3V}$ | Power Supply Voltage | 3.0 | 3.6 | V | Normal operation |
| $V_{IH}$[a] | Input High Voltage | 2.0 | | V | $V_{DD}$ core voltage = 3.0V |
| $V_{IL}$[a] | Input Low Voltage | | 0.8 | V | $V_{DD}$ core voltage = 3.6V |
| $V_{IHC}$[a] | Input High Voltage CMOS | 0.7 $V_{DD}$[b] | | V | $V_{DD}$ core voltage = 4.5V |
| $V_{ILC}$[a] | Input Low Voltage CMOS | | 0.2 $V_{DD}$[b] | V | $V_{DD}$ core voltage = 5.5V |
| $V_{OH}$ | Output High Voltage | 2.4 | | V | At rated $I_{OH}$, ISA_VCC = 3.0V |
| $V_{OHC}$ | Output High Voltage CMOS | ISA_VCC − 0.5 | | V | At rated $I_{OHC}$, ISA_VCC = 3.0V |
| $V_{OL}$ | Output Low Voltage | | 0.4 | V | At rated $I_{OL}$ |
| $I_{OH}$ | Output Current High, 2-mA-type driver | -2 | | mA | ISA_VCC = 3.0V, $V_{OH}$ = 2.4V |
| | Output Current High, 12-mA-type driver | -5 | | mA | |
| | Output Current High, 16-mA-type driver | -5 | | mA | |
| $I_{OHC}$ | Output Current High CMOS, 2-mA-type driver | -1 | | mA | ISA_VCC = 3.0V, $V_{OHC}$ = ISA_VCC − 0.5V |
| | Output Current High CMOS, 12-mA-type driver | -1 | | mA | |
| | Output Current High CMOS, 16-mA-type driver | -1 | | mA | |
| $I_{OL}$ | Output Current Low, 2-mA-type driver | 2 | | mA | ISA_VCC = 3.0V, $V_{OL}$ = 0.4V |
| | Output Current Low, 12-mA-type driver | 12 | | mA | |
| | Output Current Low, 16-mA-type driver | 16 | | mA | |

[a] When the $V_{DD}$ core voltage is 3.3V, input thresholds are TTL compatible; when the $V_{DD}$ core voltage is 5V, input thresholds are CMOS compatible.

[b] The value of the input threshold level is dependent on the voltage applied to $V_{DD}$ pins of the CL-PD67XX.

Table 12–4. Power Control Interface (+5V Powered) DC Specifications

| Symbol | Parameter | MIN | MAX | Unit | Conditions |
|---|---|---|---|---|---|
| +5V | +5V Supply Voltage | Highest $V_{CC} - 0.3$ | 5.5 | V | |
| $V_{IH}$ | Input High Voltage | 2.0 | | V | +5V pin voltage = 4.5V |
| $V_{IL}$ | Input Low Voltage | | 0.8 | V | +5V pin voltage = 5.5V |
| $V_{OH}$ | Output High Voltage | 2.4 | | V | +5V pin voltage = 4.5V, $I_{OH}$ = -5 mA |
| $V_{OHC}$ | Output High Voltage CMOS | +5V voltage – 0.5 | | V | +5V pin voltage = 4.5V, $I_{OH}$ = -1 mA |
| $V_{OL}$ | Output Low Voltage | | 0.4 | V | |
| $I_{OH}$ | Output Current High, 16-mA-type driver | -5 | | mA | Respective +5V pin voltage = 4.5V, $V_{OH}$ = 2.4V |
| $I_{OHC}$ | Output Current High CMOS, 16-mA-type driver | -1 | | mA | Respective +5V pin voltage = 4.5V, $V_{OHC}$ = +5V pin voltage – 0.5V |
| $I_{OL}$ | Output Current Low, 16-mA-type driver | 16 | | mA | Respective +5V pin voltage = 4.5V, $V_{OL}$ = 0.4V |

Table 12–5. Operating Current Specifications

| Symbol | Parameter | MIN | TYP | MAX | Unit | Conditions |
|---|---|---|---|---|---|---|
| $Icc_{tot(1)}$ | Power Supply Current, operating | < 6 | 8 | < 20 | mA | $V_{DD}$ core voltage = 3.3V; +5V, SLOT_VCC, and ISA_VCC = 5.0V; $P_{DISS}$ = < 85 mW |
| $Icc_{tot(2)}$ | Power Supply Current, Suspend | | < 150 | | µA | $V_{DD}$ core voltage = 3.3V; +5V, SLOT_VCC, and ISA_VCC = 5.0V; $P_{DISS}$ = < 2 mW |
| $Icc_{tot(3)}$ | Power Supply Current, Super Suspend, No Clocks | | < 20 | | µA | $V_{DD}$ core voltage = 3.3V; +5V, SLOT_VCC, and ISA_VCC = 5.0V; $P_{DISS}$ = < 1 mW |

12.3 AC Timing Specifications

This section includes system timing requirements for the CL-PD67XX. Timings are provided in nanoseconds (ns), at TTL input levels, with the ambient temperature varying from 0 to 70°C, and $V_{CC}$ varying from 3.0 to 5.5V DC. The AT bus speed is 10 MHz unless otherwise noted. Note that an asterisk (*) denotes an active-low signal for the ISA bus interface, and a dash (-) denotes an active-low signal for the PCMCIA socket interface.

Additionally, the following statements are true for all timing information:

- All timings assume a load of 50 pF.
- TTL signals are measured at TTL threshold; CMOS signals are measured at CMOS threshold.

Table 12–6. Index of AC Timing Specifications

| Title | Page Number |
|---|---|
| Table 12–7. ISA Bus Timing | 73 |
| Table 12–8. Reset Timing | 75 |
| Table 12–9. Input Clock Specification | 76 |
| Table 12–10. Memory Read/Write Timing | 78 |
| Table 12–11. Word I/O Read/Write Timing | 79 |
| Table 12–12. PCMCIA Read/Write Timing When Host is 8-Bit | 80 |
| Table 12–13. Normal Byte Read/Write Timing | 81 |
| Table 12–14. Word-To-Byte Conversion, Odd Byte I/O Read/Write Timing | 82 |
| Table 12–15. DMA Read Cycle Timing | 83 |
| Table 12–16. DMA Write Cycle Timing | 84 |
| Table 12–17. DMA Request Timing | 86 |

12.3.1 Bus Timing — ISA Bus

Table 12-7. ISA Bus Timing

| Symbol | Parameter | MIN | MAX | Unit |
|---|---|---|---|---|
| $t_1$ | MEMCS16* active delay from LA[23:17] valid | | 40 | ns |
| $t_{1a}$ | LA[23:17] setup to ALE inactive | 30 | | ns |
| $t_{1b}$ | LA[23:17] hold from ALE inactive | 5 | | ns |
| $t_2$ | IOCS16* active delay from SA[15:0][1] | | 30 | ns |
| $t_{2a}$ | IOCS16* inactive delay from SA[15:0][1] | | 30 | ns |
| $t_3$ | SA[16:0], SBHE* setup to any Command active[1,2]<br>LA[23:17] latching by ALE to any Command active | 30<br>90 | | ns<br>ns |
| $t_4$ | Any Command active to IOCHRDY inactive (low)[3] | | 40 | ns |
| $t_{4a}$ | IOCHRDY three-state from Command inactive[4] | 5 | 30 | |
| $t_5$ | MEMCS16* inactive delay from unlatched LA[23:17] | | 40 | ns |
| $t_{6a}$ | IOW* or IOR* pulse width[1] | 140 | | ns |
| $t_{6b}$ | MEMW* or MEMR* pulse width[1] | 180 | | ns |
| $t_7$ | Any Command inactive to next Command active | 100 | | ns |
| $t_8$ | Address or SBHE* hold from any Command inactive | 0 | | ns |
| $t_9$ | Data valid from MEMW* active[5]<br>Data valid from IOW* active | | 40<br>40 | ns<br>ns |
| $t_{10}$ | Data hold from MEMW* inactive<br>Data hold from IOW* inactive | 0<br>0 | | ns<br>ns |
| $t_{11}$ | Data delay from IOR* active, for internal registers | 0 | 130 | ns |
| $t_{12}$ | Data delay from IOCHRDY active | | 15 | ns |
| $t_{13}$ | Data hold from IOR* or MEMR* inactive | 0 | 20 | ns |
| $t_{14}$ | AEN inactive setup to valid IOR* or IOW* active | 40 | | ns |
| $t_{15}$ | AEN hold from IOR* or IOW* inactive | 5 | | ns |
| $t_{16}$ | REFRESH* inactive setup to valid MEMR* or MEMW* active | 40 | | ns |
| $t_{17}$ | REFRESH* inactive hold from MEMR* or MEMW* active | 0 | | ns |
| $t_{18}$ | MEMCS16* active delay from SA[16:12] valid | | 30 | ns |
| $t_{19}$ | *ZWS delay from MEMW* active | | 30 | ns |
| $t_{20}$ | *ZWS hold from MEMW* inactive | | 15 | ns |

1 AEN must be inactive for $t_2$, $t_3$, and $t_6$ timing specifications to be applicable.
2 Command is defined as IOR*, IOW*, MEMR*, or MEMW*.
3 Except for valid card memory writes, which are zero wait state when internal write FIFO is not full.
4 If card is removed during a card access cycle, IOCHRDY is three-stated without waiting for end of Command.
5 Based on 25-MHz internal clock, produced either by an internal synthesizer and 14.318-MHz signal applied to CLK pin, or by supplying 25 MHz directly to CLK pin and bypassing the internal synthesizer.

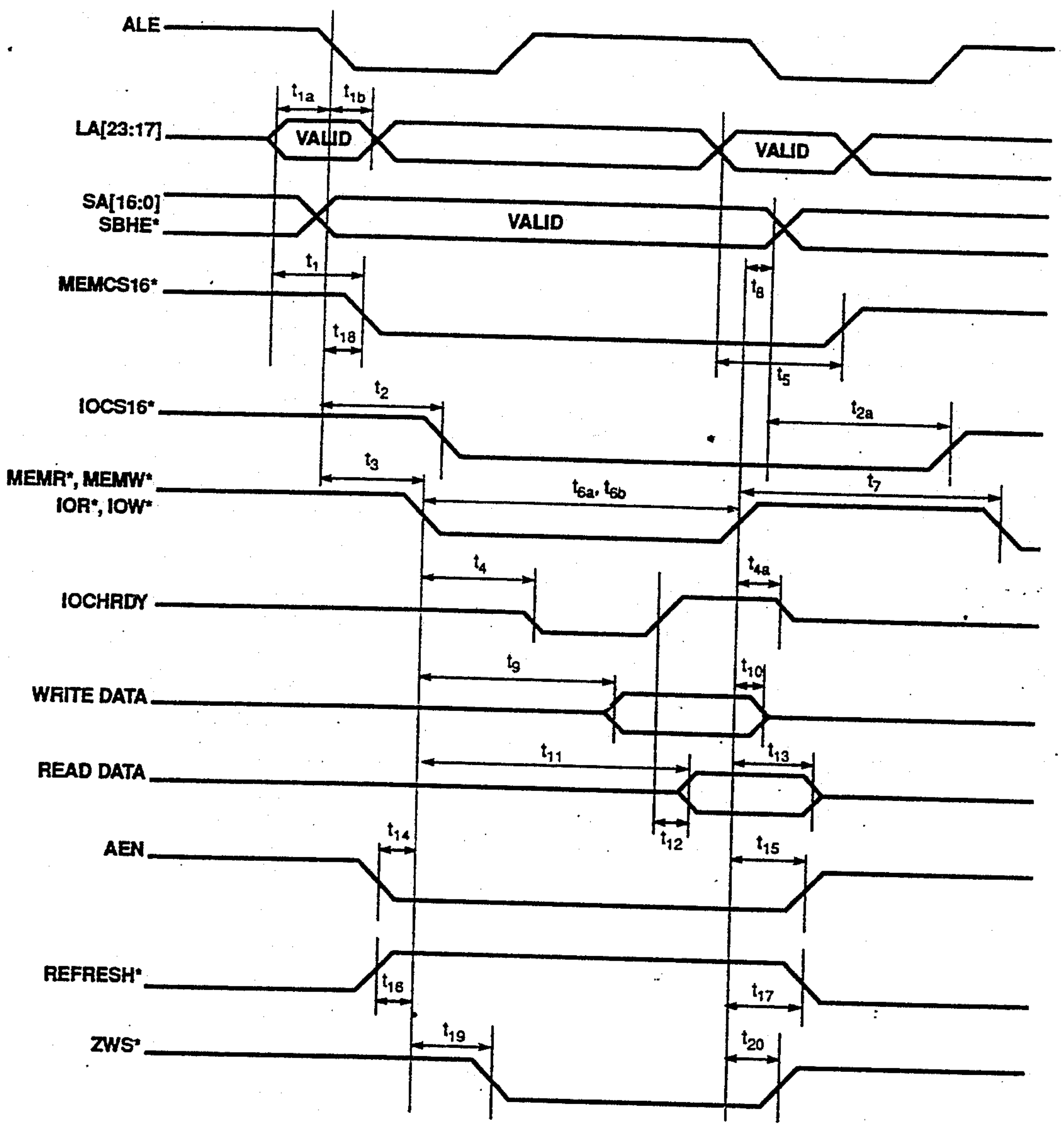
Figure 12–1. Bus Timing — ISA Bus

12.3.2 Reset Timing

Table 12–8. Reset Timing

| Symbol | Parameter | MIN | MAX | Units |
|---|---|---|---|---|
| $t_1$ | PWRGOOD generated reset pulse width | 500 | | ns |
| $t_2$ | Clock active before end of reset[1] | 500 | | ns |
| $t_3$ | End of PWRGOOD generated reset to first Command | 500 | | ns |

[1] Clock input must be active for a minimum of 500 ns before PWRGOOD goes active to allow sufficient internal clocks to initialize internal circuitry.

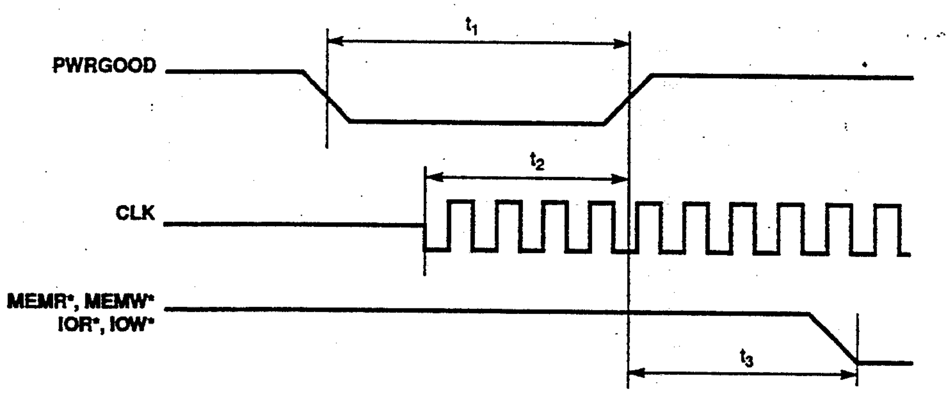

Figure 12–2. Reset Timing

12.3.3 Input Clock Specification

Table 12–9. Input Clock Specification

| Symbol | Parameter | MIN | MAX | Units | Conditions |
|---|---|---|---|---|---|
| $t_1$ | CLK pin input rise time | 1 | 7 | ns | |
| $t_2$ | CLK pin input fall time | 1 | 7 | ns | |
| $t_3$ | CLK input low period | 0.4 $T_{CLKP}$ | 0.6 $T_{CLKP}$ | ns | |
| $t_4$ | CLK input high period | 0.4 $T_{CLKP}$ | 0.6 $T_{CLKP}$ | ns | |
| $V_{center}$ | Center voltage at which period specified | 0.5 $V_{DD}$ | 0.5 $V_{DD}$ | V | |
| $T_{CLKP}$ | Input clock period, internal clock | 69.84 – 0.1% | 69.84 + 0.1% | ns | Normal synthesizer operation. Misc Control 2 register, bit 0 = '0'. CLK pin at 14.318 MHz. |
| $T_{CLKP}$ | Input clock period, external clock | 40 – 0.1% | 40 + 0.1% | ns | Synthesizer bypassed. Misc Control 2 register, bit 0 = '1'. CLK pin at 25 MHz. |
| $V_{IHmin}$ | CLK input high voltage | 2.0 | | V | $V_{DD}$ core voltage = 3.0V |
| $V_{ILmax}$ | CLK input low voltage | | 0.8 | V | $V_{DD}$ core voltage = 3.6V |
| $V_{IHCmin}$ | CLK input high voltage | 0.7 $V_{DD}$ | | V | $V_{DD}$ core voltage = 4.5V |
| $V_{ILCmax}$ | CLK input low voltage | | 0.2 $V_{DD}$ | V | $V_{DD}$ core voltage = 5.5V |

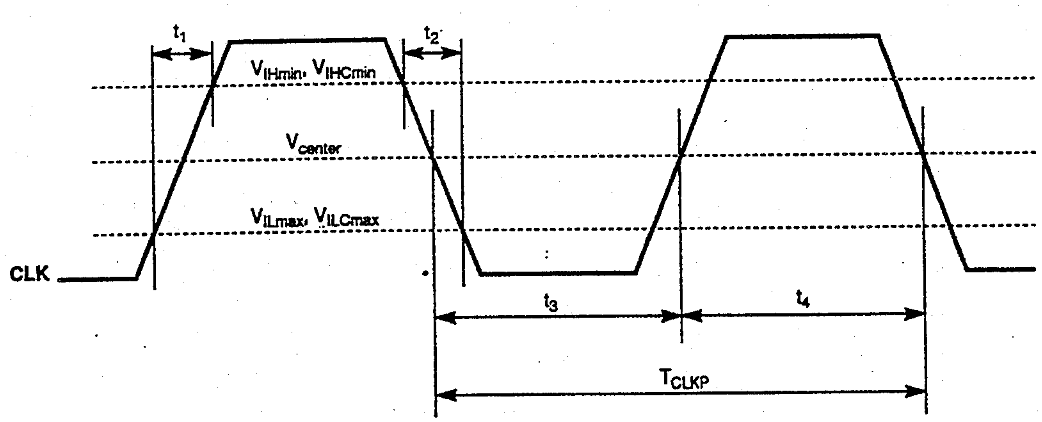

Figure 12–3. Input Clock Specification

12.3.4 PCMCIA Bus Timing Calculations

Calculations for minimum PCMCIA cycle Setup, Command, and Recovery timings are made by first calculating factors derived from the applicable timing set's timing registers and then by applying the factor to an equation relating it to the internal clock period.

The PCMCIA cycle timing factors, in terms of the number of internal clocks, are calculated as follows:

$$S = (N_{pres} \times N_{val}) + 1$$

$$C = (N_{pres} \times N_{val}) + 1$$

$$R = (N_{pres} \times N_{val}) + 2^{1}$$

$N_{pres}$ and $N_{val}$ are the specific selected prescaler and multiplier value from the timing set's Setup, Command, and Recovery Timing registers (see Chapter 9 for description of these registers).

From this, a PCMCIA cycle's Setup, Command, and Recovery time for the selected timing set are calculated as follows:

$$\text{Minimum Setup time} = (S \times Tcp) - 10 \text{ ns}$$

$$\text{Minimum Command time} = (C \times Tcp) - 10 \text{ ns}$$

$$\text{Minimum Recovery time} = (R \times Tcp) - 10 \text{ ns}$$

When the internal synthesizer is used, the calculation of the internal clock period Tcp is:

$$Tcp = T_{CLKP} \times 4/7$$

where $T_{CLKP}$ is the period of the clock supplied to the CLK input pin. An input frequency of 14.318 MHz at the CLK input pin results in an internal clock period of Tcp = 40 ns.

When the internal synthesizer is bypassed, Tcp = $T_{CLKP}$. An input frequency of 25 MHz in this circumstance would also result in an internal clock period of Tcp = 40 ns.

The timing diagrams that follow were derived for a CL-PD67XX using the internal synthesizer and a 14.318-MHz CLK pin input. The internal clock frequency of the CL-PD67XX is 7/4 of this incoming signal (Tcp = 40 ns). The examples are for the default values of the Timing registers for timing set 0, as follows:

| Timing Register Name (Timing Set 0) | Index | Value (Default) | Resultant $N_{pres}$ | Resultant $N_{val}$ |
|---|---|---|---|---|
| Setup Timing 0 | 3Ah | 01h | 1 | 1 |
| Command Timing 0 | 3Bh | 06h | 1 | 6 |
| Recovery Timing 0 | 3Ch | 00h | 1 | 0 |

Thus the minimum times are as follows:

$$\text{Minimum Setup time} = (S \times Tcp) - 10 \text{ ns} = \{[(1 \times 1) + 1] \times 40 \text{ ns}\} - 10 \text{ ns} = \mathbf{70\ ns}$$

$$\text{Minimum Command time} = (C \times Tcp) - 10 \text{ ns} = \{[(1 \times 6) + 1] \times 40 \text{ ns}\} - 10 \text{ ns} = \mathbf{270\ ns}$$

$$\text{Minimum Recovery time} = (R \times Tcp) - 10 \text{ ns} = \{[(1 \times 0) + 2] \times 40 \text{ ns}\} - 10 \text{ ns} = \mathbf{70\ ns}$$

[1] If socket cycles are back-to-back, then $R = (N_{pres} \times N_{val}) + 1$.

12.3.5 Bus Timing — PCMCIA Bus

Table 12–10. Memory Read/Write Timing

| Symbol | Parameter | MIN | MAX | Units |
|---|---|---|---|---|
| $t_1$ | -CE[2:1], -REG, Address, and Write Data setup to Command active[1] | (S x Tcp) – 10 | | ns |
| $t_2$ | Command pulse width[2] | (C x Tcp) – 10 | | ns |
| $t_3$ | Address hold and Write Data valid from Command inactive[3] | (R x Tcp) – 10 | | ns |
| $t_4$ | -WAIT active from Command active | | (C – 2)Tcp – 10 | ns |
| $t_5$ | Command hold from -WAIT inactive | 2 Tcp | | ns |
| $t_6$ | Data setup before -OE inactive | (2 Tcp) +10 | | ns |
| $t_7$ | Data hold after -OE inactive | 0 | | ns |
| $t_8$ | Data valid from -WAIT inactive | Tcp + 10 | | ns |

[1] The Setup time is determined by the value programmed into the Setup Timing register, index 3Ah/3Dh. Using the timing set 0 default value of 01h, the setup time would be 70 ns. S = ($N_{pres}$ x $N_{val}$ + 1), see page 77.

[2] The Command time is determined by the value programmed into the Command Timing register, index 3Bh/3Eh. Using the timing set 0 default value of 06h, the Command time would be 270 ns. C = ($N_{pres}$ x $N_{val}$ + 1), see page 77.

[3] The Recovery time is determined by the value programmed into the Recovery Timing register, index 3Ch/3Fh. Using the timing set 0 default value of 00h, the hold (Recovery) time would be 70 ns. Generally, R = ($N_{pres}$ x $N_{val}$ + 2), see page 77.

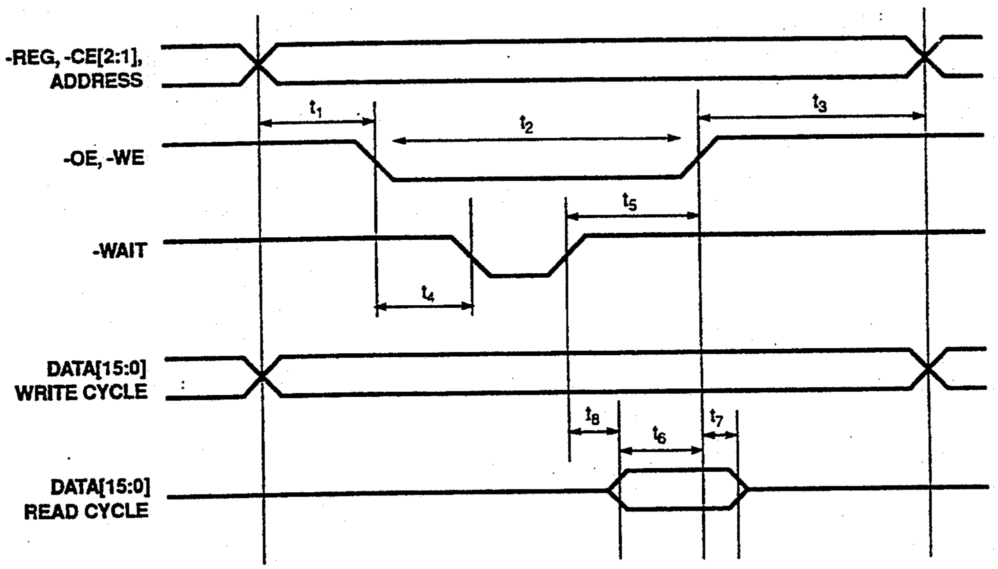

Figure 12–4. Memory Read/Write Timing

Table 12–11. Word I/O Read/Write Timing

| Symbol | Parameter | MIN | MAX | Units |
|---|---|---|---|---|
| $t_1$ | -REG or Address setup to Command active[1] | (S x Tcp) – 10 | | ns |
| $t_2$ | Command pulse width[2] | (C x Tcp) – 10 | | ns |
| $t_3$ | Address hold and Write Data valid from Command inactive[3] | (R x Tcp) – 10 | | ns |
| $t_{ref}$ | Card -IOIS16 delay from valid Address | | 35 | ns |
| $t_4$ | -IOIS16 setup time before Command end | (3 Tcp) + 10 | | ns |
| $t_5$ | -CE2 delay from -IOIS16 active[4] | Tcp – 10 | | ns |
| $t_6$ | Data setup before -IORD inactive | (2 Tcp) + 10 | | ns |
| $t_7$ | Data hold after -IORD inactive | 0 | | ns |

[1] The Setup time is determined by the value programmed into the Setup Timing register, index 3Ah/3Dh. Using the timing set 0 default value of 01h, the setup time would be 70 ns. $S = (N_{pres} \times N_{val} + 1)$, see page 77.

[2] The Command time is determined by the value programmed into the Command Timing register, index 3Bh/3Eh. Using the timing set 0 default value of 06h, the Command time would be 270 ns. $C = (N_{pres} \times N_{val} + 1)$, see page 77.

[3] The Recovery time is determined by the value programmed into the Recovery Timing register, index 3Ch/3Fh. Using the timing set 0 default value of 00h, the hold (Recovery) time would be 70 ns. Generally, $R = (N_{pres} \times N_{val} + 2)$, see page 77.

[4] -IOIS16 must go low within 3Tcp + 10 ns of the cycle beginning or -IOIS16 will be ignored and -CE will not be activated.

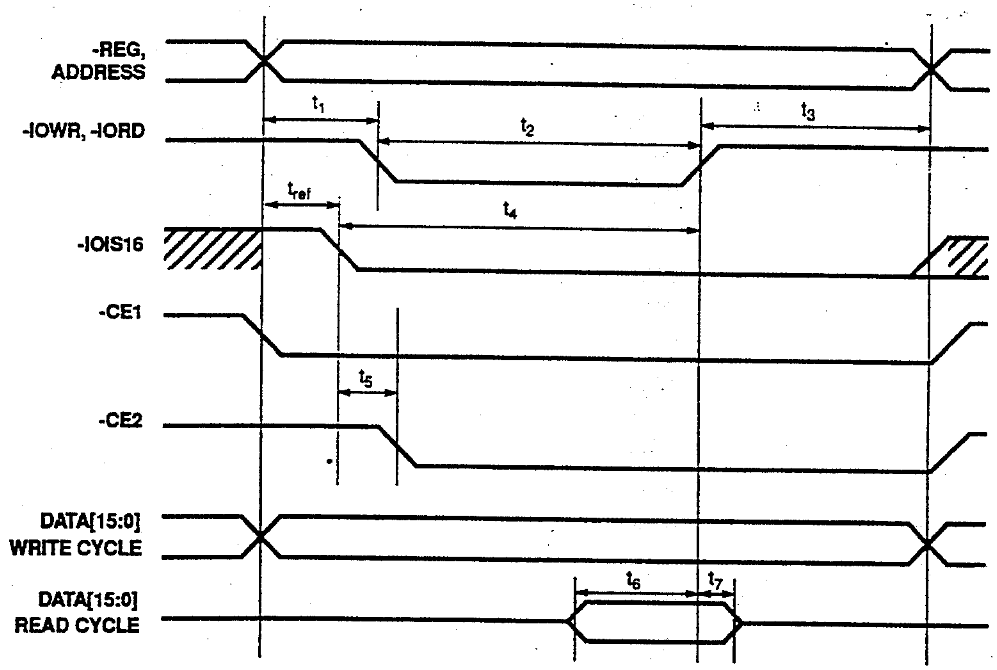

Figure 12–5. Word I/O Read/Write Timing

Table 12–12. PCMCIA Read/Write Timing When Host Is 8-Bit

| Symbol | Parameter | MIN | MAX | Units |
|---|---|---|---|---|
| $t_1$ | -REG or Address setup to Command active[1] | (S x Tcp) – 10 | | ns |
| $t_2$ | Command pulse width[2] | (C x Tcp) – 10 | | ns |
| $t_3$ | Address hold from Command inactive[3] | (R x Tcp) – 10 | | ns |
| $t_4$ | Data setup before Command inactive | (2 Tcp) + 10 | | ns |
| $t_5$ | Data hold after command inactive | 0 | | ns |

[1] The Setup time is determined by the value programmed into the Setup Timing register, index 3Ah/3Dh. Using the timing set 0 default value of 01h, the setup time would be 70 ns. S = ($N_{pres}$ x $N_{val}$ + 1), see page 77.
[2] The Command time is determined by the value programmed into the Command Timing register, index 3Bh/3Eh. Using the timing set 0 default value of 06h, the Command time would be 270 ns. C = ($N_{pres}$ x $N_{val}$ + 1), see page 77.
[3] The Recovery time is determined by the value programmed into the Recovery Timing register, index 3Ch/3Fh. Using the timing set 0 default value of 00h, the hold (Recovery) time would be 70 ns. Generally, R = ($N_{pres}$ x $N_{val}$ + 2), see page 77.

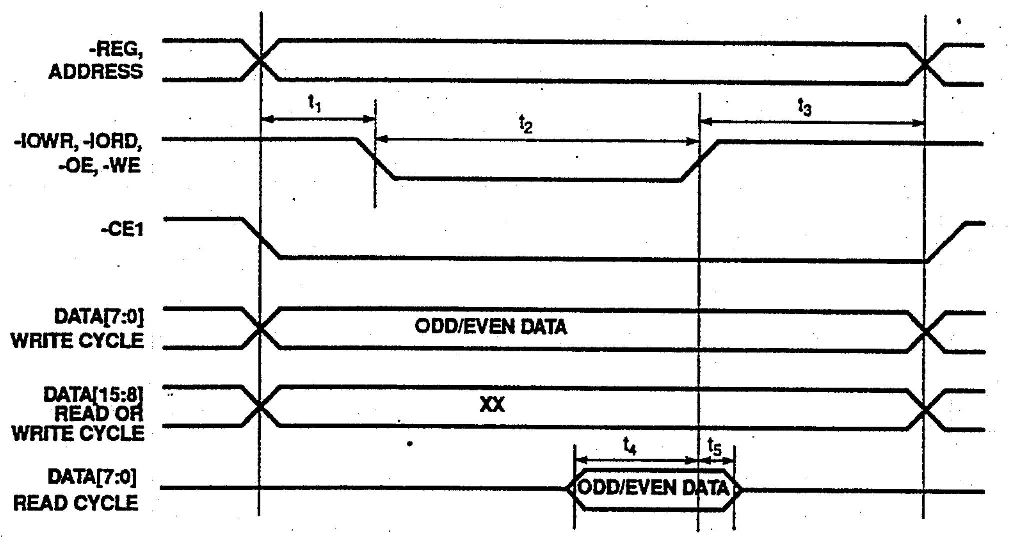

Figure 12–6. PCMCIA Read/Write Timing When Host Is 8-Bit (SBHE Tied High)

Table 12–13. Normal Byte Read/Write Timing

| Symbol | Parameter | MIN | MAX | Units |
|---|---|---|---|---|
| $t_1$ | Address setup to Command active[1] | (S x Tcp) – 10 | | ns |
| $t_2$ | Command pulse width[2] | (C x Tcp) – 10 | | ns |
| $t_3$ | Address hold from Command inactive[3] | (R x Tcp) – 10 | | ns |

[1] The Setup time is determined by the value programmed into the Setup Timing register, index 3Ah/3Dh. Using the timing set 0 default value of 01h, the setup time would be 70 ns. S = ($N_{pres}$ x $N_{val}$ + 1), see page 77.

[2] The Command time is determined by the value programmed into the Command Timing register, index 3Bh/3Eh. Using the timing set 0 default value of 06h, the Command time would be 270 ns. C = ($N_{pres}$ x $N_{val}$ + 1), see page 77.

[3] The Recovery time is determined by the value programmed into the Recovery Timing register, index 3Ch/3Fh. Using the timing set 0 default value of 00h, the hold (Recovery) time would be 70 ns. Generally, R = ($N_{pres}$ x $N_{val}$ + 2), see page 77.

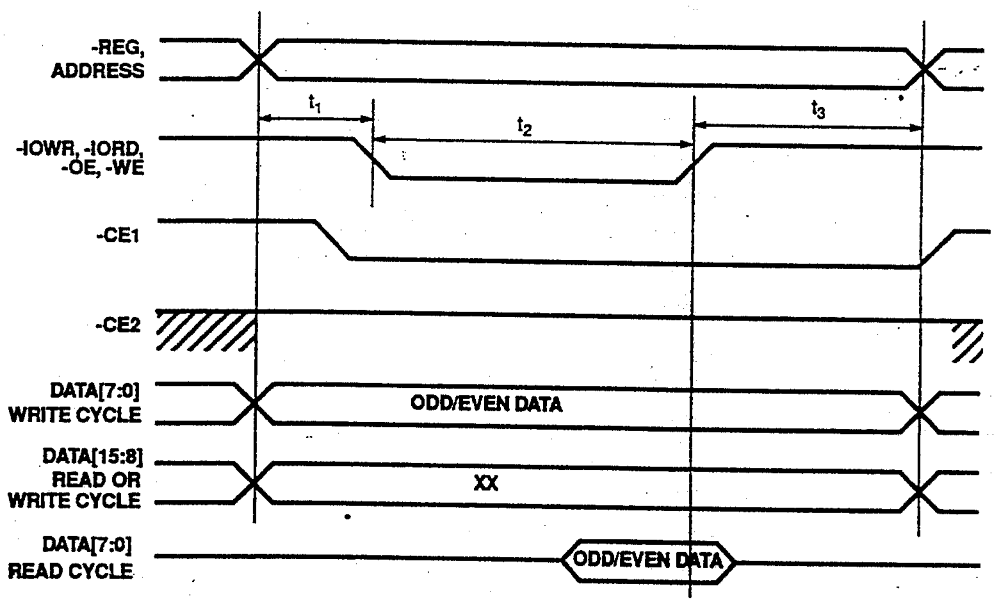

Figure 12–7. Normal Byte Read/Write Timing (e.g., All Other Byte Accesses, Including Odd I/O Cycles Where -IOIS16 is Low)

Table 12–14. Word-To-Byte Conversion, Odd Byte I/O Read/Write Timing

| Symbol | Parameter | MIN | MAX | Units |
|---|---|---|---|---|
| $t_1$ | Address setup to Command active[1] | (S x Tcp) – 10 | | ns |
| $t_2$ | Command pulse width[2] | (C x Tcp) – 10 | | ns |
| $t_3$ | Address hold from Command inactive[3] | (R x Tcp) – 10 | | ns |
| $t_4$ | -IOIS16 inactive to -CE1 active[4] | 20 | | ns |
| $t_5$ | -IOIS16 inactive to -CE2 inactive | 20 | | ns |

1 The Setup time is determined by the value programmed into the Setup Timing register, index 3Ah/3Dh. Using the timing set 0 default value of 01h, the setup time would be 70 ns. S = ($N_{pres}$ x $N_{val}$ + 1), see page 77.
2 The Command time is determined by the value programmed into the Command Timing register, index 3Bh/3Eh. Using the timing set 0 default value of 06h, the Command time would be 270 ns. C = ($N_{pres}$ x $N_{val}$ + 1), see page 77.
3 The Recovery time is determined by the value programmed into the Recovery Timing register, index 3Ch/3Fh. Using the timing set 0 default value of 00h, the hold (Recovery) time would be 70 ns. Generally, R = ($N_{pres}$ x $N_{val}$ + 2), see page 77.
4 -IOIS16 must go low within 3Tcp + 10 ns of the cycle beginning or -IOIS16 will be ignored and -CE will not be activated.

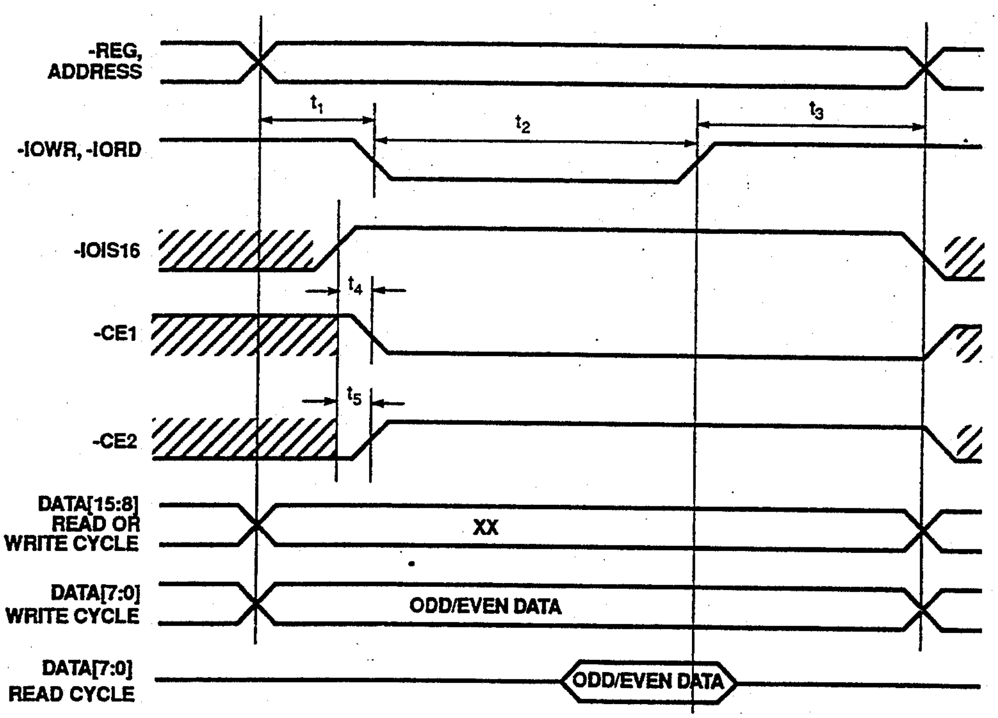

Figure 12–8. Word-To-Byte Conversion, Odd Byte I/O Read/Write Timing

Table 12–15.DMA Read Cycle Timing

| Symbol | Parameter | MIN | MAX | Units |
|---|---|---|---|---|
| $t_1$ | DACK* (IRQ9) active to DMA cycle begin | 40 | | ns |
| $t_2$ | -CE[2:1], -REG, -IORD, -OE, and Write Data setup to -IOWR active[1] | (S x Tcp) – 10 | | ns |
| $t_3$ | Command: -IOWR pulse width[2] | (C x Tcp) – 10 | | ns |
| $t_4$ | Recovery: -IOWR inactive to end of cycle[3] | (R x Tcp) – 10 | | ns |
| $t_5$ | -WAIT active from -IOWR active | | (C – 2)Tcp – 10 | ns |
| $t_6$ | -WAIT inactive to -IOWR inactive | 2 Tcp | | ns |
| $t_7$ | System TC (-VPP_VALID high) to card TC (-WE) | 40 | | ns |

[1] The Setup time is determined by the value programmed into the Setup Timing register, index 3Ah/3Dh. Using the timing set 0 default value of 01h, the setup time would be 70 ns. $S = (N_{pres} \times N_{val} + 1)$, see page 77.

[2] The Command time is determined by the value programmed into the Command Timing register, index 3Bh/3Eh. Using the timing set 0 default value of 06h, the Command time would be 270 ns. $C = (N_{pres} \times N_{val} + 1)$, see page 77.

[3] The Recovery time is determined by the value programmed into the Recovery Timing register, index 3Ch/3Fh. Using the timing set 0 default value of 00h, the hold (Recovery) time would be 70 ns. Generally, $R = (N_{pres} \times N_{val} + 2)$, see page 77.

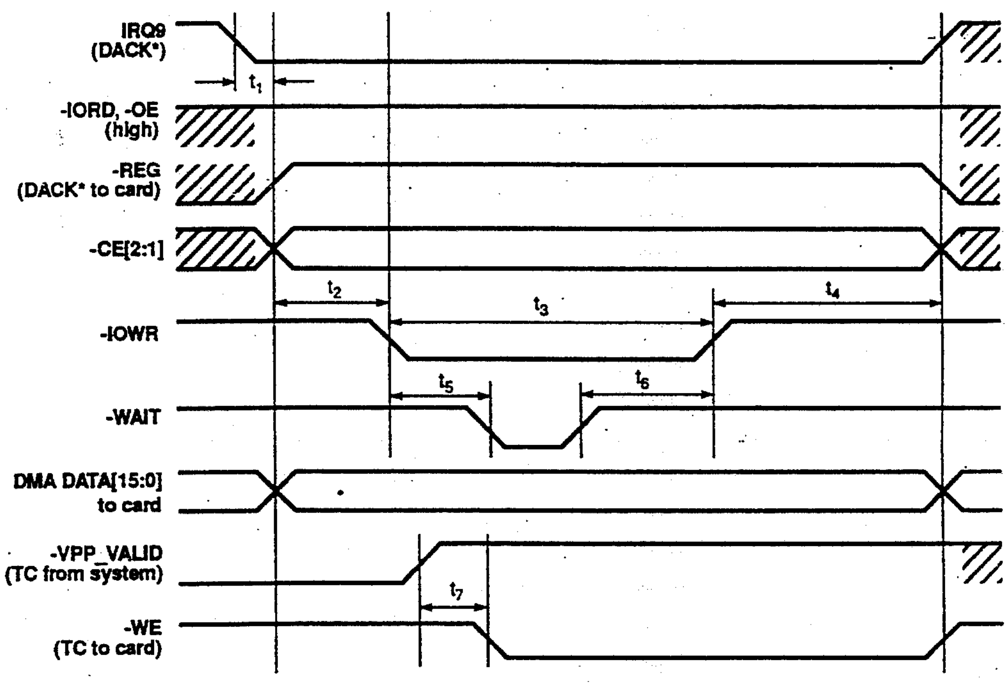

Figure 12–9. DMA Read Cycle Timing

Table 12–16. DMA Write Cycle Timing

| Symbol | Parameter | MIN | MAX | Units |
|---|---|---|---|---|
| $t_1$ | DACK* (IRQ9) active to DMA cycle begin | 40 | | ns |
| $t_2$ | -CE[2:1], -REG, -IOWR, -WE, and Write Data setup to -IORD active[1] | (S x Tcp) – 10 | | ns |
| $t_3$ | Command: -IORD pulse width[2] | (C x Tcp) – 10 | | ns |
| $t_4$ | Recovery: -IORD inactive to end of cycle[3] | (R x Tcp) – 10 | | ns |
| $t_5$ | -WAIT active from -IORD active | | (C – 2)Tcp – 10 | ns |
| $t_6$ | -WAIT inactive to -IORD inactive | 2 Tcp | | ns |
| $t_7$ | System TC (-VPP_VALID high) to card TC (-OE) | 40 | | ns |
| $t_8$ | Data setup before -OE inactive | (2 Tcp) +10 | | ns |
| $t_9$ | Data hold after -OE inactive | 0 | | ns |
| $t_{10}$ | Data valid from -WAIT inactive | Tcp + 10 | | ns |

[1] The Setup time is determined by the value programmed into the Setup Timing register, index 3Ah/3Dh. Using the timing set 0 default value of 01h, the setup time would be 70 ns. S = ($N_{pres}$ x $N_{val}$ + 1), see page 77.

[2] The Command time is determined by the value programmed into the Command Timing register, index 3Bh/3Eh. Using the timing set 0 default value of 06h, the Command time would be 270 ns. C = ($N_{pres}$ x $N_{val}$ + 1), see page 77.

[3] The Recovery time is determined by the value programmed into the Recovery Timing register, index 3Ch/3Fh. Using the timing set 0 default value of 00h, the hold (Recovery) time would be 70 ns. Generally, R = ($N_{pres}$ x $N_{val}$ + 2), see page 77.

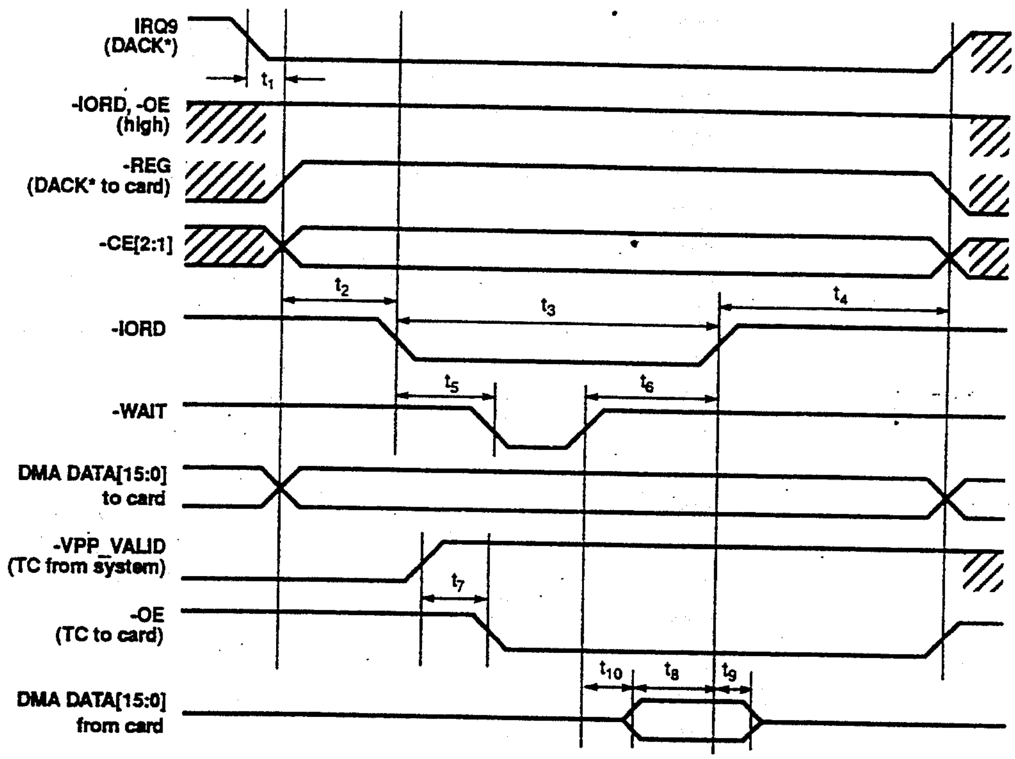
Figure 12–10. DMA Write Cycle Timing

Table 12–17. DMA Request Timing

| Symbol | Parameter | MIN | MAX | Units |
|---|---|---|---|---|
| $t_1$ | DMA request from socket interface to system[1] | 40 | | ns |

[1] After FIFO empty. DMA requests held off from being presented to the system until all write data to a card has been emptied from the socket interface FIFO.

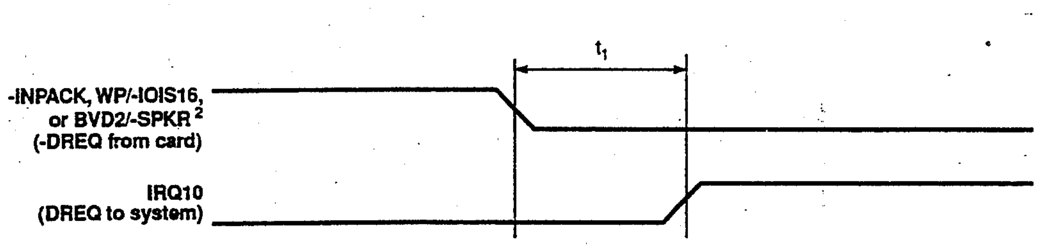

[2] DMA Control register bits 7 and 6 define which of these three signals serve as the active-low DMA request from the card.

Figure 12–11. DMA Request Timing

13. PAKAGE DIMENSIONS
13.1 144-Pin VQFP Package
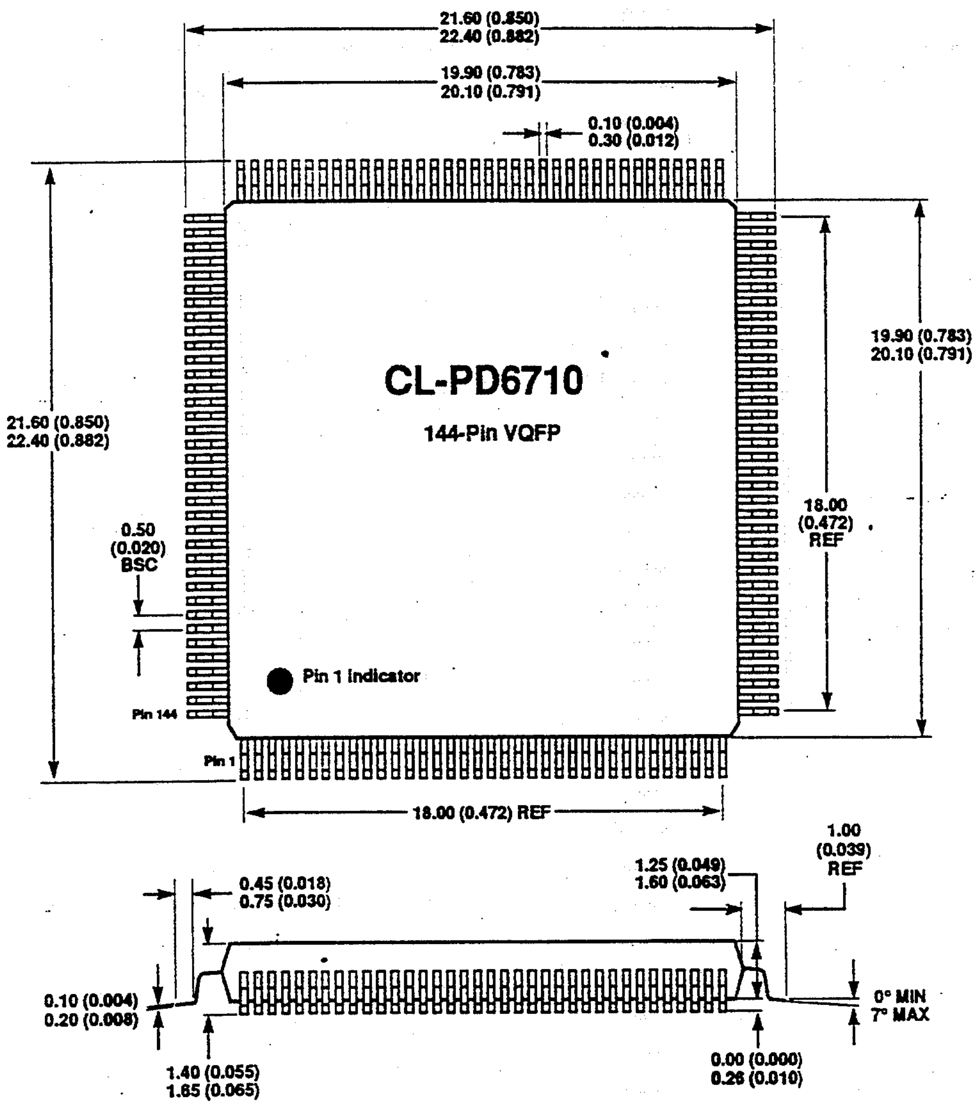
NOTES:
1) Dimensions are in millimeters and parenthetically in inches.
2) BSC = basic dimension.

13.2 208-Pin PQFP Package
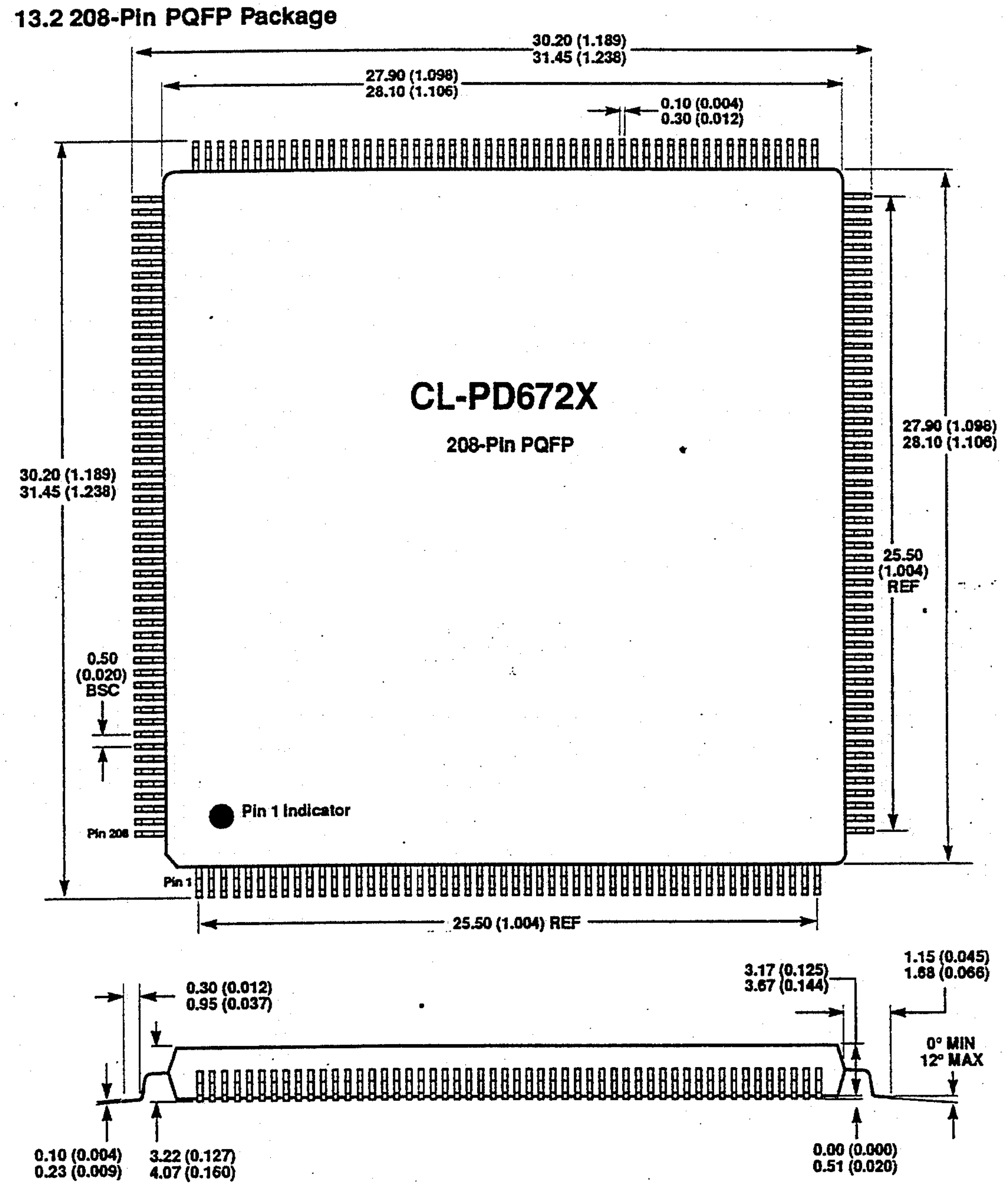
NOTES:
1) Dimensions are in millimeters and parenthetically in inches.
2) BSC = basic dimension.

14. ORDERING INFORMATION

The order number for the part is:

CL – PD67XX – QC – A

- CL: Cirrus Logic, Inc.
- P: Product Line: Portable Products
- D67XX: Part Number
- Q: Package Type:
  - Q = Quad Flat Pack (In plastic package) (CL-PD672X)
  - V = Very-tight-pitch Quad Flat Pack (CL-PD6710)
- C: Temperature Range:
  - C = Commercial
- A: Revision †

† Contact Cirrus Logic for up-to-date information on revisions.

15. REGISTER SUMMARY TABLES

15.1 Access Registers

| *Register Name:* **Index** <br> *Index:* **N/A** | | | | | | | *Register Per:* chip <br> *Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Device Index | Socket Index | Register Index | | | | | |
| RW:X | RW:X | RW:XXXXXX | | | | | |

| *Register Name:* **Data**[a] <br> *Index:* **N/A** | *Register Per:* chip <br> *Register Compatibility Type:* 365 |
|---|---|

[a] Bits 7-0 data interpreted as defined by the Index register (see page 26).

15.2 Chip Control Registers

| *Register Name:* **Chip Revision** <br> *Index:* **0h** | | | | | | | *Register Per:* chip <br> *Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Interface ID | | 0 | 0 | Revision | | | |
| R:10 | | R:0 | R:0 | R:0010[a] | | | |

[a] Value for the current stepping only.

| *Register Name:* **Interface Status** <br> *Index:* **1h** | | | | | | | *Register Per:* socket <br> *Register Compatibility Type:* 365 |
|---|---|---|---|---|---|---|---|
| *Bit 7* <br> *-VPP_VALID* | *Bit 6* | *Bit 5* <br> *RDY* | *Bit 4* <br> *WP* | *Bit 3* <br> *-CD2* | *Bit 2* <br> *-CD1* | *Bit 1* <br> *BVD2* | *Bit 0* <br> *BVD1* |
| $V_{PP}$ Valid | Card Power On | Ready/Busy* | Write Protect | Card Detect | | Battery Voltage Detect | |
| R[a] | R:0 | R[b] | R[c] | R[d] | | R[e] | |

[a] Bit 7 is the inversion of the value of the -VPP_VALID pin (see page 13).
[b] Bit 5 is the value of the RDY/-IREQ pin (see page 15).
[c] Bit 4 is the value of the WP/-IOIS16 pin (see page 15).
[d] Bits 3-2 are the inversion of the values of the -CD1 and -CD2 pins (see page 16).
[e] Bits 1-0 are the values of the BVD1/-STSCG and BVD2/-SPKR pins (see page 16).

| *Register Name:* **Power Control** | | | | | | | *Register Per:* socket |
|---|---|---|---|---|---|---|---|
| *Index:* **2h** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| Card Enable | *Scratch Bit* | Auto-Power | $V_{CC}$ Power | *Scratch Bit* | *Scratch Bit* | $V_{PP}1$ Power | |
| RW:0 | RW:0 | RW:0 | RW:0 | RW:0 | RW:0 | RW:00 | |

| *Register Name:* **Interrupt and General Control** | | | | | | | *Register Per:* socket |
|---|---|---|---|---|---|---|---|
| *Index:* **3h** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| Ring Indicate Enable | Card Reset* | Card Is I/O | Enable Manage Int | IRQ Level | | | |
| RW:0 | RW:0 | RW:0 | RW:0 | RW:0000 | | | |

| *Register Name:* **Card Status Change** | | | | | | | *Register Per:* socket |
|---|---|---|---|---|---|---|---|
| *Index:* **4h** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| *0* | *0* | *0* | *0* | Card Detect Change | Ready Change | Battery Warning Change | Battery Dead Or Status Change |
| R:0 | R:0 | R:0 | R:0 | R:0 | R:0 | R:0 | R:0 |

| *Register Name:* **Management Interrupt Configuration** | | | | | | | *Register Per:* socket |
|---|---|---|---|---|---|---|---|
| *Index:* **5h** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| Management IRQ | | | | Card Detect Enable | Ready Enable | Battery Warning Enable | Battery Dead Or Status Change Enable |
| RW:0000 | | | | RW:0 | RW:0 | RW:0 | RW:0 |

| *Register Name:* **Mapping Enable** | | | | | | | *Register Per:* socket |
|---|---|---|---|---|---|---|---|
| *Index:* **6h** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| I/O Map 1 Enable | I/O Map 0 Enable | MEMCS16 Full Decode | Memory Map 4 Enable | Memory Map 3 Enable | Memory Map 2 Enable | Memory Map 1 Enable | Memory Map 0 Enable |
| RW:0 | RW:0 | RW:0 | RW:0 | RW:0 | RW:0 | RW:0 | RW:0 |

15.3 I/O Window Mapping Registers

| *Register Name:* **I/O Window Control**<br>*Index:* **7h** | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Timing Register Select 1 | *Scratch Bit* | Auto-Size I/O Window 1 | I/O Window 1 Size | Timing Register Select 0 | *Scratch Bit* | Auto-Size I/O Window 0 | I/O Window 0 Size |
| RW:0 | RW:0 | RW:0 | RW:0 | RW:0 | RW:0 | RW:0 | RW:0 |

| *Register Name:* **I/O Map 0-1 Start Address Low**<br>*Index:* **8h, Ch** | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Start Address 7-0<br>RW:00000000 | | | | | | | |

| *Register Name:* **I/O Map 0-1 Start Address High**<br>*Index:* **9h, Dh** | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| Start Address 15-8<br>RW:00000000 | | | | | | | |

| *Register Name:* **I/O Map 0-1 End Address Low**<br>*Index:* **Ah, Eh** | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| End Address 7-0<br>RW:00000000 | | | | | | | |

| *Register Name:* **I/O Map 0-1 End Address High**<br>*Index:* **Bh, Fh** | | | | | | | *Register Per:* socket<br>*Register Compatibility Type:* 365 |
|---|---|---|---|---|---|---|---|
| *Bit 7* | *Bit 6* | *Bit 5* | *Bit 4* | *Bit 3* | *Bit 2* | *Bit 1* | *Bit 0* |
| End Address 15-8<br>RW:00000000 | | | | | | | |

| Register Name: **I/O Map 0-1 Address Offset Low**<br>Index: **36h, 38h** | | | | | | | Register Per: **socket**<br>Register Compatibility Type: **ext.** |
|---|---|---|---|---|---|---|---|
| *Bit 7* | *Bit 6* | *Bit 5* | *Bit 4* | *Bit 3* | *Bit 2* | *Bit 1* | *Bit 0* |
| Offset Address 7-1<br>RW:0000000 | | | | | | | *Scratch Bit*<br>RW:0 |

| Register Name: **I/O Map 0-1 Address Offset High**<br>Index: **37h, 39h** | | | | | | | Register Per: **socket**<br>Register Compatibility Type: **ext.** |
|---|---|---|---|---|---|---|---|
| *Bit 7* | *Bit 6* | *Bit 5* | *Bit 4* | *Bit 3* | *Bit 2* | *Bit 1* | *Bit 0* |
| Offset Address 15-8<br>RW:00000000 | | | | | | | |

15.4 Memory Window Mapping Registers

| Register Name: **Memory Map 0-4 Start Address Low**<br>Index: **10h, 18h, 20h, 28h, 30h** | | | | | | | Register Per: **socket**<br>Register Compatibility Type: **365** |
|---|---|---|---|---|---|---|---|
| *Bit 7* | *Bit 6* | *Bit 5* | *Bit 4* | *Bit 3* | *Bit 2* | *Bit 1* | *Bit 0* |
| Start Address 19-12<br>RW:00000000 | | | | | | | |

| Register Name: **Memory Map 0-4 Start Address High**<br>Index: **11h, 19h, 21h, 29h, 31h** | | | | | | | Register Per: **socket**<br>Register Compatibility Type: **365** |
|---|---|---|---|---|---|---|---|
| *Bit 7* | *Bit 6* | *Bit 5* | *Bit 4* | *Bit 3* | *Bit 2* | *Bit 1* | *Bit 0* |
| Window Data Size<br>RW:0 | *Scratch Bit*<br>RW:0 | *Scratch Bit*<br>RW:0 | *Scratch Bit*<br>RW:0 | Start Address 23-20<br>RW:0000 | | | |

| Register Name: **Memory Map 0-4 End Address Low**<br>Index: **12h, 1Ah, 22h, 2Ah, 32h** | | | | | | | Register Per: **socket**<br>Register Compatibility Type: **365** |
|---|---|---|---|---|---|---|---|
| *Bit 7* | *Bit 6* | *Bit 5* | *Bit 4* | *Bit 3* | *Bit 2* | *Bit 1* | *Bit 0* |
| End Address 19-12<br>RW:00000000 | | | | | | | |

| *Register Name:* **Memory Map 0-4 End Address High** | | | | | | | *Register Per:* socket |
|---|---|---|---|---|---|---|---|
| *Index:* **13h, 1Bh, 23h, 2Bh, 33h** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| Card Timer Select | | *Scratch Bit* | *Scratch Bit* | End Address 23-20 | | | |
| RW:00 | | RW:0 | RW:0 | RW:0000 | | | |

| *Register Name:* **Memory Map 0-4 Address Offset Low** | | | | | | | *Register Per:* socket |
|---|---|---|---|---|---|---|---|
| *Index:* **14h, 1Ch, 24h, 2Ch, 34h** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| Offset Address 19-12 | | | | | | | |
| RW:00000000 | | | | | | | |

| *Register Name:* **Memory Map 0-4 Address Offset High** | | | | | | | *Register Per:* socket |
|---|---|---|---|---|---|---|---|
| *Index:* **15h, 1Dh, 25h, 2Dh, 35h** | | | | | | | *Register Compatibility Type:* 365 |
| *Bit 7* | *Bit 6* | *Bit 5* | *Bit 4* | *Bit 3* | *Bit 2* | *Bit 1* | *Bit 0* |
| Write Protect | REG Setting | Offset Address 25-20 | | | | | |
| RW:0 | RW:0 | RW:000000 | | | | | |

15.5 Extension Registers

| *Register Name:* **Misc Control 1** | | | | | | | *Register Per:* socket |
|---|---|---|---|---|---|---|---|
| *Index:* **16h** | | | | | | | *Register Compatibility Type:* ext. |
| *Bit 7* | *Bit 6* | *Bit 5* | *Bit 4* | *Bit 3* | *Bit 2* | *Bit 1* | *Bit 0* |
| In-pack Enable | *Scratch Bit* | *Scratch Bit* | Speaker Enable | Pulse System IRQ | Pulse Management Interrupt | $V_{CC}$ 3.3V | 5V Detect |
| RW:0 | RW:0 | RW:0 | RW:0 | RW:0 | RW:0 | RW:0 | R |

| *Register Name:* **FIFO Control** | | | | | | | *Register Per:* socket |
|---|---|---|---|---|---|---|---|
| *Index:* **17h** | | | | | | | *Register Compatibility Type:* ext. |
| *Bit 7* | *Bit 6* | *Bit 5* | *Bit 4* | *Bit 3* | *Bit 2* | *Bit 1* | *Bit 0* |
| Empty Write FIFO | *Scratch Bit* | *Scratch Bit* | *Scratch Bit* | *Scratch Bit* | *Scratch Bit* | *Scratch Bit* | *Scratch Bit* |
| RW | RW:0 | RW:0 | RW:0 | RW:0 | RW:0 | RW:0 | RW:0 |

| *Register Name:* **Misc Control 2** *Index:* **1Eh** | | | | | | *Register Per:* chip *Register Compatibility Type:* ext. | |
|---|---|---|---|---|---|---|---|
| *Bit 7* | *Bit 6* | *Bit 5* | *Bit 4* | *Bit 3* | *Bit 2* | *Bit 1* | *Bit 0* |
| IRQ15 Is RI Out | DMA System *(CL-PD6722)* | Three-State Bit 7 | Drive LED Enable | 5V Core | Suspend | Low-Power Dynamic Mode | Bypass Frequency Synthesizer |
| RW:0 | RW:0 | RW:0 | RW:0 | RW:0 | RW:0 | RW:1 | RW:0 |

| *Register Name:* **Chip Information** *Index:* **1Fh** | | | | | | *Register Per:* chip *Register Compatibility Type:* ext. | |
|---|---|---|---|---|---|---|---|
| *Bit 7* | *Bit 6* | *Bit 5* | *Bit 4* | *Bit 3* | *Bit 2* | *Bit 1* | *Bit 0* |
| Chip Identification | | Dual/Single Slot* | CL-PD67XX Revision Level | | | *Scratch Bit* | *Scratch Bit* |
| R:11 | | R[a] | R:111 | | | RW:0 | RW:0 |

[a] The value for CL-PD6710 is '0', and the value for CL-PD672X is '1'.

| *Register Name:* **ATA Control** *Index:* **26h** | | | | | | *Register Per:* socket *Register Compatibility Type:* ext. | |
|---|---|---|---|---|---|---|---|
| *Bit 7* | *Bit 6* | *Bit 5* | *Bit 4* | *Bit 3* | *Bit 2* | *Bit 1* | *Bit 0* |
| A25/CSEL | A24/M/S* | A23/VU | A22 | A21 | *Scratch Bit* | Speaker Is LED Input | ATA Mode |
| RW:0 | RW:0 | RW:0 | RW:0 | RW:0 | RW:0 | RW:0 | RW:0 |

| *Register Name:* **Extension Index** *Index:* **2Eh** | | | | | | Register Per: socket Register Compatibility Type: ext. | |
|---|---|---|---|---|---|---|---|
| *Bit 7* | *Bit 6* | *Bit 5* | *Bit 4* | *Bit 3* | *Bit 2* | *Bit 1* | *Bit 0* |
| Extension Register Index | | | | | | | |
| RW:00000000 | | | | | | | |

| *Register Name:* **Data Mask 0** *Index:* **2Fh** | | | Extension: 01h | | | Register Per: socket Register Compatibility Type: ext. | |
|---|---|---|---|---|---|---|---|
| *Bit 7* | *Bit 6* | *Bit 5* | *Bit 4* | *Bit 3* | *Bit 2* | *Bit 1* | *Bit 0* |
| Data Mask Select 0 | | | | | | | |
| RW:00000000 | | | | | | | |

| *Register Name:* **Data Mask 1** *Index:* **2Fh** | | | Extension: 02h | | | Register Per: socket Register Compatibility Type: ext. | |
|---|---|---|---|---|---|---|---|
| *Bit 7* | *Bit 6* | *Bit 5* | *Bit 4* | *Bit 3* | *Bit 2* | *Bit 1* | *Bit 0* |
| Data Mask Select 1 RW:00000000 | | | | | | | |

| *Register Name:* **DMA Control** *Index:* **2Fh** | | | Extension: 03h | | | Register Per: socket Register Compatibility Type: ext. | |
|---|---|---|---|---|---|---|---|
| *Bit 7* | *Bit 6* | *Bit 5* | *Bit 4* | *Bit 3* | *Bit 2* | *Bit 1* | *Bit 0* |
| DMA Enable | | Disable Socket Pull-Ups | *0* | *0* | *0* | *0* | *0* |
| RW:00 | | RW:0 | RW:0 | RW:0 | RW:0 | RW:0 | RW:0 |

15.6 Timing Registers

| *Register Name:* **Set-up Timing 0-1** *Index:* **3Ah, 3Dh** | | | | | | *Register Per:* socket *Register Compatibility Type:* 365 | |
|---|---|---|---|---|---|---|---|
| *Bit 7* | *Bit 6* | *Bit 5* | *Bit 4* | *Bit 3* | *Bit 2* | *Bit 1* | *Bit 0* |
| Setup Prescaler Select | | Setup Multiplier Value | | | | | |
| RW:00 | | RW:000001 | | | | | |

| *Register Name:* **Command Timing 0-1** *Index:* **3Bh, 3Eh** | | | | | | *Register Per:* socket *Register Compatibility Type:* 365 | |
|---|---|---|---|---|---|---|---|
| *Bit 7* | *Bit 6* | *Bit 5* | *Bit 4* | *Bit 3* | *Bit 2* | *Bit 1* | *Bit 0* |
| Command Prescaler Select | | Command Multiplier Value | | | | | |
| RW:00 | | RW:001111/000110[a] | | | | | |

[a] Standard AT bus timing (Command Timing 0) resets to 06h and AT bus timing; with added wait states (Command Timing 1) resets to 0Fh.

| *Register Name:* **Recovery Timing 0-1** *Index:* **3Ch, 3Fh** | | | | | | *Register Per:* socket *Register Compatibility Type:* 365 | |
|---|---|---|---|---|---|---|---|
| *Bit 7* | *Bit 6* | *Bit 5* | *Bit 4* | *Bit 3* | *Bit 2* | *Bit 1* | *Bit 0* |
| Recovery Prescaler Select | | Recovery Multiplier Value | | | | | |
| RW:00 | | RW:000000 | | | | | |

Index

Numerics

+5V 17
5V Core 51
5V Detect 49
5V_DET 17

A

A[25:0] 14
A_PinName 14
A21 54
A22 54
A23/VU 54
A24/M/S* 54
A25/CSEL 54
AEN 11
ALE 10
ATA Control 53
ATA Mode 53
Auto-Power 33
Auto-Size I/O Window 0 40
Auto-Size I/O Window 1 40

B

B_PinName 14
Battery Dead Or Status Change 36
Battery Dead Or Status Change Enable 37
Battery Voltage Detect 30
Battery Warning Change 36
Battery Warning Enable 37
Bit Descriptions Conventions 6
Bus Sizing 23
BVD1/-STSCHG 16
BVD2/-SPKR 16
Bypass Frequency Synthesizer 51

C

C_SEL 12
Card Detect 30
Card Detect Change 36
Card Detect Enable 37
Card Enable 33
Card Is I/O 34
Card Power On 31
Card Reset* 35
Card Status Change 36
Card Timer Select 46
-CD[2:1] 16
-CE[2:1] 16
Chip Identification 53
Chip Information 53
Chip Revision 29
CLK 13
CL-PD67XX Revision Level 53
Command Multiplier Value 58
Command Prescaler Select 58
Command Timing 0 58
Command Timing 1 58
Constant 5

D

D[15:0] 14
Data 27
Data Mask 0 55
Data Mask 1 56
Device Index 26
Disable Socket Pull-Ups 56
DMA Control 56
DMA Enable 56
DMA System 52
Drive LED Enable 51
Dual/Single Slot* 53

E

Empty Write FIFO 50
Enable Manage Int 34
End Address 15-8 42
End Address 19-12 46
End Address 23-20 46
End Address 7-0 42
Extension Data 55
Extension Index 55

F

FIFO Control 50

G

General Conventions 5
GND 17

H

Host Access to Registers 24

I

I/O Map 0 Address Offset High 43
I/O Map 0 Address Offset Low 43
I/O Map 0 Enable 39
I/O Map 0 End Address High 42
I/O Map 0 End Address Low 42
I/O Map 0 Start Address High 41
I/O Map 0 Start Address Low 41
I/O Map 1 Address Offset High 43
I/O Map 1 Address Offset Low 43
I/O Map 1 Enable 39
I/O Map 1 End Address High 42
I/O Map 1 End Address Low 42
I/O Map 1 Start Address High 41
I/O Map 1 Start Address Low 41
I/O Window 0 Size 40
I/O Window 1 Size 40
I/O Window Control 40
Index 26
-INPACK 15
Inpack Enable 50
Interface ID 29
Interface Status 30
Interrupt and General Control 34
Interrupts 21
-INTR 12
IOCHRDY 11
IOCS16* 11
-IOIS16 15
IOR* 10
-IORD 15
IOW* 10
-IOWR 15
-IREQ 15
IRQ Level 34
IRQ[14, 11, 7, 5-3] 11
IRQ10 11
IRQ12 12
IRQ15 12
IRQ15 Is RI Out 52
IRQ9 11
ISA Interface Signals 10
ISA_VCC 13

L

LA[23:17] 10
Low-Power Dynamic Mode 51
Low-power Dynamic mode description 21

M

Management Interrupt Configuration 37
Management IRQ 38
Mapping Enable 38
MEMCS16 Full Decode 39
MEMCS16* 11
Memory Map 0 Address Offset High 47
Memory Map 0 Address Offset Low 47
Memory Map 0 Enable 38
Memory Map 0 End Address High 46
Memory Map 0 End Address Low 45
Memory Map 0 Start Address High 45
Memory Map 0 Start Address Low 44
Memory Map 1 Address Offset High 47
Memory Map 1 Address Offset Low 47
Memory Map 1 Enable 38
Memory Map 1 End Address High 46
Memory Map 1 End Address Low 45
Memory Map 1 Start Address High 45
Memory Map 1 Start Address Low 44
Memory Map 2 Address Offset High 47
Memory Map 2 Address Offset Low 47
Memory Map 2 Enable 39
Memory Map 2 End Address High 46
Memory Map 2 End Address Low 45
Memory Map 2 Start Address High 45
Memory Map 2 Start Address Low 44
Memory Map 3 Address Offset High 47
Memory Map 3 Address Offset Low 47
Memory Map 3 Enable 39
Memory Map 3 End Address High 46
Memory Map 3 End Address Low 45
Memory Map 3 Start Address High 45
Memory Map 3 Start Address Low 44
Memory Map 4 Address Offset High 47
Memory Map 4 Address Offset Low 47
Memory Map 4 Enable 39
Memory Map 4 End Address High 46
Memory Map 4 End Address Low 45
Memory Map 4 Start Address High 45
Memory Map 4 Start Address Low 44
MEMR* 10
MEMW* 10
Misc Control 1 49
Misc Control 2 51

N

Numeric Naming Conventions 5

O

-OE 15
Offset Address 15-8 43
Offset Address 19-12 47

Offset Address 25-20 48
Offset Address 7-1 43

P

PCMCIA Basics 19
PCMCIA Timing 23
Pin Diagram
144-Pin VQFP 7
208-Pin PQFP 8
Pin Naming Conventions 9
Pin Usage Summary 18
Power Control 32
Power Management 21
Power-On Configuration 18
Power-On Setup 25
Pulse Management Interrupt 49
Pulse System IRQ 50
PWRGOOD 10

R

RDY/-IREQ 15
Read-Only 5
Ready Change 36
Ready Enable 37
Ready/Busy* 31
Recovery Multiplier Value 59
Recovery Prescaler Select 59
Recovery Timing 0 59
Recovery Timing 1 59
REFRESH* 10
-REG 14
REG Setting 48
Register Description Notation 5
Register Heading Description 6
Register Index 26
Reserved 5, 17
RESET 16
Revision 29
Ring Indicate Enable 35

S

SA[16:0] 10
SBHE* 10
SD[15:0] 10
Setup Multiplier Value 57
Setup Prescaler Select 57
Setup Timing 0 57
Setup Timing 1 57
SLOT_VCC 17
Socket Index 26
Socket Interface Signals 14
Socket Power Features 21
Speaker Enable 50
Speaker Is LED Input 54
-SPKR 16
SPKR_OUT*/C_SEL 12
Start Address 15-8 42
Start Address 19-12 44
Start Address 23-20 45
Start Address 7-0 41
-STSCHG 16
Suspend 51
Suspend mode description 21

T

Three-State Bit 7 52
Timing Register Select 0 40
Timing Register Select 1 41

V $V_{CC}$ 3.3V 49
$V_{CC}$ Power 33
-VCC_3 17
-VCC_5 17
VDD 17
$V_{PP}$ Valid 31
-VPP_VALID 13
$V_{PP}1$ Power 33
VPP1_PGM 17
VPP1_VCC 17

W

-WAIT 16
-WE 15
Window Data Size 45
Windowing 19
WP/-IOIS16 15
Write FIFO 23
Write Protect 30, 48

Z

ZWS* 12

CIRRUS LOGIC

CL-PD6710/PD672X

*Advance Data Sheet*

Direct Sales Offices

*Domestic*

NORTHERN CALIFORNIA
San Jose
TEL: 408/436-7110
FAX: 408/437-8960

SOUTHERN CALIFORNIA
Tustin
TEL: 714/258-8303
FAX: 714/258-8307

Thousand Oaks
TEL: 805/371-5381
FAX: 805/371-5382

ROCKY MOUNTAIN AREA
Denver, CO
TEL: 303/786-9696
FAX: 303/786-9695

SOUTH CENTRAL AREA
Austin, TX
TEL: 512/794-8490
FAX: 512/794-8069

Dallas, TX
TEL: 214/252-6698
FAX: 214/252-5681

CENTRAL AREA
Chicago, IL
TEL: 708/981-6950
FAX: 708/981-6846

NORTHEASTERN AREA
Andover, MA
TEL: 508/474-9300
FAX: 508/474-9149

Philadelphia, PA
TEL: 215/625-0781
FAX: 215/625-0731

SOUTHEASTERN AREA
Boca Raton, FL
TEL: 407/362-5225
FAX: 407/362-5235

*International*

GERMANY
Herrsching
TEL: 49/8152-2030
FAX: 49/8152-40077

HONG KONG
Tsimshatusi
TEL: 852/376-0801
FAX: 852/375-1202

JAPAN
Tokyo
TEL: 81/3-3340-9111
FAX: 81/3-3340-9120

KOREA
Seoul
TEL: 82/2-565-8561
FAX: 82/2-565-8565

SINGAPORE
TEL: 65/3532122
FAX: 65/3532166

TAIWAN
Taipei
TEL: 886/2-718-4533
FAX: 886/2-718-4526

UNITED KINGDOM
Hertfordshire, England
TEL: 44/0727-872424
FAX: 44/0727-875919

The Company

Cirrus Logic, Inc., produces high-integration peripheral controller circuits for mass storage, graphics, and data communications. Our products are used in leading-edge personal computers, engineering workstations, and office automation equipment.

The Cirrus Logic formula combines innovative architectures in silicon with system design expertise. We deliver complete solutions — chips, software, evaluation boards, and manufacturing kits — on-time, to help you win in the marketplace.

Cirrus Logic's fabless manufacturing strategy, unique in the semiconductor industry, employs a full manufacturing infrastructure to ensure maximum product quality, availability and value for our customers.

Talk to our systems and applications specialists; see how you can benefit from a new kind of semiconductor company.

© Copyright, Cirrus Logic, Inc., 1993

*Advance* product information describes products that are in development and subject to developmental changes. Cirrus Logic, Inc., believes the information contained in this document is accurate and reliable. However, it is marked Advance and is subject to change without notice. No responsibility is assumed by Cirrus Logic, Inc., for its use, nor for infringements of patents or other rights of third parties. This document implies no license under patents or copyrights. No part of this publication may be reproduced, stored in a retrieval system, or transmitted, inany form or by any means, electronic, mechanical, photocopying, or otherwise, without the prior written consent of Cirrus Logic, Inc. Cirrus Logic, S/LA, FeatureChips, AutoMap, UXART, Good Data, Fair Share and SimulSCAN are trademarks of Cirrus Logic, Inc. Other trademarks in this document belong to their respective companies. Cirrus Logic, Inc., products are covered under one or more of the following U.S. patents: 4,293,783; Re. 31,287; 4,763,332; 4,777,635; 4,839,896; 4,931,946; 4,975,828; 4,979,173; 5,032,981; 5,122,783; 5,131,015; 5,140,595; 5,157,618; 5,179,292; 5,185,602; 5,220,295.

CIRRUS LOGIC, Inc., 3100 West Warren Ave. Fremont, CA 94538
TEL: 510/623-8300 FAX: 510/226-2180

Appendix B

Method and Apparatus for Controlling a Mixed Voltage Interface in a Multivoltage System

Docket No.: 14295.P030X

A NOTEBOOK MOTHERBOARD PCMCIA HOST ADAPTER SOLUTION
CL-PD6710/PD6720
ANPD1

PREPARED BY:
BLAKELY, SOKOLOFF, TAYLOR & ZAFMAN
12400 Wilshire Boulevard, 7th Floor
Los Angeles, California 90025
(310) 207-3800

I hereby certify that this correspondence is being deposited with the United States Postal Service as Express Mail No. TB006370265US addressed to: Commissioner of Patents and Trademarks, Washington, DC 20231, on November 8, 1993

Margaret M. Hasson — November 8, 1993
Date

CIRRUS LOGIC®

CL-PD6710/PD6720

*Advance Application Note — AN-PD1*

A Notebook Motherboard PCMCIA Host Adapter Solution

*using the CL-PD6710 or CL-PD6720*

By Portable Products Applications

PCMCIA Group
Cirrus Logic, Inc.

Scope and Applicability

This application note presents information on the integration of the CL-PD6710 or CL-PD6720 in a sample notebook PCMCIA host adapter motherboard solution. This document contains information for connecting the CL-PD6710 or CL-PD6720 to an ISA Bus. Its purpose is to offer connectivity data to aid the system designer.

Related Documents:

– *CL-PD6710/PD6720 Data Book*

© Copyright — Cirrus Logic, Inc. 1993
All rights reserved. Permission is hereby granted for use, reproduction, republication, or abstraction of this material with attribution, by companies not involved in the sale or manufacture of integrated circuits.

Notice

This document describes a potential application of Cirrus Logic integrated circuits. No warranty is given for the suitability of the circuitry or program code described herein for any purpose other than demonstrating functional operation. Cirrus Logic believes this information is accurate and reliable. However, it is subject to change without notice. No responsibility is assumed by Cirrus Logic for the use of this information, nor for infringements of patents or other rights of third parties. This document implies no license under patents or copyrights.

CIRRUS LOGIC

Table of Contents

1. INTRODUCTION ........ 4

2. OVERVIEW ........ 4

3. HARDWARE DESCRIPTION ........ 5
   - 3.1 ISA Bus Interface ........ 5
   - 3.2 PCMCIA Socket Interface ........ 6
   - 3.3 PCMCIA Socket Power Control ........ 6
   - 3.4 Power Distribution ........ 8

4. POWER-SAVING MODES ........ 10
   - 4.1 Automatic Low-Power Dynamic Mode ........ 10
   - 4.2 Suspend Mode ........ 11
   - 4.3 Super Suspend Mode ........ 11
   - 4.4 Additional Notes on PCMCIA Subsystem Power Reduction ........ 11

5. WINDOWS ........ 12
   - 5.1 Memory Windows ........ 12
   - 5.2 I/O Windows ........ 15

6. TIMING REGISTERS ........ 17
   - 6.1 An Example: Setting Timing Register for Flash ROM ........ 17
   - 6.2 Programming the Timing 1 Register Set ........ 17

A. CL-PD6710/PD6720 ISA Bus Demonstration Board PCMCIA Solution — Schematics ........ 23

List of Figures

Figure 3–1. Block Diagram of Card-Socket Power Supply/Switching Circuit ........ 7

Figure 3–2. CL-PD67XX Powering of Internal Logic ........ 8

Figure 3–3. Typical Power Distribution for the CL-PD67XX ........ 9

Figure 4–1. Relationship Between IOCHRDY High and IOR* High for Automatic Low-Power Dynamic Mode Operation ........ 11

Figure 5–1. Window Mapping Example of System Memory Address to PCMCIA Socket Memory Address ........ 13

Figure 5–2. Window Mapping Example of System I/O Addresses Without Offset to PCMCIA I/O Address ........ 15

Figure 6–1. Setup, Command, and Recovery Timing Diagram ........ 18

Figure 6–2. Timing Diagram of Example Flash ROM Write Timing Setting ........ 20

1. INTRODUCTION

The CL-PD6710 and CL-PD6720 are single-chip PCMCIA interface controllers capable of controlling one or two PCMCIA sockets, respectively. They are designed for use in notebook computers where reduced form factor and low power consumption are critical design objectives.

With the CL-PD6710, a complete single-socket PCMCIA solution with power-control circuitry can occupy less than 1.5 square inches (10 square centimeters) of board space. Similarly, with the CL-PD6720, a complete dual-socket PCMCIA solution with power-control circuitry can occupy less than 2 square inches (13 square centimeters) of board space.

The CL-PD67XX[1] controllers are completely compatible with the standards of PCMCIA (Personal Card Memory International Association) Release 2.0 Standard as well as JEIDA (Japan Electronic Industry Development Association) Version 4.1 Standard. The CL-PD67XX controllers also offer special power-saving features such as Automatic Low-power Dynamic Mode and Suspend Mode. Both controllers are true mixed-voltage devices that can operate at +5 volts, +3.3 volts, or a combination of these at various interfaces. The controllers have full internal buffering and require no additional circuitry to interface to the ISA Bus or to PCMCIA sockets.

Other features of the CL-PD67XX controllers are discussed throughout this application note.

2. OVERVIEW

This application note provides information to help system designers create a successful CL-PD67XX motherboard PCMCIA host controller solution in an Intel® 80X86-compatible environment. For information on how to design the CL-PD67XX PCMCIA controllers in a non-Intel environment, customers should contact their Cirrus Logic application engineer.

This application note presents specific pin connection information for motherboard and ISA Bus solutions. The following CL-PD67XX controller interfaces are discussed:

- ISA Bus interface
- PCMCIA socket interface
- PCMCIA socket power control signals
- Power distribution pins Section 3 describes the CL-PD67XX ISA Bus and PCMCIA Socket interfaces in enough detail to permit a successful interface between an ISA Bus and a PCMCIA connector. The power-saving modes of the CL-PD67XX are discussed in Section 4.

Section 5 presents PCMCIA address windowing basics and Section 6 present examples of how a card memory window is set up and mapped between the ISA Bus memory address space and the PCMCIA card memory address space.

In Appendix A are schematics that demonstrate a CL-PD67XX ISA Bus implementation, including power-control circuitry. Note that these sample circuits are provided for demonstration purposes only and do not represent the minimum component count achievable in a motherboard solution. An ORCAD 4.1 database of this implementation is available from Cirrus Logic. Customers can modify this database to meet the specific needs of their design.

[1] In this document, CL-PD67XX represents both the CL-PD6710 and CL-PD6720.

3. HARDWARE DESCRIPTION

This section describes the signals of the ISA Bus interface, socket interface, PCMCIA socket power control, and power distribution.

3.1 ISA Bus Interface

The CL-PD67XX ISA Bus interface signals are internally buffered and can be directly connected to the ISA Bus. The CL-PD67XX signals are named the same as (or similarly to) most 80X86 motherboard ISA Bus signal names so connections can be easily identified.

The following bus control/status signals can be directly connected to their corresponding ISA Bus signals: **IOR*, IOW*, MEMR*, MEMW*, REFRESH*, IOCS16*, MEMCS16*, IOCHRDY, SBHE*, and ZWS*.**

There are two methods of interfacing address lines to an 80X86 motherboard ISA Bus. The type of processor in the system determines the method to be used. For processors with LA address lines (e.g., Intel 80286, 80386, etc.), directly connect the CL-PD67XX Address Lines LA[23:17] and SA[16:0] to the ISA Bus Address Lines LA[23:17] and SA[16:0]. For motherboards using Intel processors *without* the LA address lines (e.g., Intel 8080), tie ALE of the CL-PD67XX high, ground LA[23:20] of the CL-PD67XX, and then connect LA[19:17] and SA[16:0] of the CL-PD67XX to SA[19:0] of the ISA Bus.

For 16-bit processors such as the 80X86 family, the CL-PD67XX Data Lines SD[15:0] can be directly connected to the ISA Bus Data Lines SD[15:0]. These lines are used to transfer data during memory and I/O cycles. For 8-bit processors, connect the CL-PD67XX Data Lines SD[7:0] to the ISA Bus Data Lines SD[7:0], tie the CL-PD67XX SBHE* Pin high, and leave the CL-PD67XX Data Lines SD[15:8] disconnected.

The CLK Signal of the CL-PD67XX may be directly connected to the ISA Bus OSC Signal or to another 14.318-MHz 50%-duty-cycle source. The CL-PD67XX uses an internal synthesizer to generate its internal 25-MHz clock from this 14.318-MHz input. If this on-board, 25-MHz clock synthesizer is to be internally bypassed, a 25-MHz 50%-duty-cycle clock source should be provided to the CL-PD67XX CLK Pin.

The PWRGOOD Signal is the CL-PD67XX active-low reset input. It should be connected to the Power Good Signal from the system power supply or reset circuit. If the system does not provide a Power Good Signal, an inverted ISA Bus RESETDRV Signal may be used.

**SPKR_OUT*/C_SEL** is a dual-function pin. While PWRGOOD is low, it is a configuration option input used to determine which sockets the CL-PD67XX will control. The rising edge of PWRGOOD is used to latch the level on this pin as the configuration option selection as follows: If there is only one CL-PD67XX in the system, the SPKR_OUT*/C_SEL Signal (CL-PD6710 Pin 141 or CL-PD6720 Pin 200) can be left open because it is internally pulled-up while PWRGOOD is low. This will configure the CL-PD6710 socket interface as PCMCIA Socket 0 and the CL-PD6720 socket interface as PCMCIA Sockets 0 and 1. If SPKR_OUT*/C_SEL is low while PWRGOOD is low, this will configure the CL-PD6710 socket interface as PCMCIA Socket 2 and the CL-PD6720 socket interface as PCMCIA Sockets 2 and 3. For more information on socket address, refer to the *CL-PD6710/PD6720 Data Book.*

After PWRGOOD goes active-high, SPKR_OUT*/C_SEL becomes a TTL-level-compatible digital output from each socket's speaker input. This pin should be connected, along with the core-logic speaker signal, to the input of the system's speaker driver or amplifier. If the core-logic digital speaker output is active-low, the SPKR_OUT*/C_SEL Signal should be XNOR'ed with the core-logic speaker output. Firmware should configure the Misc Control 1 Register (Index 16h) Bit 4 (Speaker Enable) to a '1' to enable the SPKR_OUT*/C_SEL Pin to function as an output to drive a speaker. On a CL-PD6720, the output of SPKR_OUT*/C_SEL is the logical XNOR of the speaker inputs from each socket interface.

The -VPP_VALID Pin is a readable status input to the CL-PD67XX. Its active-low level indicates that the PCMCIA VPP power supply is operating at a stable voltage. Some PCMCIA power-supply chips include a '-VPP STABLE' status output, which can be directly connected to -VPP_VALID. If the PCMCIA power-supply chip does not include a -VPP STABLE status output, -VPP_VALID can be tied low. On the CL-PD6710/PD6720 ISA Bus demonstration board, the -VPP_VALID Signal is 'jumperable' to a logical '0' since the ISA demonstration board always has a stable PCMCIA VPP voltage available in the form of the card operating voltage or the +12 volts from the ISA Bus.

The IRQ[15,14,12:9,7,5:3] Signals are used to indicate an interrupt request from a card. These signals should be connected directly to the corresponding ISA Bus interrupt signals. The IRQ12 and IRQ15 Signals have a dual-function capability. They can operate as a normal interrupts by connecting directly to the ISA Bus interrupt signals or they can perform alternate functions, as described below.

If the Misc Control 2 Register (Index 1Eh) Bit 4 (Drive LED Enable) is set, the IRQ12 Pin functions instead as an open-drain driver for disk-status LED signals from the PCMCIA sockets. The schematics in Appendix A show one possible solution using the IRQ12 Pin as a disk-status LED driver.

If the Misc Control 2 Register (Index 1Eh) Bit 7 (IRQ15 Is RI Out) is set, the IRQ15 Pin functions instead as a debounced -RI ring indicate output from each socket's BVD1/-STSCG Pin. This allows ring-indicate status from some PCMCIA modem cards to be used to signal systems to go from standby to full operation. To enable a socket's -RI Signal Out to IRQ15, the corresponding socket's Interrupt and General Register Control Register (Index 3h) Bit 7 (Ring Indicate Enable) must be set to '1'. In a '386SL-based system, IRQ15 can then be connected to the '360SL -RI input. In the CL-PD6720, if either cards' -RI input is active, IRQ15 will go low in this mode. Note that when IRQ15 is being used as a -RI output, debouncing circuitry prevents IRQ15 from going high again until a new ISA Bus cycle occurs.

How the -INTR output should be connected is usually a function of which Card-services/Socket-services software is to be integrated with the system. With most Card-services/Socket-services, the -INTR Pin of the CL-PD67XX will not be used and can be left disconnected. Typically, a Card-service device driver will designate a particular IRQ Interrupt to indicate a card status change.

If the designer wishes to use the -INTR Pin for status change interrupts, it should be connected to the '360SL $\overline{\text{SMI}}$ input in a '386SL-based system (or to the $\overline{\text{NMI}}$ input in a core-logic-based system) to allow the CL-PD67XX to generate system interrupts. If the designer chooses to wire-OR the -INTR Pin to the $\overline{\text{SMI}}$ or $\overline{\text{NMI}}$ input of the processor, along with similar signals from other devices in the system, an interrupt handler needs to be employed so the processor can service the interrupt as a CL-PD67XX status change. PCMCIA Card-services/Socket-services software vendors can typically provide sample code to be integrated into system interrupt handlers for this purpose.

3.2 PCMCIA Socket Interface

The CL-PD67XX host controller has a fully buffered PCMCIA socket interface. There is no need to use any additional socket buffering. All the socket interface signals can be directly connected to the socket connector.

3.3 PCMCIA Socket Power Control

The CL-PD67XX power-control signals are used to the control PCMCIA socket power circuits. The signals are intended to be used to enable the power from the PCMCIA socket power source to socket VCC (the power to the card) and VPP (the programming and peripheral voltage) power pins. A description of these signals and how they are used is discussed in this section. Refer to Figure 3–1 for a block diagram of the VCC and VPP Signals.

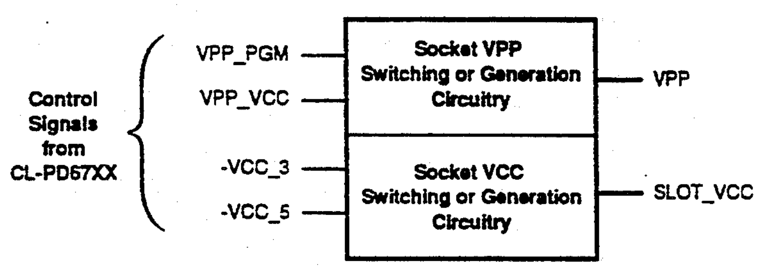

Figure 3–1. Block Diagram of Card-Socket Power Supply/Switching Circuit

The CL-PD67XX -VCC_3 and -VCC_5 Signals for a socket interface are intended to be used to enable the power-switching circuitry that selects the power source applied to VCC Pins 17 and 51 of each PCMCIA socket. Both -VCC_3 and -VCC_5 are active-low signals and are mutually exclusive of each other. The Misc Control 1 Register (Index 16h) and the Power Control Register (Index 2h) are used to control -VCC_3 and -VCC_5. (See the *CL-PD6710/PD6720 Data Book* for more information about the registers and their function.) A low on -VCC_3 is intended to cause a PCMCIA socket power-supply circuit to provide +3.3 volts to the Card-socket VCC Pins 17 and 51; a low on -VCC_5 is intended to enable +5 volts to be provided to Card-socket VCC Pins 17 and 51.

When both -VCC_3 and -VCC_5 Pins for a socket interface are inactive-high, it is intended that a PCMCIA power supply would disconnect power sources from the socket's VCC Pins. Unlike other PCMCIA host controllers, there is no need to clamp a socket's VCC Pins to ground when both -VCC_3 and -VCC_5 are inactive-high; special interface circuitry in the CL-PD67XX prevents card damage in this situation.

CL-PD67XX socket-interface VPP_VCC and VPP_PGM Signals are used to control the voltage level to VPP Pins at the associated PCMCIA socket. To be PCMCIA compatible and function with both memory and I/O cards, the VPP switching/generation circuitry should be able to supply 0 volts, the selected card VCC voltage of +3.3 or +5 volts, and +12 volts to the socket's VPP pins. Both the VPP_VCC and VPP_PGM Signals are active-high signals that are mutually exclusive of each other. A high on VPP_VCC should be used to enable the PCMCIA socket VPP switching/generation circuit to provide the socket's current VCC voltage (as determined by the -VCC_3 and -VCC_5 Control Signals) to the Card Socket Pins 18 and 52; a high on VPP_PGM enables +12 volts to be provided to Card Socket Pins 18 and 52.

The PCMCIA standard requires that a socket's VPP-supply pins be at a logic '0' when programming voltages are not being applied. This can be accomplished by selecting a VPP switching or generation circuit that forces its VPP output to 0 volts when the socket interface's VPP_VCC and VPP_PGM Signals are both inactive-low. Alternatively, a bleed resistor can be placed from the socket's VPP Pins to ground, although this method may create unwanted power consumption for power-sensitive applications.

The schematics in Appendix A show a sample design on implementing the power-control supply logic for VCC and VPP to the PCMCIA socket in a system where +12 volts is already available.

The CL-PD67XX host controller provides an input called +5V_DET. This signal can be used by applications to determine if an inserted card functions at +5 volts only or is capable of operating at +3.3 volts as well. The +5V_DET Pin should be connected to Pin 43[1] of the PCMCIA socket. The CL-PD67XX internally pulls the +5V_DET Signal high. Cards that can support +3.3-volt operation will ground their Pin 43, and cards that work at +5 volts only, or that can work at +5 volts but choose to report their low-voltage capability through their card information structures, will leave their Pin 43 floating, causing +5V_DET to be active high.

3.4 Power Distribution

The CL-PD67XX has four types of power-distribution pins that are used to provide power to various parts of the circuitry (see Figure 3–2). These types are: ISA_VCC Power Pins, VDD Power Pins, SLOT_VCC Power Pins, and the +5V Power Pin.

Using these separate types of power pins permits the use of the CL-PD67XX in a wide variety of applications where PCMCIA card voltages are dynamically changing between +3.3 and +5 volts or are being powered-on and -off.

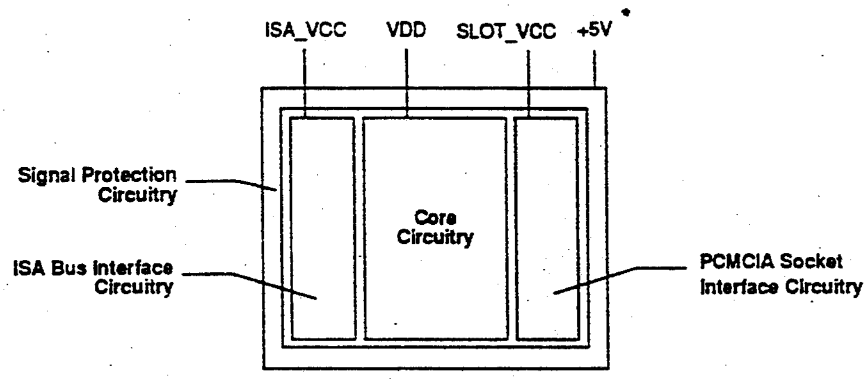

Figure 3–2. CL-PD67XX Powering of Internal Logic

The ISA_VCC Power Pins are used to power the ISA-bus-interface circuitry. The ISA_VCC Power Pins should be connected to the same power source used to drive other ISA Bus signals. When ISA_VCC is at +3.3 volts, ISA Bus interface signals operate at +3.3 volts. When ISA_VCC is at +5 volts, ISA-bus-interface signals operate at +5 volts.

The VDD Power Pins supply power to the main core circuitry of the CL-PD67XX. Since VDD may be set at +3.3 or +5 volts, independent of the operating voltage at the ISA-bus or Card-socket interfaces, it is preferred that VDD be set to +3.3 volts to reduce system power consumption. If there is no +3.3-volt supply available in the system, a regulator or diode circuit may be used to step-down the VDD voltage for power savings.

[1] Use of Pin 43 as +5V_DET is not yet officially approved as a PCMCIA Standard. Actual pin number assignment is subject to change pending approval by the 3.3/5V PCMCIA Working Group Committee.

SLOT_VCC Power Pins supply power to the socket-interface pins and should be powered from the same card-power-circuit output that goes to the corresponding socket VCC Pins. This allows the respective socket-interface signals to operate at the same voltage as the card operating voltage.

On the CL-PD6720, which has two separate socket interfaces, each interface's SLOT_VCC Pins can operate independent of the other socket interface. This would prevent signal mismatch problems when, for example, a card in Slot A is operating at +5 volts while a card in Slot B is operating at +3.3 volts or is powered-off.

The power pin labeled '+5V' must be connected to the system +5-volt power supply. During conditions when the system +5-volt supply is not always powered-on, the +5V Pin must be connected to a supply whose voltage is at the same or higher potential than any of the voltages provided to the CL-PD67XX other power pins.

CAUTION: If the other supply voltages (ISA_VCC, VDD, or SLOT_VCC) are raised more than 0.5 volts above the voltage applied to the +5V Pin, latch-up and/or damage to the CL-PD67XX can result. Connecting the CL-PD67XX power pins as previously described should prevent any potentially problematic situations. However, the possibility for latch-up conditions should be carefully analyzed in each design.

Refer to Figure 3–3 for a block diagram of the host and socket interfaces.

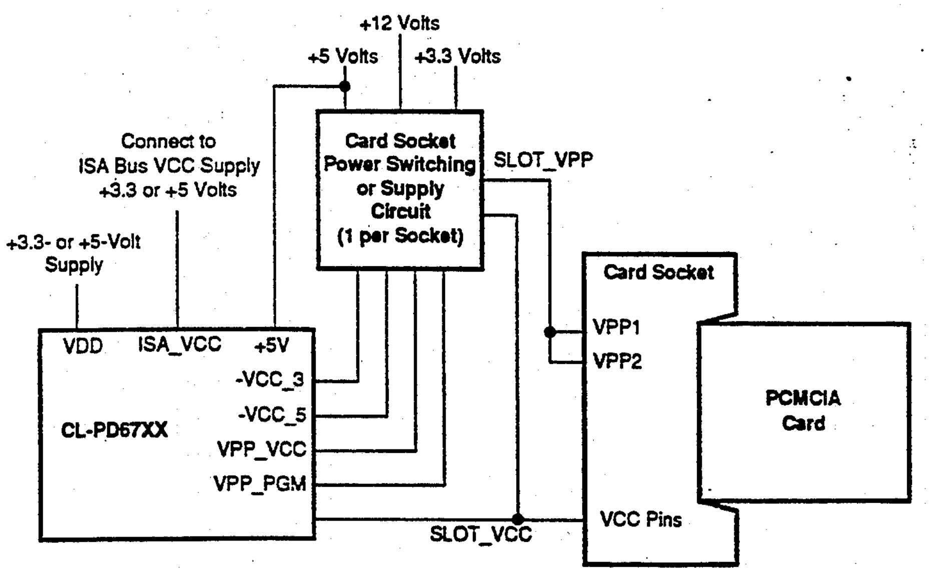

Figure 3–3. Typical Power Distribution for the CL-PD67XX

4. POWER-SAVING MODES

In addition to the normal operating mode, which consumes very low power, the CL-PD67XX supports three power-saving modes to further reduce the power consumption of the PCMCIA host controller. Refer to the *CL-PD6710/PD6720 Data Book* for a full description of power-management features.

4.1 Automatic Low-Power Dynamic Mode

The Automatic Low-power Dynamic Mode is transparent to normal system operation and is by default enabled after chip reset. After reset, the host is configured for Automatic Low-power Dynamic Mode. This mode can be turned-off by writing to Misc Control 2 Register (Index 1Eh) and setting Bit 1 to a '0'. During periods of system inactivity in Automatic Low-power Dynamic Mode, the internal clock is turned off to most of the chip and the PCMCIA address lines are held at static values. Socket VCC and VPP Power Control Signals are not affected. Once activity occurs at the card socket (e.g., -INTR activation or status pins change) or ISA Bus cycles occur to either valid card addresses or CL-PD67XX registers, the CL-PD67XX restarts internal clocking. When ISA Bus cycles cease to access valid card address windows or the chip's internal registers, the CL-PD67XX automatically stops internal clocks again and holds socket interface outputs static.

An example of a code segment that may be used to enable Automatic Low-power Dynamic Mode is shown below:

```
MOV     DX, E0h
MOV     AL, 01Eh
MOV     AH, 02h
OUT     DX, AX
```

Note that when operating in Automatic Low-power Dynamic Mode, the system bus IOR* Signal must go inactive within 120 ns after IOCHRDY goes from low to high. This time is represented as time t1 in Figure 4–1. If the system core logic fails to meet this timing requirement, and Automatic Low-power Dynamic Mode is to be used, then the CL-PD67XX Recovery Timing Registers must be programmed to adjust for the longest time that the system requires for IOR* to become inactive after IORCHDY becomes inactive.

If the maximum t1 time, $t1_{max}$, is greater than 120 ns, then a minimum value $n$ is to be programmed into the Recovery Timing Registers. The value is calculated as follows:[1]

$$n = \left(\frac{t1_{max}}{\text{Prescaler value}}\right) - 1 \quad \text{(round-up } n \text{ to nearest intenger)}$$

For example, if $t1_{max}$ in a system implementation is 280 ns, then the minimum value programmed into the Recovery Timing Registers would be:

$$n = \left(\frac{280\text{ ns}}{40\text{ ns}}\right) - 1 = 6$$

In this example, Recovery Timing Registers (Index 3Ch/7Ch and 3Fh/7Fh) should be programmed to a minimum value of 06h.

[1] See Chapter 6 for a description of the prescaler value. It is typically 40 ns, indicated by Bits 7 and 6 of the Recovery Timing Register being set to '0,0'. If Bits 7 and 6 are not set to '0,0', refer to Table 6–2 to determine the prescaler value (to be used in this equation) that corresponds to the bit settings.

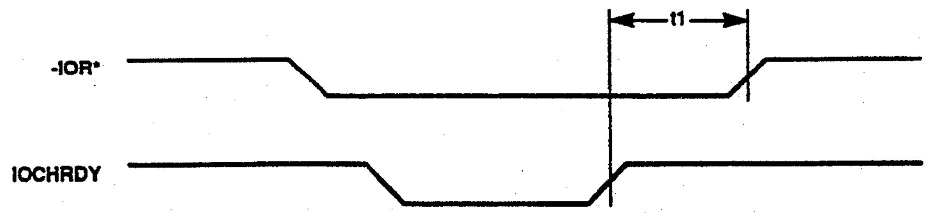

**Figure 4–1. Relationship Between IOCHRDY High and IOR* High for Automatic Low-Power Dynamic Mode Operation**

4.2 Suspend Mode

During periods of operation when no card or chip access is needed, Suspend Mode may be used for increased power savings. The CL-PD67XX is put into Suspend Mode by writing to the Misc Control 2 Register (Index 1Eh) and setting Bit 2 to a '1'. In Suspend Mode, the internal synthesizer and all the internal clocks are turned off and only access to the Index Register and the Misc Control 2 Register is supported. Both VCC and VPP Power Control Pins to each socket's power-switching/supply chipset are left unchanged (it is up to the system power-management software to suspend power to the socket before Suspend Mode if such an action is appropriate). Card-socket status changes and card interrupts are still detected and system interrupts are still generated when in Suspend Mode.

To return from Suspend Mode, the Misc Control 2 Register Bit 2 is set to a '0'. If the internal synthesizer is being used, other registers should not be accessed for 50 ms after return from Suspend Mode to allow the CL-PD67XX to restart the internal clock synthesizer.

An example of a code segment that may be used to enable Suspend Mode is shown below:

```
MOV     DX, 3E0h
MOV     AL, 01Eh
MOV     AH, 04h
OUT     DX, AX
```

4.3 Super Suspend Mode

If the Misc Control 2 Register Bit 2 is set to a '1' and then the AEN Signal is held high, the CL-PD67XX enters a 'Super Suspend' Mode. Super Suspend Mode retains all features of Suspend Mode, except access to the Misc Control 2 Register is not allowed. A key feature of Super Suspend Mode is that all ISA Bus inputs are disabled, shielding the CL-PD67XX from the effects of floating ISA Bus signals in power-down modes of some systems.

4.4 Additional Notes on PCMCIA Subsystem Power Reduction

The CL-PD67XX strictly controls power consumption during power-saving modes. The following measures can be utilized at the system-level to further minimize power consumption of the entire PCMCIA subsystem (including the PCMCIA power-switching/supply circuit and card):

1) Controlling power to the cards (Power Control Register Bits 5:0)
2) Enabling and disabling card interfaces (Power Control Register Bit 7)
3) Externally turning-off clock sources to the CL-PD67XX

5. WINDOWS

The CL-PD67XX provides memory and I/O address-translation features that allow transformation of system addresses into address ranges suitable for use with PCMCIA memory and I/O cards. These address-translation features are organized as five independent memory windows per socket and two independent I/O windows per socket.

Typical memory and I/O windows are configured using PCMCIA Card- and Socket-service software or card-vendor-provided setup utilities.

5.1 Memory Windows

The CL-PD67XX has five memory windows. These windows are accessed through the Socket-service software. A typical example of how a window is defined and accessed is described below.

Memory window sizes can be programmed on 4-Kbyte-increment boundaries. Offsets for these windows are provided so that the actual address used to access the PCMCIA peripheral can be different than the system ISA-bus address. For example, assume you want to access a memory card in your PCMCIA socket. The memory card has memory you wish to access at PCMCIA Addresses 0 through 0FFFF (64K bytes). A memory window could be specified in the computer's space that starts at 0D000:0 and continues through 0D000:0FFFF. This would allocate the memory space in the host (assuming it wasn't already being used by the computer) to the PCMCIA host adapter. To program the PCMCIA socket memory addresses to start at location 000 0000h for ISA-bus-memory addresses starting at 0D000:0, an offset needs to be computed so that the ISA-bus-memory address plus the window's memory-map offset equals the PCMCIA address (000 0000h). This is done by taking the two's complement of 0D000:00000 to create the desired negative offset (remember that the 4-Kbyte-increment window resolution causes A11-A0 to map directly). This computed offset value is then programmed into the selected window's Memory Map Address Offset High and Memory Map Address Offset Low Registers. This then causes ISA-bus-memory accesses at Address 0D000:0 (for example) to occur at PCMCIA Address 0 and so on through the ISA-bus-memory map up to 0D000:0FFFF. Figure 5–1 shows how the mapping is done.

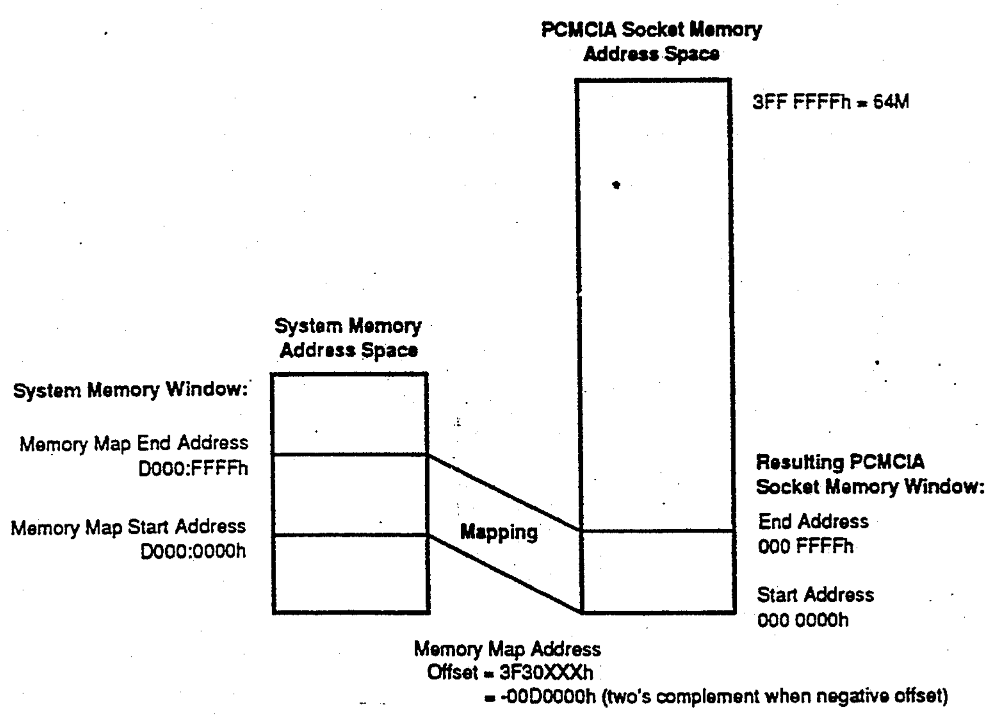
Figure 5–1. Window Mapping Example of System Memory Address to PCMCIA Socket Memory Address

Below is a code segment (related to the example in Figure 5–1) that programs a CL-PD62XX socket-interface Memory Window 0 as a 1-Mbyte window with a starting system address at location D000:0000h and a negative offset to create a 1-Mbyte socket memory window starting at PCMCIA address 000 0000h:

```
MOV    DX, 03E0h
MOV    AL, 02h
MOV    AH, B0h     Set socket to Auto-power-on when card is installed.
OUT    DX, AX

MOV    AL, 06
IN     AX, DX
AND    AH, FE      Disable Memory Map 0 during memory map window programming,
OUT    DX, AX      leave all other bits unchanged.

MOV    AL, 10h
MOV    AH, D0h     Program Memory Map 0 Start Address Low Byte (A19-A12).
OUT    DX, AX

MOV    AL, 11h
MOV    AH, 80h     Program Memory Map 0 Start Address High Byte (A23-A20) to all zeros;
OUT    DX, AX      enable 16-bit card memory cycles.

MOV    AL, 12h
MOV    AH, DFh     Program Memory Map 0 End Address Low Byte (A19-A12).
OUT    DX, AX

MOV    AL, 13h
MOV    AH, 00h     Program Memory Map 0 End Address High Byte (A23-A20); select card
OUT    DX, AX      cycle Timing Register Set 0 for memory operations in this window.

MOV    AL, 14h
MOV    AH, 30h     Program Memory Map 0 Address Offset Low Byte (A19-A12).
OUT    DX, AX

MOV    AL, 15h
MOV    AH, 3Fh     Program Memory Map 0 Address Offset High Byte (A25-A20); program
OUT    DX, AX      Memory Window 0 to be common memory; clear Write Protect to allow
                   writes to card memory in Memory Window 0.

MOV    AL, 06
IN     AX, DX
OR     AH, 01      Enable Memory Map 0, leave all other bits unchanged.
OUT    DX, AX
```

5.2 I/O Windows

The CL-PD67XX supports two I/O windows per card socket. I/O-window mapping works similarly to that of memory windows. I/O window sizes can be specified in increments of even addresses on byte boundaries. Offsets are also provided from I/O windows so that the actual address used to access I/O on a PCMCIA card can be different than the system I/O address. A typical example of how an I/O window is defined and accessed is described below.

The example in Figure 5–2 shows two I/O windows programmed for IDE drive support with I/O-map offsets of zero. The first I/O window has a start address at 01F0h and a stop address at 01F7h. A second I/O window has a start address at 03F6h and a stop address at 03F7h.

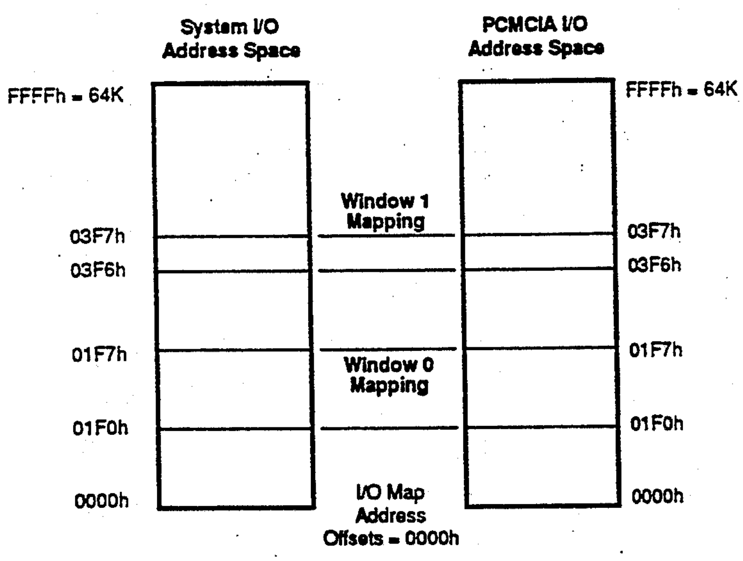

Figure 5–2. Window Mapping Example of System I/O Addresses Without Offset to PCMCIA I/O Address

Following is a code segment related to the example in Figure 5–2.

```
MOV   DX, 3E0h
MOV   AL, 08h
MOV   AH, F0h    Program I/O Map 0 Start Address Low.
OUT   DX, AX

MOV   AL, 09h
MOV   AH, 01h    Program I/O Map 0 Start Address High.
OUT   DX, AX

MOV   AL, 0Ah
MOV   AH, F7h    Program I/O Map 0 End Address Low.
OUT   DX, AX

MOV   AL, 0Bh
MOV   AH, 01h    Program I/O Map 0 End Address High.
OUT   DX, AX

MOV   AL, 0Ch
MOV   AH, F6h    Program I/O Map 1 Start Address Low.
OUT   DX, AX

MOV   AL, 0Dh
MOV   AH, 03h    Program I/O Map 1 Start Address High.
OUT   DX, AX

MOV   AL, 0Eh
MOV   AH, F7h    Program I/O Map 1 End Address Low.
OUT   DX, AX

MOV   AL, 0Fh
MOV   AH, 03h    Program I/O Map 1 End Address High.
OUT   DX, AX

MOV   AL, 06
MOV   AH, C0     Enable I/O Map 0 and I/O Map 1.
OUT   DX, AX

MOV   AL, 02
MOV   AH, B0     Program Card Enable, Auto Power, and Card Power On.
OUT   DX, AX
```

6. TIMING REGISTERS

The timing registers are used to program PCMCIA-card-access timing for the following timing parameters: Setup, Command, and Recovery. Programming the timing registers of the CL-PD67XX for a specific timing value can relieve the CPU of the task of performing software timing loops to meet the required timing specifications for slower-access PC cards (e.g., Flash-memory cards). The CL-PD67XX has two timing register sets: Timing 0 and Timing 1. Each timing register set has a Setup Timing Register, a Command Timing Register, and a Recovery Timing Register. Memory and I/O windows can be individually programmed to use card access timing from either of the programmable timing register sets (Timing 0 or Timing 1).

NOTE: The timing-set register values should not be modified in the middle of PCMCIA Bus cycles. Timing registers should not be changed until the Write FIFO is empty because the timing changes begin immediately and may corrupt any in-progress cycles. This can be verified by checking that FIFO Control Register (Index 17h) Bit 7 (Empty Write FIFO) is set to a '1'.

After reset, the Timing 0 Register Set defaults to the values shown in Table 6–1 below. The Command Signals (i.e., -WE, -OE, -IOWR, and -IORD) are the signals used to control Setup, Command, and Recovery. The window widths are derived from the falling edge and rising edge of these signals. The register setting for the Timing Set 0 Register after reset is shown in Table 6–1 and the timing diagram is shown in Figure 6–1.

Table 6–1. Programmable Timing Set 0 Default Setting

| Parameter | Register | Value | Time |
|---|---|---|---|
| Setup | 3A | 01 | 80 ns |
| Command | 3B | 06 | 280 ns |
| Recovery | 3C | 00 | 40 ns |

6.1 An Example: Setting Timing Register for Flash ROM

The user can change the values in the timing registers to vary the width of the Setup, Command, and Recovery Time for a particular application.

For example, consider programming a flash memory card that requires a minimum address Setup Time of 30 ns, a write pulse width of 150 ns, and a data Recovery Time of 50 ns. This particular flash-memory card has a write cycle time of 15 ms and will not accept another write until this unit of time has elapsed. The CL-PD67XX can be configured as described in Section 6.2 to accommodate this flash-timing specification. By programming the required cycle parameters into a timing-register set, flash-card programming can be accomplished without the system CPU having to calculate cycle periods.

6.2 Programming the Timing 1 Register Set

Each timing register has two variable fields that control the scale and duration of the timing parameter — the prescaler value and the multiplier value. Using the prescaler value and the multiplier value, the timing parameter is calculated as follows:

$$\text{Timing parameter} = (\text{Prescaler value}) \times (\text{Multiplier value}) + 40 \text{ ns}$$

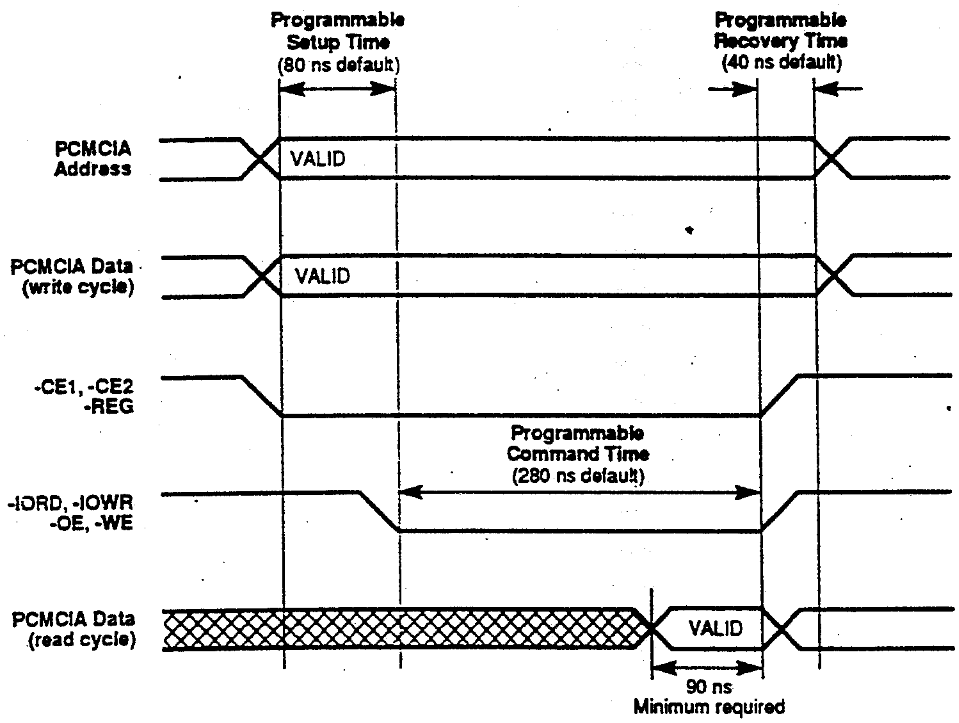
Figure 6–1. Setup, Command, and Recovery Timing Diagram

Prescaler values are determined by Bits 7 and 6 of each of the three timing registers comprising Timing Set 0 and Timing Set 1. The possible values are as shown in Table 6–2.

Table 6–2. Prescaler Values

| Timing Parameter Register Bit 7, Bit 6 | Prescaler Value |
|---|---|
| 0,0 | 40 ns |
| 0,1 | 640 ns |
| 1,0 | 10.24 µs |
| 1,1 | 327.68 µs |

The multiplier is used to increase the timing parameter by a factor of the selected prescaler. The multiplier value is determined by Bits 5:0 of the three timing registers comprising Timing Set 0 and Timing Set 1. The six bits permit integer values from 0 to 63.

Based on the range of prescaler and multiplier values, the minimum timing-parameter-window width is 40 ns, and the maximum timing-parameter-window width is slightly greater than 20 ms, which is large enough to accommodate the 15-ms write cycle time for flash ROM.

To select a Setup Time parameter close to 30 ns, choose '0,0' for Bits 7 and 6 (corresponding to a prescaler value of 40 ns), and with a multiplier of zero, this gives an address Setup Time of 40 ns:

$$\text{Setup Time} = (40\ \text{ns}) \times (0) + 40\ \text{ns} = 40\ \text{ns}$$

The Command and Recovery Registers are configured similarly. After setting up the Timing 1 Registers for the example described, the Setup, Command, and Recovery Registers would have the values shown in Table 6–3 and Figure 6–2.

Table 6–3. Example of Flash ROM Write Timing Setting

| Parameter | Register | Value | Time |
|---|---|---|---|
| Setup | 3D | 00 | 40 ns |
| Command | 3E | 04 | 160 ns |
| Recovery | 3F | BE | 15.07 ms |

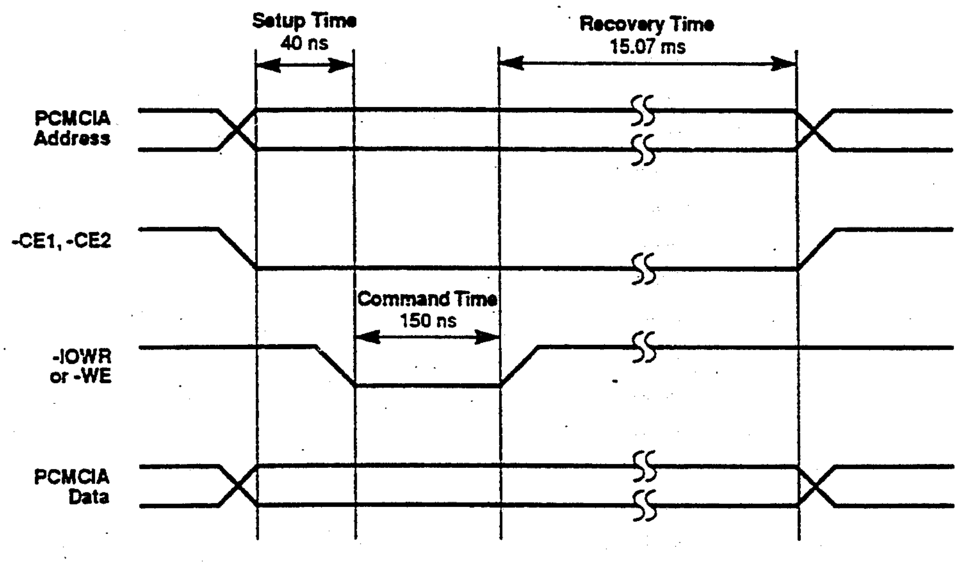
Figure 6–2. Timing Diagram of Example Flash ROM Write Timing Setting

The following code segment demonstrates the code needed to program the Timing 1 Registers for the Flash-ROM timing example:

```
        MOV     CX, 3FFh        Set up counter for time out.
        MOV     DX, 03E0h       FIFO Register Index.
LOOP:   IN      AX, DX          Read Register.
        AND     AL, 80h
        DEC     CX
        JZ      BUSY            Time out.
        JNE     LOOP            FIFO is not empty.

        MOV     DX, 03E0h
        MOV     AL, 3Dh
        MOV     AH, 01h         Set Setup Time window of 40 ns.
        OUT     DX, AX

        MOV     DX, 03E0h
        MOV     AL, 3Eh
        MOV     AH, 06h         Set Command Time window of 150 ns.
        OUT     DX, AX

        MOV     DX, 03E0h
        MOV     AL, 3Fh
        MOV     AH, BE          Set Recovery Time window of 15.07 ms.
        OUT     DX, AX

        MOV     DX, 03E0h
        MOV     AL, 13h
        MOV     AH, 40h         Set up Memory Window 0 to use Timing 1 timing.
        OUT     DX, AX

BUSY:
```

Notes

CIRRUS LOGIC

Appendix A

CL-PD6710/PD6720 ISA Bus Demonstration Board PCMCIA Solution — Schematics

The schematics in Appendix A show sample circuits. The signal connections used in evaluation board schematics can be applied to a motherboard solution. The evaluation board schematics provided include the following:

- Sample circuitry for the CL-PD6710:
  - Power-control logic
  - ISA Bus interface
- Sample circuitry for the CL-PD6720:
  - Power-control logic
  - ISA Bus interface
  - PCMCIA Bus interface

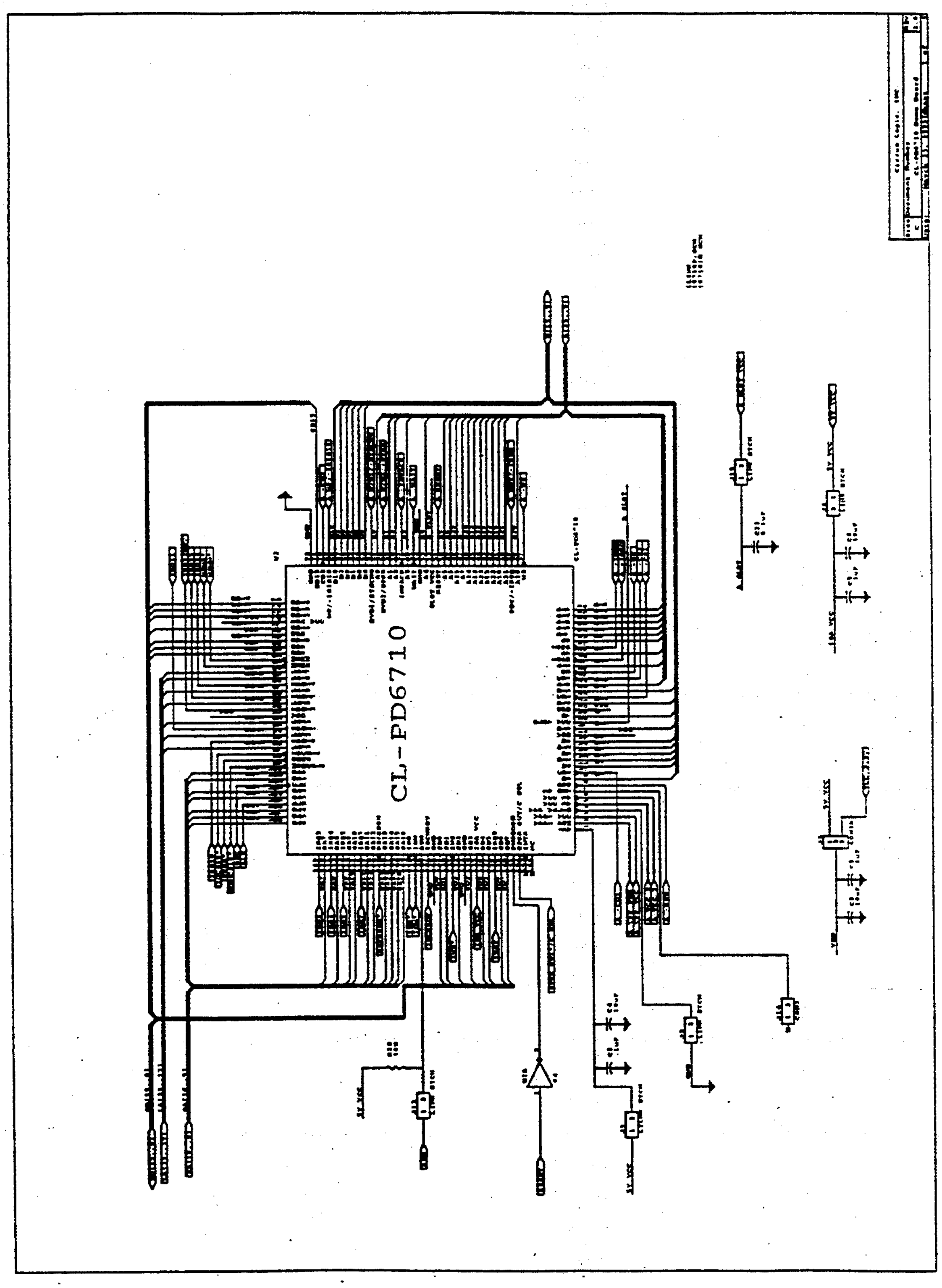
CL-PD6710

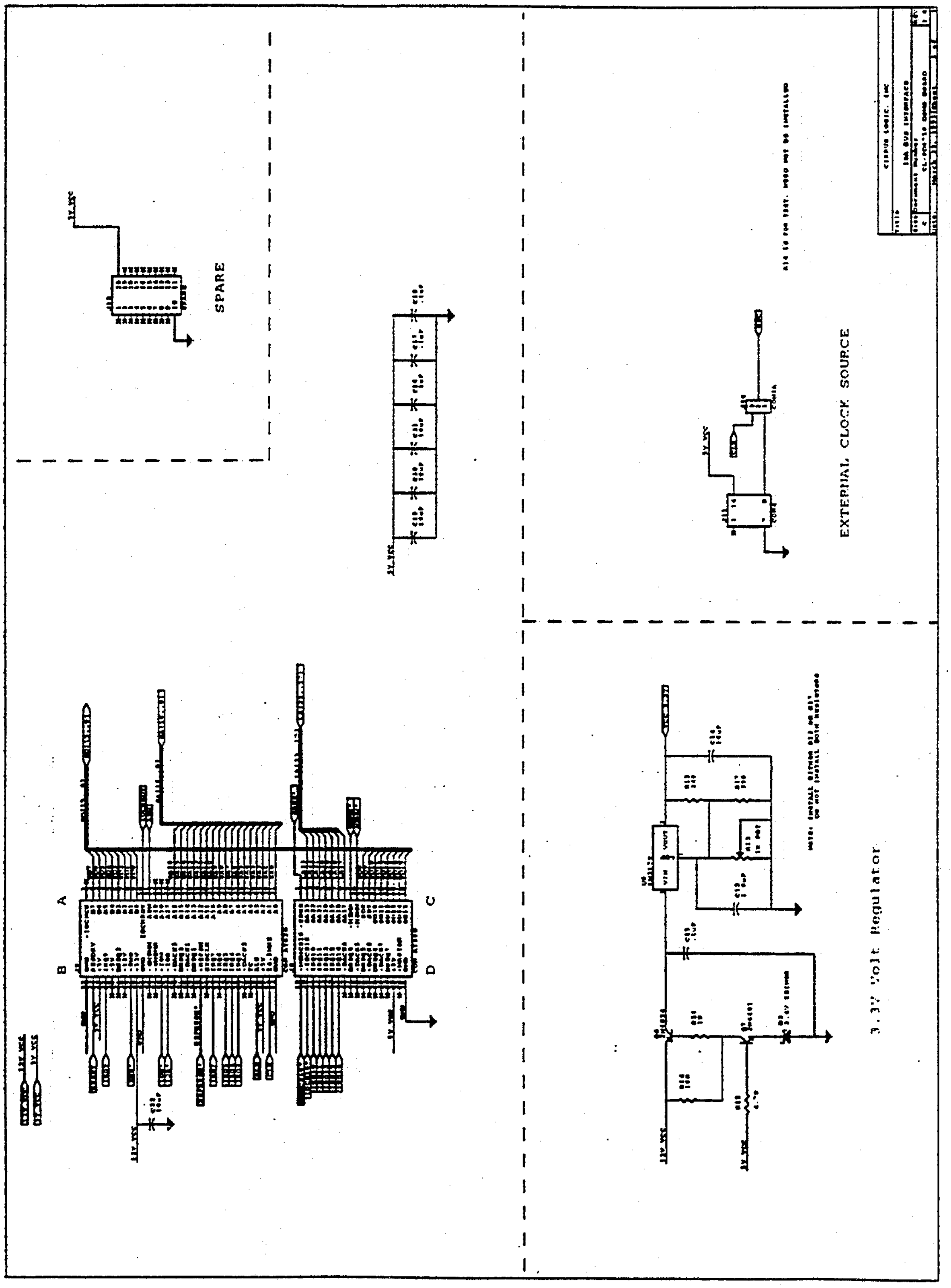
SPARE
EXTERNAL CLOCK SOURCE
3.3V Volt Regulator
A
B
C
D

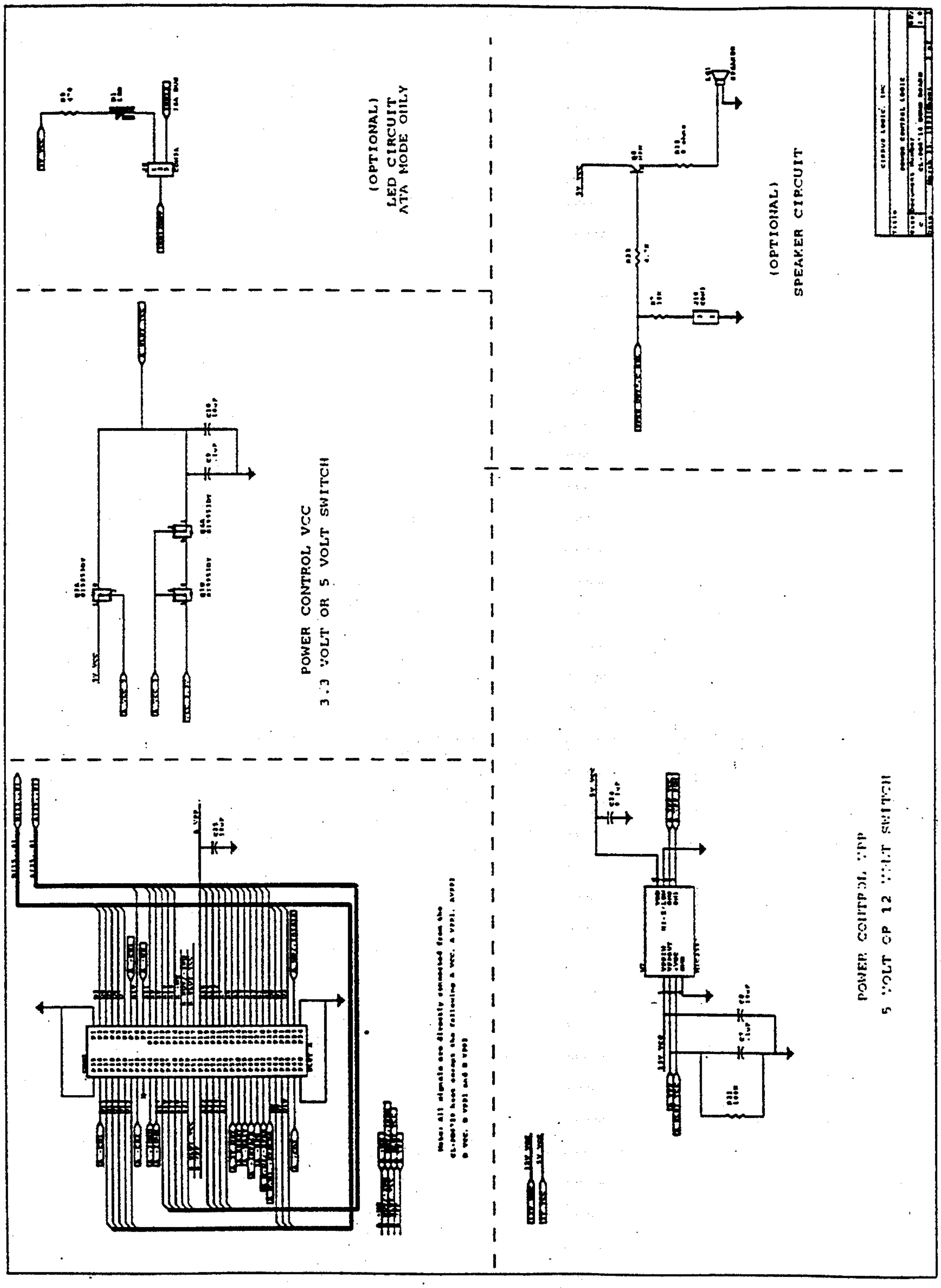
(OPTIONAL)
LED CIRCUIT
ATA MODE ONLY
POWER CONTROL VCC
3.3 VOLT OR 5 VOLT SWITCH
(OPTIONAL)
SPEAKER CIRCUIT
POWER CONTROL VPP
5 VOLT OR 12 VOLT SWITCH

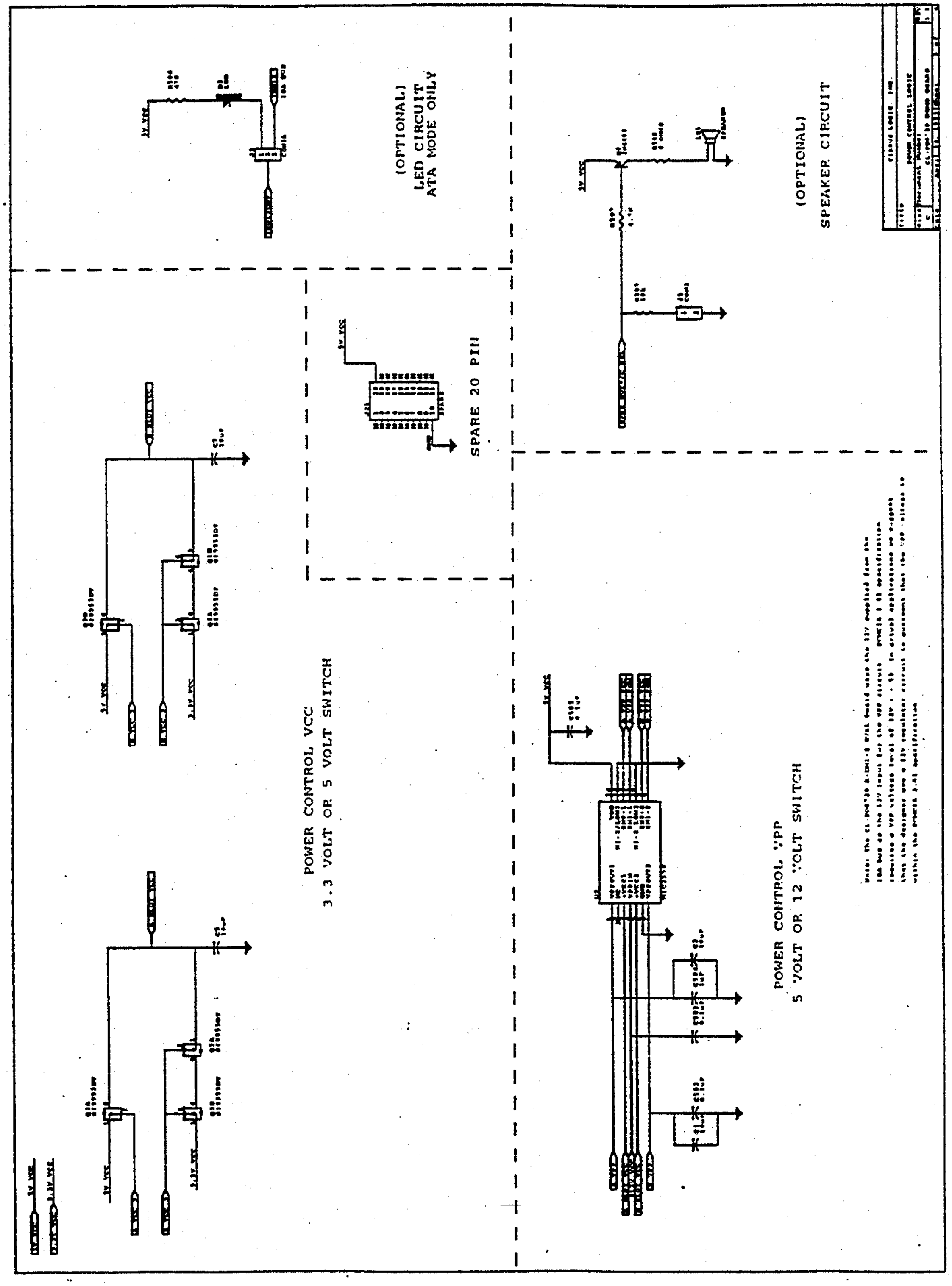
(OPTIONAL)
LED CIRCUIT
ATA MODE ONLY
SPARE 20 PIN
(OPTIONAL)
SPEAKER CIRCUIT
POWER CONTROL VCC
3.3 VOLT OR 5 VOLT SWITCH
POWER CONTROL VPP
5 VOLT OR 12 VOLT SWITCH

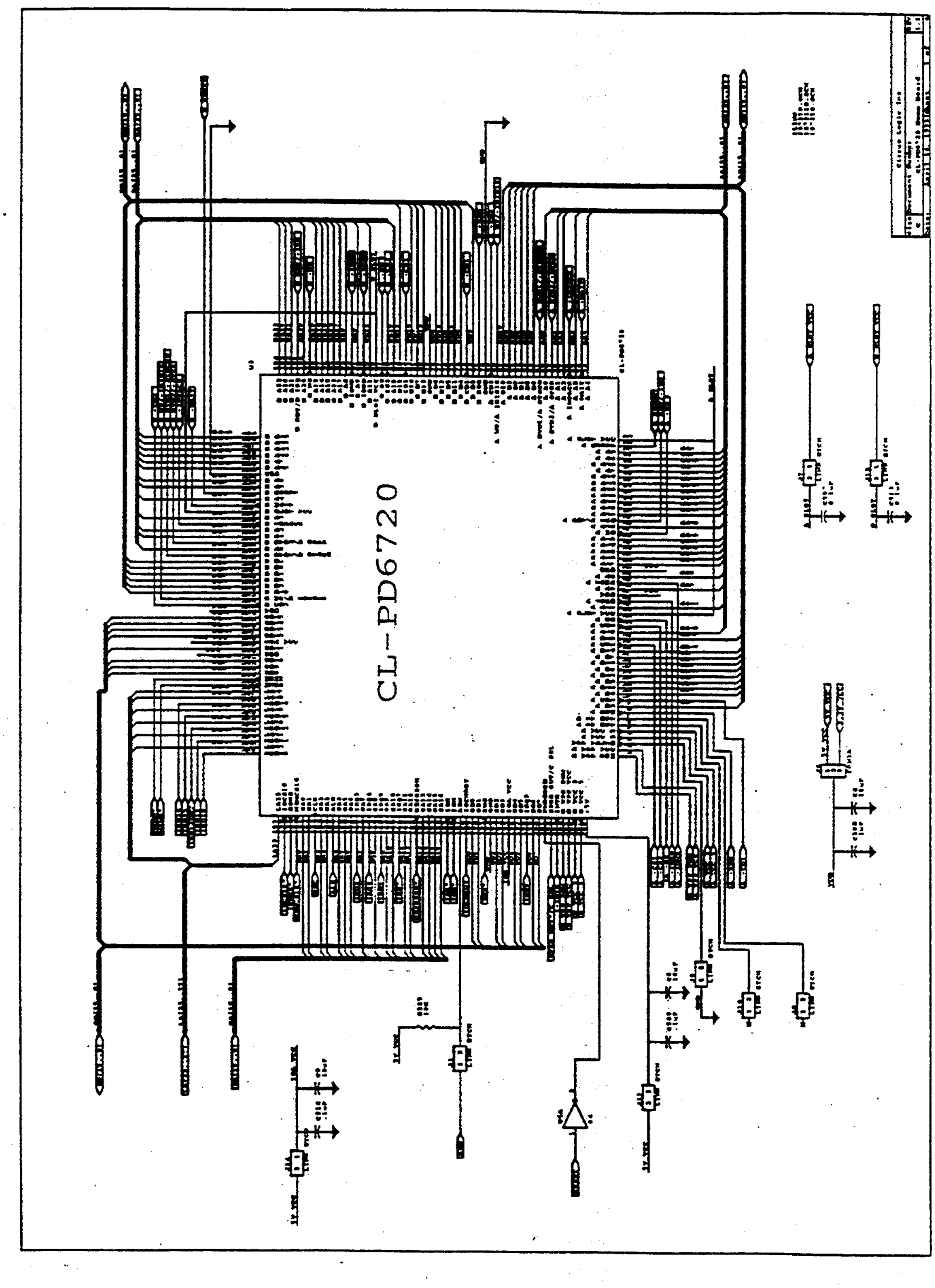
CL-PD6720

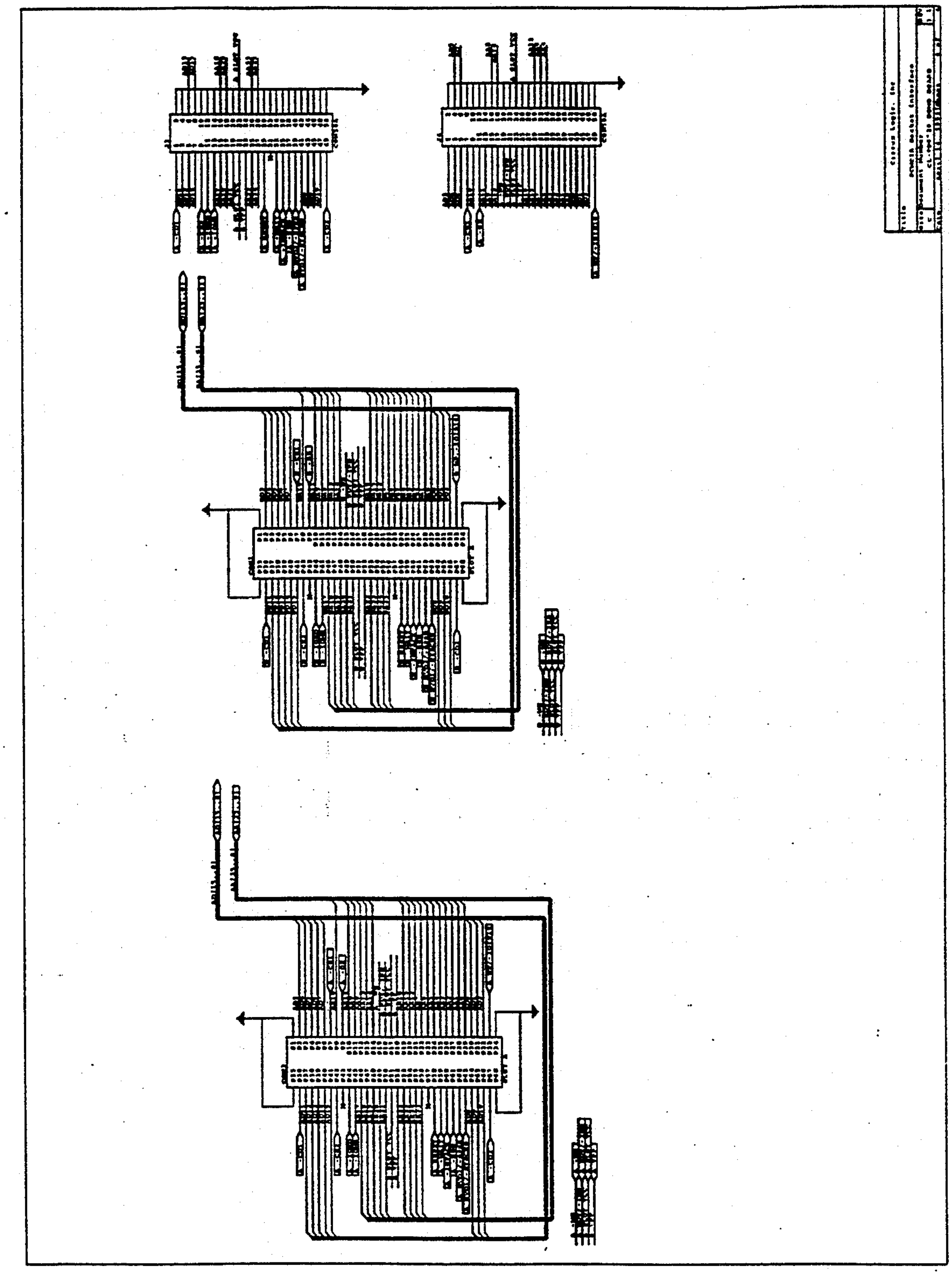

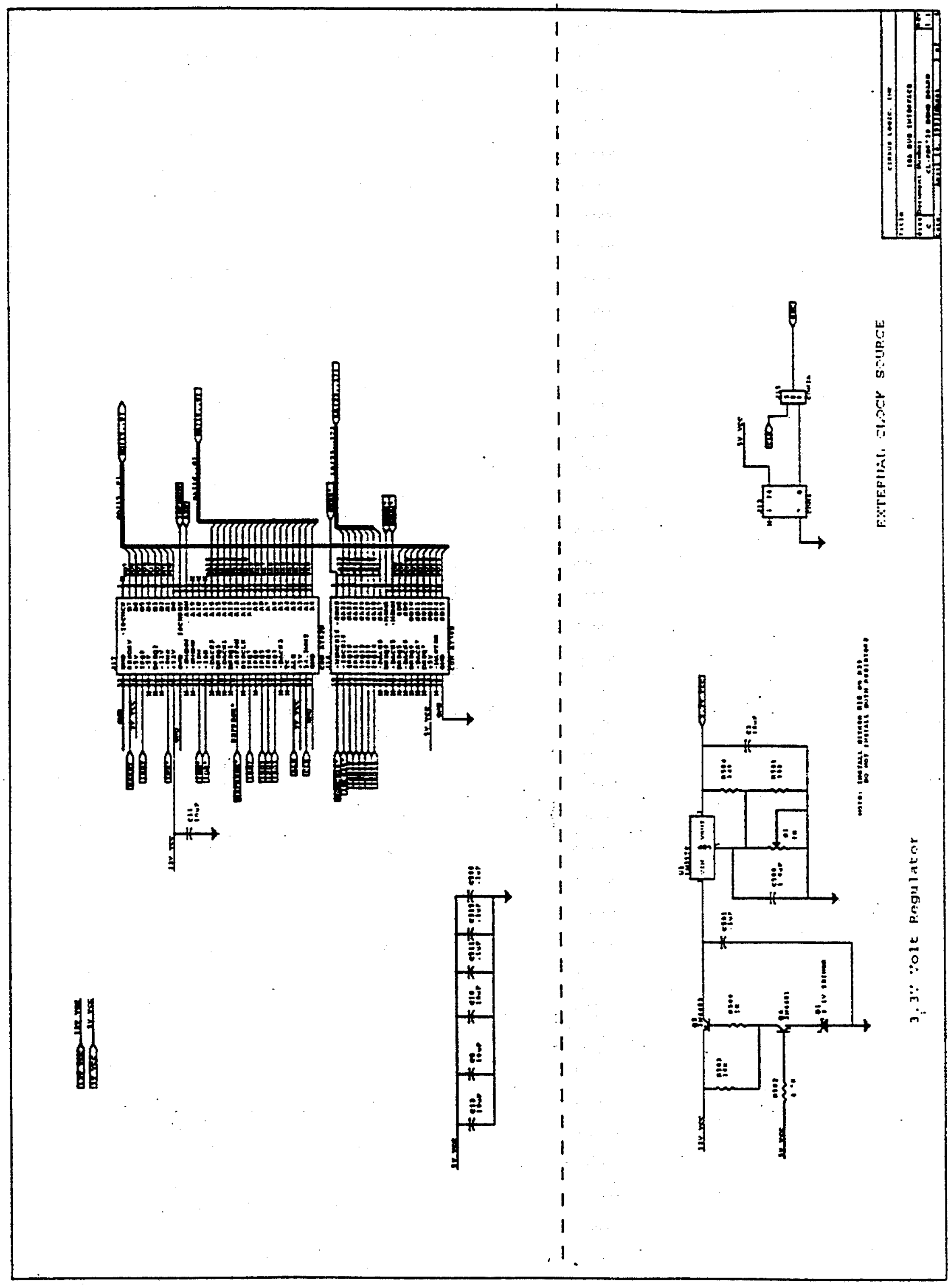
EXTERNAL CLOCK SOURCE
3.3V Volt Regulator

CIRRUS LOGIC

CL-PD6710/PD6720

*Advance Application Note — AN-PD1 v1.0*

Direct Sales Offices

Domestic

N. CALIFORNIA
San Jose
TEL: 408/436-7110
FAX: 408/437-8960

S. CALIFORNIA
Tustin
TEL: 714/258-8303
FAX: 714/258-8307

Thousand Oaks
TEL: 805/371-5381
FAX: 805/371-5382

ROCKY MOUNTAIN AREA
Denver, CO
TEL: 303/768-9696
FAX: 303/768-9695

SOUTH CENTRAL AREA
Austin, TX
TEL: 512/794-8490
FAX: 512/794-8069

Plano, TX
TEL: 214/985-2334
FAX: 214/964-3119

CENTRAL AREA
Chicago, IL
TEL: 708/490-5940
FAX: 708/490-5942

NORTHEASTERN AREA
Andover, MA
TEL: 508/474-9300
FAX: 508/474-9149

Philadelphia, PA
TEL: 215/625-0781
FAX: 215/625-0731

SOUTH EASTERN AREA
Boca Raton, FL
TEL: 407/362-5225
FAX: 407/362-5235

International

GERMANY
Herrsching
TEL: 49/08152-2030
FAX: 49/08152-6211

JAPAN
Tokyo
TEL: 81/3-3340-9111
FAX: 81/3-3340-9120

SINGAPORE
TEL: 65/3532122
FAX: 65/3532166

TAIWAN
Taipei
TEL: 886/2-718-4533
FAX: 886/2-718-4526

UNITED KINGDOM
Hertfordshire, England
TEL: 44/0727-872424
FAX: 44/0727-875919

The Company

Cirrus Logic, Inc., produces high-integration peripheral controller circuits for mass storage, graphics, and data communications. Our products are used in leading-edge personal computers, engineering workstations, and office automation equipment.

The Cirrus Logic formula combines innovative architectures in silicon with system design expertise. We deliver complete solutions — chips, software, evaluation boards, and manufacturing kits — on-time, to help you win in the marketplace.

Cirrus Logic's fabless manufacturing strategy, unique in the semiconductor industry, employs a full manufacturing infrastructure to ensure maximum product quality, availability and value for our customers.

Talk to our systems and applications specialists; see how you can benefit from a new kind of semiconductor company.

© Copyright, Cirrus Logic, Inc., 1993

*Advance* product information describes products that are in development and subject to developmental changes. Cirrus Logic, Inc., believes the information contained in this document is accurate and reliable. However, it is marked Advance and is subject to change without notice. No responsibility is assumed by Cirrus Logic, Inc., for its use, nor for infringements of patents or other rights of third parties. This document implies no license under patents or copyrights. Cirrus Logic, S/LA, FeatureChips, AutoMap, UXART, Good Data, Fair Share and SimulSCAN are trademarks of Cirrus Logic, Inc. Other trademarks in this document belong to their respective companies. Cirrus Logic, Inc., products are covered under one or more of the following U.S. patents: 4,293,783; Re. 31,287; 4,763,332; 4,777,635; 4,839,896; 4,931,946; 4,975,828; 4,979,173; 5,032,981; 5,122,783; 5,131,015; 5,140,595; 5,157,618; 5,179,292; 5,185,602.

CIRRUS LOGIC, Inc., 3100 West Warren Ave. Fremont, CA 94538
TEL: 510/623-8300 FAX: 510/226-2180

Notes

Appendix C

Method and Apparatus for Controlling a Mixed Voltage Interface in a Multivoltage System Docket No.: 14295.P030X

PCMCIA CARD SPECIFICATION

1) Section - 4
   Card Interface

2) Section - 5
   Card Metaformat

3) JEDEC Standard No. 8

PREPARED BY:
BLAKELY, SOKOLOFF, TAYLOR & ZAFMAN
12400 Wilshire Boulevard, 7th Floor
Los Angeles, California 90025
(310) 207-3800

I hereby certify that this correspondence is being deposited with the United States Postal Service as Express Mail No. TB006370265US addressed to: Commissioner of Patents and Trademarks, Washington, DC 20231, on November 8, 1993

November 8, 1993
Margaret M. Hasson　　Date

SECTION - 4

CARD INTERFACE

CARD INTERFACE

4.1 Pin Assignments[1]

Table 4-1: PCMCIA PC Card Pin 1 To Pin 34 Assignments

| Memory Only Card Interface: (Always available at card insertion[1]) | | | | | | I/O and Memory Card Interface: (Available only after card and socket are configured) | | | | |
|---|---|---|---|---|---|---|---|---|---|---|
| Pin | Signal | I/O | Function | +/- | Notes | Pin | Signal | I/O | Function | +/- |
| 1 | GND | | Ground | | | 1 | GND | | Ground | |
| 2 | D3 | I/O | Data bit 3 | | | 2 | D3 | I/O | Data bit 3 | |
| 3 | D4 | I/O | Data bit 4 | | | 3 | D4 | I/O | Data bit 4 | |
| 4 | D5 | I/O | Data bit 5 | | | 4 | D5 | I/O | Data bit 5 | |
| 5 | D6 | I/O | Data bit 6 | | | 5 | D6 | I/O | Data bit 6 | |
| 6 | D7 | I/O | Data bit 7 | | | 6 | D7 | I/O | Data bit 7 | |
| 7 | CE1 | I | Card enable | - | 3 | 7 | CE1 | I | Card enable | - |
| 8 | A10 | I | Address bit 10 | | | 8 | A10 | I | Address bit 10 | |
| 9 | OE | I | Output enable | - | | 9 | OE | I | Output enable | - |
| 10 | A11 | I | Address bit 11 | | | 10 | A11 | I | Address bit 11 | |
| 11 | A9 | I | Address bit 9 | | | 11 | A9 | I | Address bit 9 | |
| 12 | A8 | I | Address bit 8 | | | 12 | A8 | I | Address bit 8 | |
| 13 | A13 | I | Address bit 13 | | | 13 | A13 | I | Address bit 13 | |
| 14 | A14 | I | Address bit 14 | | | 14 | A14 | I | Address bit 14 | |
| 15 | WE/PGM | I | Write enable | - | | 15 | WE/PGM | I | Write enable | - |
| 16 | RDY/BSY | O | Ready/busy | +/- | 2, 4 | 16 | IREQ | O | Interrupt Request | - |
| 17 | Vcc | | | | | 17 | Vcc | | | |
| 18 | Vpp1 | | Programming Supply Voltage 1 | | 2, 3 | 18 | Vpp1 | | Programming and Peripheral Supply | |
| 19 | A16 | I | Address bit 16 | | | 19 | A16 | I | Address bit 16 | |
| 20 | A15 | I | Address bit 15 | | | 20 | A15 | I | Address bit 15 | |
| 21 | A12 | I | Address bit 12 | | | 21 | A12 | I | Address bit 12 | |
| 22 | A7 | I | Address bit 7 | | | 22 | A7 | I | Address bit 7 | |
| 23 | A6 | I | Address bit 6 | | | 23 | A6 | I | Address bit 6 | |
| 24 | A5 | I | Address bit 5 | | | 24 | A5 | I | Address bit 5 | |
| 25 | A4 | I | Address bit 4 | | | 25 | A4 | I | Address bit 4 | |
| 26 | A3 | I | Address bit 3 | | | 26 | A3 | I | Address bit 3 | |
| 27 | A2 | I | Address bit 2 | | | 27 | A2 | I | Address bit 2 | |
| 28 | A1 | I | Address bit 1 | | | 28 | A1 | I | Address bit 1 | |
| 29 | A0 | I | Address bit 0 | | | 29 | A0 | I | Address bit 0 | |
| 30 | D0 | I/O | Data bit 0 | | | 30 | D0 | I/O | Data bit 0 | |
| 31 | D1 | I/O | Data bit 1 | | | 31 | D1 | I/O | Data bit 1 | |
| 32 | D2 | I/O | Data bit 2 | | | 32 | D2 | I/O | Data bit 2 | |
| 33 | WP | O | Write protect | + | 2, 3 | 33 | IOIS16 | O | IO Port Is 16-bit | - |
| 34 | GND | | Ground | | | 34 | GND | | Ground | |

NOTES: Active "low" signals are indicated by -(minus). Active "high" signals are indicated by +(plus).

1. Wait and Reset are RFU (no connect) in *PCMCIA PC Card Standard*, Release 1.0. Both must be implemented in the system for compliance with *PCMCIA PC Card Standard*, Release 2.
2. Use of signal changes between memory only and I/O interface.
3. Signal must not be connected between cards. If it is an output signal from the card, it must not be directly connected to any signal source within the host. It must not be wire-OR'd or wire-AND'd with any host signals.

1. The glossary in Appendix A defines many of the technical terms in this chapter.

PCMCIA © 1992

Table 4-2: PCMCIA PC Card Pin 35 To Pin 68 Assignments

| Memory Only Card Interface (Always available at card insertion) | | | | | | I/O and Memory Card Interface (Available only after card and socket are configured) | | | | |
|---|---|---|---|---|---|---|---|---|---|---|
| Pin | Signal | I/O | Function | +/- | Notes | Pin | Signal | I/O | Function | +/- |
| 35 | GND | | Ground | | | 35 | GND | | Ground | |
| 36 | CD1 | O | Card detect | - | 3 | 36 | CD1 | O | Card detect | - |
| 37 | D11 | I/O | Data bit 11 | | | 37 | D11 | I/O | Data bit 11 | |
| 38 | D12 | I/O | Data bit 12 | | | 38 | D12 | I/O | Data bit 12 | |
| 39 | D13 | I/O | Data bit 13 | | | 39 | D13 | I/O | Data bit 13 | |
| 40 | D14 | I/O | Data bit 14 | | | 40 | D14 | I/O | Data bit 14 | |
| 41 | D15 | I/O | Data bit 15 | | | 41 | D15 | I/O | Data bit 15 | |
| 42 | CE2 | I | Card enable | - | 3 | 42 | CE2 | I | Card enable | - |
| 43 | RFSH | I | Refresh | | | 43 | RFSH | I | Refresh | |
| 44 | RFU | | Reserved | | 2 | 44 | IORD | I | IO Read | - |
| 45 | RFU | | Reserved | | 2 | 45 | IOWR | I | IO Write | - |
| 46 | A17 | I | Address bit 17 | | | 46 | A17 | I | Address bit 17 | |
| 47 | A18 | I | Address bit 18 | | | 47 | A18 | I | Address bit 18 | |
| 48 | A19 | I | Address bit 19 | | | 48 | A19 | I | Address bit 19 | |
| 49 | A20 | I | Address bit 20 | | | 49 | A20 | I | Address bit 20 | |
| 50 | A21 | I | Address bit 21 | | | 50 | A21 | I | Address bit 21 | |
| 51 | Vcc | | | | | 51 | Vcc | | | |
| 52 | Vpp2 | | Programming Supply Voltage 2 | | 2, 3 | 52 | Vpp2 | | Programming and Peripheral Supply 2 | |
| 53 | A22 | I | Address bit 22 | | | 53 | A22 | I | Address bit 22 | |
| 54 | A23 | I | Address bit 23 | | | 54 | A23 | I | Address bit 23 | |
| 55 | A24 | I | Address bit 24 | | | 55 | A24 | I | Address bit 24 | |
| 56 | A25 | I | Address bit 25 | | | 56 | A25 | I | Address bit 25 | |
| 57 | RFU | | Reserved | | | 57 | RFU | | Reserved | |
| 58 | RESET | I | Card Reset | + | 1, 5 | 58 | RESET | I | Card Reset | + |
| 59 | WAIT | O | Extend bus cycle | - | 1, 3 | 59 | WAIT | O | Extend bus cycle | - |
| 60 | RFU | | Reserved | | 2, 3 | 60 | INPACK | O | Input Port Acknowledge | - |
| 61 | REG | I | Register select | - | 2, | 61 | REG | I | Register select & IO Enable | - |
| 62 | BVD2 | O | Battery voltage detect 2 | | 2, 3 | 62 | SPKR | O | Audio Digital Waveform | - |
| 63 | BVD1 | O | Battery voltage detect 1 | | 2, 3 | 63 | STSCHG | O | Card Statuses Changed | - |
| 64 | D8 | I/O | Data bit 8 | | | 64 | D8 | I/O | Data bit 8 | |
| 65 | D9 | I/O | Data bit 9 | | | 65 | D9 | I/O | Data bit 9 | |
| 66 | D10 | I/O | Data bit 10 | | | 66 | D10 | I/O | Data bit 10 | |
| 67 | CD2 | O | Card detect | - | 3 | 67 | CD2 | O | Card detect | - |
| 68 | GND | | Ground | | | 68 | GND | | Ground | |

NOTES: I - Input to card, O - Output from card, I/O - Bidirectional

4. Signal must not be connected between cards when I/O interface is supported. If it is an output signal from the card, it must not be directly connected to any signal source within the host. It must not be wire-OR'd or wire-AND'd with any host signals 5. Reset must not be connected between cards unless all cards are reset when any card has Vcc power removed.

6. In systems which switch Vcc individually to cards, no signal should be directly connected between cards other than ground.

4.2 Memory Card Features

Table 4-3: Features of PCMCIA Memory Card

| Item | Feature |
|---|---|
| Access | Random access |
| Data Bus | Bus 16 bits/8 bits |
| Memory Types | MaskROM, OTPROM, EPROM, EEPROM, Flash-Memory, SRAM |
| Memory Capacity | 64MB (A0-A25) maximum |
| REG function | Attribute Memory for storing card identification |
| I/O Address Space | 64 Mbyte (A0-A25) maximum (64 Kbyte for PC compatible architectures) |
| I/O Space Decoding | Overlapping I/O Address Window: card performs partial selection decoding<br>Independent I/O Address Window: system performs entire selection decoding |
| I/O Interrupts | 1 Interrupt Request signal per card. Routed to specific interrupt level by the host system |

4.2.1 Memory Types and Speed Version

Table 4-4: Memory Types and Speed Version

| | Speed Version | | | | |
|---|---|---|---|---|---|
| Memory Type | 600ns[1] | 250ns | 200ns | 150ns | 100ns |
| SRAM | Defined | defined | defined | defined | defined |
| MaskROM, OTPROM, EPROM, EEPROM, Flash-Memory | Defined | defined | defined | defined | defined |

1. Specified for Dual Operating Voltage Cards while operating at Reduced Operating Voltage (Vcc = 3.3 volts).

4.2.2 Memory Address Space

A separate memory address space of 64 megabytes (A0-A25) is permitted for each memory card installed in a system. The Common Memory may be accessed by a host system for memory read and write operations. Direct-memory access (DMA) read and write operations to Common Memory are possible when Common Memory is mapped directly into a DMA controller's address space.

There is an additional 64 megabyte address space for Attribute Memory which is selected by the -REG signal at the interface. This memory space may not be used for DMA operations.

The Attribute Memory space may be divided into areas for:

1. Card Information Structure — a description of the card's capabilities and specifications and (optionally) its use,
2. Configuration Registers — an optional set of registers which allow the card to be configured by the system, and
3. Reserved Area— the portion of the Attribute Memory space which has not yet been specified.

The size of each of these areas is determined by the card vendor. The Card Information Structure must begin at address 0 but need not be a single, contiguous region. It is recommended that the Card Information Structure and the Card Configuration Registers be located at relatively low addresses to ensure their accessibility by all hosts.

PCMCIA © 1992

4.2.3 Memory Only Interface

The Memory-Only Interface supports memory cards, but does not contain signals which support I/O Cards. The signals +RDY/-BSY, WP, BVD1 and BVD2 are present on the Memory-Only Interface but replaced by other signals when the I/O Interface is selected. Cards and systems which are designed to *PCMCIA PC Card Standard*, Release 1.0, do not support the RESET or -WAIT signals.

The Memory-Only Interface is the default selected in both the socket and the card whenever a card is inserted into a socket, and immediately following the application of Vcc or the RESET signal to a card. This interface is required to be implemented in all Release 2 compliant systems.

After a Card's Card Information Structure has been interpreted, the card and the socket may be configured, if appropriate, to use the I/O Interface (described in Section 4.2.5).

4.2.4 I/O Address Space

The hardware interface supports a single I/O address space of 64 megabytes (A0 to A25) for peripheral-device access. The I/O address space is shared and divided among all the cards installed in the system. However, many system architectures (such as the 80x86 architectures found in many PCs) support only a 64 kilobyte I/O address space.

I/O registers (ports) may be 8 or 16 bits wide. An -IOIS16 signal is activated by each I/O card when the address at the interface corresponds to a 16-bit I/O register. This permits hardware in a system to adjust the access width (8 or 16 bits) to match the size of I/O port being addressed. When a 16-bit operation is attempted to an 8-bit I/O port, the system hardware may divide the operation into two consecutive 8-bit operations as is done in PC systems that support the ISA bus structure.

Peripheral cards may be designed such that the host system alone determines when the card is selected. Alternatively, both the host and card may play a role in determining when the latter is selected. The card includes information in the Card Information Structure which tells the host the address decodings the card may be configured to perform. The host then programs the card to perform a particular decoding using the card's Configuration Registers.

To ensure compatibility in peripheral cards which completely emulate existing fixed-address peripherals, the cards may decode a portion of the address space. For example, a card might decode only A0 through A9 and respond only when a range of addresses corresponding to the peripheral's registers are selected. Correspondingly, the system could decode address lines A9 and A8 and simultaneously select all the appropriately configured peripheral cards only when A9 or A8 is high. A peripheral card drives the Input Port Acknowledge signal (-INPACK) low when an input port on the card is being accessed. This allows any data buffers in the host between the card and the host's internal bus to be activated during the access.

Peripheral cards must be configured by the system before their I/O address space becomes accessible. It is recommended that new devices which do not require software compatibility with existing drivers decode only enough address lines to address the number of I/O ports implemented. Furthermore, they should allow the system to locate them arbitrarily in the I/O address space, thereby eliminating conflicts with other I/O devices.

4.2.5 I/O Interface

The I/O Interface requires that the Memory-Only Interface also be implemented within the same socket, and that the Memory-Only Interface be selected in the socket when no card is inserted and immediately following Card reset and the application of Vcc to the card. The I/O interface contains all the signals in the Memory- Only Interface with the exception of the +RDY/-BSY, WP, BVD1 and BVD2 signals.

The I/O interface also supports the following additional signals, some of which replace Memory Only signals not supported on the I/O interface:

> Interrupt Request (-IREQ), I/O Port is 16 bits (-IOIS16), I/O Read strobe (-IORD), I/O Write strobe (-IOWR), Input Port Acknowledge (-INPACK), audio digital waveform intended for a speaker (-SPKR), and a card Status Changed (-STSCHG) signal.

The Extend Bus Cycle (-WAIT) and Card Reset (+RESET) signals, which are not required in a *PCMCIA PC Card Standard*, Release 1.0 memory interface, are required for both the Memory-Only and the I/O-Card interfaces in all systems supporting Release 2.

Peripheral cards must be configured by the system before their I/O Interface becomes active. Before configuring a card, the system must examine the card's Card Information Structure to determine the I/O address space, interrupt request, and other requirements of the possible card configurations. The system uses this information to select the best configuration from those available in the card, as determined by the system's hardware and software capabilities, as well as the requirements of other cards installed concurrently. If no card configuration is suitable for the system, because the card requires resources which are not available in the system, or which have already been assigned by the system to other cards, the system may reject the card without configuring it.

Unless otherwise specified, all signals must be implemented by the system to be compliant with I/O portion of the standard. Since, systems with 8-bit data buses are not required to implement 16-bit data buses or 16-bit operations, they must keep the -CE2 signal in the inactive state at all times.

4.2.6 Custom Interfaces

Systems may provide custom interfaces through a standard socket. Custom interfaces are expected to support enhanced features, such as internal-bus extensions, or customized signals not applicable across architectures. A card or a socket may support more than one custom interface.

A custom interface is handled by the system and the card in a manner similar to an I/O interface. Both the socket and the card must use a Memory-Only Interface when a card is inserted, or when power is removed from a card. After a card is powered up, the system reads the card's Card Information Structure. If the card is found to support a custom interface also supported by the host socket, the card and the socket may be configured to the custom-interface mode. The card is configured using its Configuration Index Register.

Refer to Section 4.15 for information on configurable cards and to Section 5.1.3 for information on Card Information Structure data relating to custom interfaces.

4.2.7 Configurable Cards

Certain memory and all peripheral cards may be configured by the system. This is to ensure that cards incompatible with the system, or with other cards installed in the system, are either compatibly reconfigured, or rejected, if a compatible configuration is not available on the card.

The system adjusts the card using the Card Configuration Registers. These are located in the card's Attribute-Memory space, at the location indicated in the card's Card Information Structure.

Refer to Section 4.14 for information on configurable cards.

4.2.8 Compatibility Between Revision Levels of this Standard

*PCMCIA PC Card Standard*, Release 1.0 defined the Memory-Only interface without a Card Reset (RESET) input signal and Extended Bus Cycle (WAIT) signal. Systems built to the Release 1.0 interface have the option of leaving the RESET pin as no connect or (card) Vcc and the WAIT pin

PCMCIA © 1992 as a no connect. When a Release 2 Memory Card is inserted into a Release 1.0 socket the +Reset signal will appear asserted continuously. In order to be backward compatible a Release 2.01 Memory Card inserted into a Release 1.0 socket must appear to the host system on Power-on, after the 20 millisecond Vcc settling time, as a Release 1.0 compliant card in its initial default power-on state.

Release 2 cards which are not intended for operation in Release 1.0 host-system sockets (e.g. I/O cards or mixed I/O-memory cards) need not present a valid CIS while RESET is asserted, and must not reply to read commands or act on write commands while RESET is asserted.

A Release 2 host system socket, upon recognizing a Release 2 Memory Card, can subsequently take advantage of the RESET and WAIT signals employed on the card.

4.3 Signal Description

Signals on the PCMCIA interface, whether operating at the standard operating supply level of 5 volts or the reduced operating supply voltage of 3.3V, are considered asserted within the range of $V_{OH}$ and negated within the range of $V_{OL}$. However, the $V_{OH}$ and $V_{OL}$ ranges are determined by the supply voltage as shown in the following table. $V_{OH}$, $V_{IH}$, $V_{OL}$ and $V_{IL}$ for 3.3V operation are under review in JEDEC, and the resulting JEDEC standard will be adopted by this standard. All signals are considered to be active when the line is asserted,(+), unless the signal name is preceded by the minus sign, (-), in which case it shall be considered active when the line is negated.

Table 4-5: PC Card Logic Levels

| DC Levels | | Host | | Card |
|---|---|---|---|---|
| Parameter | Conditions | Min | Max | |
| $V_{IH}$ | Vcc = 5 V +/- 5% | 2.4 V | Vcc+.25 V | TTL or CMOS |
| $V_{IL}$ | Vcc = 5 V +/- 5% | 0.0 V* | 0.8 V | TTL or CMOS |
| $V_{OH}$ | Vcc = 5 V +/- 5% | 2.8V (.9Vcc)[1] | Vcc | TTL or CMOS |
| $V_{OL}$ | Vcc = 5 V +/- 5% | 0.0 V | 0.5 V (.1 Vcc)[1] | TTL or CMOS |
| $V_{IH}$ | Vcc = 3.3V +/- 5% | Pending JEDEC Review | | |
| $V_{IL}$ | Vcc = 3.3V +/- 5% | Pending JEDEC Review | | |
| $V_{OH}$ | Vcc = 3.3V +/- 5% | Pending JEDEC Review | | |
| $V_{OL}$ | Vcc = 3.3V +/- 5% | Pending JEDEC Review | | |

1. (for CMOS Loads)

All signals are grouped under four classifications: I (Input), O (Output), I/O (Bidirectional), and R (Reserved). Input signals are those driven by the host and output signals are those driven by the PC Card.

All pins identified as ground shall be connected to signal ground at the host. Signal pins identified as *reserved* shall have no connection at either the host or the card.

The data path to the memory card is 16 bits wide and consists of signals D0-D15. The card supports a 26-bit address bus, (A0-A25), for a maximum 64 megabyte addressing range.

4.3.1 Address BUS (A0-A25)

Signals A0 through A25 are address-bus-input lines which enable direct address of up to 64 megabytes of memory on the card. Signal A0 is not used in word-access mode. Signal A25 is the most significant bit, and bit number (and significance) decrease downward to A0.

4.3.2 Data BUS (D0-D15)

Signals D0 through D15 constitute the bidirectional data bus. The most significant bit is D15. Bit number (and significance) decrease downward to D0.

4.3.3 Card Enable (-CE1 & -CE2)

The -CE1 and -CE2 lines are active-low, card-enable, input signals. The -CE1 input enables evennumbered-address bytes and -CE2 enables odd-numbered-address bytes. A multiplexing scheme based on A0, -CE1 and -CE2 allows 8-bit hosts to access all data on D0 through D7 if desired. See Table 4-7.

To ensure data retention on battery-backed-up SRAM cards, and permit power-up initialization of peripheral cards, a minimum of 20 milliseconds must elapse after:

1. the application of Vcc to the card, or
2. the end of the RESET signal to the card (in systems which support the RESET signal), whichever event occurs latest.

The card enables are used to access both Common and Attribute Memory, and to access I/O.

Refer to Section 4.7 for additional information on Common Memory Read Functionality.

Refer to Section 4.14 for additional information regarding I/O Read and Write Functionality.

4.3.4 Output Enable (-OE)

The -OE line is the active-low, input signal used to gate Memory Read data from the memory card. SRAM memory cards fall into two categories:

1. cards where the -OE signal must be negated during write operations, and
2. cards that do not use the -OE signal during write operations and allow the signal to be in either state.

Hosts must negate the -OE signal during write operations.

4.3.5 Write Enable/Program (-WE/-PGM)

The -WE/-PGM input signal is used for strobing Memory Write data into the memory card. This line is also used for memory cards employing programmable-memory technologies. See Section 5.2.6 for identification of Programmable Memory Technology cards.

4.3.6 Ready/Busy (+RDY/-BSY)

The Ready/Busy function is provided by the +RDY/-BSY signal when the card and the host socket are configured for the Memory-Only Interface. When a host socket and the card inserted into it are both configured for the I/O interface, the +RDY/-BSY function is provided by the +RDY/-BSY status bit in the card's Pin Replacement Register. When the Pin Replacement Register is not implemented on a card configured for the I/O Interface, the +RDY/-BSY function is continuously in the Ready condition. The following descriptions of the +RDY/-BSY signal apply equally to both the +RDY/-BSY signal of the Memory- Only Interface and to the +RDY/-BSY bit in the Pin Replacement Register of a card configured for the I/O Interface. See Section 4.14.3 for a description of the Pin Replacement Register.

PCMCIA © 1992

The +RDY/-BSY signal is a status signal polled by the host, or used by the socket to generate an interrupt on the Busy to Ready transition or on both transitions. It is intended to indicate the completion of potentially lengthy operations within the a card. It is not intended to delay the completion of a machine cycle at the PCMCIA interface or on the Host's internal bus, the -WAIT signal is available for that purpose.

The +RDY/-BSY line is driven low by the PC Card to indicate that the PC Card circuits are busy and unable to accept some data-transfer operations. The +RDY/-BSY signal is set low while the card is busy processing a previous command or performing initialization. The signal +RDY/-BSY is set high when the PC Card is ready to accept a new data-transfer command.

When independent, unrelated sources for the +RDY/-BSY signal are present on the card, +RDY/-BSY signal shall by Busy while any of the unrelated sources of the +RDY/-BSY on the card require the blocking of certain host accesses and are indicating Busy. A group of related devices on the card and managed by the same host software shall be treated collectively as a single independent source of +RDY/-BSY.

A PC Card is permitted to process subsequent operations from the host while the +RDY/-BSY signal is low if its internal circuits allow proper operation. It is the responsibility of the card or device vendor to communicate (through CIS descriptions or other means) those operations which are permitted to a card while the +RDY/-BSY signal is asserted. In the absence of any such knowledge, the host shall not attempt any access to the card while the card is Busy.

The host must not access a card until a minimum of 20 milliseconds has passed after Vcc is stable, and, for Release 2.0 and later systems, after the RESET signal is negated. In addition, the card's +RDY/-BSY line must be high (RDY) before the initial access. If the card will not be initialized and ready for operations at the end of the 20 millisecond waiting period, the +RDY/-BSY signal will be set low (BSY) within 10 microseconds of reset or application of Vcc to the card. A card that requires more than 20 milliseconds for internal initialization before access shall drive +RDY/-BSY to a low (BSY) condition until it is ready for initial access.

Release 1.0 required that cards containing battery-backed-up SRAM not be accessed before 20 milliseconds after stable power is applied. However, some systems otherwise conforming to Release 1.0 may access a card before the end of the initialization period. Therefore, it is recommended that during the initialization period the card's Card Information Structure contain the correct card description. If that is not possible, then it should contain a valid CIS description of a null or ROM device. This will prevent the Release 1.0 system from presuming that the card is an unitialized SRAM card.

[Note that a Release 1.0 system will never remove the reset condition (as +Reset is not connected in a Release 1.0 system).]

If the card will require more than 10 microseconds to enter the Sleep Mode, or to return to operating condition following Card Wakeup, the +RDY/-BSY signal will be set low (BSY) within 10 microseconds after the power-down bit in the Card Configuration and Status Register is changed. Following Card Wakeup the host must not access the card until a minimum of 10 microseconds has passed and the Card's +RDY/-BSY line is in a high (RDY) state. If a card requires more than 10 microseconds following Wakeup, and before the card is ready for operation, the card shall hold the +RDY/-BSY in a low (BSY) state until the card is ready for operation.

When a card and its socket have been configured for the I/O Interface, the +RDY/-BSY status may be available in the Pin Replacement Register and the signal is replaced on interface pin 16 with the -IREQ (Interrupt Request) signal. See Section 4.6.2 regarding the Interrupt Request function.

4.3.7 Card Detect (-CD1 & -CD2)

The -CD1 and -CD2 signals provide for proper detection of PC Card insertion. The signal pins are at opposite ends of the connector to ensure a valid detection (i.e. ensuring both sides of the card are firmly inserted). The -CD1 and -CD2 signals are connected to ground internally on the PC Card and will be forced low whenever a card is placed in a host socket. The host socket interface circuitry shall provide 10K or larger pull-up resistors to Vcc on each of these signal pins.

4.3.8 Write Protect (+WP)

The WP output signal is used to reflect the status of the card's Write Protect switch. If the Write Protect switch is present, this +WP signal will be asserted by the card when the switch is enabled, and negated when the switch is disabled. If the memory card has no Write Protect switch, the card will connect this line to ground or Vcc depending on the condition of the card memory. For example, if the card can always be written to, the pin will be connected to ground, and if the card is permanently Write Protected, the pin will be connected to Vcc.

When a card or socket is configured for the I/O Interface, the Write Protect status may be available in the Pin Replacement Register, and the signal is replaced in the interface by the I/O Port is 16 bits (-IOIS16) signal. Refer to Section 4.6.1 for information on the -IOIS16 signal.

4.3.9 Attribute Memory Select (-REG)

The -REG signal is kept inactive (high) for all Common Memory access. When this signal is active (low), access is limited to Attribute Memory (-OE or -WE active) and to the I/O space (-IORD or -IOWR active). Attribute Memory is a separately-accessed section of card memory and is generally used to record card capacity and other configuration and attribute information. Attribute Memory is also used to access standardized Card Configuration Registers.

The timing of Attribute Memory may be different than that of Common Memory. Refer to manufacturer's specifications for details. When Attribute Memory is accessed, only data signals D0-D7 are valid and signals D8-D15 shall be ignored. Signals -CE1, -CE2 and A0 are still valid, but it is only possible to select even-numbered addresses. A combination of signals -CE1/-CE2/A0 that requests an odd-numbered byte will result in invalid data on the bus. See Table 4-6.

I/O space is used for access to peripheral devices via the -IORD and -IOWR strobe signals. Systems which generate the -IORD and -IOWR strobe signals during DMA operations must keep -REG inactive (i.e. high) during DMA transfers to prevent spurious I/O accesses while a memory address is present on the address lines.

4.3.10 Battery Voltage Detect (BVD1 & BVD2)

The signals BVD1 and BVD2 are generated by the memory card as an indication of the condition of its battery.

Both signals are kept asserted when the battery is in good condition. A replacement warning condition is signalled by BVD1 asserted and BVD2 negated, although data integrity on the card is still assured. If BVD1 is negated, with BVD2 either asserted or negated, the battery is no longer serviceable and data is lost. Refer to Table 4-15.

When the I/O Interface is selected the BVD1 and BVD2 signals are replaced at the interface by the card Status Changed (-STSCHG) and the Audio Digital Waveform (-SPKR) signals respectively. The battery voltage status information may be available in the card's Pin Replacement Register while the I/O Interface is configured. Refer to Sections 4.6.3, 4.6.4 and 4.15.3.

PCMCIA © 1992

4.3.11 Program and Peripheral Voltages (Vpp1 & Vpp2)

The Vpp1 and Vpp2 signals supply programming voltages for programmable-memory operation, or additional supply voltages for Peripheral Cards. These pins are to be connected to the Vcc voltage level until the Card Information Structure (CIS) of the card has been read and other permissible values for Vpp1 or Vpp2 have been determined. Vpp voltages are used on the card for Peripheral Card operation and for altering programmable memory on the card. The voltage applied to the Vpp pins of a card must never be greater than the Vpp level appropriate for the card. If the appropriate Vpp voltage for a card cannot be determined, the voltage applied to the Vpp pins must not exceed Vcc. Refer to Section 5.3.2.1 and the Card Information Structure for more information on the characteristics of Vpp1 and Vpp2.

Systems are required to be able to supply the Vcc level on the Vpp pins.

It is recommended that systems be able to supply at least the Vpp voltage of +12 Volts ±5% in addition to the Vcc level.

For low power applications it is recommended that the system be able to apply a low logic level to Vpp.

When the Vpp value required by a card is unavailable in a system, the system may reject the card.

4.3.12 Card Voltage and Ground (Vcc & GND)

The Vcc and GND input pins have been placed at symmetrical positions on the memory card to provide safety in the case of an inverted-card insertion. Two power pins (#'s 17 and 51) and four ground pins (#'s 1, 34, 35 and 68) are employed to reduce the impedance between the memory card and the system.

In order to determine a card's characteristics, Vcc must be within the Operating Voltage range (e.g. 5 Volts) when a card is read initially. If the Card Information Structure indicates that the card is a Dual Operating Voltage Card capable of operating at the Reduced Operating Voltage (3.3 Volts), then the Vcc supply voltage may be lowered to the Reduced Operating Voltage, and access timing adjusted according to the indicated information.

4.3.13 Refresh (RFSH)

The Refresh signal is intended for pseudostatic SRAMS (PSRAM). Its use will be more clearly defined in a future version of this standard.

4.3.14 Reserved Pins (RFU)

Several pins have been identified as Reserved for Future Use (RFU). Neither memory cards nor host systems shall make any electrical connections to these pins.

4.4 Release 2 Signals Affecting Both Memory Only and I/O Interfaces

4.4.1 Card Reset (RESET)

The +RESET signal clears the Card Configuration Option Register thus placing a card in an unconfigured (Memory-Only Interface) state. It also signals the beginning of any additional card initialization. The system must place the +RESET signal in high-impedance during card power-up (including both Vcc turn-on and hot insertion). The signal must remain in high impedance for at least 1 ms after Vcc becomes valid. All configurable cards (including all I/O Cards) must monitor +RESET and return to the unconfigured state when +RESET is active. A card remains in the unconfigured state until the Card Configuration Option Register has been written with a valid configuration.

Cards requiring RESET must enter the unconfigured state each time power is applied. For example:

1. the card may generate a power-on RESET internally, or
2. the +RESET signal may be pulled up to Vcc through a >100K resistor on cards requiring reset.

This ensures when a card is inserted into a socket it is reset before the signal pins make contact with the socket, and the card is reset (continuously) when placed into a Release 1.0 compatible socket.

All new system designs — including those which support just the Memory-Only Interface — should support the +RESET and -WAIT function.

System compatibility with Release 2.0 and above requires support of the +RESET signal.

4.4.2 Extend Bus Cycle (-WAIT)

The -WAIT signal is asserted by a card to delay completion of the memory-access or I/O- access cycle then in progress.

All new system designs — including designs which support just the Memory-Only Interface — should support the -WAIT and +RESET function.

System compatibility with Release 2.0 and above requires support of the -WAIT signal.

4.5 I/O Interface Signals Replacing RFU Pins

4.5.1 I/O Read (-IORD)

The -IORD signal is made active to read data from the card's I/O space. The -REG signal and at least one of -CE1 or -CE2 must also be active for the I/O transfer to take place. A PC Card will not respond to the -IORD signal until it has been configured for I/O operation by the system.

4.5.2 I/O Write (-IOWR)

The -IOWR signal is made active to write data to the card's I/O space. The -REG signal and at least one of -CE1 or -CE2 must also be active for the I/O transfer to take place. A PC Card will not respond to the -IOWR signal until it has been configured for I/O operation by the system.

4.5.3 Input Acknowledge (-INPACK) [I/O Operation]

The Input Acknowledge output signal is asserted when the card is selected and the card can respond to an I/O read cycle at the address on the address bus. This signal is used by the host to control the enable of any input data buffer between the card and the CPU. This signal must be inactive until the card is configured.

[Note: In cases where a card is configured to respond to I/O read cycles at all addresses, the -INPACK signal may be asserted whenever the Card Enable (-CE1 and-CE2) inputs are true.]

4.6 I/O Interface Signals Replacing Memory Interface Signals

4.6.1 I/O IS 16 Bit Port (-IOIS16) [replaces WP]

The -IOIS16 output signal is asserted when the address at the socket corresponds to an I/O address to which the card responds, and the I/O Port being addressed is capable of 16-bit access.

When this signal is not asserted during a 16-bit I/O access, the system will generate 8-bit references to the even and odd byte of the 16-bit port being accessed.

4.6.2 Interrupt Request (-IREQ) [replaces +RDY/-BSY]

The Interrupt Request signal is available only when the card and the interface are configured for the I/O and Memory Interface (indicated as Interface Type 1 in the TPCE_IF field of the TPCE tuple, see Section 5.2.8.3). Interrupt Request is asserted by an I/O Card to indicate to the host that a card device requires host software service. The interrupt signal at the interface is routed by the system to one of the interrupt request signals on the system's internal bus. The signal is held at the inactive level when no interrupt is requested.

4.6.2.1 Interrupt Request Routing

A general-purpose system should be able to route each card's interrupt request to any of the interrupt-request levels used for installable devices within the system. A system which is both hardware- and software-dedicated to a particular application may support only the subset of interrupt-request levels necessary for the application. Driver software customization will be necessary to support I/O cards in the dedicated-system environment.

*Implementation Note:*

For "PC" compatible computers it is recommended that -IREQ from the card be able to be routed to at least the following interrupt signals in the system.

| Function | AT IRQ | XT IRQ |
|---|---|---|
| Communications 2 (COM2) | IRQ3 | IRQ3 |
| Communications 1 (COM1) | IRQ4 | IRQ4 |
| Fixed Disk | IRQ14 | IRQ5 |
| Floppy Disk | IRQ6 | IRQ6 |
| Parallel Port (LPT1) | IRQ7 | IRQ7 |
| Network/Other | IRQ10 | Not Available |

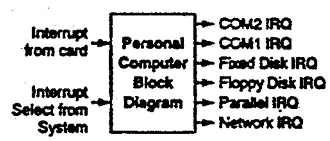

4.6.2.2 Pulsed- and Level-Mode Interrupt Support

The Interrupt Request may be either a pulse or a level depending upon the needs of the system.

I/O cards designed to operate in a variety of machines should support both level-mode and pulsed-mode interrupts. Therefore, it is recommended that I/O Cards support both of these modes.

The host system selects the mode of interrupt — level or pulsed — through the Card Configuration Registers. Refer to Section 4.14.2.

4.6.2.3 Pulsed-Mode Interrupt Signal

A pulsed-mode interrupt is asserted by placing an active- going (i.e. low) pulse on the interrupt line. Pulsed-mode interrupts are generally utilized by systems using the "ISA" PC architecture in which interrupts are edge sensitive. The pulse width must be at least 0.5 microseconds, and the interrupt will be recognized by the host on the trailing (i.e. rising) edge of the pulse.

[Note: The pulsed-mode interrupt may be lost when more than one interrupting device shares an interrupt-request signal at the system bus, and standard system and application software is used. Interrupt requests may be lost if they arrive at the system before a prior request on the shared interrupt-request signal has been fully serviced.]

4.6.2.4 Level-Mode Interrupt Signal

A level-mode interrupt is asserted by placing the Interrupt Request signal in an active (i.e. low) state until the interrupt has been serviced by the system. The interrupt-request signal is then held in the inactive state. The level-mode interrupt is standard in PC- compatible systems using the Micro Channel Architecture, as well as in many non-PC-compatible systems.

Cards must support the level-interrupt-request mode.

4.6.2.5 Interrupts and +RDY/-BSY

Pin 16 serves as +RDY/-BSY in memory-only cards, and as -IREQ for I/O cards. Pin 16 is used as +RDY/-BSY while an I/O-capable card is configured for the Memory-Only Interface. See the +RDY/-BSY description in Section 4.3.6.

4.6.3 Audio Digital Waveform (-SPKR) [replaces BVD2]

This Binary Audio signal is an optional signal which may be available only when the card and the socket have been configured for the I/O Interface. It provides a single-amplitude, on-off, (binary) audio waveform intended to drive the host's loudspeaker. The signal to the speaker should be generated by taking the exclusive-OR function of the -SPKR signals from all those cards providing Binary Audio, and from the system speaker source. When no audio signal is present, or if the card does not support the Binary Audio function, the -SPKR signal shall be held inactive (i.e. high).

Cards which supply the Binary Audio function are required to support the Audio Enable bit in the Card Configuration Registers. This allows the system to selectively enable or disable the audio function. Refer to Section 4.15.2.

PCMCIA recommends, but does not require, that systems support the Binary Audio function.

The BVD2 signal is available on the same pin as -SPKR when the Card and Socket are configured for the Memory Only Interface.

4.6.4 Status Changed (-STSCHG) [replaces BVD1]

Status Changed is an optional signal used to alert the system to changes in the Ready/Busy (RDY/BSY), Write Protect (WP), or Battery Voltage (BVD) conditions of the card while the I/O Interface is configured.

The signal is held inactive (i.e. high) if the function is not supported by the card or when the "SigChg" bit in the Card Status Register is false (logic 0). When the "SigChg" bit is true (logic 1), the Status Changed signal is active (i.e. low) when the "Changed" bit in the Card Status Register is true (logic 1), and the signal is inactive (i.e. high) when the "Changed" bit is false (logic 0). The Changed bit is the logical OR result of the individual changed bits — CBVD1, CBVD2, CWP, and CRDBSY — in the Pin Replacement Register.

The system mechanism used for BVD1 fail detection may be used to detect a change of status signals. Therefore cards which are configured for I/O operation may continue to notify the system of changes of these status signals although the status signals no longer appear as independent signals on the card interface.

While the card and socket are configured for the Memory-Only Interface, the BVD1 signal is available on this pin. Refer to Section 4.15.3.

4.7 Operating Conditions

| Item | Symbol | Conditions |
|---|---|---|
| Operating Voltage (All Cards) | Vcc | 5V, ±5% |
| Reduced Operating Voltage (Dual Operating Voltage Cards Only) | Vcc | 3.3V, ±5% |
| Signal Interface Level | - | TTL or CMOS Level |

4.7.1 Default Conditions and Card Identification

When a card is first inserted, or when the system cannot determine whether or not the card has been changed, the following procedure must be followed before the Reduced Operating Voltage may be applied to the card.

When power is initially applied to a card, the normal Operating Voltage (5 volts) must be applied to the card. If the system determines from the card's Card Information Structure (CIS) that the card is operable at the Reduced Operating Voltage (3.3 volts), then at the system's option the Reduced Operating Voltage may be applied to the card. While the Reduced Operating Voltage is applied to the card, the card's access timing must be adjusted to meet the criteria indicated in the card's CIS.

If the system cannot determine (from the card's CIS) that the card is capable of operation at the Reduced Operating Voltage, then the card must be accessed at the normal Operating Voltage.

4.8 Memory Function

4.8.1 Common Memory Function

This section describes operations of the Common Memory area.

4.8.2 Common Memory Read Function

The memory card can be configured with different types of memory devices (such as SRAM, MaskROM, etc.), however, the Read function shares common signal-state sequencing.

To access Common Memory, the signal -REG shall be kept inactive, and the signal -OE shall be active during the Read cycle. Signals -CE1 and -CE2 control the activation of the Memory Card and A0 control-byte ordering on the data- bus lines D0-D15. Table 4-6 shows the signal states and data bus validity for the Read functions described below.

When both -CE1 and -CE2 are inactive, the card is in standby mode. When either -CE1 or -CE2 become active (low), the memory card is activated and ready for data transfers. When -CE1 is active and -CE2 is not active, Byte Access mode is enabled (8-bit transfers). Both the even-byte data and odd- byte data outputs will be valid in data bus lines D0-D7. The selection of an even-byte or an odd-byte is controlled by signal A0.

When using word access (16-bit transfers), both -CE1 and -CE2 are active (low), and the even-byte data and odd-byte data outputs are valid in data bus lines D0-D15. During Word mode, signal A0 is ignored.

Odd-Byte-Only access is enabled by -CE1 being inactive and -CE2 active. During Odd-Byte-Only access, only data lines D8-D15 contain valid data, and address signal A0 is ignored.

Table 4-6: Common Memory Read Function for all types of Memory

| Function Mode | -REG | -CE2 | -CE1 | A0 | -OE | -WE | Vpp2 | Vpp1 | D15-D8 | D7-D0 |
|---|---|---|---|---|---|---|---|---|---|---|
| Standby Mode | X | H | H | X | X | X | Vcc* | Vcc* | High-Z | High-Z |
| Byte Access (8 bits) | H<br>H | H<br>H | L<br>L | L<br>H | L<br>L | H<br>H | Vcc*<br>Vcc* | Vcc*<br>Vcc* | High-Z<br>High-Z | Even-Byte<br>Odd-Byte |
| Word Access (16 bits) | H | L | L | X | L | H | Vcc* | Vcc* | Odd-Byte | Even-Byte |
| Odd-Byte Only Access | H | L | H | X | L | H | Vcc* | Vcc* | Odd-Byte | High-Z |

* Additional Vpp2 and Vpp1 values are permitted when cards use Vpp voltages as additional power supply levels for other card functions as indicated by Card Information Structure. Refer to Sections 4.14 and 5.2.7.

4.8.3 Common Memory Write Function for SRAM, EEPROM and Single-Supply Flash Cards.

During Write mode, the function of signals -REG, -CE1, -CE2 and A0 are the same as in the Read mode.

During Write mode, signal -OE must be kept inactive, and signal -WE/-PGM is active. The Memory Card can perform Write operations in 3 modes: Byte access, Word access, and Odd-Byte-Only access. Refer to Table 4-7 for signal states and data-bus validity for Common Memory Write modes.

Table 4-7: Common Memory Write Function for SRAM, EEPROM and Single-Supply Flash Cards

| Function Mode | -REG | -CE2 | -CE1 | A0 | -OE | -WE | Vpp2 | Vpp1 | D15-D8 | D7-D0 |
|---|---|---|---|---|---|---|---|---|---|---|
| Standby Mode | X | H | H | X | X | X | Vcc* | Vcc* | XXX | XXX |
| Byte Access (8 bits) | H<br>H | H<br>H | L<br>L | L<br>H | H<br>H | L<br>L | Vcc*<br>Vcc* | Vcc*<br>Vcc* | XXX<br>XXX | Even-Byte<br>Odd-Byte |
| Word Access (16 bits) | H | L | L | X | H | L | Vcc* | Vcc* | Odd-Byte | Even-Byte |
| Odd-Byte-Only Access | H | L | H | X | H | L | Vcc* | Vcc* | Odd-Byte | XXX |

* Additional Vpp2 and Vpp1 values are permitted when cards use Vpp voltages as additional power supply for other card functions as indicated by the CIS. Refer to Sections 4.14 and 5.2.7.

4.8.4 Common Memory Write Function for OTPROM, EPROM and Flash-Memory

Memory write functions for programming operations are vendor specific.

4.8.5 Attribute Memory Function

Attribute Memory is an optional space intended for storing memory-card identification and configuration information, and does not require a large address space. Attribute Memory is limited to 8-bit wide access for economical reasons.

4.8.6 Attribute Memory Read Function

For the Attribute Memory Read function, signals -REG and -OE must be active during the cycle. As in the Common Memory Read function, the signals -CE1 and -CE2 control the even-byte and oddbyte address, but only even-byte data is valid during the Attribute Memory Read function. Refer to Table 4-8 for signal states and bus validity for the Attribute Memory Read function.

Table 4-8: Attribute Memory Read Function

| Function Mode | -REG | -CE2 | -CE1 | A0 | -OE | -WE | Vpp2 | Vpp1 | D15-D8 | D7-D0 |
|---|---|---|---|---|---|---|---|---|---|---|
| Standby Mode | X | H | H | X | X | X | Vcc* | Vcc* | High-Z | High-Z |
| Byte Access (8 bits) | L<br>L | H<br>H | L<br>L | L<br>H | L<br>L | H<br>H | Vcc*<br>Vcc* | Vcc*<br>Vcc* | High-Z<br>High-Z | Even-Byte<br>Not Valid |
| Byte Access (16 bits) | L | L | L | X | L | H | Vcc* | Vcc* | Not Valid | Even-Byte |
| Odd-Byte- Only Access | L | L | H | X | L | H | Vcc* | Vcc* | Not Valid | High-Z |

* Additional Vpp2 and Vpp1 values for Read Function are permitted when cards use Vpp voltages as additional power supply levels rather than only for programmable memory. However, no voltage level other than Vcc may be applied to the Vpp pins until a card has been identified as supporting alternate Vpp levels by reading its Card Information Structure. Refer to Sections 4.14 and 5.2.7.

4.8.7 Attribute Memory Write Function for SRAM, EEPROM and Single-Supply Flash Cards While writing to Attribute Memory, signals -REG and -WE/-PGM must be kept active for the entire cycle while the signal -OE is kept inactive for the entire cycle. See Table 4-9 for signal states and bus validity for the Attribute Memory Write function.

Table 4-9: Attribute Memory Function for Single Supply SRAM and EEPROM

| Function Mode | -REG | -CE2 | -CE1 | A0 | -OE | -WE | Vpp2 | Vpp1 | D15-D8 | D7-D0 |
|---|---|---|---|---|---|---|---|---|---|---|
| Standby Mode | X | H | H | X | X | X | Vcc* | Vcc* | XXX | XXX |
| Byte Access (8 bits) | L<br>L | H<br>H | L<br>L | L<br>H | H<br>H | L<br>L | Vcc*<br>Vcc* | Vcc*<br>Vcc* | XXX<br>XXX | Even-Byte<br>XXX |
| Byte Access (16 bits) | L | L | L | X | H | L | Vcc* | Vcc* | XXX | Even-Byte |
| Odd-Byte-Only Access | L | L | H | X | H | L | Vcc* | Vcc* | XXX | XXX |

* Additional Vpp2 and Vpp1 values for Write Function are permitted when cards use Vpp voltages as additional power supply levels rather than only for programmable memory. Refer to Sections 4.14 and 5.2.7.

4.8.8 Attribute Memory Write Function for Dual Supply OTPROM, EPROM and Flash Cards Memory write functions for programming operations are vendor specific.

4.8.9 Write Protect Function

Table 4-10 below, describes the write-protection options and corresponding write-protect (WP) switch and signal states.

Table 4-10: Write Protect Function

| Memory Writeability Combinations on Card | Symbol | WP Switch | WP Signal | Minimum Card Information Contents Related to Write Protect |
|---|---|---|---|---|
| Always Writable | A | None | Low | No WP Information Needed - Memory follows WP signal which is always Low (Not Protected). Optionally the Card info may specify all devices as Always writeable. |
| Never Writable | N | None | High | No WP Information Needed - Memory follows WP signal which is always High (Protected). Optionally the Card info may specify all devices as Never writeable. |
| Switch Controlled | S | Protect | High | No WP Information Needed - Memory follows WP signal. |
| | | No prot | Low | |
| Always/Never | AN | None | Low | Card info must specify devices (addresses) which ignore the WP signal and are Never writeable. The remaining devices follow the WP signal and are therefore Always writeable. |
| Always/Switch | AS | Protect | High | Card info must specify devices (addresses) which ignore the WP signal and are Always writeable. The remaining devices follow the WP signal. |
| | | No prot | Low | |
| Never/Switch | NS | Protect | High | Card info must specify devices (addresses) which ignore the WP signal and are Never writeable. The remaining devices follow the WP signal. |
| | | No prot | Low | |
| Always/Never/Switch | ANS | Protect | High | Card info must specify both devices (addresses) which ignore the WP signal and are Always writeable as well as the devices which ignore the WP signal and are Never writeable. The remaining devices follow the WP signal |
| | | No prot | Low | |

PCMCIA © 1992

4.9 Timing Functions

4.9.1 Common Memory Timing Specification

This section describes Common Memory Access Timing.

4.9.2 Common Memory Read Timing for all types of Memory

There are several types of Memory Cards — SRAM, OTPROM, etc.— and within a memory card, several types of memory devices may be mounted. To maintain compatibility among several types of memory devices, read-timing specifications are common. The read-timing specifications are shown in Table 4-11.

Table 4-11: Common Memory Read Timing Specification for all types of Memory

| Speed Version | | | 600ns[1,2] | | 250ns[3] | | 200ns | | 150ns | | 100ns | |
|---|---|---|---|---|---|---|---|---|---|---|---|---|
| Item | Symbol | IEEE Symbol | Min | Max | Min | Max | Min | Max | Min | Max | Min | Max |
| Read Cycle Time | tcR | t AVAV | 600[2] | | 250[5] | | 200 | | 150 | | 100 | |
| Address Access Time[4] | ta (A) | t AVQV | | 600[2] | | 250[3] | | 200 | | 150 | | 100 |
| Card Enable Access Time | ta (CE) | t ELQV | | 600[2] | | 250[3] | | 200 | | 150 | | 100 |
| Output Enable Access Time | ta (OE) | t GLQV | | 300[2] | | 125[3] | | 100 | | 75 | | 50 |
| Output Disable Time from CE | tdis (CE) | t EHQX | | 150 | | 100 | | 90 | | 75 | | 50 |
| Output Disable Time from OE | tdis (OE) | t GHQZ | | 150 | | 100 | | 90 | | 75 | | 50 |
| Output Enable Time from CE | ten (CE) | t ELQNZ | 5 | | 5 | | 5 | | 5 | | 5 | |
| Output Enable Time from OE | ten (OE) | t GLQNZ | 5 | | 5 | | 5 | | 5 | | 5 | |
| Data Valid from Add Change[4] | tv (A) | t AXQX | 0 | | 0 | | 0 | | 0 | | 0 | |
| Address Setup Time[5] | tsu (A) | t AVGL | 100 | | 30 | | 20 | | 20 | | 10 | |
| Address Hold Time[5] | th (A) | t GHAX | 35 | | 20 | | 20 | | 20 | | 15 | |
| Card Enable Setup Time[5] | tsu (CE) | t ELGL | 0 | | 0 | | 0 | | 0 | | 0 | |
| Card Enable Hold Time[5] | th (CE) | t GHEH | 35 | | 20 | | 20 | | 20 | | 15 | |
| Wait Valid from OE[5] | tv (WT-OE) | t GLWTV | | 100 | | 35 | | 35 | | 35 | | 35 |
| Wait Pulse Width[6] | tw (WT) | t WTLWTH | | 12us | | 12us | | 12us | | 12us | | 12us |
| Data Setup for Wait Released[6] | tv (WT) | t QVWTH | 0 | | 0 | | 0 | | 0 | | 0 | |

1. 600 nsec cycle times apply for 3.3 volt reduced operating voltage.
2. 3.3V timing for cycles >600 ≠ n sec are equal to value given + (cycle time-600). All other parameters are identical.
3. 5V timing for cycles >250≠ n sec are equal to value given + (cycle time-250). All other parameters are identical.
4. The –REG signal timing is identical to address signal timing.
5. These timing are specified for hosts and cards which support the –WAIT signal.
6. These timings specified only when –WAIT is asserted within the cycle.
7. All timings measured at card. Skews & delays from the system driver/receiver to the card must be accounted for by the system.

4.9.3 Write Timing for SRAM Card

Write Timing Specs are shown in Table 4-12.

Table 4-12: Common Memory Write Timing Specification SRAM

| Speed Version | | | 600ns[3,6] | | 250ns[5] | | 200ns | | 150ns | | 100ns | |
|---|---|---|---|---|---|---|---|---|---|---|---|---|
| Item | Symbol | IEEE Symbol | Min | Max | Min | Max | Min | Max | Min | Max | Min | Max |
| Write Cycle Time | tcW | t AVAV | 600[6] | | 250[5] | | 200 | | 150 | | 100 | |
| Write Pulse Width | tw (WE) | t WLWH | 300[6] | | 150[5] | | 120 | | 80 | | 60 | |
| Address Setup Time[4] | tsu (A) | t AVWL | 50 | | 30 | | 20 | | 20 | | 10 | |
| Address Setup Time for WE[4] | tsu (A-WEH) | t AVWH | 350[6] | | 180[5] | | 140 | | 100 | | 70 | |
| Card Enable Setup Time for WE | tsu (CE-WEH) | t ELWH | 300[6] | | 180[5] | | 140 | | 100 | | 70 | |
| Data Setup Time for WE | tsu (D-WEH) | t DVWH | 150[6] | | 80[5] | | 80 | | 50 | | 40 | |
| Data Hold Time | th (D) | t WMDX | 70 | | 30 | | 30 | | 20 | | 15 | |
| Write Recover Time | trec (WE) | t WMAX | 70 | | 30 | | 30 | | 20 | | 15 | |
| Output Disable Time from WE | tdis (WE) | t WLQZ | | 150 | | 100 | | 90 | | 75 | | 50 |
| Output Disable Time from OE | tdis (OE) | t GHQZ | | 150 | | 100 | | 90 | | 75 | | 50 |
| Output Enable Time from WE | ten (WE) | t WHQNZ | 5 | | 5 | | 5 | | 5 | | 5 | |
| Output Enable Time from OE | ten (OE) | t GLQNZ | 5 | | 5 | | 5 | | 5 | | 5 | |
| Output Enable Setup from WE | tsu (OE-WE) | t GHWL | 35 | | 10 | | 10 | | 10 | | 10 | |
| Output Enable Hold from WE | th (OE-WE) | t WHGL | 35 | | 10 | | 10 | | 10 | | 10 | |
| Card Enable Setup Time[1] | tsu (CE) | t ELWL | 0 | | 0 | | 0 | | 0 | | 0 | |
| Card Enable Hold Time[1] | th (CE) | t GHEH | 35 | | 20 | | 20 | | 20 | | 15 | |
| Wait Valid from WE [1] | tv (WT-WE) | t WLWTV | | 100 | | 35 | | 35 | | 35 | | 35 |
| Wait Pulse Width [2] | tw (WT) | t WTLWTH | | 12us | | 12us | | 12us | | 12us | | 12us |
| WE High from Wait Released [2] | tv (WT) | t WTHWH | 0 | | 0 | | 0 | | 0 | | 0 | |

Notes:
1) These timing are specified for hosts and cards which support the -WAIT signal.
2) These timings specified only when -WAIT is asserted within the cycle.
3) 600 nsec cycle times apply for 3.3 volt reduced operating voltage.
4) The -REG signal timing is identical to address signal timing.
5) 5V timing for cycles >250 ≠ n sec are equal to value given + (cycle time-250). All other parameters are identical.
6) 3.3V timing for cycles >600 ≠ n sec are equal to value given + (cycle time-600). All other parameters are identical.
7) All timings measured at card. Skews & delays from the system driver/receiver to the card must be accounted for by the system.

4.9.4 Common Memory Write Timing for OTPROM, EPROM, and Flash Memory

The programming specification of various memory devices are not standardized. Moreover, programming specifications may vary among different generations of the same device. Consequently, it is not practical to set standardized programming specifications for these memory cards.

4.9.5 Attribute Memory Read Timing Specification

The Attribute Memory's access time is defined as 300ns at standard operating voltage of Vcc=5V ±5%. Detailed timing specifications are shown in Table 4-13.

Table 4-13: Attribute Memory Read Timing Specification for all types of Memory

| Speed Version | | | 300ns | |
|---|---|---|---|---|
| Item | Symbol | IEEE Symbol | Min | Max |
| Read Cycle Time | tcR | t AVAV | 300 | |
| Address Access Time | ta (A) | t AVQV | | 300 |
| Card Enable Access Time | ta (CE) | t ELQV | | 300 |
| Output Enable Access Time | ta (OE) | t GLQV | | 150 |
| Output Disable Time from CE | tdis (CE) | t EHQZ | | 100 |
| Output Disable Time from OE | tdis (OE) | t GHQZ | | 100 |
| Output Enable Time from CE | ten (CE) | t ELQNZ | 5 | |
| Output Enable Time from OE | ten (OE) | t GLQNZ | 5 | |
| Data Valid from Add Change | tv (A) | t AXQX | 0 | |
| Address Setup Time[1] | tsu (A) | t AVGL | 30 | |
| Address Hold Time [1] | th (A) | t GHAX | 20 | |
| Card Enable Setup Time[1] | tsu (CE) | t ELGL | 0 | |
| Card Enable Hold Time[1] | th (CE) | t GHEH | 20 | |
| Wait Valid from OE [1] | tv (WT-OE) | t GLWTV | | 35 |
| Wait Pulse Width [2] | tw (WT) | t WTLWTH | | 12us |
| Data Setup for Wait Released [2] | tv (WT) | t QVWTH | 0 | |

Notes: 1) These timing are specified for hosts and cards which support the –WAIT signal.
2) These timings specified only when –WAIT is asserted within the cycle.

4.9.6 Attribute Memory Write Timing Specification

In the absence of other information, Attribute Memory Write timing will be 250 nsec SRAM timing.

4.9.7 Memory Timing Diagrams

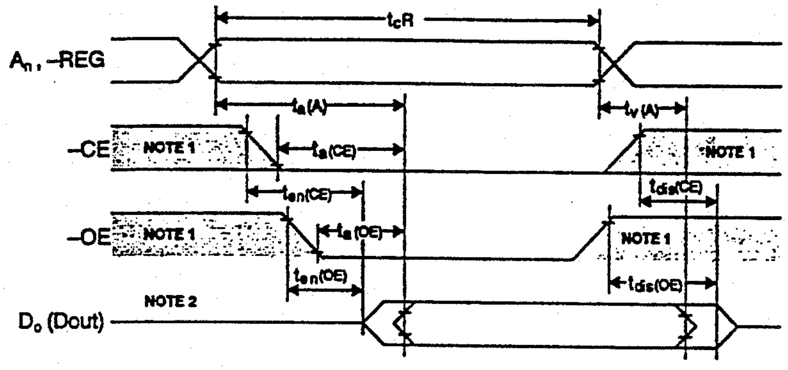

Note 1: The shaded portion may be either high or low.
Note 2: Output Load = 1 TTL + 100pf.
Note 3: -WE remains high throughout this diagram.

Figure 4-1. Read Timing Diagram

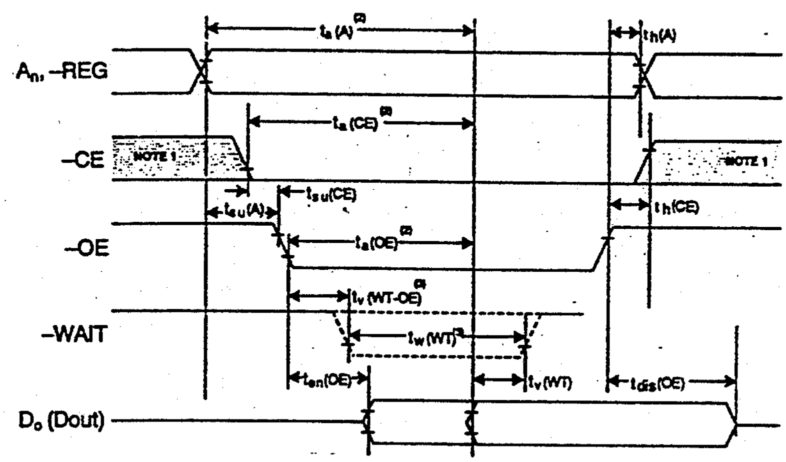

Note 1: The shaded portion may be either high or low.
Note 2: Applies to card only when -WAIT is not asserted by card. However, the host shall always provide at least this access time before sampling data.
Note 3: Applies only when -WAIT is asserted by card.

Figure 4-2. Read Timing Diagram (Wait Supported by Socket)

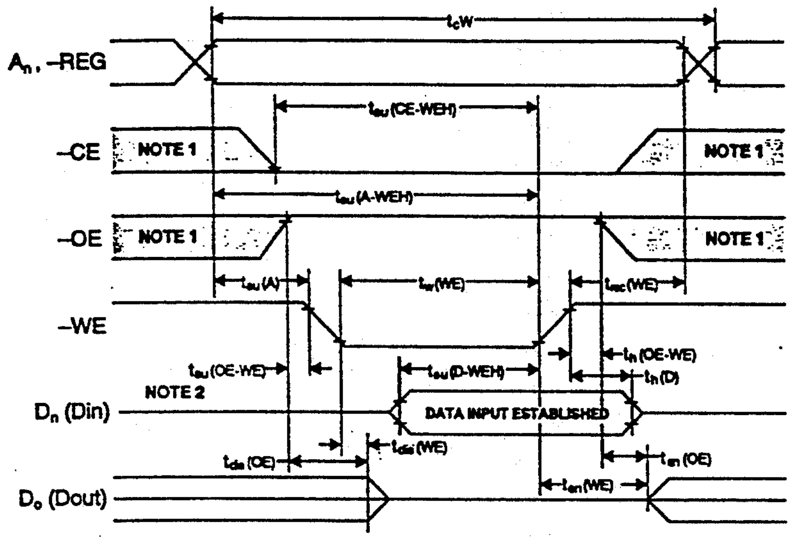

Note 1: The shaded portion may be either high or low.
Note 2: When the data I/O pin is in the output state, no signals shall be applied to the data pins (D0- D15) by the system.

Figure 4-3. Write Timing Diagram (WE control)

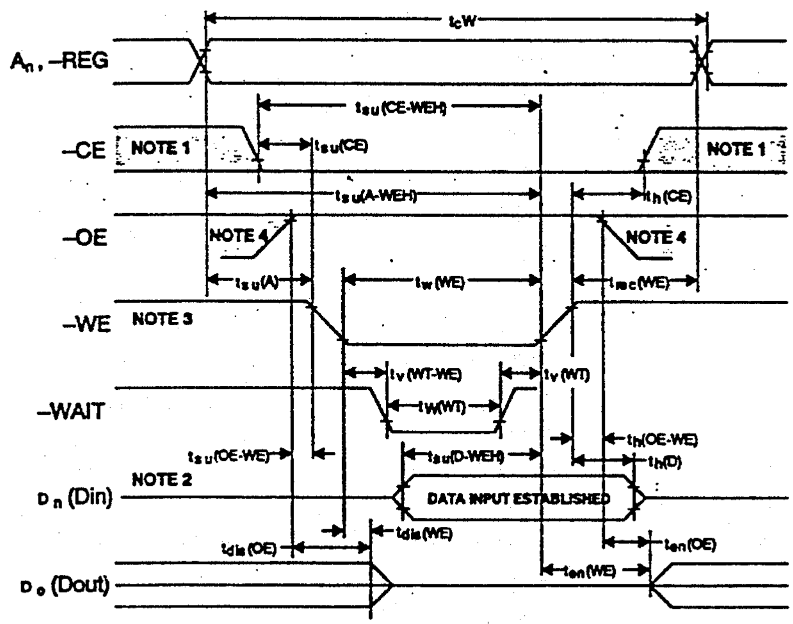

Note 1: The hatched portion may be either high or low.
Note 2: When the data I/O pin is in the output state, no signals shall be applied to the data pins (D0- D15) by the system.
Note 3: Minimum write pulse width must always be met whether or not card asserts -WAIT.
*Note 4: May be high or low for Write timing, but restrictions on -OE timing in Figure 4-2 apply.*

Figure 4-4. Write Timing Diagram (Wait Supported by Socket)

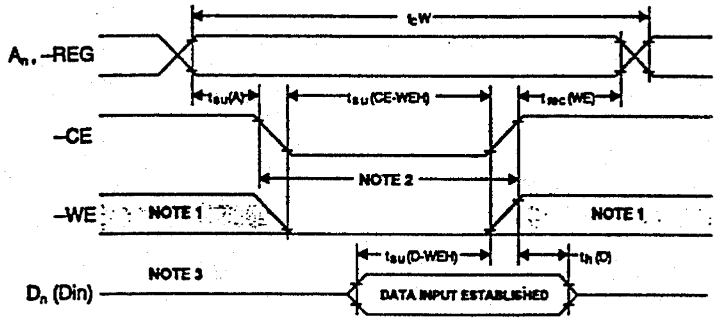
Note 1: The shaded portion may be either high ("H") or low ("L").
Note 2: OE must be high ("H").
Note 3: When the data I/O pin is in the output state, no signals shall be applied to the data pins (D0-D15) by the system.
Figure 4-5. Write Timing Diagram (CE control)

4.10 Electrical Interface

4.10.1 Signal Interface

Electrical specifications must be maintained to insure data reliability.

The Memory Card normal Operating Voltage for Vcc is 4.75 to 5.25 DC. Dual Operating Voltage Cards also permit a Reduced Operating Voltage for Vcc of 3.135 to 3.465. Interface signal levels are compatible with standard TTL or CMOS for the Operating Voltage used.

Table 4-14: Electrical Interface

| Item | Signal | Card | Host | Card Output Format |
|---|---|---|---|---|
| Control Signal | -CE1<br>-CE2<br>-REG<br>-IORD<br>-IOWR | pull-up to Vcc R > 10K ohms and must be sufficient to keep inputs inactive when the pins are not connected at the host.[3] | | |
| | -OE<br>-WE/PGM | pull-up to Vcc R > 10K ohms*[3] | | |
| | +RESET | pull-up to Vcc R > 100K ohms* | | |
| | RFSH | NC | NC | Not Defined |
| Status Signal | +RDY/-BSY<br>-INPACK<br>-WAIT | | pull-up[4] | |
| | +WP | | | |
| Address | A0-A25 | pull-down R > 100K ohms*[5] | | |
| Data Bus | D0-D15 | pull-down R > 100K ohms*[2] | 2 | |
| Card Detect | -CD1<br>-CD2 | connected to GND in the card | pull-up > 10K ohms | |
| Reserved Pin | RFU | NC | NC | |
| Battery/Detect | BVD1<br>BVD2 | | pull-up, NOTE 1 | asserted or deasserted |

*Resistor is optional

1. BVD2 was not defined in the JEIDA Version 3 document. Systems fully supporting JEDIA version 3 SRAM cards must pull up pin 62 (BVD2) to avoid sensing their batteries as "Low".
2. Data Signals: The host and each card shall present a load no larger than 50 pF at a DC current 450 μA low state and 150 μA high state. The host and each card shall be able to drive at least the following load while meeting all AC timing requirements: 100 pF with DC current 1.6mA low state and 300μA high state. This permits the host to wire two sockets in parallel without derating the card access speeds.
3. Control Signals: Each card shall present a load to the socket no larger than 50 pF at a DC current of 700 μA low state and 150 μA high state, including pullup resistor. The socket shall be able to drive at least the following load while meeting all AC timing requirements: (the number of sockets wired in parallel) multiplied by (50 pF with DC current 700 μA low state and 150 μA high state per socket).
4. Status Signals: The socket shall present a load to the card no larger than 50 pF at a DC current of 400 μA low state and 100 μA high state, including pullup resistor. The card shall be able to drive at least the following load while meeting all AC timing requirements: 50 pF at a DC current of 400 μA low state and 100 μA high state.
5. Address Signals: Each card shall present a load of no more than 100 pF at a DC current of 450A μA low state and 150 μA high state. The host shall be able to drive at least the following load while meeting all AC timing requirements: (the number of sockets wired in parallel) multiplied by ( *100* 50 pF with DC current 450 μA low state and 150 μA high state per socket).

4.10.2 Memory Address Decoding

The PC Card's maximum memory-address space is 64 megabytes. The address bus is defined in A0-A25 with A0 being the LSB and A25 the MSB. Address bit A0 is a "don't care" when card is in word-access mode.

In the case of SRAM without Attribute Memory, address decoding is required as follows:

1. Minimum memory unit is 16KB
2. Memory address starts from 00H
3. Memory units exist continuously.

4.10.2.1 Card Configuration Registers Address Decoding

PC Cards that can be configured by the system — including cards which support I/O and those which exceed nominal system requirements — contain Card Configuration Registers located in the Attribute Memory space. The Card Configuration Registers are a set of numbered, standardized, 8-bit registers. These registers are addressed at consecutive even-byte addresses starting at the Base Address indicated in the Configuration Tuple. Whether Card Configuration Register number N is present on the card or not, the location of the register is always given by: Base Address + 2 * N. Refer to Section 4.15.

4.10.3 I/O Address Space Decoding

During I/O operations, the I/O address spaces of each PC Card may be either independent or overlapping. An independent I/O-address window is a portion of the system's I/O space which is assigned solely to a single PC Card and not shared with any other system resource. Each system must be able to allocate to each card an independent I/O-address window of at least 8 bytes of contiguous address space. The window must begin exactly on an 8-byte boundary. An overlapping I/O-address window is a portion of the system's I/O space which is assigned to any combination of PC Cards and other system resources. When the Overlapping Window method is used by the card, the card responds to only a limited number of the I/O addresses in the window. Also with this method, the card may permit the system to choose from a selection of addresses to which the card can respond.

During a card reset, and immediately following a card reset, a card will not respond to any I/O-read or I/O-write cycles until it has been configured.

The standard permits PC Cards which implement I/O functions to use either an Independent or Overlapping Window, or to permit selecting between the two methods. The types of I/O address decoding performed by the card, as well as the specific range of addresses to which the card will respond (in Overlapping I/O Window mode), are described in the Card Configuration Table located within the Card Information Structure. To select a particular card configuration, the system writes the index number of one table entry back to the Card Configuration Registers.

Refer to Sections 4.15 and 5.2.8 regarding card configuration.

In order to be able to accommodate cards which require higher number of I/O ports, such as LAN, VGA, multifunction cards and game cards, PCMCIA recommends that the system reserve 128 contiguous bytes of its I/O space.

Typically this will be available in systems that decode I/O addresses above 400H PCMCIA recommends that when the system reserves addresses above 400H the base address will begin at 128 byte boundaries.

4.10.3.1 Independent I/O Address Window

Independent I/O-Address windows for PC Cards provide a straightforward mechanism for I/O-space allocation among PC Cards and other system resources installed in the system. The method can be applied to systems which permit I/O drivers to determine the card's I/O-port assignment at execution time.

PCMCIA © 1992

For each PC Card socket, the system must reserve a minimum of 8 contiguous bytes of its I/O address space starting at a Base Address with A0 through A2 all zero.

[Note: This should not be interpreted as preventing a system from actually allocating a smaller or discontiguous space to a particular I/O card whose I/O-space requirements are met thereby.]

The location of the Independent I/O-Address Window for each PC Card socket may be fixed permanently, or may be allocated when an I/O card is detected in the socket. The system must include a software method permitting driver software (or application software, if I/O is permitted from applications) to determine a card's I/O space Base Address.

Cards which use the Independent I/O-Address Window need decode only enough address lines to distinguish among the I/O ports actually implemented on the card. When two identical cards are installed in the system, they automatically reside at different addresses. They rely upon the system to provide sufficient address decoding to prevent conflicts with other installed devices, and may be located anywhere in the I/O space of the system.

Example: An example of this concept is used in the EISA bus. Each EISA card slot is uniquely assigned the first 256 bytes of a corresponding 1 kilobyte of I/O space.

4.10.3.2 Overlapping I/O Address Window

The Overlapping I/O-Address Window is provided for those systems whose I/O drivers have their I/O addresses bound before execution time. This includes both systems for which execution-time binding is not possible, and those having existing drivers which do not take advantage of execution-time binding of I/O addresses.

The system assigns the same block(s) of its I/O space to each PC Card using the Overlapping I/O-Address Window. Other resources in the system may also use portions of the block. Each card and system resource is responsible for decoding addresses within the block and responding to I/O only within a unique subset of those addresses. This mechanism relies on the cards and system resources having non-overlapping subsets of addresses to which they respond.

When each PC Card is installed in a system that uses an Overlapping I/O-Address Window, the addresses used by the card must be compared with the addresses used by other installed PC Cards, and the addresses used by other system resources. If the addresses conflict, the new card may be gracefully rejected by the system.

A PC Card may allow operation at several alternative sets of addresses. The host selects the desired alternative from the Card Configuration Table and informs the card by writing the index of the selected entry to the Card Configuration Registers. Refer to Section 4.15.

Example: A desktop computer example of Overlapping I/O-Address Windows occurs in both ISA and EISA bus-based computers. In these systems all expansion slots are selected during I/O accesses to the last 768 bytes of each 1 kilobyte of I/O space. The expansion cards individually determine to which addresses within that range they will respond. The specific set of addresses is often set by configuration switches, or jumpers, on the expansion card. A service technician is responsible for ensuring, during installation, that no address conflicts will occur.

4.11 Card Detect

The Memory Card provides a means of allowing the system to detect card insertion and removal. Signal lines CD1 and CD2 are connected to GND in the card. A pull-up resistor must be connected to CD1 and CD2 on the system side.

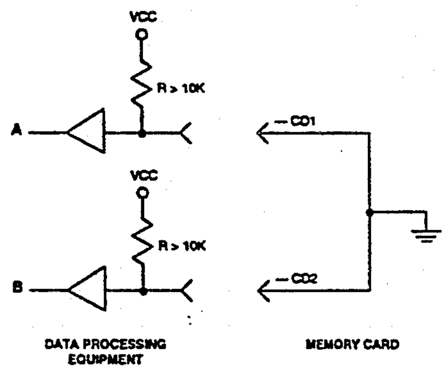

Figure 4-6. Card Detect

4.12 Battery Voltage Detect

When using SRAM Cards, it is critical for the system's data integrity to be able to determine the status of the on-card battery. The SRAM card provides two status signals for this purpose: BVD1 and BVD2. The Memory Card contains one or two voltage comparators and one or two reference voltages. The Memory Card compares the battery voltage with the reference voltages. Battery status is expressed on 2 digital signal lines, BVD1 and BVD2. If signal BVD2 is not supported, it is held to Vcc through a pull-up resistor on the card.

Table 4-15: Battery Voltage Detect

| BVD1 (#63) | BVD2 (#62) | COMMENT |
|---|---|---|
| H | H | 'GREEN' Battery Operational |
| H | L | 'YELLOW' Battery should be replaced. Data is OK. |
| L | H | 'RED' Battery & Data integrity is not guaranteed. |
| L | L | 'RED' Battery & Data integrity is not guaranteed.* |

* If BVD2 is not supported, BVD2 is held to Vcc and only one reference voltage is required.

4.13 Power-up And Power-down

4.13.1 Power-up/Power-down Timing

To retain data in the SRAM Card during power-up or power-down cycles, and to permit peripheral cards to perform power-up initialization, a timing specification is defined as follows.

Table 4-16: Power-up/Power-down Timing

| | | | Value | | |
|---|---|---|---|---|---|
| Item | Symbol | Condition | Min | Max | Unit |
| CE signal level[1] | Vi (CE) | 0V < Vcc < 2.0V | 0 | ViMAX | V |
| | | 2.0V < Vcc <VIH | Vcc-0.1 | ViMAX | |
| | | VIH < Vcc | VIH | ViMAX | |
| CE Setup Time | tsu (Vcc) | | 20 | | ms |
| CE Setup Time | tsu (RESET) | | 20 | | ms |
| CE Recover Time | trec (Vcc) | | 0.001 | | ms |
| Vcc Rising Time[2] | tpr | 10%—>90% of (Vcc +5%) | 0.1 | 300 | ms |
| Vcc Falling Time[2] | tpf | 90% of (Vcc -5%)—>10% | 3.0 | 300 | ms |
| RESET Width | tw (RESET) | | 10 | | µs |
| | th (Hi-z Reset) | | 1 | | ms |
| | ts (Hi-z Reset) | | 0 | | ms |

1 ViMAX means Absolute Maximum Voltage for Input in the period of 0V < Vcc < 2.0V, Vi (CE) is only 0V–ViMAX 2 The tpr and tpf are defined as "linear waveform" in the period of 10% to 90% or vice-versa, Even if the waveform is not "linear waveform", its rising and falling time must be met this specification.

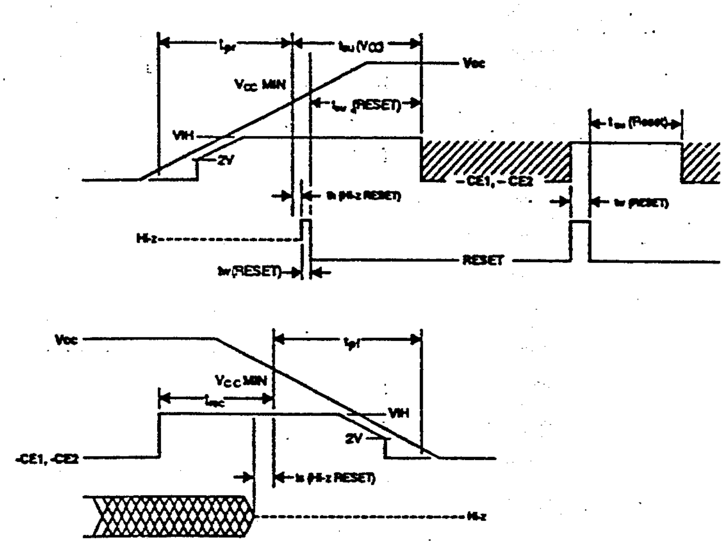

Figure 4-7. Power-Up/Down Timing for Systems Supporting RESET

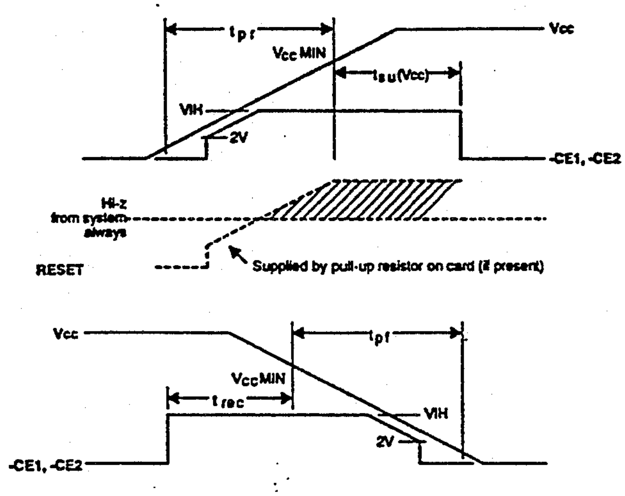

Figure 4-8. Power-Up/Down Timing for Systems Not Supporting RESET

4.13.2 Data Retention

This specification does not guarantee data retention in memory cards that conform to it. The conditions in the preceding tables indicate the minimum requirements to ensure data retention. Card vendors and system vendors may have to negotiate with each other to determine the detailed method of guaranteeing data retention for specific memory-card models.

4.13.3 Supplement

During card insertion or removal, with power active, its data-retention capability will depend on the individual Memory Card model, the manufacturer's environmental specifications, and other conditions. Therefore, there is no guarantee of data retention during card insertion or removal when under power.

4.14 I/O Function

This section describes the operation and configuration of I/O Cards inserted into a PCMCIA/JEIDA socket.

4.14.1 I/O Transfer Function

This section describes the operation of I/O transfer cycles (Input and Output Instructions) on I/O Cards.

PCMCIA © 1992

4.14.2 I/O Input Function for I/O Cards

I/O-input transfers from I/O cards may be either 8-bit or 16-bit.

When a 16-bit transfer is attempted from a 16-bit port, the signal -IOIS16 must be asserted by the I/O Card. Otherwise, the -IOIS16 signal must be negated. When a 16-bit transfer is attempted, and the -IOIS16 signal is not asserted by the card, the system generates a pair of 8-bit references to access the word's even byte and odd byte.

An I/O card may extend the length of an input cycle by asserting the -WAIT signal at the start of the cycle.

Table 4-17: I/O Input Function for I/O Cards

| Function Mode | -REG | -CE2 | -CE1 | A0 | -IORD | -IOWR | D15-D8 | D7-D0 |
|---|---|---|---|---|---|---|---|---|
| Standby Mode | X | H | H | X | X | X | High-Z | High-Z |
| Byte Input (8 bits) | L<br>L | H<br>H | L<br>L | L<br>H | L<br>L | H<br>H | High-Z<br>High-Z | Even-Byte<br>Odd-Byte |
| Word Access (16 bits) | L | L | L | L | L | H | Odd-Byte | Even-Byte |
| I/O Inhibit (e.g. during DMA) | H | X | X | X | L | H | High-Z | High-Z |
| High Byte Only | L | L | H | X | L | H | Odd-Byte | High-Z |

Note: The Vpp1 and Vpp2 signals to the I/O Card are not required to be other than Vcc specifically for input transfers, however, they may be required to be at other voltage levels for proper card operation as indicated in the Card Information Structure. If the required Vpp levels cannot be provided by the system, the card may be rejected by the system.

4.14.3 I/O Output Function for I/O Cards

I/O-output transfers to I/O cards may be either 8-bit or 16-bit.

When a 16-bit transfer is attempted to a 16-bit port, the signal -IOIS16 must be asserted by the I/O Card. Otherwise, the -IOIS16 signal must be negated. When a 16-bit transfer is attempted, and the -IOIS16 signal is not asserted by the card, the system generates a pair of 8-bit references to access the word's even byte and odd byte.

An I/O card may extend the length of an output cycle by asserting the -WAIT signal at the start of the cycle.

Table 4-18: I/O Output Function for I/O Cards

| Function Mode | -REG | -CE2 | -CE1 | A0 | -IORD | -IOWR | D15-D8 | D7-D0 |
|---|---|---|---|---|---|---|---|---|
| Standby Mode | X | H | H | X | X | X | X | X |
| Byte Input (8 bits) | L<br>L | H<br>H | L<br>L | L<br>H | H<br>H | L<br>L | X<br>X | Even-Byte<br>Odd-Byte |
| Word Access (16 bits) | L | L | L | L | H | L | Odd-Byte | Even-Byte |
| I/O Inhibit (e.g. during DMA) | H | X | X | X | H | L | X | X |
| High Byte Only | L | L | H | X | H | L | Odd-Byte | X |

Note: The Vpp1 and Vpp2 signals to the I/O Card are not required to be other than Vcc specifically for output transfers, however, they may be required to be at other voltage levels for proper card operation as indicated in the Card Information Structure. If the required Vpp levels cannot be provided by the system, the card may be rejected by the system.

4.14.4 I/O Read (Input) Timing Specification

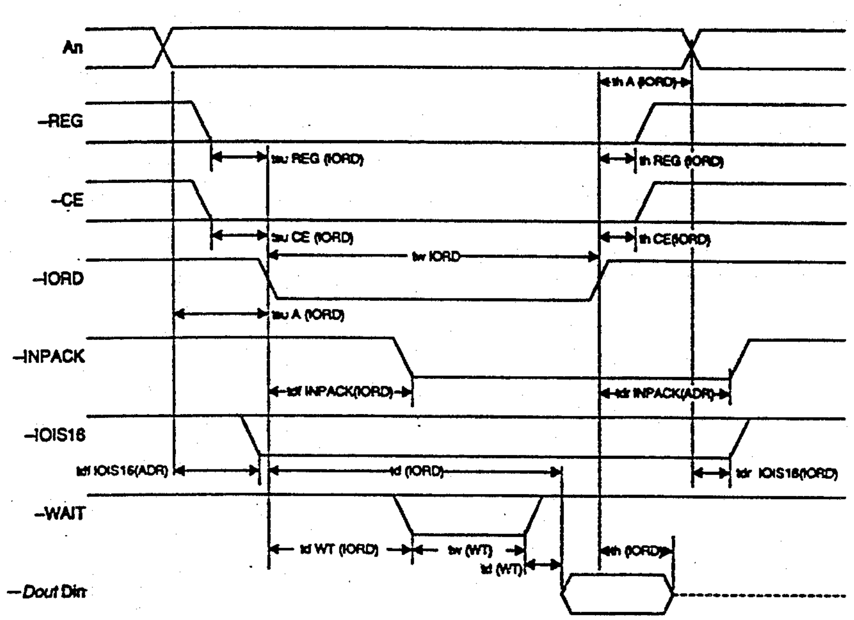

All timings are measured at the Card. Skews and delays from the system driver/receiver to the card must be accounted for by the system design.
Minimum time from -WAIT high to -IORD high is 0 nsec, but minimum -IORD width must still be met.
*Dout signifies data provided by the card to the system.*

Table 4-19: I/O Read (Input) Timing Specification for All 5V I/O Cards

| Item | Symbol | IEEE Symbol | Min | Max |
|---|---|---|---|---|
| Data Delay after IORD | td (IORD) | t IGLQV | | 100 |
| Data Hold following IORD | th (IORD) | t IGHQX | 0 | |
| IORD Width Time | tw IORD | t IGLIGH | 165 | |
| Address Setup before IORD | tsu A (IORD) | t AVIGL | 70 | |
| Address Hold following IORD | th A (IORD) | t IGHAX | 20 | |
| CE Setup before IORD | tsu CE (IORD) | t ELIGL | 5 | |
| CE Hold following IORD | th CE (IORD) | t IGHEH | 20 | |
| REG Setup before IORD | tsu REG (IORD) | t RGLIGL | 5 | |
| REG Hold following IORD | th REG (IORD) | t IGHRGH | 0 | |
| INPACK Delay Falling from IORD | tdf INPACK (IORD) | t IGLIAL | 0 | 45 |
| INPACK Delay Rising from IORD | tdr INPACK (IORD) | t IGHIAH | | 45 |
| IOIS16 Delay Falling from Address | tdf IOIS16 (ADR) | t AVISL | | 35 |
| IOIS16 Delay Rising from Address | tdr IOIS16 (ADR) | t AVISH | | 35 |
| Wait Delay Falling from IORD | td WT (IORD) | t IGLWTL | | 35 |
| Data Delay from Wait Rising | td (WT) | t WTHQV | | 35 |
| Wait Width Time | tw (WT) | t WTLWTH | | 12,000 |

Note: The maximum load on WAIT, INPACK and IOIS16 are 1 LSTTL with 50 pF total load.
All timing in nsec.

PCMCIA © 1992, 1993

4.16 Future Tasks And Remarks

4.16.1 Insertion/Removal with Power Active

PCMCIA recognizes the market need for card insertion or removal while under power. PCMCIA has been discussing this issue but has not yet achieved consensus on a specification which would guarantee a card's data retention during active-power insertion or removal. PCMCIA will continue to discuss this issue at future meetings.

4.16.2 Standardization of EPROM and EEPROM Programming

Programming specifications for EPROM and EEPROM are not yet standardized at the device level. Instead, the programming voltage, timing, and other conditions vary with individual vendors. Consequently, it is impossible to standardize at the memory-card level. PCMCIA urges device vendors to standardize their programming voltage, timing, and other conditions. The memory-card committee will continue to work towards a standard memory card which is reliable and easy to use.

4.16.3 Wide Operating Voltage

There is a large potential market of memory cards for battery-powered equipment. Low-voltage operation is urgently needed by this market. To respond to these needs, PCMCIA has specified a Dual Operating Voltage card (5 Volt and 3.3 Volt) and is investigating additional means by which low-voltage memories can be supported by the standard.

4.16.4 I/O Functionality

PCMCIA has defined an I/O interface as described in this document. This I/O functionality allows a variety of I/O cards — such as communications cards or disk emulation cards — to be implemented. The PCMCIA is continuing to address issues of additional I/O functions.

SECTION - 5

CARD METAFORMAT

CARD METAFORMAT

5.1 The Metaformat[1]

5.1.1 Goals of This Standard

The following goals guided the development of this standard.

1. The standard must support several different file-system formats on a single card, both DOS compatible as well as other file systems (e.g., XENIX). It should also support applications such as data storage for VCRs or musical instruments, which might not use any traditional file system to record their data. At the same time, any computer system should be able to look someplace on a card and determine such things as the card's overall size, type and other low-level information.

Given the wide potential scope of applications for memory cards, the ability to read non-DOS cards on DOS-based systems will be of significant value to users.

The ability to detect that a given card is formatted (though perhaps not readable by the computer into which it is plugged) is particularly valuable in that it allows system designers to protect users against common mistakes. Such a capability could be used, for example, to inform the user during the format routine that the card is already formatted as a data-storage card for a VCR.

2. Because application requirements differ, the standard should support various low-level data recording strategies (akin to physical formatting for floppies). These strategies would include sequential recording of blocks of bytes with no error checking; sequential recording of blocks of bytes with embedded error checking (CRC codes); sequential recording of bytes with separate error checking (e.g., non-sequential checksum bytes); or sequential non-blocked recording of bytes.

3. For compatibility with existing operating systems and application programs, the standard should be most focused on those environments where all media are organized in a disk-like way (i.e. with sectors, tracks and cylinders). On the other hand, the standard should also support those environments that simply address media as sequences of blocks.

4. The standard should support cards that include directly-executable ROM images, and cards that include a mixture of directly-executable images and DOS file systems.

5. The standard should support cards for the DOS environment that include programs that can be directly executed from ROM, or executed from RAM in the usual fashion, depending on the capabilities of the computer system.

6. The standard should be reasonably general, and should allow for future expansion without major rewriting of existing software. At the same time, for common (MS-DOS) environments, the standard should not be excessively general.

5.1.2 Overview

*PCMCIA PC Card Standard*, Release 2.01 Metaformat goals include the ability to handle numerous, somewhat incompatible data-recording formats and data organizations. As is done with networking standards, the Metaformat is a hierarchy of layers. Each layer has a number, which increases as the level of abstraction gets higher.

1. The glossary in Appendix A defines many of the technical terms in this chapter.

The layers are:

0. The Physical Layer — the lowest layer of possible standardization. This layer specifies the interface and electrical characteristics of PC Cards.

1. The Basic Compatibility Layer specifies a minimal level of card-data organization. To be compatible at this level, each card should contain a small Card Information Structure ("CIS") or conform to the requirements of Section 5.5.3. This structure contains certain Level-1 information, primarily some fundamental information about the card's devices, such as size, speed, and the like. The information contained in the Card Information Structure is commonly called the Metaformat. In addition, this structure contains information about the card's organization at Levels 2, 3, and 4. References to Levels 1 through 4 pertain to levels of compliance.

A card can comply at Level 1 without being required to comply at any higher level. Thus, *PCMCIA PC Card Standard*, Release 2.01 is an open standard. Cards that comply only at Level 1 need not reserve space for the higher-level information.

The CIS can be thought of as being separate from the data recorded on the media. Under DOS, only the BIOS (or device driver) would be aware of its existence.

The information block must be located such that it can be easily found by low-level software. This standard requires that the primary CIS be recorded in Attribute Memory starting at address zero.

The first tuple starting from address 0 in the ATTRIBUTE memory space must be either a "Device Information tuple" (tuple code 01H), a "Null Control tuple" (tuple code 00H), or an "End of List tuple" (tuple code FFH, see Section 5.2.5.5 for processing).

For flexibility, the CIS can be extended into Common Memory. This allows application parameters to be changed by the user. To facilitate automatic identification of "blank" cards, Attribute Memory can be read-only memory.

At this level, the standard defines two kinds of information:

- Data structures and concepts used by all layers of this standard, and
   - Physical device information.

2. The Data Recording Format Layer specifies how the data on the card is organized at the lowest level. This layer is analogous to the physical format of a floppy disk.

The use of a traditional DOS file system or boot block, is not specified (or required) for compatibility at Level 2.

Specific formats supported are:

- Blocked, Unchecked — the bytes are recorded in blocks with no error checking,
   - Blocked, Checksummed — the bytes are recorded in blocks with checksums for error checking,
   - Blocked, with CRC — the bytes are recorded in blocks with CRC codes for error checking,
   - Unblocked — individual bytes of the card may be accessed or modified by software directly at random. The bytes are recorded in a way that does not correspond to a disk organization.

3. The Data Organization Layer specifies how the data is logically organized on the card. Possibilities are:

- DOS (or other operating system) file system,
   - Flash file system,
   - Execute-In-Place (XIP) ROM image [see Section 6],
   - Application-specific organization.

PCMCIA © 1992

A DOS file system can be used with any of the appropriate (blocked) Level- 2 organizations.

4. The System-Specific Layer defines standards that by their nature are specific to a particular operating environment.
   - The DOS XIP Standard defines a standardized way of preparing DOS-executable images on ROM cards. Programs that conform to this standard will execute correctly on any system that can read the ROM card and includes the appropriate address translation hardware and support software. A standard "RAM execution".EXE or.COM file can also be loaded into system RAM memory from a ROM card if XIP is not supported. See Section 6.

5.1.3 Vendor-Specific Information

Vendor-specific information allows card and software vendors to implement proprietary functions while remaining within the general framework of this standard.

Vendor-specific information is of two kinds:

- Vendor-specific fields are areas reserved in the data structures for free use by vendors. These fields have no meaning to the standard software.
- Vendor-specific codes are encoding values reserved to represent non-standard values in standard fields. In the absence of other information, standard software must interpret vendor-specific codes as meaning "the information in this field is not specified."

The card-manufacturer field in the CIS gives (knowledgeable) system software enough information to interpret vendor-specific fields and code values in the card Physical-Description tuples.

Similarly, the OEM and INFO fields in the CISTPL_VERS_2 tuple give (knowledgeable) system software enough information to interpret vendor-specific fields and code values in the card Logical-Format tuples.

In general, a system will not be able to interpret all possible vendor-specific fields or code values.

5.1.4 System Rejection of Unsupported Cards

This standard requires the following behavior when a system encounters an unrecognized vendor-specific field:

- If the unrecognized field itself is vendor-specific, the system shall ignore that field.
- If a standard field contains an unrecognized vendor-specific code, the system must refuse to perform any operation that requires the information encoded in that field.

5.2 Basic Compatibility (Layer 1)

This layer is the cornerstone of the standard. Any card that complies with this standard shall have at least a rudimentary Card Information Structure (referred to as the "CIS") starting at address zero of the card's Attribute-Memory space.

The Card Information Structure is a variable-length chain (or linked list) of data blocks or *tuples*. All tuples have the format shown in Table 5-1. One or more chains of tuple lists can be used. Longlink tuples are used to connect chains (see Section 5.2.5.2).

Table 5-1: Tuple Format

| Byte | 7 | 6 | 5 | 4 | 3 | 2 | 1 | 0 |
|---|---|---|---|---|---|---|---|---|
| 0 | TPL_CODE | | Tuple code: CISTPL_xxx; see Table 5-2. | | | | | |
| | TPL_LINK | | Offset to next tuple in list. This can be viewed as the number of additional bytes in tuple, excluding this byte. (n-1) | | | | | |
| | | | Bytes specific to this tuple. | | | | | |

Byte 0 of each tuple contains a tuple code. A tuple code of FFH is a special mark indicating that there are no more tuples in the list. Byte 1 of each tuple contains a link to the next tuple in the list. If the link field is zero, then the tuple body is empty. If the link field contains FFH, then this tuple is the last tuple in the list.

There are thus two ways of marking the end of the tuple list: A tuple code of FFH, or a tuple link of FFH. See Section 5.2.5.5 for end of tuple list processing.

An End of List tuple should be used if the tuple list is intended to be extendable. A link field of FFH conserves one (1) byte of memory space but does not describe the actual length of the last tuple in the chain. It is recommended that CIS chains be terminated with an End of List tuple.

The use of an FFH link value is allowed for backward compatibility, but it is recommended to use the end of list tuple whenever possible. System software must use the link field to validate tuples. No tuple can be longer than 256 bytes. Some tuples provide a termination or stop byte that marks the end of the tuple. In this case, the tuple can effectively be shorter than the value implied by its link field. However, software must not scan beyond the implied length of the tuple, even if a termination byte has not been seen.

The following tuple codes are defined:

Table 5-2: Tuple Codes

| Code | Name | Description |
|---|---|---|
| **Layer 1 Basic Compatibility Tuples** | | |
| 00H | CISTPL_NULL | Null tuple - ignore |
| 01H | CISTPL_DEVICE | The device information tuple (common memory) |
| 02H-07H | - | (Reserved for future, upward-compatible versions of the device information tuple). |
| 08H-0F | - | (Reserved for future, incompatible versions of the device information tuple). |
| 10H | CISTPL_CHECKSUM | The checksum control tuple. |
| 11H | CISTPL_LONGLINK_A | The long-link-control tuple (to Attribute Memory). |
| 12H | CISTPL_LONGLINK_C | The long-link-control tuple (to Common Memory). |
| 13H | CISTPL_LINKTARGET | The link-target-control tuple. |
| 14H | CISTPL_NO_LINK | The no-link-control tuple. |
| 15H | CISTPL_VERS_1 | Level 1 version/product-information tuple. |
| 16H | CISTPL_ALTSTR | The alternate-language-string tuple. |
| 17H | CISTPL_DEVICE_A | Attribute Memory device information. |
| 18H | CISTPL_JEDEC_C | JEDEC programming information (for Common Memory). |
| 19H | CISTPL_JEDEC_A | JEDEC programming information (for Attribute Memory). |
| 1AH | CISTPL_CONFIG | The Configuration tuple. |
| 1BH | CISTPL_CFTABLE_ENTRY | The Configuration-Table-Entry tuple. |
| 1CH | CISTPL_DEVICE_OC | Other operating conditions device information for Common Memory. |
| 1DH | CISTPL_DEVICE_OA | Other operating conditions device information for Attribute Memory. |
| *1EH* | *CISTPL_DEVICE_GEO* | *Device geometry info tuple.* |
| *1FH* | *CISTPL_DEVICE_GEO_A* | *Device geometry infor tuple.* |
| **Layer 2 Data Recording Format Tuples** | | |
| *20H* | *CISTPL_MANFID* | *Manufacturer Identification Tuple* |
| *21H* | *CISTPL_FUNCID* | *Function Identification tuple* |
| *22H* | *CISTPL_FUNCE* | *Function Extension Tuples* |
| *23H* | *CISTPL_SWIL* | *Software interleave tuple.* |
| *24H-3FH* | - | *(Reserved for future standardization)* |
| 40H | CISTPL_VERS_2 | The level-2 version tuple. |
| 41H | CISTPL_FORMAT | The format tuple. |
| 42H | CISTPL_GEOMETRY | The geometry tuple. |
| 43H | CISTPL_BYTEORDER | The byte order tuple. |
| 44H | CISTPL_DATE | The card initialization date tuple. |
| 45H | CISTPL_BATTERY | The battery replacement date tuple. |
| **Layer 3 Data Organization Tuples** | | |
| 46H | CISTPL_ORG | The organization tuple. |
| 47H-7FH | - | (Reserved for future standardization). |
| **Layer 4 System-Specific Standard Tuples** | | |
| 80H-FEH | - | Vendor unique tuples* |
| FFH | CISTPL_END | The end-of-list tuple. |

* Note: The use of vendor-specific tuples is under review and subject to change. PCMCIA recommends restricting their use to the 80-8FH range.

PCMCIA expects that the CIS will be written once when the card is formatted and then rarely (if ever) updated. The standard is not designed to allow incremental updating of the CIS on Flash media. On EEPROM devices that require the CIS to be erased occasionally (for example when a Flash-type file system is reorganized), it is suggested that a buffer-page strategy be used, with an appropriate utility that can recover from a power-failure.

PCMCIA © 1992, 1993 by a second byte, which is their JEDEC ID. They may use up to two additional bytes of their own designation.

The subtuple is defined as follows:

Table 5-25: Custom Interface Subtuples

| Byte | 7 | 6 | 5 | 4 | 3 | 2 | 1 | 0 |
|---|---|---|---|---|---|---|---|---|
| 0 | ST_CODE | | Interface subtuple code (CCST_CIF, $C0_H$) | | | | | |
| 1 | ST_LINK | | Link to next tuple (m-1; minimum 1) | | | | | |
| 2.. | STCI_IFN | | Interface ID Number 1 to 4 bytes<br>Least significant byte first | | | | | |
| .. m | STCI_STR | | Interface Description Strings | | | | | |

| | | | |
|---|---|---|---|
| STCI_IFN | This field provides a unique 8- to 32- bit number which identifies the interface.<br>Within the ID number are two bits (bits 6 and 7 of byte 0) which give the size of this field.<br>The first two or three bytes of the ID number is assigned by PCMCIA or its designer.<br>When a vendor has been assigned a two- or three- byte initial portion the remaining one or two bytes of the field are assigned by that vendor to uniquely identify the interface. | | |
| | Bits 7,6 of byte 0 give the Size of STCI_IFN | 0 | 1 Byte long STCI_IFN field |
| | | 1 | 2 Byte long STCI_IFN field |
| | | 2 | 3 Byte long STCI_IFN field |
| | | 3 | 4 Byte long STCI_IFN field |
| STCI_STR | A list of strings, the first being ISO 646 IRV coded and the rest being coded as ISO alternate language strings with the initial escape character suppressed. Each string is terminated by a 0 byte and the last string, if it does not extend to the end of the subtuple, is followed by an $FF_H$ byte. | | |

5.2.8.2 Card Configuration Table

The initial portion of each entry of the Card Configuration Table is given in a compact, standard form. Additional information may be added to the compact information by appending tuple-formatted information (tuple-code, offset to next tuple, and tuple contents) within the interface-definition or configuration-entry tuples containing the Configuration Table Entry. Subtuple codes 80-$BF_H$ are reserved for vendor-specific configuration information.

The Card Configuration Table organization for a Memory-Only Card and an I/O Card are the same. However, a Memory-Only Card should not include I/O-specific fields or tuples. Fields related to Vcc, Vpp and timing apply to all cards.

5.2.8.3 CISTPL_CFTABLE_ENTRY: Card Configuration Table Entry Tuple

Configuration Table Entry tuples are used to specify each possible configuration of a card and to distinguish among the permitted configurations. The Configuration tuple must be located before all Configuration Table Entry tuples. The Configuration Table Entry, whose Configuration Table Index matches the last index in the Configuration tuple, must appear after all other Configuration Table Entries.

When the default bit is set in an entry's Configuration-Table index byte, that Configuration Table Entry provides all default values for following entries in the Card Configuration Table While the default bit is not set in an entry's Configuration-Table index byte, the entry provides default values which apply only to the configuration indicated by the that entry's Configuration-Table Index (TPCE_INDX) byte.

Values which are not present in a specific entry are taken from the card's most recently scanned default entry, as indicated in the specific fields below.

Table 5-26: Configuration Table Entry Tuple

| Byte | 7 | 6 | 5 | 4 | 3 | 2 | 1 | 0 |
|---|---|---|---|---|---|---|---|---|
| 0 | TPL_CODE | | Configuration Entry tuple code (CISTPL_CFTABLE_ENTRY, 1BH) | | | | | |
| 1 | TPL_LINK | | Link to next tuple (n-1, [2 minimum]) | | | | | |
| 2 | TPCE_INDX | | Configuration Table Index Byte | | | | | |
| .. | TPCE_IF | | Interface-definition byte.<br>This field is present only when the interface bit of the Configuration-Table Index Byte is set. | | | | | |
| .. | TPCE_FS | | Feature-selection field indicates which optional fields are present. | | | | | |
| .. | TPCE_PD | | Power-description structure | | | | | |
| .. | TPCE_TD | | Timing-description structure | | | | | |
| .. | TPCE_IO | | I/O-description structure | | | | | |
| .. | TPCE_IR | | Interrupt-request-description structure | | | | | |
| .. | TPCE_MS | | Memory-space- description structure | | | | | |
| .. | TPCE_MI | | Miscellaneous- information structure | | | | | |
| ..n | TPCE_ST | | Additional information about the configuration in subtuple format. | | | | | |

5.2.8.3.1 TPCE_INDX: The Configuration Table Index Byte

The Configuration-Table index byte contains the value to be written to the Card Configuration Register in order to enable the configuration described in the tuple. In addition, this byte contains a bit to indicate that the configuration defined in this tuple should be taken as the default conditions for Configuration Entry tuples that follow.

Table 5-27: Configuration Index Byte

| 7 | 6 | 5 | 4 | 3 | 2 | 1 | 0 |
|---|---|---|---|---|---|---|---|
| Intface | Default | Configuration Entry Number | | | | | |

| | | |
|---|---|---|
| Configuration Entry Number | | Contains the value to be written to the Card Configuration Register to enable the configuration described in the tuple |
| Default | | This bit indicates that this entry provides default values for succeeding entries until another entry is encountered with its Default bit set.<br>When the default bit of the entry is set, the default conditions for following table entries are exactly those conditions specified in this entry.<br>When the default bit of the entry is not set, the default conditions are the conditions specified by the last entry encountered with its default bit set. |
| Intface<br>See 5.2.8.3.2 | 0 | No interface-configuration byte is present following this byte.<br>When the default bit is set in this byte or no Configuration Entry tuple has been scanned with its default bit set then the standard, Memory- Only Interface with RDY/BSY, Write Protect and Battery Voltage Detects are present at pins but not necessarily in a Pin Replacement Register. WAIT is not generated for memory cycles. (TPCE_IF value of 70H)<br>Otherwise, the timing is specified by the most recently scanned Configuration-Entry tuple with its default bit set. |
| | 1 | An interface configuration byte follows this byte. |

5.2.8.3.2 TPCE_IF: Table Entry Interface Description Field

The Table Entry interface-description field indicates the particular card interface which the configuration uses. The interface type (Memory-Only or Memory-I/O) is specified. In addition, the card's requirements for system support of the Battery Voltage Detect, Write Protect, Ready/Busy and Wait functions may be indicated.

Table 5-28: Entry Interface Description Field

| 7 | 6 | 5 | 4 | 3 | 2 | 1 | 0 |
|---|---|---|---|---|---|---|---|
| M Wait Req'd | RdyBsy Active | WP Active | BVDs Active | Interface Type | | | |

| | |
|---|---|
| Interface Type | 0 Memory<br>1 I/O<br>2 Reserved for future standardization<br>3 Reserved for future standardization<br>4 Custom Interface 0<br>5 Custom Interface 1<br>6 Custom Interface 2<br>7 Custom Interface 3<br>8-15 Reserved for future standardization.<br>Interfaces 4 through 7 correspond to interfaces which are defined in CCSTPL_CIF subtuples in the Configuration Tuple.The custom interface number is the relative position of the CCSTPL_CIF subtuple used by this configuration in the set of CCSTPL_CIF subtuples within the Configuration Tuple for this card. |
| BVDs Active | BVD1 and BVD2 Statuses are active and should be recovered from the Pin Replacement Register if not available on Pins 62 and 63. |
| WP Active | Write Protect Status is active and should be recovered from the Pin Replacement Register if not available on Pin 33. |
| RdyBsy Active | Ready/Busy Status Active and should be recovered from the Pin Replacement Register if not available on Pin 16. |
| M Wait Req'd | Wait Signal support required for Memory Cycles |

Note: The status bits BVDs Active, WP Active, RdyBsy Active, and MWait Req'd are TRUE when set to the "1" state.

5.2.8.3.3 TPCE_INFO: Configuration Table Entry Information

This group of fields contains information which applies to this configuration. This information is in addition to, or in contrast with, the information given in the default conditions at the time the field is read.

5.2.8.3.4 TPCE_FS: Feature Selection Byte

The feature-selector byte indicates which compact descriptive fields are present within the table entry. Those fields which are present are indicated by a 1 in the corresponding bit of the selector byte. Within the entry, the fields are ordered in the order of the selector bits starting from bit 0 (LSB) to bit 7 (MSB).

Table 5-29: Feature Selection Byte

| 7 | 6 | 5 | 4 | 3 | 2 | 1 | 0 |
|---|---|---|---|---|---|---|---|
| Misc | Mem Space | | IRQ | IO Space | Timing | Power | |

| | | |
|---|---|---|
| Power<br>See 5.2.8.3.5 | The power supply requirements and load characteristics for this configuration are indicated. There may be 0, 1, 2 or 3 fields following representing Vcc, Vpp, or both Vpp1 and Vpp2 in that order. The coding is as follows: | |
| | **Code** | **Description** |
| | 0 | No power-description structures<br>Use the default |
| | 1 | Vcc power-description-structure Only |
| | 2 | Vcc and Vpp (Vpp1 = Vpp2) power-description-structures |
| | 3 | Vcc, Vpp1 and Vpp2 power-description-structures |
| Timing<br>See 5.2.8.3.6 | 0 | When the default bit is set in this tuple, or no Configuration-Entry tuple has been scanned with its default bit set, then no timing is specified. RDY/BSY may indicate busy indefinitely. WAIT will be active from 0 to 12 microseconds.<br>Otherwise, the timing is specified by the most recently scanned Configuration-Entry tuple with its default bit set. |
| | 1 | A timing-description structure is present following the power-description structure. |
| IO Space<br>See 5.2.8.3.7 | 0 | When the default bit is set in this tuple, or no Configuration-Entry tuple has been scanned with its default bit set, then no I/O space is used.<br>Otherwise, the I/O-space requirement is specified by the most recently scanned Configuration-Entry tuple with its default bit set. |
| | 1 | An I/O-space-description structure is present following the timing-description structure. |
| IRQ<br>See 5.2.8.3.8 | 0 | When the default bit is set in this tuple, or no Configuration-Entry tuple has been scanned with its default bit set, then no interrupt is used.<br>Otherwise, the Interrupt-request requirement is specified by the most recently scanned Configuration- Entry tuple with its default bit set. |
| | 1 | An Interrupt-request-description structure is present following the I/O- space-description structure. |
| MemSpace<br>See 5.2.8.3.9 | Memory address space mapping requirements for this configuration. There may be 0, 2, 4 or N bytes of information following the Interrupt Request Structure. The coding is as follows: | |
| | **Code** | **Description** |
| | 0 | When the default bit is set in this tuple, or no Configuration-Entry tuple has been scanned with its default bit set, then no configuration-dependent, memory-address space is used.<br>Otherwise, the memory-address-space requirement is specified by the most recently scanned Configuration-Entry tuple with its default bit set. |
| | 1 | Single 2-byte length specified. |
| | 2 | Length (2 bytes) and Card Address (2 bytes) specified. |
| | 3 | A memory- space-selection byte followed by table-memory-space descriptors (length determined by selection byte) |
| Misc<br>See 5.2.8.3.10 | 0 | When the default bit is set in this tuple, or no Configuration-Entry tuple has been scanned with its default bit set, then the miscellaneous fields are interpreted to be all zero.<br>Otherwise, the miscellaneous fields are specified by the most recently scanned Configuration-Entry tuple with its default bit set. |
| | 1 | A miscellaneous-fields structure is present following the memory-space-description structure. |

PCMCIA © 1992

5.2.8.3.5 TPCE_PD: Power Description Structure

Each power-description structure has the following format:

Table 5-30: Power Description Structure

| |
|---|
| Parameter Selection Byte |
| First Parameter Definition |
| ... |
| Last Parameter Definition |

Each bit in the parameter-selection byte indicates whether or not the corresponding parameter is described by parameter definitions which follow that byte. The parameter definitions are present for each logic-1 bit in the parameter-selection byte. Each byte in a parameter definition, except the last byte, has a logic-1 in bit 7 of the byte. The parameter definitions are ordered corresponding to bits 0 through 7 of the parameter-selection byte.

1) Parameter Selection Byte

Table 5-31: Power Description Structure Parameter Selection Byte

| Byte | 7 | 6 | 5 | 4 | 3 | 2 | 1 | 0 |
|---|---|---|---|---|---|---|---|---|
| 0 | RFU (0) | PDwn I | Peak I | Avg I | Static I | Max V | Min V | Nom V |

| | |
|---|---|
| Nom V | Nominal operating supply voltage. In the absence of other information the nominal operating voltage has a tolerance of ±5%. |
| Min V | Minimum operating supply voltage. |
| Max V | Maximum operating supply voltage. |
| Static I | Continuous supply current required. |
| Avg I | Maximum current required averaged over 1 second. |
| Peak I | Maximum current required averaged over 10 milliseconds. |
| PDwn I | Power-down supply current required. |
| RFU | Reserved for future standardization. |

2) Parameter Definitions

Parameter definitions consist of a first byte containing a mantissa and exponent as described below. Additional bytes appearing after the first byte serve to modify the initial value as described below. An arbitrary number of additional bytes may be defined with the last byte in the list having a 0 in bit 7. The next parameter definition, or the next field of the I/O tuple, is in the byte immediately following the last byte of the parameter definition.

Table 5-32: Power Description Structure Parameter Definitions

| Byte | 7 | 6 | 5 | 4 | 3 | 2 | 1 | 0 |
|---|---|---|---|---|---|---|---|---|
| 0 | EXT | Mantissa | | | | Exponent | | |
| 1[1] | EXT | Extension | | | | | | |

1. The extension bytes may be continued indefinitely until the first byte which contains a 0 in bit 7, which is the final byte of the extension

| Exponent | The Exponent of the Current and Voltage Values are given below: | | |
|---|---|---|---|
| | Exponent | Current Scale | Voltage Scale |
| | 0 | 100 nA | 10 μV |
| | 1 | 1 μA | 100 μV |
| | 2 | 10 μA | 1 mV |
| | 3 | 100 μA | 10 mV |
| | 4 | 1 mA | 100 mV |
| | 5 | 10 mA | 1 V |
| | 6 | 100 mA | 10 V |
| | 7 | 1 A | 100 V |

| Mantissa | The mantissa of the value is given by the following table: | |
|---|---|---|
| | 0 | 1 |
| | 1* | 1.2 |
| | 2* | 1.3 |
| | 3* | 1.5 |
| | 4 | 2 |
| | 5* | 2.5 |
| | 6 | 3 |
| | 7* | 3.5 |
| | 8 | 4 |
| | 9* | 4.5 |
| | AH | 5 |
| | BH* | 5.5 |
| | CH | 6 |
| | DH | 7 |
| | EH | 8 |
| | FH | 9 |

* - These values are not permitted when the EXT bit is set.

| EXT | An extension byte follows this byte. | |
|---|---|---|
| Extension | The extension field is defined as follows: | |
| | 0..63H | Binary value for next two decimal digits to the right of the current value. |
| | 64..7CH | Reserved. |
| | 7DH | No connection (i.e. high impedance) permitted during sleep or power-down only. (Must be last extension byte). |
| | 7EH | Zero value required (Must be only extension byte). |
| | 7FH | No connection (i.e. high impedance) is required (Must be only extension byte) |
| | Extension bytes may be concatenated indefinitely. The final extension byte contains a 0 in bit 7. | |

PCMCIA © 1992

Here is an example power descriptor of a card with the following characteristics:

Operates over a Vcc range of 2.5 to 7 volts. Operating current is 1 mA standby (static), 30 mA average operating current. When in power down mode, the card requires only 75 microamps. It uses a Vpp of 12 volts ±5% at 50mA peak which need not be connected during sleep or power down.

Table 5-33: Power Description Example

| Byte | Value | D7 | D6 | D5 | D4 | D3 | D2 | D1 | D0 | notes |
|---|---|---|---|---|---|---|---|---|---|---|
| xxx+0 | $02_H$ | 0 | 0 | 0 | 0 | 0 | 0 | 2 Vcc & Vpp | | Feature Byte |
| +1 | $5E_H$ | 0 RFU | 1 Power Down | 0 No Peak I | 1 Avg I | 1 Static I | 1 Max V | 1 Min V | 0 No Nominal V | Parameter Selection Byte for Vcc |
| +2 | $2D_H$ | 0 No Ext | 5 2.5 X | | | | 5 1 Volt | | | Vcc Minimum Voltage |
| +3 | $6D_H$ | 0 No Ext | Dh 7 X | | | | 5 1 Volt | | | Vcc Maximum Voltage |
| +4 | $04_H$ | 0 No Ext | 0 1...0 | | | | 4 1 mA | | | Vcc Static Current |
| +5 | $35_H$ | 0 No Ext | 6 3.0 X | | | | 5 10 mA | | | Vcc Average Current |
| +6 | $EA_H$ | 1 Ext Next | Dh 7.0 X | | | | 2 10 μA | | | Vcc Power Down Current |
| +7 | $32_H$ | 0 No Ext | $32_H$ +.50 (gives 7.50 x 10 μA) | | | | | | | Vcc Power Down Current Extension Byte |
| +8 | $21_H$ | 0 RFU | 0 No Pwr Down I | 1 Peak I Specified | 0 No Avg I | 0 No Static I | 0 No Max V | 0 No Min V | 1 Nominal V | Vpp Parameter Selection Byte, Nominal V and Peak I given |
| +9 | $8E_H$ | 1 Ext Next | 1 1.2 X | | | | 6 10 Volts | | | Nominal Vpp is 12.0 Volts ±5% |
| +Ah | $7D_H$ | 0 No Ext | $7D_H$ Vpp may be made no connect during power down and sleep modes | | | | | | | Extension byte indicates that No Connect is permitted on Vpp during Sleep and power Down |
| $+B_H$ | $55_H$ | 0 No Ext | $A_H$ 5.0 X | | | | 5 10 mA | | | Peak Vpp current is 50 mA. |

5.2.8.3.6 TPCE_TD: Configuration Timing Information

Timing information for Wait, Ready/Busy and Initialization Delay are given in scaled, extended-device-speed-code format. The first byte contains the scale factors and the other bytes contain the unscaled factors in the extended-device-speed-code format.

See Section 5.2.7.1.4 Device ID Speed Field for encoding of extended-device-speed code.

Table 5-34: Configuration Timing Information

| Byte | 7 | 6 | 5 | 4 | 3 | 2 | 1 | 0 |
|---|---|---|---|---|---|---|---|---|
| 0 | Reserved Scale 7 | | | Ready/Busy Scale | | | Wait Scale | |

The timing descriptions, when present, occur in the same order as the fields are listed below.

| | |
|---|---|
| WAIT Scale | This field is the power of 10 scale factor to be applied to the MAX WAIT time in extended-device-speed format which follows. The value 3 indicates that the WAIT signal is not used and the MAX WAIT Speed is not present following the timing byte. |
| RDY/BSY Scale | This field is the power of 10 scale factor to be applied to the MAX time in the Busy State for the Ready/Busy signal. A value of 7 indicates that Ready/Busy is not used and no maximum time is present following the timing-scale-factor byte. |
| Reserved Scale 7 | This field is the power of 10 scale factor which is to be applied to a reserved- time definition. A value of 7 indicates that no initial or extended reserved-speed bytes follow the Ready/Busy extended-speed bytes. |

5.2.8.3.7 TPCE_IO: I/O Space Addresses Required For This Configuration

The I/O-space entry consists of a set of 3- byte fields, each of which represents a range of I/O addresses occupied by the card in this mode. If more than one contiguous group of I/O addresses is present on the card, then the EXT bit is set on each group but the last.

Table 5-35: I/O Space Addresses Required For Configuration

| Byte | 7 | 6 | 5 | 4 | 3 | 2 | 1 | 0 |
|---|---|---|---|---|---|---|---|---|
| 0 | Range | Bus16 | Bus8 | IOAddrLines | | | | |

| | | |
|---|---|---|
| IOAddrLines | Total number of address lines which are used by the card to determine when the card is selected. | |
| | 0 | When IOAddr Lines is zero, the card will respond to all addresses presented to the card. The system is entirely responsible for when the card is selected, and at what addresses the card is selected. The system must assign to the card a portion of the address space which is at least as large as the number of bytes indicated in the length field of the following range entry. The Base Address for the I/O space (assigned to the card by the system) must begin on a 2^N address boundary such that 2^N is greater than the number of bytes indicated in the length field. |
| | 1-26 | When I OAddrLines is non-zero, the card performs address decoding to determine when it is selected. In this case, the card and the system share the determination of when a card is actually selected. The card must indicate in IOAddrLines the highest address line (plus 1) which it decodes to determine when it has been selected. The card provides a list of ranges of addresses for which it is selected within the I/O space that it decodes.<br>The system and the card then share the task of determining when the card is selected. The system controls when the Card Enables are activated during I/O cycles, and the card determines to which addresses it will respond when it is enabled by those Card Enables. The card returns the Input-Acknowledge signal to the system whenever the card can actually respond to an input at the I/O address on the bus. |
| | 27-31 | Reserved. |

INTERFACE STANDARD FOR LOW VOLTAGE TTL-COMPATIBLE (LVTTL) VLSI DIGITAL CIRCUITS (From JEDEC Council Ballot JCB-84-20, formulated under the cognizance of JEDEC Committees JC-40.2, JC-42.1, JC-42.3 and JC-44.)

1.0 SCOPE

This Addendum No. 1 to JEDEC Standard No. 8 defines dc interface parameters for a logic family operating from a power supply of 3.3 ± 0.3 V and driving/driven by either parts of the same family or standard 5 V TTL parts. With proper attention to the specifications in this Standard and comments in the Supporting Material, LVTTL and TTL parts, powered by their respective 3.3 V and 5.0 V supplies, can be interconnected in a system.

2.0 ABSOLUTE MAXIMUM RATINGS*

| | |
|---|---|
| DC voltage on any pin (referenced to ground) | -0.5 to +5.5 V |
| DC input current (any one input or output pin) | -30 mA to +5 mA |

3.0 OPERATING CONDITIONS

DC Supply Voltage $V_{CC}$ = 3.3 ± 0.3 V

3.1 Operating Temperature Range $T_A$

As specified by manufacturer to be commercial, industrial and/or military grade.

*NOTE: Stresses above those listed under "Absolute Maximum Ratings" may cause permanent damage to the device. This is a stress rating only and functional operation of the device at these or at any other condition above those indicated in the operational sections of this Standard is not implied. Exposure to absolute maximum rating conditions for extended periods may affect device reliability.

TABLE 1

3.0 STATIC CHARACTERISTICS ($V_{CC}$ = 3.3 ± 0.3 V, across operating temperature range)

| Parameter | Limits Min | Max | Conditions |
|---|---|---|---|
| $V_{OL}$ | | 0.4 V | $I_{OL}$ = 4.0 mA |
| $V_{OH}$ | 2.15 V (a) | | $I_{OH}$ = -200 μA |
| $V_{IL}$ | -1.2 V (b) | 0.8 V | $V_{OUT} \geq V_{OH(min)}$ or |
| $V_{IH}$ | 2.0 V | 4.8 V (c) | $V_{OUT} \leq V_{OL(max)}$ |
| $I_{IL}$ | -400 uA ≤ $I_{IL}$ ≤ 1 μA | | $V_{IN}$ = 0.4 V |
| $I_{IH}$ | -1 uA ≤ $I_{IH}$ ≤ 20 uA | | $V_{IN}$ = 2.7 V |
| $I_{IK}$ Input Clamp Current | | -18 mA | $V_{IN}$ = -1.2 V |
| $I_I$ Input Current at $V_{IH(max)}$ | | 100 μA | $V_{IN}$ = 4.8 V |

NOTES: FOR IMPROVED NOISE MARGIN in high noise environment a pullup resistor to (a) ~~[illegible] noise margin in high noise [illegible]~~
the 3.3 V supply is recommended.

(b) A value of up to -1.2 V is permitted only as a transient while clamping quality is being measured by forcing a worst-case current equivalent to -18 mA. The continuous dc voltage is limited to -0.5 V by absolute maximum

4.0 SUPPORTING MATERIAL

4.1 Requirements of Scaling

To obtain better performance and higher density, semiconductor technologists are reducing the vertical and horizontal dimensions of integrated device structures. If constant supply voltages and interface levels are maintained, on-chip electric fields will increase and higher system level slew rates will lead to increased electromagnetic interference. Additionally, with increasing numbers of on-chip functions, chip power dissipation may increase. All of these factors -- increased electric fields, electromagnetic interference and power dissipation -- lead to reduced reliability at the chip and system level. Thus, to continue the semiconductor scaling trend, a voltage reduction for chip power supply will be required. This JEDEC Standard will smooth the transition from the existing 5 V ± 10% TTL standard by achieving advance agreement among the manufacturers and users.

4.2 TTL Compatibility

A survey conducted by the JEDEC TG-16 Task Group of the JC-42.3 Committee concluded that there is an overwhelming demand for continued compatibility with existing TTL components. The installed user base and design investment in TTL-compatible components are too huge to be discarded if not absolutely necessary. Thus, the overriding goal of this Standard is to specify an interface which allows new generations of low-voltage IC's to function in the same system with existing TTL-compatible components.

The term "TTL-compatible" is somewhat ambiguous since TTL has evolved from its early beginnings. In particular the logic input current ($I_{IH}$, $I_{IL}$) have dropped significantly with time.

Because this Standard looks to the future, "TTL-compatibility" is taken to mean compatibility with the most modern implementations of TTL, in particular all forms of advanced Schottky logic (see Table II).

As LVTTL components are introduced, they will be utilized in systems having two power supply voltages, one at 5 V and the other at 3.3 V. Eventually, a comprehensive family of LVTTL components may exist, allowing entire digital systems to operate from a single 3.3 V supply.

4.3 Circuit Implementation

Power supply voltage and tolerance, as well as limits on $V_{OH}(min)$ and $V_{IH}$ (max), have been chosen to permit circuit implementation with all - NPN bipolar, complementary bipolar, NMOS, PMOS and CMOS technologies. With some circuits and/or technologies, in driving a bus which is also driven by 5 V TTL parts, care must be taken to limit the maximum bus voltage to 3.3 V. If this is not done, junction(s) at the output of the 3.3 V devices can become forward biased and cause undesired current flow.

TABLE II

COMPARISON OF VARIOUS TTL LOGIC FAMILIES

| Parameter | LVTTL | ALS | LS | AS & F | S |
|---|---|---|---|---|---|
| $V_{OH}(min)$ @ $I_{OH}$ | 2.15 V @ -.2 mA | 2.5 @ -.4 | 2.7 @ -.4 | 2.7 @ -1.0 | 2.7 @ -1.0 |
| $V_{OL}(max)$ @ $I_{OL}$ | 0.4 V @ 4 mA | 0.4 @ 4 | 0.4 @ 4 | 0.5 @ 20 | 0.5 @ 20 |
| $V_{IH}(min)$ | 2.0 V | 2.0 | 2.0 | 2.0 | 2.0 |
| $V_{IL}(max)$ | 0.8 V | 0.8 | 0.8 | 0.8 | 0.8 |
| $I_{IH}(max)$ @ $V_{IH}$ | 20 μA @ 2.7 V | 20 @ 2.7 | 20 @ 2.7 | 20 @ 2.7 | 50 @ 2.7 |
| $I_{IL}(max)$ @ $V_{IL}$ | -400 μA @ 0.4 V | -400 @ 0.4 | -400 @ 0.4 | -600 @ 0.5 | -2000 @ 0.5 |
| $I_{IK}$ @ $V_{IL}(min)$ | -18 mA @ -1.2 V | -18 @ -1.5 | -18 @ -1.5 | -18 @ -1.2 | -18 @ -1.2 |
| $I_I$ @ $V_{IH}(max)$ | 100 μA @ 4.8V | 100 @ 7.0V | 100 @ 7.0V | 100 @ 7.0V | 100 @ 5.5V |
| $V_{CC}$ Range | 3.0 - 3.6 V | 4.5 - 5.5 | 4.5-5.5 | 4.5 - 5.5 | 4.5 - 5.5 |
| Temperature | Not Specified | -55 to +125°C | -55 to +125 | -55 to +125 | -55 to +125 |

JEDEC STANDARD No. 8

STAN[illegible] [illegible]

OPERATIN[illegible] [illegible]

FOR [illegible] CIRCU[illegible]

4.6 Clarification of the LVTTL Specifications

The specifications represent a minimum set. Components whose tolerances meet and functionally exceed the standard will be said to "meet or exceed the JEDEC Standard for LVTTL VLSI digital circuits".

This Standard is intended for components at the VLSI level of integration. This will include memories, microprocessors/peripherals and gate arrays.

Conversion to the Standard will not occur at any specific time. Instead, manufacturers forced to reduce operating voltages for any of the reasons summarized previously should convert to the Standard rather than to some other set of specifications.

The absolute maximum ratings are specified with values which allow LVTTL components to be accidentally socketed in a 5 V ± 10% system without incurring permanent damage.

$I_{OH}$, $I_{OL}$, $I_{IH}$, $I_{IL}$ are chosen to be compatible with ALS and AS & F families.

$V_{IL(min)}$ of -1.2 V is chosen to guarantee tolerance to negative overshoot caused by ringing. $V_{IH(max)}$ of 4.8 V is chosen to two reasons:

- To guarantee tolerance to positive overshoot caused by ringing.
- To guarantee that standard 5 V TTL component output drivers (which may pull up to ~4.8 V max) can function as inputs to LVTTL.

Note that open-collector TTL can function with LVTTL by tying its external pullup resistor to the 3.3 V power supply.

A number of required data data sheet specifications are not included in the Standard. Parameters such as $C_{IN}$, $C_{OUT}$, $C_{LOAD}$, $I_{CC}$ and timings are excluded. These values are application-dependent and do not fundamentally affect the ability of LVTTL to interface to TTL or to itself.

STANDARD
FOR
REDUCED OPERATING VOLTAGES AND INTERFACE LEVELS
FOR
INTEGRATED CIRCUITS

TABLE OF CONTENTS

| Paragraph | Page |
|---|---|
| SECTION 1<br>STANDARD OPERATING VOLTAGES FOR FUTURE INTEGRATED CIRCUITS | 1 |
| SECTION 2<br>INTERFACE STANDARD FOR LOW VOLTAGE CMOS (LVCMOS) | 1 - 2 |
| SECTION 3<br>INTERFACE STANDARD FOR LOW-VOLTAGE BATTERY OPERATED VLSI DIGITAL CIRCUITS (LVBO) | 3 - 4 |
| APPENDIX A<br>APPLICATION GUIDELINES | 5 |
| 1.0 REQUIREMENTS OF SCALING | 5 |
| 2.0 LVCMOS COMPATABILITY WITH MODERN LOGIC FAMILIES | 5 - 7 |
| 2.1 COMMENTS ON THE LVCMOS SPECIFICATIONS | 7 - 8 |
| 3.0 BATTERY-OPERATED SYSTEMS | 8 - 9 |
| 3.1 COMMENTS ON THE LVBO SPECIFICATIONS | 9 - 10 |

**STANDARD
FOR
REDUCED OPERATING VOLTAGES AND INTERFACE LEVELS
FOR
INTEGRATED CIRCUITS**

(From JEDEC Council Ballot JCB-84-1, formulated under the cognizance of JEDEC JC-40, JC-42 and JC-44 Committees.)

SECTION 1 - STANDARD OPERATING VOLTAGES FOR FUTURE INTEGRATED CIRCUITS

SCOPE:

The intent of this Standard is to guide any future designs intended for low voltage applications and to provide for a realistic transition from SSI/MSI/LSI technologies to VLSI. The objective is to provide standard operating voltage levels that can be used by designers and application engineers as they develop and introduce new products. Therefore, implementation of the change in operating voltage levels will take place over a transition period of a few years or more as VLSI technology is adopted.

A. FOR DEVICES INTENDED FOR OPERATION FROM A REGULATED POWER SUPPLY THE OPERATING VOLTAGE IS:

3.3 volts ± 0.3 volt

B. FOR DEVICES INTENDED FOR OPERATION FROM BATTERIES THE OPERATING VOLTAGE IS 2.8 volts ± 0.8 volt This is interesting

SECTION 2 - INTERFACE STANDARD FOR LOW VOLTAGE CMOS (LVCMOS)

VLSI DIGITAL CIRCUITS

SCOPE

This Standard defines dc interface parameters for a logic family operating from a power supply of 3.3 ± 0.3 V and driving/driven by parts of the same family. Devices in the LVCMOS are not intended to be intermixed with devices operating from a 5.0 ± 0.5 V power supply. The LVTTL family, defined in a separate Standard, is intended for such intermixing.

SECTION 2 (Cont.)

A. ABSOLUTE MAXIMUM RATINGS*

DC voltage on any pin (with respect to $V_{SS}$) — -0.5 to 4.6V

DC input current (any one input or output pin) — ±20mA When $V_{IN} \leq 0V$ or $V_{IN} \geq V_{DD}$

*Comment: Stresses above those listed under "Absolute Maximum Ratings" may cause permanent damage to the device. This is a stress rating only, and functional operation of the device at these or any other conditions above those indicated in the operation sections of this specification is not implied. Exposure to absolute maximum rating conditions for extended periods may affect device reliability.

B. OPERATING CONDITIONS

DC supply voltage — $V_{DD} = 3.3 \pm 0.3V$

Operating temperature range $T_A$
(As specified by manufacturer. Expected to be commercial, industrial, and/or military grade.)

C. STATIC CHARACTERISTICS ($V_{DD} = 3.3 \pm 0.3V$, across operating temp. range)

| PARAMETER | LIMITS MINIMUM | LIMITS MAXIMUM | CONDITIONS |
|---|---|---|---|
| VOL | | 0.1V | $V_{IN} \geq$ VIHMIN or $V_{IN} \leq$ VILMAX and $\lvert I_{OUT} \rvert$ = 20uA |
| VOH | $V_{DD}$ -0.1V | | |
| VIL | -0.5V | $0.2V_{DD}$ | $V_{OUT} \geq$ VOHMIN or $V_{OUT} \leq$ VOLMAX |
| VIH | $0.7V_{DD}$ | $V_{DD}$ +0.5V | |
| $I_{IN}$ | | ± 1uA | $0 \leq V_{IN} \leq V_{DD}$ |

SECTION 3 - INTERFACE STANDARD FOR LOW-VOLTAGE BATTERY OPERATED VLSI DIGITAL CIRCUITS (LVBO)

SCOPE:

This standard defines DC interface parameters for a logic family operating from an unregulated battery supply with voltage between 2.0V and 3.6V. Parts in this family are intended to drive and be driven by parts from the same family operating from the same battery voltage. They are not intended to be intermixed with parts from other logic families unless care is taken to insure that all interface specifications of both families are satisfied.

A. Absolute Maximum Ratings*

| | |
|---|---|
| DC voltage on any pin (with respect to $V_{SS}$) | -0.5 to 5.5V |
| DC input current (any one input or output pin) | ± 20mA When $V_{IN} \leq 0V$ or $V_{IN} \geq V_{DD}$ |

*Comment: Stresses above those listed under "Absolute Maximum Ratings" may cause permanent damage to the device. This is a stress rating only and functional operation of the device at these or any other conditions above those indicated in the operational sections of this specification is not implied. Exposure to absolute maximum rating conditions for extended periods may affect device reliability.

B. Operating Conditions

DC supply voltage $V_{DD}$ = 2.0 to 3.6V

Operating temperature range $T_A$
(As specified by manufacturer. Expected to be commercial, industrial, and/or military grade)

C. Static Characteristics ($V_{DD}$ = 2.0 to 3.6V, across operating temperature range)

| PARAMETER | LIMITS MINIMUM | LIMITS MAXIMUM | CONDITIONS |
|---|---|---|---|
| VOL | | 0.1V | $V_{IN} \geq$ VIHMIN or $V_{IN} \leq$ VILMAX and $\lvert I_{OUT} \rvert$ = 20uA |
| VOH | $V_{DD}$ -0.1V | | |
| VIL | -0.5V | $0.2V_{DD}$ | $V_{OUT} \geq$ VOHMIN or $V_{OUT} \leq$ VOLMAX |
| VIH | $0.7V_{DD}$ | $V_{DD}$ +0.5V | |
| $I_{IN}$ | | ± 1uA | $0 \leq V_{IN} \leq V_{DD}$ |

APPENDIX A

APPLICATION GUIDELINES

1.0 REQUIREMENTS OF SCALING

To obtain better performance and higher density, semiconductor technologists are reducing the vertical and horizontal dimensions of integrated device structures. If constant supply voltages and interface levels are maintained, on-chip electric fields, system-level slew rates and electromagnetic interference will increase. In addition, with increasing numbers of on-chip functions, chip power dissipation may increase. All of these factors – increased electric fields, electromagnetic interference, and power dissipation – lead to reduced chip and system level reliability, and in some cases make continued functionality impossible. Thus, to continue the semiconductor scaling trend, a reduction in voltage for chip power supply and interface levels will be required. This JEDEC standard will smooth the transition from existing voltage levels by achieving advance agreement among the manufacturers and users.

2.0 LVCMOS COMPATIBILITY WITH MODERN LOGIC FAMILIES

A new generation of SSI and MSI CMOS logic is already emerging with a voltage range of about 2-6V. The JEDEC committee for CMOS logic has developed a standard for this "74HC" family of logic. It is the intent of the low-voltage CMOS-compatible VLSI standard to be as compatible as possible with 74HC logic. When used with LVCMOS parts, it is intended that 74HC parts be powered from the same power supply (3.3 ± 0.3V) as the LVCMOS parts. The following table summarizes the relevant information from the 74HC standard.

INTERFACE STANDARD FOR
74HC HIGH SPEED CMOS LOGIC (JC40.2)

- ABSOLUTE MAXIMUM RATINGS

DC voltage on any pin (with respect to $V_{SS}$) — -0.5 to 7.0V

DC input current (any one input or output pin) — ± 20mA When $V_{IN} \leq 0V$ or $V_{IN} \geq V_{DD}$

- OPERATING CONDITIONS

DC supply voltage — 2.0 to 6.0V

- STATIC CHARACTERISTICS

| PARAMETER | $V_{DD}$ RANGE | LIMITS MINIMUM | LIMITS MAXIMUM | CONDITIONS |
|---|---|---|---|---|
| VOL | 2.0-6.0V | | 0.1V | $V_{IN} \geq$ VIHMIN or $V_{IN} \leq$ VILMAX and $\lvert I_{OUT} \rvert$ = 20uA |
| VOH | 2.0-6.0V | $V_{DD}$ -0.1V | | |
| VIL | 2.0V | | $0.15V_{DD}$ | $V_{OUT} \geq$ VOHMIN or $V_{OUT} \leq$ VOLMAX |
| | 4.5-6.0V | | $0.2V_{DD}$ | |
| VIH | 2.0V | $0.75V_{DD}$ | | |
| | 4.5-6.0V | $0.7V_{DD}$ | | |
| $I_{IN}$ | 6.0V | | ±1uA | $0 \leq V_{IN} \leq V_{DD}$ |

The differences between the LVCMOS and the 74HC standards are limited to two areas:

- Absolute maximum voltage: the 7.0V limit for 74HC is likely to be unreliable with the incrementally scaled technologies for which the LVCMOS standard is intended. When used as intended, the maximum power supply voltage will be 3.6V. The proposed LVCMOS absolute maximum voltage of 4.6V provides for overshoot of 1.0V.

- VIL and VIH at $V_{DD}$ = 2.0V: the 74HC specs degrade system noise margins at $V_{DD}$ = 2.0V compared to $V_{DD}$ = 5.0V. This was presumably necessary because of the wider $V_{DD}$ range of almost 3:1 which is supported. Calculations indicate that with proper threshold targets and manufacturing control, VIL and VIH can meet $0.2V_{DD}$ and $0.7V_{DD}$ for the more restricted LVCMOS range of 3.3 ± 0.3V.

2.1 COMMENTS ON THE LVCMOS SPECIFICATIONS

The specifications represent a minimum set. Components whose tolerances meet and functionally exceed the standard will be said to "meet and exceed the JEDEC standard for low-voltage CMOS-compatible VLSI digital circuits".

The standard is intended for components at the VLSI level of integration. This will include memories, microprocessors/peripherals, and gate arrays.

Conversion to the standard will not occur at any specific time. Instead, manufacturers forced to reduce operating voltages for any of the reasons summarized previously should convert to the standard rather than to some other set of specifications.

Most of the LVCMOS VLSI specifications have been modeled after existing CMOS families. In particular, the input trigger levels are specified as a constant fraction of $V_{DD}$. The characteristics of CMOS then guarantee a good manufacturing yield and good noise margins in spite of the wide range of $V_{DD}$.

A number of required data sheet specs are not included in the LVCMOS standard. These specs are not included for the following reasons:

- Operating temperature range, $T_A$: the industry has already reached defacto standards for commercial, industrial and military grade parts. $T_A$ does not directly impact the establishment of the low-voltage interface standard. Components meeting the new standard are expected to fall into one or more of the traditional temperature ranges depending on a manufacturer's market thrust and capabilities.

- Output drive current, IOH, IOL: the specified 20uA is intended to cover fanout leakages. Additional drive current is clearly necessary to drive output load capacitance at a given speed. However, the required current is application dependent (high speed versus low speed, $V_{DD}$ value chosen, load capacitance driven, etc.) and does not fundamentally affect the ability to interface LVCMOS components to one another.

- Power supply current, IDD: limitations on IDD are application and package technology dependent.

- Input, output, and load capacitances: the competitive trend will be to minimize input and output capacitances while maximizing allowed output load capacitance. Defacto standards (or ranges of acceptable values) can be expected to develop, but such parameters would add no substantive value to the proposed standard at this time.

- Timings: again, these are highly application dependent, and do not affect interface compatibility.

Other parameters not listed here or in the proposed standard can be ruled out for similar reasons.

3.0 BATTERY-OPERATED SYSTEMS

The LVBO standard applies to systems where the prime source of operating power is an unregulated battery. This leads to the need for a wide voltage operating range of the system components. The need arises for several reasons:

- A wide variety of battery technologies exist, including rechargeable NiCd batteries with nominal 1.25V potential and primary lithium batteries with nominal voltages up to about 3.5V.

- The manufacturable tolerance of nominal battery potential generally exceeds ± 10%.

- The battery potential changes significantly during its discharge cycle and with temperature and load.

The component operating range of 2.0 to 3.6V has been chosen to encompass two series-connected NiCd cells at capacity discharge on the low end, and all of the common fully-charged lithium cells on the high end. The 3.6V upper limit is also convenient in that it may allow a common technology to service both the low-voltage battery-operated standard and the low-voltage CMOS-compatible standard (3.3 ± 0.3V).

The wide voltage range also implies that the logic interface levels must be referenced to the battery potential, $V_{DD}$, rather than to a fixed voltage. This is discussed below.

Another tacit requirement of a battery-operated system is that the components have low power dissipation. This applies to both the logic interfacing circuitry (input/output buffering) and internal circuitry. The traditional solution has been to use a CMOS technology with interface voltage levels nominally swinging from $V_{SS}$ to $V_{DD}$. This proposed standard has been written with CMOS technology in mind. However, it does not rule out the application of other technologies with equivalent interface capabilities.

The differences between the LVBO and the 74HC standards are limited to two areas:

- Absolute maximum voltage: the 7.0V limit for 74HC is likely to be unreliable with the incrementally scaled technologies for which the LVBO (low-voltage battery-operated) standard is intended. 5.5V was chosen in case LVBO components are accidentally inserted in a 5V ± 10% system.

- VIL and VIH at $V_{DD}$ = 2.0V: The 74HC specs degrade system noise margins at $V_{DD}$ = 2.0V compared to $V_{DD}$ = 5.0V. This was presumable necessary because of the wider $V_{DD}$ range of almost 3:1 which is supported. Calculations indicate that with proper threshold targets and manufacturing control, VIL and VIH can met $.2V_{DD}$ and $.7V_{DD}$ for the more restricted LVBO range of 2.0 - 3.6V.

3.1 COMMENTS ON THE LVBO SPECIFICATIONS

The specifications represent a minimum set. Components whose tolerances meet and functionally exceed the standard will be said to "meet and exceed the JEDEC standard for low-voltage battery-operated VLSI digital circuits".

The standard is intended for components at the VLSI level of integration. This will include memories, microprocessors/peripherals and gate arrays.

Conversion to the standard will not occur at any specific time. Instead, manufacturers forced to reduce operating voltages for any of the reasons summarized previously should convert to the standard rather than to some other set of specifications.

Appendix D

Method and Apparatus for Controlling a Mixed Voltage Interface in a Multivoltage System Docket No.: 14295.P030X

HOST ADAPTER VHDL

Hierarchial Order:

1) slottop.vhd 2) slotpwr.vhd 3) slotctl.vhd 4) index_reg208dma.vhd

PREPARED BY:
BLAKELY, SOKOLOFF, TAYLOR & ZAFMAN
12400 Wilshire Boulevard, 7th Floor
Los Angeles, California 90025
(310) 207-3800

I hereby certify that this correspondence is being deposited with the United States Postal Service as Express Mail No. TB00637026US addressed to: Commissioner of Patents and Trademarks, Washington, DC 20231, on November 8, 1993

Margaret M. Hasson November 8, 1993
Date

```
-- $Header: /tmp_mnt/ph2/phiter2/sas/df/sim/RCS/slottop.vhd,v 3.5 1993/02/03 23:26:16 bezz
ant Exp $
library synopsys;
use synopsys.types.all;
use synopsys.arithmetic.all;
use work.slotpack.all;

entity slottop is
port (
-- General interface:
    signal int_out              :out    mvl7;
    signal clk                  :in     mvl7;
    signal reset                :in     mvl7;
    signal ata_mode              : in   mvl7;
    signal ata_read             :in     mvl7;
    signal card_oe_n            :in     mvl7;
    signal slot_sig_oe_n        :out    mvl7;
    signal card_ok              :buffer mvl7;

-- interface to FIFO
    signal f_w_bhe              :in     mvl7;
    signal f_w_reg              :in     mvl7;
    signal f_w_mem              :in     mvl7;
    signal f_w_timer            :in     mvl7;
    signal f_w_addr0            :in     mvl7;
    signal f_w_do_op            :in     mvl7;
    signal f_w_data_size_8       : in   mvl7;
    signal f_w_io_win_0  : in  mvl7;
    signal f_w_ignore_iois16    :in     mvl7;

    signal f_wp_bhe             :in     mvl7;
    signal f_wp_timer           :in     mvl7;
    signal f_wp_addr0           :in     mvl7;
    signal f_wp_do_op           :in     mvl7;
    signal f_wp_data_size_8      : in   mvl7;
    signal f_wp_io_win_0         : in   mvl7;
    signal f_wp_mem              : in   mvl7;
    signal f_wp_ignore_iois16   :in     mvl7;
    signal f_wp_reg             :in     mvl7;


    signal f_r_bhe              :in     mvl7;
    signal f_r_reg              :in     mvl7;
    signal f_r_mem              :in     mvl7;
    signal f_r_timer            :in     mvl7;
    signal f_r_addr0            :in     mvl7;
    signal f_r_do_op            :in     mvl7;
    signal f_r_data_size_8       : in   mvl7;
    signal f_r_io_win_0  : in  mvl7;
    signal f_r_ignore_iois16    :in     mvl7;

    signal active_will_end      :buffer mvl7;
    signal recover_will_end     :buffer mvl7;
    signal f_read_write_bar     :out    mvl7;
    -- this is a dir line for data and address

    signal first_of_two         :buffer mvl7;
```

```
    -- indicates first cycle of a word to byte conversion

-- interface to SOCKETs
    --
    signal card_rdy_bsy_dg      :in     mvl7;--  deglitched rdy/busy
    -- rdy/bsy is mux'd with int
    signal card_det_dg          :in     mvl7_vector(1 downto 0);
    -- deglitched card detects
    signal bvd_dg               :in     mvl7_vector(1 downto 0);
    -- deglitched bvd(0)=BVD1 and bvd(1) = BVD2 signals

    -- batt volt is mux'd with spkr and stschg
    signal card_en              :buffer mvl7_vector(1 downto 0);
    signal card_iord            :buffer mvl7;
    signal card_iowr            :out    mvl7;
    signal card_wait            :in     mvl7;
    signal card_inpack          :in     mvl7;
    signal card_reg             :out    mvl7;
    signal card_oe              :buffer mvl7;
    signal card_we              :out    mvl7;

    signal card_vpp1_lev        :out    mvl7_vector(1 downto 0);
    signal card_vpp2_lev        :out    mvl7_vector(1 downto 0);
    signal card_vcc             :buffer mvl7;
    signal card_reset            : out  mvl7;

-- signals to/from the registers

    --power and resetdrv control register
    signal vpp1_cntl_0          :in     mvl7;
    signal vpp1_cntl_1          :in     mvl7;
    signal vpp2_cntl_0          :in     mvl7;
    signal vpp2_cntl_1          :in     mvl7;
    signal vcc_enable           :in     mvl7;
    signal auto_pwr_enable      :in     mvl7;
    signal vcc_is_3v            :in     mvl7;
    signal vcc_3v_en            :out    mvl7;
    signal vcc_5v_en            :out    mvl7;

    --interrupt and general control register
    signal spkr_out_enable      :in     mvl7;--  Misc Ctrl Reg I bit 4
    signal spkr_inp_is_led      :in     mvl7;--  ATA Ctrl Reg Bit 1

    signal card_is_io           :in     mvl7;

    signal card_reset_ctl        : in   mvl7;

    --timer value
    signal timer_select         :buffer mvl7_vector(3*2-1 downto 0);
    signal timer_val            :in     mvl7_vector(7 downto 0);

    signal isa_ready_out        :out    mvl7;
    signal timer_lt_2           :buffer mvl7;
    signal second_of_two        :buffer mvl7;
    signal mem_w_prot            : in   mvl7;
    signal ok_to_pwr_off        :buffer mvl7;
```

```
    signal suspend              :in     mvl7;
    signal v5_core              :in     mvl7;
    signal data_pdat            :out    mvl7;
    signal data_pdac            :out    mvl7;
    signal cntrl_pdat           :out    mvl7;
    signal cntrl_pdac           :out    mvl7;
    signal irq_pdat             :out    mvl7;
    signal irq_pdac             :out    mvl7;
    signal spkr_pdat            :out    mvl7;
    signal spkr_pdac            :out    mvl7;
    signal ri_en                :in     mvl7;
    signal io_win_sel_i         :in     mvl7_vector(1 downto 0);
    test_active                 :in     mvl7;
    b_s_data_upper              :inout  mvl7_vector(3 downto 0);
    read_active                 :out    mvl7;
    write_active                :out    mvl7
);

end slottop;

--  ************************
--  * ARCHITECTURE SLOTTOP *
--  ************************
architecture slottop of slottop is
--  ***************************************************************
--  * COMPONENT DECLARATIONS FOR ARCHITECTURE SLOTTOP OF SLOTTOP *
--  ***************************************************************

--------------------------------------------------------------------------------
--  card_enf component -> creates card_en signals and first_of_two and
--  second_of_two
--------------------------------------------------------------------------------
component card_enf
  port (

-- FIFO interface:
    signal f_w_bhe              :in     mvl7;
    signal f_w_addr0            :in     mvl7;
    signal f_w_do_op            :in     mvl7;
    signal f_w_data_size_8       : in   mvl7;
    signal f_w_io_win_0  : in  mvl7;
    signal f_w_mem              :in     mvl7;
    signal f_w_ignore_iois16    :in     mvl7;

    signal f_wp_bhe             :in     mvl7;
    signal f_wp_addr0           :in     mvl7;
    signal f_wp_do_op           :in     mvl7;
    signal f_wp_data_size_8      : in   mvl7;
    signal f_wp_io_win_0         : in   mvl7;
    signal f_wp_mem              : in   mvl7;
    signal f_wp_ignore_iois16   :in     mvl7;

    signal f_r_bhe              :in     mvl7;
    signal f_r_addr0            :in     mvl7;
    signal f_r_do_op            :in     mvl7;
    signal f_r_data_size_8       : in   mvl7;
```

```
    signal f_r_io_win_0  : in   mvl7;
    signal f_r_mem             :in     mvl7;
    signal f_r_ignore_iois16   :in     mvl7;

    signal recover_will_end    :in     mvl7;
    signal first_of_two        :buffer mvl7;
    signal second_of_two       :buffer mvl7;

    -- indicates first cycle of a word to byte conversion

-- General interface:
    signal clk                 :in     mvl7;
    signal reset               :in     mvl7;

-- socket interface:
    signal card_en             :buffer mvl7_vector(1 downto 0);

    signal current_state       :in     mvl7_vector(state_bits-1 downto 0);
    signal next_state   :in    mvl7_vector(state_bits-1 downto 0);
    signal ata_mode             : in   mvl7;
    signal active_will_end      : in   mvl7;
    signal mem_w_prot           : in   mvl7;
    signal io_win_sel_i        :in     mvl7_vector(1 downto 0)
  );
end component;

------------------------------------------------------------------------------
--  misc_tim component -> creates isa_card_ready and active_will_end and
--  recover_will_end
------------------------------------------------------------------------------
component misc_tim
port (
    signal active_will_end     :buffer mvl7;
    signal recover_will_end    :buffer mvl7;
    signal isa_ready_out       :out    mvl7;


    signal timer_eq_0          :in     mvl7;
    signal timer_lt_2_unq      :in     mvl7;
    signal timer_lt_2          :buffer mvl7;
    signal current_state       :in     mvl7_vector(state_bits-1 downto 0);
    signal card_wait           :in     mvl7;

    signal clk                 :in     mvl7
);
end component;

----&&&&&&&&&&&&&&&&&&&&&&&&&&&&&&&&&&&&&&&&&&&&&&&&&&&&&&&&&&&&&&&&&&&&&&------
----&&&&&&&&&&&&&&&&&&&&&&&&&&&&&&&&&&&&&&&&&&&&&&&&&&&&&&&&&&&&&&&&&&&&&&------
component slotctl
port (

-- FIFO interface:
    signal f_w_reg             :in     mvl7;
    signal f_w_mem             :in     mvl7;
    signal f_w_timer           :in     mvl7;
```

```
    signal f_w_do_op            :in     mvl7;

    signal f_wp_timer           :in     mvl7;
    signal f_wp_do_op           :in     mvl7;
    signal f_wp_mem             :in     mvl7;
    signal f_wp_reg             :in     mvl7;

    signal f_r_reg              :in     mvl7;
    signal f_r_mem              :in     mvl7;
    signal f_r_timer            :in     mvl7;
    signal f_r_do_op            :in     mvl7;

    signal active_will_end      :in     mvl7;
    signal recover_will_end     :in     mvl7;
    signal f_read_write_bar     :out    mvl7;
    -- this is a dir line for data and address

    signal first_of_two         :in     mvl7;
    -- indicates first cycle of a word to byte conversion

-- Register bits:
    signal last_cyc_inpack      :out    mvl7;
    --   the bits of timer_select are defined as follows:
    --  0 timer set 0 setup time
    --  1 timer set 0 active time
    --  2 timer set 0 recovery time
    --  3 timer set 1 setup time
    --  4 timer set 1 active time
    --  5 timer set 1 recovery time
    --  6.. enable bits for other sockets

    signal timer_select         :buffer mvl7_vector(3*2-1 downto 0);

-- General interface:
    signal internal_clk         :in     mvl7;
    signal reset                :in     mvl7;

-- socket interface:
    signal card_iord            :buffer mvl7;
    signal card_iowr            :out    mvl7;
    signal card_inpack          :in     mvl7;
    signal card_reg             :out    mvl7;
    signal card_oe              :buffer mvl7;
    signal card_we              :out    mvl7;

    signal ok_to_pwr_off        :buffer mvl7;

-- timer interface:
    signal timer_eq_0           :in     mvl7;
    signal load_timer           :out    mvl7;
    signal current_state        :buffer mvl7_vector(state_bits-1 downto 0);
    signal next_state           :buffer mvl7_vector(state_bits-1 downto 0);
    signal ata_mode              : in   mvl7;
    signal ata_read             :in     mvl7;
    test_active                 :in     mvl7
);
```

```
end component;

----&&&&&&&&&&&&&&&&&&&&&&&&&&&&&&&&&&&&&&&&&&&&&&&&&&&&&&&&&&&&&&&&&&&&&&&&------
----&&&&&&&&&&&&&&&&&&&&&&&&&&&&&&&&&&&&&&&&&&&&&&&&&&&&&&&&&&&&&&&&&&&&&&&&------
component slotint
port (
    signal card_is_mem          :in     mvl7;

-- card signals
    signal card_ready           :in     mvl7;

    signal int_out              :out    mvl7;

    signal ata_mode              : in   mvl7
);
end component;

----&&&&&&&&&&&&&&&&&&&&&&&&&&&&&&&&&&&&&&&&&&&&&&&&&&&&&&&&&&&&&&&&&&&&&&&&------
----&&&&&&&&&&&&&&&&&&&&&&&&&&&&&&&&&&&&&&&&&&&&&&&&&&&&&&&&&&&&&&&&&&&&&&&&------
component slotpwr
port (
    signal clk                  :in     mvl7;
    signal reset                :in     mvl7;
    signal ok_to_pwr_off        :in     mvl7;
    signal vcc_enable           :in     mvl7;   -- turn vcc on or off
    signal vpp1_level_1         :in     mvl7;
    signal vpp1_level_0         :in     mvl7;
    signal vpp2_level_1         :in     mvl7;
    signal vpp2_level_0         :in     mvl7;
    signal auto_pwr_off         :in     mvl7;
    signal card_det_dg          :in     mvl7_vector(1 downto 0);
                                -- changed to deglitched card detects
    signal sock_vpp1_lev        :out    mvl7_vector(1 downto 0);
    signal sock_vpp2_lev        :out    mvl7_vector(1 downto 0);
    signal sock_vcc             :buffer mvl7;
    signal card_3v_en           :out    mvl7;
    signal card_5v_en           :out    mvl7;
    signal vcc_is_3v            :in     mvl7;
    signal suspend : in mvl7;
    signal card_oe : in mvl7;
    signal card_iord : in       mvl7;
    signal v5_core : in mvl7;
    signal data_pdat : out      mvl7;
    signal data_pdac : out      mvl7;
    signal cntrl_pdat : out     mvl7;
    signal cntrl_pdac : out     mvl7;
    signal irq_pdat : out       mvl7;
    signal irq_pdac : out       mvl7;
    signal spkr_pdat            :out    mvl7;
    signal spkr_pdac            :out    mvl7;
    signal card_is_io           :in     mvl7;
    signal card_oe_n            :in     mvl7;
    signal slot_sig_oe_n        :out    mvl7;
    signal spkr_out_enable      :in     mvl7;--  Misc Ctrl Reg I bit 4
    signal spkr_inp_is_led      :in     mvl7;--  ATA Ctrl Reg bit 1
    card_ok                     :buffer mvl7;
```

```
    signal ata_read            :in     mvl7
);
end component;



component timerctl
PORT (

-- General interface:
    signal internal_clk        :in     mvl7;
    signal reset               :in     mvl7;

    signal timer_load_val_c    :in     mvl7_vector(5 downto 0);
    signal timer_load_val_p    :in     mvl7_vector(1 downto 0);
    signal timer_eq_0          :buffer mvl7;
    signal timer_lt_2           : out  mvl7;
    signal load_timer          :in     mvl7;
    test_active                :in     mvl7;
    b_s_data_upper             :inout  mvl7_vector(3 downto 0)
);
end component;

component deglitch
PORT (
    in_from_pad                :in     mvl7;
    out_deglitched             :out    mvl7
);
end component;
--  ***************************************************************
--  * SIGNAL DECLARATIONS FOR ARCHITECTURE SLOTTOP OF SLOTTOP *
--  ***************************************************************

signal int_enable              :mvl7;
signal last_cyc_inpack         :mvl7;
--signal tmp_spkr                       :mvl7;
-- temporary spot for the speaker output from the socket
signal timer_load_val_c        :mvl7_vector(5 downto 0);
signal timer_load_val_p        :mvl7_vector(1 downto 0);
signal timer_eq_0              :mvl7;
signal load_timer              :mvl7;
signal current_state            : mvl7_vector(state_bits-1 downto 0);
signal next_state               : mvl7_vector(state_bits-1 downto 0);
signal card_is_mem              : mvl7;
signal timer_lt_2_unq          :mvl7;
signal timer_lt_2_unqq : mvl7;
--  timer_lt_2_unqq is qualified with wait but not read

--  ***********************************************
--  * BEGIN OF ARCHITECTURE SLOTTOP OF SLOTTOP *
--  ***********************************************

begin

  read_active <= current_state(READ_BIT);
```

```
write_active <= current_state(WRITE_BIT);

  pwr : slotpwr
  port map (
      clk,
      reset,
      ok_to_pwr_off,
      vcc_enable,
      vpp1_cntl_1,
      vpp1_cntl_0,
      vpp2_cntl_1,
      vpp2_cntl_0,
      auto_pwr_enable,
      card_det_dg, -- chgd to deglitched
      card_vpp1_lev,
      card_vpp2_lev,
      card_vcc,
      vcc_3v_en,
      vcc_5v_en,
      vcc_is_3v,
      suspend,
      card_oe,
      card_iord,
      v5_core,
      data_pdat,
      data_pdac,
      cntrl_pdat,
      cntrl_pdac,
      irq_pdat,
      irq_pdac,
      spkr_pdat,
      spkr_pdac,
      card_is_io,
      card_oe_n,
      slot_sig_oe_n,
      spkr_out_enable, -- Misc Ctrl Reg I bit 4
      spkr_inp_is_led, -- ATA Ctrl Reg bit 1
      card_ok,
      ata_read
  );

  int : slotint
  port map (
      card_is_mem,
      card_rdy_bsy_dg, -- changed to deglitched
      int_out,
      ata_mode
  );

  slot1 : slotctl
  port map (
      f_w_reg,
      f_w_mem,
      f_w_timer,
      f_w_do_op,
```

```
        f_wp_timer,
        f_wp_do_op,
        f_wp_mem,
        f_wp_reg,

        f_r_reg,
        f_r_mem,
        f_r_timer,
        f_r_do_op,

        active_will_end,
        recover_will_end,
        f_read_write_bar,
        first_of_two,

        last_cyc_inpack,                -- from bmr_regs **
        timer_select,

        clk,
        reset,

        card_iord,
        card_iowr,
        card_inpack,
        card_reg,
        card_oe,
        card_we,
        ok_to_pwr_off,

        timer_eq_0,
        load_timer,
        current_state,
        next_state,
        ata_mode,
        ata_read,
        test_active
    );

    ce1 : card_enf
    port map (
        f_w_bhe,
        f_w_addr0,
        f_w_do_op,
        f_w_data_size_8,
        f_w_io_win_0,
        f_w_mem,
        f_w_ignore_iois16,

        f_wp_bhe,
        f_wp_addr0,
        f_wp_do_op,
        f_wp_data_size_8,
        f_wp_io_win_0,
        f_wp_mem,
        f_wp_ignore_iois16,
```

```
        f_r_bhe,
        f_r_addr0,
        f_r_do_op,
        f_r_data_size_8,
        f_r_io_win_0,
        f_r_mem,
        f_r_ignore_iois16,

        recover_will_end,
        first_of_two,
        second_of_two,
        clk,
        reset,
        card_en,
        current_state,
        next_state,
        ata_mode,
        active_will_end,
        mem_w_prot,
        io_win_sel_i
    );

    mt1 : misc_tim
    port map (
      active_will_end,
      recover_will_end,
      isa_ready_out,
      timer_eq_0,
      timer_lt_2_unq,
      timer_lt_2_unqq,
      current_state,
      card_wait,
      clk
    );


    timer1 : timerctl
    port map (
        clk,
        reset,
        timer_val(5 downto 0),          --   timer count is in lower 6 bits
        timer_val(7 downto 6),          --   timer prescaler is in upper 2 bits
        timer_eq_0,
        timer_lt_2_unq,                 --  this signal needs to be qualified
                                        --  with wait before it is passed out
                                        --  as timer_lt_2
        load_timer,
        test_active,
        b_s_data_upper
    );

--  **********************************************************
--  * PROCESS DEFINITION FOR ARCHITECTURE SLOTTOP OF SLOTTOP *
--  **********************************************************

    ---------------------------------------------------------------------------
```

```
    -- Process:  tmr_lt_2
    -- Purpose:
    -- Inputs:
    -- Outputs:
    --------------------------------------------------------------------------
    tmr_lt_2 : process (timer_lt_2_unqq, f_w_do_op, first_of_two, current_state)

    begin  -- process tmr_lt_2
      if (    (current_state(READ_BIT) = '1')
          and (current_state(ACT_BIT) = '1')
         ) then
        if ((first_of_two = '0') and (timer_lt_2_unqq = '1')) then
          timer_lt_2 <= '1';
        else
          timer_lt_2 <= '0';
        end if;
      else
        timer_lt_2 <= '0';
      end if;
    end process tmr_lt_2;

--  bryan this is unneeded since spkr en tristates the pad
--    process (tmp_spkr)
--      variable foo_spkr :mvl7;
--    begin
--      if (speaker_en = '1') then
--        spkr_out <= tmp_spkr;
--      else
--        spkr_out <= '0';
--      end if;
--      if (drive_led_en = '1') then
--        led_out <= tmp_spkr;
--      else
--        led_out <= '0';
--      end if;
--    end process;

    misc_stuff_i_forgot:process (card_is_io, card_reset_ctl, ata_mode)
    begin
      if (card_is_io = '1') then
        card_is_mem <= '0';
      else
        card_is_mem <= '1';
      end if;

      if (ata_mode = '0') then
        card_reset <= not card_reset_ctl;
      else
        card_reset <= card_reset_ctl;
      end if;
    end process;

end slottop;
```

Oct 22 10:45 1993 slotpwr.vhd Page 1

```
-- $Header: /ui/ph1/ai/sas/vhdl/sim/RCS/slotpwr.vhd,v 3.5 1993/02/03 23:25:51 bezzant Exp
$
library synopsys;
use synopsys.types.all;
use work.slotpack.all;

entity slotpwr is
PORT (
    signal clk              :in     mvl7;
    signal reset            :in     mvl7;
    signal ok_to_pwr_off    :in     mvl7;
    signal vcc_enable       :in     mvl7;   -- turn vcc on or off
    signal vpp1_level_1     :in     mvl7;
    signal vpp1_level_0     :in     mvl7;
    signal vpp2_level_1     :in     mvl7;
    signal vpp2_level_0     :in     mvl7;
    signal auto_pwr_off     :in     mvl7;
    signal card_det_dg      :in     mvl7_vector(1 downto 0); -- changed to deglitched

    signal sock_vpp1_lev    :out    mvl7_vector(1 downto 0);
    signal sock_vpp2_lev    :out    mvl7_vector(1 downto 0);
    signal sock_vcc         :buffer mvl7;
    signal card_3v_en       :out    mvl7;
    signal card_5v_en       :out    mvl7;
    signal vcc_is_3v        :in     mvl7;
    signal suspend : in mvl7;
    signal card_oe : in mvl7;
    signal card_iord : in       mvl7;
    signal v5_core : in mvl7;
    signal data_pdat : out      mvl7;
    signal data_pdac : out      mvl7;
    signal cntrl_pdat : out     mvl7;
    signal cntrl_pdac : out     mvl7;
    signal irq_pdat : out       mvl7;
    signal irq_pdac : out       mvl7;
    signal spkr_pdat        :out    mvl7;
    signal spkr_pdac        :out    mvl7;
    signal card_is_io       :in     mvl7;
    signal card_oe_n        :in     mvl7;
    signal slot_sig_oe_n    :out    mvl7;
    signal spkr_out_enable  :in     mvl7; --  Misc Ctrl Reg. 1 bit 4
    signal spkr_inp_is_led  :in     mvl7; --  ATA Ctrl reg. bit 1
    card_ok                 :buffer mvl7;
    signal ata_read         :in     mvl7
);
end slotpwr;

architecture behave of slotpwr is
  signal early_data_pdat : mvl7;
  signal early_data_pdac : mvl7;
  signal early_data_pdat_dly : mvl7;
  signal early_data_pdac_dly : mvl7;

begin
    pwr_process:process(
        ok_to_pwr_off,
        vcc_enable,
```

```
        vpp1_level_1,
        vpp1_level_0,
        vpp2_level_1,
        vpp2_level_0,
        auto_pwr_off,
        card_det_dg, -- changed to deglitched
        vcc_is_3v
    )

    variable socket_on : mvl7;

    begin
      if (auto_pwr_off = '1') then
        if ((card_det_dg(0) = '0') and (card_det_dg(1) = '0')) then -- changed to deglitch
ed
          socket_on := vcc_enable;
        else
          socket_on := '0';
        end if;
      else
        socket_on := vcc_enable;
      end if;

      --  card_3v_en and card_5v_en are active low signals
      if (socket_on = '1') then
        sock_vcc <= '1';
        if (vcc_is_3v = '1') then
          card_3v_en <= '0';
          card_5v_en <= '1';
        else
          card_3v_en <= '1';
          card_5v_en <= '0';
        end if;
      else
        sock_vcc <= '0';
        card_3v_en <= '1';
        card_5v_en <= '1';
      end if;

      if (socket_on = '1') then
        if ((vpp1_level_0 = '1') and (vpp1_level_1 = '1')) then
          sock_vpp1_lev <= "00";
        else
          sock_vpp1_lev(1) <= vpp1_level_1;
          sock_vpp1_lev(0) <= vpp1_level_0;
        end if;
        if ((vpp2_level_0 = '1') and (vpp2_level_1 = '1')) then
          sock_vpp2_lev <= "00";
        else
          sock_vpp2_lev(1) <= vpp2_level_1;
          sock_vpp2_lev(0) <= vpp2_level_0;
        end if;
      else
        sock_vpp1_lev <= "00";
        sock_vpp2_lev <= "00";
      end if;
    end process;
```

```
--------------------------------------------------------------------------
-- Process: slot_oe
-- Purpose: enables the output pads when the card_enable bit is set to 1
--          and a card has been inserted (card_detects are 0
-- Inputs:
-- Outputs: slot_sig_oe_n, card_ok
--------------------------------------------------------------------------
slot_oe : process (card_det_dg, card_oe_n, sock_vcc)

begin -- process slot_oe
  if (    (card_det_dg(0) = '0') -- changed to deglitched
      and (card_det_dg(1) = '0') -- changed to deglitched
      and (card_oe_n = '0')
     ) then
    slot_sig_oe_n <= '0';
    if (sock_vcc = '1') then
      card_ok <= '1';
    else
      card_ok <= '0';
    end if;
  else
    slot_sig_oe_n <= '1';
    card_ok <= '0';
  end if;
end process slot_oe;

--------------------------------------------------------------------------
-- Process: pin_pwr
-- Purpose: turns the pin receivers on or off and determines whether to
--          use the cmos or the ttl pin receivers
-- Inputs:
--
-- Outputs:
--------------------------------------------------------------------------
pin_pwr : process (
  suspend,
  ok_to_pwr_off,
  v5_core,
  card_oe,
  card_iord,
  card_is_io,
  card_ok,
  card_det_dg, -- changed to deglitched
  spkr_inp_is_led, --  ATA Ctrl Register bit 1
  spkr_out_enable, --  Misc Ctrl I reg. bit 4
  ata_read
)
  variable early_data_pdat_v : mvl7;
  variable early_data_pdac_v : mvl7;
  variable cntrl_pdat_v : mvl7;
  variable cntrl_pdac_v : mvl7;
  variable irq_pdat_v : mvl7;
  variable irq_pdac_v : mvl7;
  variable spkr_pdat_v : mvl7;
  variable spkr_pdac_v : mvl7;
```

```
  begin  -- process pin_pwr
    early_data_pdat_v := '1';
    early_data_pdac_v := '1';
    cntrl_pdat_v := '1';
    cntrl_pdac_v := '1';
    irq_pdat_v := '1';
    irq_pdac_v := '1';
    spkr_pdat_v := '1';
    spkr_pdac_v := '1';
    if ((card_det_dg(0) = '1') or (card_det_dg(1) = '1')) then -- changed to deglitched
      -- no card, power off rcvrs
      null;
    elsif ((card_is_io = '0') and (card_ok = '0')) then
      -- memory card, not powered on, power off rcvrs
      null;
    elsif ((card_is_io = '1') and (card_ok = '0')) then
      -- io card, keep on checking -IREQ and -STSCHG
      irq_pdat_v := not v5_core;
      irq_pdac_v := v5_core;
    elsif ((suspend = '1') or (ok_to_pwr_off = '1')) then
      irq_pdat_v := not v5_core;
      irq_pdac_v := v5_core;
      cntrl_pdat_v := not v5_core;
      cntrl_pdac_v := v5_core;
      if (    (card_is_io = '0')
          or (spkr_out_enable = '1') -- If Misc Ctrl 1 bit 4 set
          or (spkr_inp_is_led = '1') -- Or if ATA Ctrl reg bit 1 set
         ) then
        spkr_pdat_v := not v5_core;
        spkr_pdac_v := v5_core;
      end if;
      -- ata_reads happen when ok_to_pwr_off is true
      if (ata_read = '1') then
        early_data_pdat_v := not v5_core;
        early_data_pdac_v := v5_core;
      end if;
    elsif ((card_oe = '1') and (card_iord = '1')) then
      cntrl_pdat_v := not v5_core;
      cntrl_pdac_v := v5_core;
      irq_pdat_v := not v5_core;
      irq_pdac_v := v5_core;
      if (    (card_is_io = '0')
          or (spkr_out_enable = '1') -- If Misc Ctrl 1 bit 4 set
          or (spkr_inp_is_led = '1') -- Or if ATA Ctrl reg bit 1 set
         ) then
        spkr_pdat_v := not v5_core;
        spkr_pdac_v := v5_core;
      end if;
    else                                -- obviously in a read state, turn
                                        -- data on
      early_data_pdat_v := not v5_core;
      early_data_pdac_v := v5_core;
      cntrl_pdat_v := not v5_core;
      cntrl_pdac_v := v5_core;
      irq_pdat_v := not v5_core;
```

```
      irq_pdac_v := v5_core;
      if (   (card_is_io = '0')
          or (spkr_out_enable = '1') -- If Misc Ctrl 1 bit 4 set
          or (spkr_inp_is_led = '1') -- Or if ATA Ctrl reg bit 1 set
         ) then
        spkr_pdat_v := not v5_core;
        spkr_pdac_v := v5_core;
      end if;
    end if;
    early_data_pdat <= early_data_pdat_v;
    early_data_pdac <= early_data_pdac_v;
    cntrl_pdat <= cntrl_pdat_v;
    cntrl_pdac <= cntrl_pdac_v;
    irq_pdat <= irq_pdat_v;
    irq_pdac <= irq_pdac_v;
    spkr_pdat <= spkr_pdat_v;
    spkr_pdac <= spkr_pdac_v;
  end process pin_pwr;

  ---------------------------------------------------------------------------
  -- Process:  pdax_delay
  -- Purpose:  to delay the data_pdaX signals turning off so that the hold
  --           time to the read latches will be a little bit longer.
  -- Inputs:   early_data_pda[ct]
  -- Outputs:  early_data_pda[ct]_dly
  ---------------------------------------------------------------------------
  pdax_delay : process (clk)

  begin -- process pdax_delay
    if ((clk = '1') and (clk'event)) then
      early_data_pdat_dly <= early_data_pdat;
      early_data_pdac_dly <= early_data_pdac;
    end if;
  end process pdax_delay;

  ---------------------------------------------------------------------------
  -- Process:  pdax_delay_async
  -- Purpose:  looks at early_data_pda[ct] and the 'dly' versions of these
  --           and decides whether to turn on the data_pda[ct] lines. Since
  --           the pda[ct] lines disable the input pad when high, the
  --           pda[ct] lines are brought low as soon as the early lines go
  --           low, but they wait until both the early and dly'd version go
  --           high before they go high.
  -- Inputs:
  -- Outputs:  data_pdat, data_pdac
  ---------------------------------------------------------------------------
  pdax_delay_async : process (early_data_pdat,
                              early_data_pdat_dly,
                              early_data_pdac,
                              early_data_pdac_dly)

  begin -- process pdax_delay_async
    if (early_data_pdat = '0') then
      data_pdat <= '0';
    elsif (early_data_pdat_dly = '0') then
      data_pdat <= '0';
```

Oct 22 10:45 1993 slotpwr.vhd Page 6

```
      else
        data_pdat <= '1';
      end if;

      if (early_data_pdac = '0') then
        data_pdac <= '0';
      elsif (early_data_pdac_dly = '0') then
        data_pdac <= '0';
      else
        data_pdac <= '1';
      end if;
    end process pdax_delay_async;
end behave;
```

Oct 22 10:45 1993 slotctl.vhd Page 1

```
-- $Header: /tmp_mnt/ph2/phiter2/sas/df/sim/RCS/slotctl.vhd,v 3.1 1993/01/11 22:55:47 ajoy
 Exp $
library synopsys;
use synopsys.types.all;
use synopsys.arithmetic.all;
use work.slotpack.all;

ENTITY slotctl is
PORT (

-- FIFO interface:
    signal f_w_reg              :in     mvl7;
    signal f_w_mem              :in     mvl7;
    signal f_w_timer            :in     mvl7;
    signal f_w_do_op            :in     mvl7;

    signal f_wp_timer           :in     mvl7;
    signal f_wp_do_op           :in     mvl7;
    signal f_wp_mem             :in     mvl7;
    signal f_wp_reg             :in     mvl7;

    signal f_r_reg              :in     mvl7;
    signal f_r_mem              :in     mvl7;
    signal f_r_timer            :in     mvl7;
    signal f_r_do_op            :in     mvl7;

    signal active_will_end      :in     mvl7;
    signal recover_will_end     :in     mvl7;
    signal f_read_write_bar     :out    mvl7;
    -- this is a dir line for data and address

    signal first_of_two         :in     mvl7;
    -- indicates first cycle of a word to byte conversion

-- Register bits:
    signal last_cyc_inpack      :out    mvl7;
    --   the bits of timer_select are defined as follows:
    --  0 timer set 0 setup time
    --  1 timer set 0 active time
    --  2 timer set 0 recovery time
    --  3 timer set 1 setup time
    --  4 timer set 1 active time
    --  5 timer set 1 recovery time
    --  6.. enable bits for other sockets

    signal timer_select         :buffer mvl7_vector(3*2-1 downto 0);

-- General interface:
    signal internal_clk         :in     mvl7;
    signal reset                :in     mvl7;

-- socket interface:
    signal card_iord            :buffer mvl7;
    signal card_iowr            :out    mvl7;
    signal card_inpack          :in     mvl7;
    signal card_reg             :out    mvl7;
    signal card_oe              :buffer mvl7;
```

```
    signal card_we              :out    mvl7;

    signal ok_to_pwr_off        :buffer mvl7;

-- timer interface:
    signal timer_eq_0           :in     mvl7;
    signal load_timer           :out    mvl7;
    signal current_state        :buffer mvl7_vector(state_bits-1 downto 0);
    signal next_state           :buffer mvl7_vector(state_bits-1 downto 0);
    signal ata_mode              : in   mvl7;
    signal ata_read             :in     mvl7;
    test_active                 :in     mvl7

);
end slotctl;

ARCHITECTURE slotctl of slotctl is

 signal cycle_is_mem            :mvl7;
 signal cycle_is_reg            :mvl7;
 signal card_iord_sync          :mvl7;
 signal next_f_read_write_bar : mvl7;
 signal next_card_reg : mvl7;


begin

--------------------------------------------------------------------------------
-- The following processes are included in this entity:
-- state_ctl                    combinatorial
--      Controls what state will be used next.
--
-- ending_signals               combinatorial
--      Figures out when the active and recovery times will be ending.
--   This information is intended for the FIFO so it can tell what it needs
--   to do next.
--
-- reg_ctl                      combinatorial
--      Controls the REG signal to be sent to the sockets
--
-- command_ctl                  combinatorial
--      Controls the OE, WE, IORD, and IOWR signals to the sockets
--
-- read_write                   combinatorial
--      Figures out the active socket and determines if byte swapping
--   will be necessary.
--
    more_timer_ctl_comb:process(
      current_state,
      f_r_timer,
      f_w_timer,
      f_wp_timer,
      f_w_do_op,
      f_wp_do_op,
      test_active
    )
```

Oct 22 10:45 1993 slotctl.vhd Page 3

```
variable timer_sel_v       : mvl7_vector(2 downto 0);
variable timer_select_v    : mvl7_vector(2*3-1 downto 0);
variable w_op              : mvl7;
variable w_n_op            : mvl7;
variable tmp               : integer;
variable shift_val         : integer;


begin
  --   first build up the base of the timer value, we'll add the type of
  --   cycle later (setup, active or recovery).

    -- this case statement determines what timer value to load next based
    -- on the state we're in right now.

    case conv_integer(current_state) is
    when idle =>
      w_n_op := '0';
      if (f_w_do_op = '1') then
        w_op := '1';
        timer_sel_v := setup_loc;
      else
        w_op := '0';
        timer_sel_v := setup_loc;
      end if;
    when w_recovery =>
      w_op := '0';
      if (f_wp_do_op = '1') then            -- there is a write waiting in
                                            --  the FIFO
        w_n_op := '1';
        timer_sel_v := setup_loc;
      else
        w_n_op := '0';
        timer_sel_v := setup_loc;
      end if;
    when r_recovery =>
      w_n_op := '0';
      if (f_w_do_op = '1') then             -- next cycle will be a
                                            --  write
        w_op := '1';
        timer_sel_v := setup_loc;
      else
        --   if here then next cycle will be a read or the second
        --   byte of a read command
        w_op := '0';
        timer_sel_v := setup_loc;
      end if;
    when w_setup =>
      w_n_op := '0';
      w_op := '1';
      timer_sel_v := active_loc;
    when w_active =>
      w_n_op := '0';
      w_op := '1';
```

```
          timer_sel_v := recovery_loc;
        when r_setup =>
          w_n_op := '0';
          w_op := '0';
          timer_sel_v := active_loc;
        when r_active =>
          w_n_op := '0';
          w_op := '0';
          timer_sel_v := recovery_loc;
        when others =>
          w_n_op := '0';
          w_op := '0';
          timer_sel_v := setup_loc;
        end case;

-------------------------------------------------------------------------------
--  first figure out which timer register set needs to be accessed
-------------------------------------------------------------------------------
        if (w_op = '1') then
          if (f_w_timer = '1') then
            shift_val := 3;
          else
            shift_val := 0;
          end if;
        elsif (w_n_op = '1') then
          if (f_wp_timer = '1') then
            shift_val := 3;
          else
            shift_val := 0;
          end if;
        elsif (f_r_timer = '1') then
          shift_val := 3;
        else
          shift_val := 0;
        end if;
-------------------------------------------------------------------------------
--  now shift_val has either 0 for set 0 or 3 for set 1.
-------------------------------------------------------------------------------
        if (test_active = '1') then
          timer_select <= conv_unsigned(1,6);
          --  when in test mode, choose values from timer set 0 setup
        elsif (shift_val = 3) then
          timer_select(5 downto 3) <= timer_sel_v;
          timer_select(2 downto 0) <= "000";
        else
          timer_select(5 downto 3) <= "000";
          timer_select(2 downto 0) <= timer_sel_v;
        end if;
    end process;


    ---------------------------------------------------------------------------
    --  Process:  load_timer_proc
    --  Purpose:
    --  Inputs:
    --  Outputs:
```

```
---------------------------------------------------------------------------
load_timer_proc : process (reset,
                           current_state,
                           active_will_end,
                           timer_eq_0)

begin -- process load_timer_proc
  if (reset = '1') then
    load_timer <= '1';
  elsif (current_state(ACT_BIT) = '1') then
    load_timer <= active_will_end;
  elsif (current_state(REC_BIT) = '1' or current_state(SET_BIT) = '1') then
    load_timer  <= timer_eq_0;
  else                             -- if idle
    load_timer <= '1';
  end if;
end process load_timer_proc;

---------------------------------------------------------------------------
-- Process:  pwr_off_proc
-- Purpose:
-- Inputs:
-- Outputs:
---------------------------------------------------------------------------
pwr_off_proc : process (current_state,
                        f_w_do_op,
                        f_r_do_op)

begin -- process pwr_off_proc
    if (    ((current_state(READ_BIT) = '0') and (current_state(WRITE_BIT) = '0'))
        and (f_w_do_op = '0')
        and (f_r_do_op = '0')
       ) then
      ok_to_pwr_off <= '1';
    else
      ok_to_pwr_off <= '0';
    end if;
end process pwr_off_proc;


---------------------------------------------------------------------------
-- Process:  r_w_proc
-- Purpose:
-- Inputs:
-- Outputs:
---------------------------------------------------------------------------
r_w_proc : process (current_state,
                    f_w_do_op,
                    f_r_do_op,
                    f_wp_do_op,
                    timer_eq_0,
                    first_of_two)

begin -- process r_w_proc

    -- now figure out what state we'll need in the next cycle
```

```
    --  first set the read/write state bits
    if ((current_state(READ_BIT) = '0') and (current_state(WRITE_BIT) = '0')) then
      if (f_w_do_op = '1') then
        next_state(WRITE_BIT) <= '1';
        next_state(READ_BIT) <= '0';
      elsif (f_r_do_op = '1') then
        next_state(WRITE_BIT) <= '0';
        next_state(READ_BIT) <= '1';
      else
        next_state(WRITE_BIT) <= '0';
        next_state(READ_BIT) <= '0';
      end if;
    elsif (current_state(REC_BIT) = '1') then
      if ((timer_eq_0 = '1') and (first_of_two = '0')) then
        if (current_state(WRITE_BIT) = '1') then
          if (f_wp_do_op = '1') then
            next_state(WRITE_BIT) <= '1';
            next_state(READ_BIT) <= '0';
          elsif (f_r_do_op = '1') then
            next_state(WRITE_BIT) <= '0';
            next_state(READ_BIT) <= '1';
          else
            next_state(WRITE_BIT) <= '0';
            next_state(READ_BIT) <= '0';
          end if;
        elsif (f_w_do_op = '1') then
          next_state(WRITE_BIT) <= '1';
          next_state(READ_BIT) <= '0';
        else
          next_state(WRITE_BIT) <= '0';
          next_state(READ_BIT) <= '0';
        end if;
      else
        next_state(WRITE_BIT) <= current_state(WRITE_BIT);
        next_state(READ_BIT) <= current_state(READ_BIT);
      end if;
    else
      next_state(WRITE_BIT) <= current_state(WRITE_BIT);
      next_state(READ_BIT) <= current_state(READ_BIT);
    end if;
end process r_w_proc;

----------------------------------------------------------------------------
--  Process:  set_proc
--  Purpose:
--  Inputs:
--  Outputs:
----------------------------------------------------------------------------
set_proc : process (current_state,
                    f_w_do_op,
                    f_r_do_op,
                    f_wp_do_op,
                    timer_eq_0,
                    first_of_two)

begin  --  process set_proc
```

```
    -- now set the setup bit
    -- IDLE
    if ((current_state(READ_BIT) = '0') and (current_state(WRITE_BIT) = '0')) then
      if ((f_w_do_op = '1') or (f_r_do_op = '1')) then
        next_state(SET_BIT) <= '1';
      else
        next_state(SET_BIT) <= '0';
      end if;
    elsif (current_state(REC_BIT) = '1') then
      if (timer_eq_0 = '1') then
        if (first_of_two = '1') then
          next_state(SET_BIT) <= '1';
        elsif (current_state(WRITE_BIT) = '1') then-- currently doing a write
          if ((f_wp_do_op = '1') or (f_r_do_op = '1')) then
            next_state(SET_BIT) <= '1';
          else
            next_state(SET_BIT) <= '0';
          end if;
        elsif (f_w_do_op = '1') then -- currently doing a read
          next_state(SET_BIT) <= '1';
        else
          next_state(SET_BIT) <= '0';
        end if;
      else
        next_state(SET_BIT) <= '0';
      end if;
    elsif (current_state(SET_BIT) = '1') then
      if (timer_eq_0 = '1') then
        next_state(SET_BIT) <= '0';
      else
        next_state(SET_BIT) <= '1';
      end if;
    else
      next_state(SET_BIT) <= '0';
    end if;

end process set_proc;

----------------------------------------------------------------------------
-- Process: act_proc
-- Purpose:
-- Inputs:
-- Outputs:
----------------------------------------------------------------------------
act_proc : process (current_state,
                    timer_eq_0,
                    active_will_end)

begin -- process act_proc
    -- now set the active state bit
    if ((current_state(SET_BIT) = '1')) then
      if (timer_eq_0 = '1') then
        next_state(ACT_BIT) <= '1';
      else
        next_state(ACT_BIT) <= '0';
      end if;
```

```
    elsif (active_will_end = '1') then
      next_state(ACT_BIT) <= '0';
    else
      next_state(ACT_BIT) <= current_state(ACT_BIT);
    end if;
end process act_proc;

----------------------------------------------------------------------------
-- Process: rec_proc
-- Purpose:
-- Inputs:
-- Outputs:
----------------------------------------------------------------------------
rec_proc : process (current_state,
                    active_will_end,
                    recover_will_end)

begin -- process rec_proc
    -- now set the recovery state bit
    if (active_will_end = '1') then
      next_state(REC_BIT) <= '1';
    elsif (recover_will_end = '1') then
      next_state(REC_BIT) <= '0';
    else
      next_state(REC_BIT) <= current_state(REC_BIT);
    end if;

end process rec_proc;

-- this process just controls the REG signal to the PCMCIA slot
reg_ctl:process(reset,
                internal_clk
)
begin

  if (reset = '1') then
    f_read_write_bar <= '1';
    card_reg <= '1';
  elsif (internal_clk'event and (internal_clk = '1')) then
    if (   ((current_state(READ_BIT) = '0') and (current_state(WRITE_BIT) = '0'))
        or ((recover_will_end = '1') and (first_of_two = '0'))
       ) then
      f_read_write_bar <= next_f_read_write_bar;
      if (ata_mode = '1') then
        card_reg <= '1';
      else
        card_reg <= next_card_reg;
      end if;
    end if;
  end if;
end process;

----------------------------------------------------------------------------
-- Process: reg_ctl_comb
-- Purpose:
-- Inputs:
```

```
-- Outputs:
-----------------------------------------------------------------------------
reg_ctl_comb : process (current_state,
                        f_w_mem,
                        f_w_reg,
                        f_r_mem,
                        f_r_reg,
                        f_wp_reg,
                        f_wp_mem,
                        f_r_do_op,
                        f_w_do_op,
                        f_wp_do_op,
                        ata_mode)
variable f_w_card_reg : mvl7;
variable f_r_card_reg : mvl7;
variable f_wp_card_reg : mvl7;

begin -- process reg_ctl_comb
  if ((f_w_mem = '1') and (f_w_reg = '1')) then
    f_w_card_reg := '0';
  elsif (f_w_mem = '0') then
    f_w_card_reg := '0';
  else
    f_w_card_reg := '1';
  end if;

  if ((f_r_mem = '1') and (f_r_reg = '1')) then
    f_r_card_reg := '0';
  elsif (f_r_mem = '0') then
    f_r_card_reg := '0';
  else
    f_r_card_reg := '1';
  end if;

  if ((f_wp_mem = '1') and (f_wp_reg = '1')) then
    f_wp_card_reg := '0';
  elsif (f_wp_mem = '0') then
    f_wp_card_reg := '0';
  else
    f_wp_card_reg := '1';
  end if;

  if ((current_state(READ_BIT) = '0') and (current_state(WRITE_BIT) = '0')) then
    if (f_w_do_op = '1') then
      next_card_reg <= f_w_card_reg;
      next_f_read_write_bar <= '0';
    elsif (f_r_do_op = '1') then
      next_card_reg <= f_r_card_reg;
      next_f_read_write_bar <= '1';
    else
      next_card_reg <= '1';
      next_f_read_write_bar <= '1';
    end if;
  elsif (current_state(REC_BIT) = '1') then
    if (current_state(READ_BIT) = '1') then
      if (f_w_do_op = '1') then
```

```
          next_card_reg <= f_w_card_reg;
          next_f_read_write_bar <= '0';
        else
          next_card_reg <= '1';
          next_f_read_write_bar <= '1';
        end if;
      else
        if (f_wp_do_op = '1') then
          next_card_reg <= f_wp_card_reg;
          next_f_read_write_bar <= '0';
        elsif (f_r_do_op = '1') then
          next_card_reg <= f_r_card_reg;
          next_f_read_write_bar <= '1';
        else
          next_card_reg <= '1';
          next_f_read_write_bar <= '1';
        end if;
      end if;
    else
      next_card_reg <= 'X';
      next_f_read_write_bar <= 'X';
    end if;
  end process reg_ctl_comb;

  ---------------------------------------------------------------------------
  -- Process:  async_ata_read
  -- Purpose:  generate asynchronous card_iord when ata_read occurs
  -- Inputs:   ata_read, card_iord_sync
  -- Outputs:  card_iord
  ---------------------------------------------------------------------------
  async_ata_read : process (card_iord_sync, ata_read)

  begin  -- process async_ata_read
    if ((ata_read = '1') or (card_iord_sync = '0')) then
      card_iord <= '0';
    else
      card_iord <= '1';
    end if;
  end process async_ata_read;

  -- This process sets the command pulses into the proper state
  -- for IDE, OE needs to be held active all the time.
  command_ctl:process(internal_clk)
  begin
      if internal_clk'event and internal_clk = '1' then
          if (reset = '1') then
            card_we <= '1';
            card_oe <= '1';
            card_iowr <= '1';
            card_iord_sync <= '1';
            last_cyc_inpack <= '0';
          else

              -- deal with oe/we and iord/iowr
              if (    (next_state(WRITE_BIT) = '1')
                  and (next_state(ACT_BIT) = '1')
```

```
                ) then
              if (ata_mode = '0') then
                if (f_w_mem = '1') then
                    card_we <= '0';
                else
                    card_iowr <= '0';
                end if;
              else
                card_we <= '1';
                if (f_w_mem = '0') then
                  card_iowr <= '0';
                else
                  card_iowr <= '1';
                end if;
              end if;
            elsif ((next_state(READ_BIT) = '1') and (next_state(ACT_BIT) = '1')) then
              if (ata_mode = '0') then
                if (f_r_mem = '1') then
                    card_oe <= '0';
                else
                    card_iord_sync <= '0';
                end if;
              else
                card_oe <= '0';
                if (f_r_mem = '0') then
                  card_iord_sync <= '0';
                else
                  card_iord_sync <= '1';
                end if;
              end if;
            else
              if (ata_mode = '0') then
                card_we <= '1';
                card_oe <= '1';
              else
                card_we <= '1';
                card_oe <= '0';
              end if;
              card_iowr <= '1';
              card_iord_sync <= '1';
            end if;

            if (     (next_state(READ_BIT) = '1')
                and (next_state(REC_BIT) = '1')
                and (f_r_mem = '0')
               ) then
                if (card_inpack = '0') then
                    last_cyc_inpack <= '1';
                else
                    last_cyc_inpack <= '0';
                end if;
            end if;
        end if;
    end if;
end process;
```

```
    read_write:process(internal_clk,reset)
    --
    begin
        if (reset = '1') then
          current_state <= conv_unsigned(idle,state_bits);
        elsif internal_clk'event and internal_clk = '1' then
          current_state <= next_state;
        end if;
    end process;
end slotctl;
```

Oct 22 10:45 1993 index_reg208dma.vhd Page 1

```
-- $Header: /tmp_mnt/ph2/phiter2/sas/df/sim/RCS/index_reg208dma.vhd,v 1.2 1993/09/02 21:41
:21 sas Exp $
---------------------------------------------------------------------------
-- This the index registers sub section of the  BIU design at
-- ~sas//pcmcai/vhdl/sim/index_reg.vhd
-- v .001, 4/14/92
--
-- COPYRIGHT 1992 CIRRUS LOGIC, Inc.
-- This program is protected as an unpublished work under the Copyright ACT of
-- 1976 and the Computer Software Act of 1980.
--
--
-- Created by Stephen a Smith; April 14 1992
-- edited on
--
--
---------------------------------------------------------------------------
library synopsys;
use synopsys.types.all;
use synopsys.attributes.all;
use synopsys.arithmetic.all;
use work.sas_stuf.all;
---------------------------------------------------------------------------
ENTITY index_reg is
        port    (signal l_config_id     :in     mvl7;
                signal index_w          :in     mvl7;
                signal index_r          :in     mvl7;
                signal reg_i_0          :in     mvl7;
                signal ior              :in     mvl7;
                signal iow              :in     mvl7;
                signal b_reset          :in     mvl7;
                signal b_s_addr         :in     mvl7_vector(15 downto 0);
                signal index_a          :buffer mvl7;
                signal index1_a         :buffer mvl7;
                signal b_sbhe_n         :in     mvl7;
                signal b_s_data         :inout  mvl7_vector (15 downto 0);
                signal index_bus        :out  mvl7_vector (7 downto 0);
                index_bus6              :out  mvl7;
                index_bus7              :out  mvl7;
                signal a_03f7           :out    mvl7;
                tristate_bit7           :buffer mvl7;
                irq12_is_led            :buffer mvl7;
                v5_core                 :buffer mvl7;
                suspend                 :buffer mvl7;
                lp_dyn_mode             :buffer mvl7;
                bypass_freq             :buffer mvl7;
                b_iocs16_n              :in     mvl7;
                clk_25m_out             :in     mvl7;
                irq15_is_ri_out         :buffer mvl7;
                chip_dma                :buffer mvl7;
                irq4pdac                :out    mvl7;
                b_aen                   :in     mvl7;
                dma_config              :in     mvl7
);
end index_reg;

ARCHITECTURE BEHAVIOR of index_reg is
```

```
        signal index_busi       :mvl7_vector(7 downto 0);
        signal misc_control_2   :mvl7_vector (7 downto 0);
        signal index_misc_2_a   :mvl7;
        signal early_suspend    :mvl7;
        signal sus       :mvl7;
        signal misc_control_2_v    :mvl7_vector(7 downto 0);

begin

su:process(clk_25m_out, early_suspend)
begin
if early_suspend = '0' then
 suspend <= '0';
 sus <= '0';
else if (clk_25m_out'event and clk_25m_out = '0') then
 sus <= early_suspend;
 suspend <= sus;
end if;
end if;
end process;

susp:process(iow, misc_control_2,misc_control_2_v, b_reset,
index1_a, suspend, index_misc_2_a,
l_config_id, index_busi, b_s_data)
begin

if b_reset = '1' then
        bypass_freq <= '1';
else
        bypass_freq <= misc_control_2(0);
end if;

lp_dyn_mode <= misc_control_2(1);
early_suspend <= misc_control_2(2);
v5_core <= misc_control_2(3);
irq12_is_led <= misc_control_2(4); --  drive LED enable
tristate_bit7 <= misc_control_2(5);
chip_dma <= misc_control_2(6) and dma_config;
irq15_is_ri_out <= misc_control_2(7);

if index1_a = '1' and index_misc_2_a = '1' and l_config_id = index_busi(7) then
        misc_control_2_v <= b_s_data(15 downto 8);
else
        misc_control_2_v <= misc_control_2;
end if;

if misc_control_2(6) = '0' or misc_control_2(2) = '1' then
        irq4pdac <= '1';
else
        irq4pdac <= '0';
end if;

end process;

misc_2:process(iow,b_reset,misc_control_2_v)
```

```
begin
if (b_reset = '1') then misc_control_2 <= conv_unsigned(2,8);
 else
 if ( iow'event and iow = '0') then
    misc_control_2 <= misc_control_2_v;
 end if;
end if;
end process;

slot_regs_overall:process(b_sbhe_n, index_busi, index_a, iow, misc_control_2,
ior, index_misc_2_a, b_reset, l_config_id, reg_i_0,b_iocs16_n,
 b_s_addr, index_w, index_r, b_s_data, suspend, index1_a )
-- the stupid process statement

begin
-------------------------------------------------------------------------------------
-- the index register
-------------------------------------------------------------------------------------
if (index_w = '1') then
 index_busi <= b_s_data(7 downto 0);
end if;
index_bus <= index_busi;
index_bus6 <= index_busi(6);
index_bus7 <= index_busi(7);

if (index_r= '1' or
 (index_a = '1' and suspend = '1' and ior = '1')) then
 b_s_data(7 downto 0) <= index_busi;
else b_s_data(7 downto 0) <= "ZZZZZZZZ";
end if;
-------------------------------------------------------------------------------------
-- misc control 2
-------------------------------------------------------------------------------------
if  (conv_integer(index_misc_2) = conv_integer(index_busi(6 downto 0))) then
index_misc_2_a <= '1';
else
index_misc_2_a <= '0';
end if;

if ((reg_i_0 = '1' and index_misc_2_a = '1') or
 (index1_a = '1' and suspend = '1' and ior = '1' and index_misc_2_a = '1' and
       l_config_id = index_busi(7))) then
 b_s_data(15 downto 8) <= misc_control_2 ;
else b_s_data(15 downto 8) <= "ZZZZZZZZ";
end if;


-------------------------------------------------------------------------------------
-- decode the index and data addresses
-------------------------------------------------------------------------------------

if (b_aen = '0' and conv_integer(b_s_addr) = conv_integer(address_3e0)) then
 index_a <= '1';
else
 index_a <= '0';
end if;
```

```
if ((index_a = '1' and b_sbhe_n = '0') or (conv_integer(b_s_addr) =
 conv_integer(address_3e1))) and b_aen = '0' then
 index1_a <= '1';
else
 index1_a <= '0';
end if;

-----------------------------------------------------------------------------------
-- the special floppy IDE address
-----------------------------------------------------------------------------------
if ((conv_integer(address_03f7) = conv_integer(b_s_addr))  or
   (conv_integer(address_0377) = conv_integer(b_s_addr))) and b_aen = '0'
then
 a_03f7 <= '1';
else
a_03f7 <= '0';
end if;

-----------------------------------------------------------------------------------
-- decode the test address
-----------------------------------------------------------------------------------

--if (conv_integer(b_la_add) = conv_integer(test_a)) then
-- test <= '1';
--else
--test <= '0';
--end if;

end process;
end;
```

We claim:

1. A receiver for receiving signals along an input line, said receiver being within an integrated circuit having core circuitry operating at a core voltage power level, said receiver comprising:

a first NOR gate having a first input connected to said input line and a second input connected to a first gate enable line, said first NOR gate having a triggering level set to a first triggering level;

a second NOR gate having a first input connected to said input line and a second input connected to a second gate enable line, said second NOR gate having a triggering level set to a second triggering level;

a third NOR gate having first and second inputs connected to outputs of said first and second NOR gates respectively, and an output connected to an output line connected to the core circuitry of the integrated circuit;

said first, second and third NOR gates being powered at said core voltage power level; and means for transmitting a NOR gate enable signal to one of said first and second NOR gates along a respective gate enable line for enabling one of said first and second NOR gates.

2. The receiver of claim 1, wherein said core voltage is set to one of two predetermined levels and said first and second triggering levels of said first and second NOR gates are set to levels optimized for converting signals from input voltages to said core voltage.

3. The receiver of claim 2, wherein said core voltage is either 3.3 V or 5.0 V and wherein said first triggering level is about 1.4 V and said second triggering level is about 1.6 V.

4. The receiver of claim 1, further comprising additional NOR gates connected in parallel between said input line and said third NOR gate, said additional NOR gates having differing triggering levels.

5. A receiver for receiving binary signals along an input line, said binary signals including high and low signals, said receiver being within in an integrated circuit having core circuitry operating at a core voltage power level, said receiver comprising:

a first signal receiving means for receiving the binary signal along said input line and for translating said binary signal to signal levels corresponding to the core voltage level, said first signal receiving means having a triggering level set for distinguishing between high and low signals received along said input line, said triggering level being set to a first triggering voltage optimized for a first internal core voltage level;

a second signal receiving means for receiving the binary signal along said input line and for translating said binary signal to signal levels corresponding to the core voltage level, said second signal receiving means having a triggering level set for distinguishing between high and low signals received along said input line, said triggering level being set to a second triggering voltage optimized for a second internal core voltage level;

enabling means for enabling operation of one of said first and second receiving means, said enabling means enabling said first receiving means if said core voltage is at said first level and enabling said second receiving means if said core voltage is at said second level.

6. The receiver of claim 5, wherein said core voltage is either 3.3 V or 5.0 V and wherein said first triggering level is about 1.4 V and said second triggering level is about 1.6 V.

7. The receiver of claim 5, further comprising additional signal receiving means connected in parallel with said first and second signal receiving means, said additional signal receiving means having differing triggering levels from said first and second signal receiving means.

8. A receiver for receiving signals along an input line, said receiver being within in an integrated circuit having core circuitry operating at a core voltage power level, said receiver comprising:

a plurality of two-input NOR gates connected in parallel to said input line, each of said NOR gates having a first input connected to said input line and a second input connected to a respective gate enable line, each of said NOR gates having a different triggering voltage level;

a multiple-input NOR gate having a plurality of inputs each connected to an output of a respective one of said plurality of two-input NOR gates, said multiple-input NOR gate having an output connected to an output line connected to the core circuitry of the integrated circuit; with each of said two-input NOR gates and said multiple-input NOR gate being powered at said core voltage power level; and means for transmitting a NOR gate enable signal to one of said two-input NOR gates along a respective gate enable line for enabling one of said two-input NOR gates.

9. The receiver of claim 8, wherein said core voltage is set to one of a plurality of predetermined levels and said triggering levels of said two-input NOR gates are set to levels optimized for converting signals from input voltages to respective core voltages.

10. The receiver of claim 8, wherein said core voltage is either 3.3 V or 5.0 V and wherein a triggering level of a first of said two-input NOR gates is about 1.4 V and a triggering level of a second of said two-input NOR gates is about 1.6 V.

11. The receiver of claim 8, wherein said core voltage is one of 5.0 V, 3.3 V, 2.7 V, 2.5 V, or 2.0 V.

12. The receiver of claim 8, wherein one or more of said two-input NOR gates has a triggering level optimized for one of several predetermined integrated circuit fabrication methodologies.

13. A method for receiving signals along an input line within an integrated circuit having core circuitry operating at a core voltage power level, said method comprising the steps of:

determining the core voltage power level;

passing an input signal through a first NOR gate having a voltage triggering level set to a first voltage level, if said core voltage is at the first voltage level;

passing an input signal through a second NOR gate having a voltage triggering level set to a second voltage level, if said core voltage is at the second voltage level;

passing an output of either said first or second NOR gates through a third NOR gate; and transmitting an output of said third NOR gate to the core circuitry of the integrated circuit.

14. The method of claim 13, wherein said core voltage is either 3.3 V or 5.0 V and wherein said triggering level of said first NOR gate is about 1.4 V and said triggering level of said second NOR gate is about 1.6 V.

15. A method for receiving signals along an input line within in an integrated circuit having core circuitry operating at a core voltage power level, using a set of NOR gates having respective triggering levels optimized for different core voltage levels, said method comprising the steps of:

determining the core voltage power level;

selecting one of said set of NOR gate receivers for receiving said binary signals, with said one NOR gate receiver being selected based on the triggering level of the NOR gate and the core voltage level; and receiving said binary signal using said selected NOR gate receiver.

16. The method of claim 15, wherein said core voltage is either 3.3 V or 5.0 V and wherein a triggering level of a first of said two-input NOR gates is about 1.4 V and a triggering level of a second of said two input NOR gates is about 1.6 V.

17. The method of claim 15, wherein one or more of said two-input NOR gates has a triggering level optimized for one of several predetermined integrated circuit fabrication methodologies, and wherein said method incudes the steps of:

detecting the fabrication methodology used to fabricate said integrated circuit; and selecting one of said set of NOR gate receivers for receiving said binary signals, with said one NOR gate receiver being selected based on the detected fabrication methodology and the triggering level voltage.

* * * * *